US011611032B2

(12) United States Patent
Leipold et al.

(10) Patent No.: US 11,611,032 B2
(45) Date of Patent: Mar. 21, 2023

(54) SEMICONDUCTOR PROCESS OPTIMIZED FOR QUANTUM STRUCTURES

(71) Applicant: equal1.labs Inc., Fremont, CA (US)

(72) Inventors: Dirk Robert Walter Leipold, Fremont, CA (US); George Adrian Maxim, Saratoga, CA (US); Michael Albert Asker, San Jose, CA (US)

(73) Assignee: Equal1.Labs Inc., Fremont, CA (US)

( * ) Notice: Subject to any disclaimer, the term of this patent is extended or adjusted under 35 U.S.C. 154(b) by 55 days.

(21) Appl. No.: 17/157,062

(22) Filed: Jan. 25, 2021

(65) Prior Publication Data
US 2021/0143313 A1 May 13, 2021

Related U.S. Application Data

(60) Division of application No. 16/734,337, filed on Jan. 5, 2020, now Pat. No. 10,903,413, which is a
(Continued)

(51) Int. Cl.
*H10N 60/10* (2023.01)
*H10N 60/80* (2023.01)
(Continued)

(52) U.S. Cl.
CPC .......... *H01L 39/228* (2013.01); *G06N 10/00* (2019.01); *H01L 39/025* (2013.01); *H01L 39/223* (2013.01); *H01L 39/2493* (2013.01)

(58) Field of Classification Search
CPC ... H01L 39/228; H01L 39/025; H01L 39/223; H01L 39/2493
See application file for complete search history.

(56) References Cited

U.S. PATENT DOCUMENTS 6,301,029 B1   10/2001   Azuma et al.
6,472,681 B1   10/2002   Kane et al.
(Continued)

FOREIGN PATENT DOCUMENTS

CN    108776582 A    11/2018
EP       1860600       11/2008
(Continued)

OTHER PUBLICATIONS

Guo et al., "Control and Readout of Software in Superconducting Quantum Computing," https://arxiv.org/abs/1806.04021, Jun. 2018.
(Continued)

*Primary Examiner* — Marc Anthony Armand
(74) *Attorney, Agent, or Firm* — Zaretsky Group PC; Howard Zaretsky

(57) ABSTRACT

A novel and useful modified semiconductor fabrication technique for realizing reliable semiconductor quantum structures. Quantum structures require a minimization of the parasitic capacitance of the control gate and the quantum well. The modified semiconductor process eliminates the fabrication of the metal, contact, and optionally the raised diffusion layers from the quantum wells, thereby resulting in much lower well and gate capacitances and therefore larger Coulomb blockade voltages. This allows easier implementation of the electronic control circuits in that they can have larger intrinsic noise and relaxed analog resolution. Several processes are disclosed including implementations of semiconductor quantum structures with tunneling through an oxide layer as well as tunneling through a local well depleted region. These techniques can be used in both planar semiconductor processes and 3D, e.g., FinFET, semiconductor processes. A dedicated process masking step is used for realizing the raised diffusions. In addition, the edge of the
(Continued)

raised diffusion layer may be placed either in the gate region or the active layer region.

20 Claims, 86 Drawing Sheets

Related U.S. Application Data continuation-in-part of application No. 16/445,645, filed on Jun. 19, 2019, now Pat. No. 10,865,106.

(60) Provisional application No. 62/794,655, filed on Jan. 20, 2019, provisional application No. 62/794,591, filed on Jan. 19, 2019, provisional application No. 62/791,818, filed on Jan. 13, 2019, provisional application No. 62/788,865, filed on Jan. 6, 2019, provisional application No. 62/731,810, filed on Sep. 14, 2018, provisional application No. 62/726,397, filed on Sep. 3, 2018, provisional application No. 62/726,271, filed on Sep. 2, 2018, provisional application No. 62/726,290, filed on Sep. 2, 2018, provisional application No. 62/703,888, filed on Jul. 27, 2018, provisional application No. 62/698,278, filed on Jul. 15, 2018, provisional application No. 62/695,842, filed on Jul. 10, 2018, provisional application No. 62/694,022, filed on Jul. 5, 2018, provisional application No. 62/692,804, filed on Jul. 1, 2018, provisional application No. 62/692,844, filed on Jul. 1, 2018, provisional application No. 62/692,745, filed on Jun. 30, 2018, provisional application No. 62/689,291, filed on Jun. 25, 2018, provisional application No. 62/689,166, filed on Jun. 24, 2018, provisional application No. 62/689,100, filed on Jun. 23, 2018, provisional application No. 62/689,035, filed on Jun. 22, 2018, provisional application No. 62/688,341, filed on Jun. 21, 2018, provisional application No. 62/687,803, filed on Jun. 21, 2018, provisional application No. 62/687,800, filed on Jun. 20, 2018, provisional application No. 62/687,793, filed on Jun. 20, 2018, provisional application No. 62/687,779, filed on Jun. 20, 2018.

(51) Int. Cl.
*G06N 10/00* (2022.01)
*H10N 60/01* (2023.01)
*H10N 60/12* (2023.01)
*H01L 39/22* (2006.01)
*H01L 39/02* (2006.01)
*H01L 39/24* (2006.01)

(56) References Cited

U.S. PATENT DOCUMENTS

| | | | |
|---|---|---|---|
| 6,597,010 B2 | 7/2003 | Eriksson | |
| 6,635,898 B2 | 10/2003 | Williams et al. | |
| 6,657,222 B1 | 12/2003 | Foden et al. | |
| 6,720,589 B1 | 4/2004 | Shields | |
| 6,787,794 B2 | 9/2004 | Cain | |
| 7,026,641 B2 | 4/2006 | Mohseni | |
| 7,317,230 B2 | 1/2008 | Lee et al. | |
| 7,451,292 B2 | 11/2008 | Routt | |
| 7,498,832 B2 | 3/2009 | Baumgardner | |
| 7,655,850 B1 | 2/2010 | Ahn | |
| 7,659,538 B2 | 2/2010 | Snyder et al. | |
| 7,830,695 B1 | 11/2010 | Moon | |
| 8,035,540 B2 | 10/2011 | Berkley | |
| 8,229,863 B2 | 7/2012 | Amin | |
| 8,294,137 B2 | 10/2012 | Jain et al. | |
| 8,507,894 B2 | 8/2013 | Morello | |
| 8,576,614 B2 | 11/2013 | Heyns | |
| 9,093,499 B2 | 7/2015 | Noel | |
| 9,126,829 B2 | 9/2015 | Wu | |
| 9,153,594 B2 | 10/2015 | Jain | |
| 9,269,052 B2 | 2/2016 | Svore et al. | |
| 9,502,265 B1 | 11/2016 | Jiang | |
| 9,633,313 B2 | 4/2017 | Svore et al. | |
| 9,691,033 B2 | 6/2017 | Rogge | |
| 9,741,081 B2 | 8/2017 | Alboszta et al. | |
| 9,842,921 B2 | 12/2017 | Eriksson | |
| 9,858,531 B1 | 1/2018 | Monroe | |
| 9,859,409 B2 | 1/2018 | Cheng et al. | |
| 9,978,020 B1 | 5/2018 | Gambetta | |
| 10,068,903 B2 | 9/2018 | Edwards | |
| 10,192,976 B2 | 1/2019 | Petta | |
| 10,229,365 B2 | 3/2019 | Fuechsle | |
| 10,255,556 B2 | 4/2019 | Hollenberg | |
| 10,311,369 B2 | 6/2019 | Epstein | |
| 10,332,023 B2 | 6/2019 | Mezzacap | |
| 10,340,290 B2 | 7/2019 | Pawlak | |
| 10,353,862 B2 | 7/2019 | Henry | |
| 10,380,496 B2 | 8/2019 | Elsherbini et al. | |
| 10,446,700 B2 | 10/2019 | Wang | |
| 10,482,388 B1 | 11/2019 | Jock | |
| 10,483,980 B2 | 11/2019 | Sete | |
| 10,491,221 B1 | 11/2019 | McKay | |
| 10,528,884 B2 | 1/2020 | Morello | |
| 10,560,096 B2 | 2/2020 | Raeis | |
| 10,565,515 B2 | 2/2020 | Lampert | |
| 10,635,989 B2 | 4/2020 | Blais | |
| 10,726,351 B1 | 7/2020 | Li et al. | |
| 10,763,349 B2 | 9/2020 | Pillarisetty et al. | |
| 10,804,399 B2 | 10/2020 | Pillarisetty | |
| 10,929,769 B2 | 2/2021 | Pioro-Ladriere | |
| 11,031,239 B2 | 6/2021 | Cheng | |
| 11,094,716 B2 | 8/2021 | Basu | |
| 11,203,526 B2 | 12/2021 | Leipold | |
| 11,222,977 B2 | 1/2022 | Glass | |
| 2002/0190249 A1 | 12/2002 | Williams et al. | |
| 2007/0063182 A1 | 3/2007 | Yang | |
| 2008/0172197 A1 | 7/2008 | Skipor | |
| 2009/0127542 A1 | 5/2009 | Sugaya | |
| 2010/0155808 A1 | 6/2010 | Makihara | |
| 2011/0121895 A1 | 5/2011 | Morello | |
| 2011/0309236 A1 | 12/2011 | Tian | |
| 2012/0212375 A1 | 8/2012 | Depree | |
| 2013/0087766 A1 | 4/2013 | Schenkel | |
| 2014/0026107 A1 | 1/2014 | Bocharov | |
| 2014/0203243 A1 | 7/2014 | Xiao | |
| 2016/0112066 A1 | 4/2016 | Ashikhmin | |
| 2016/0189053 A1 | 6/2016 | Alboszta et al. | |
| 2016/0021560 A1 | 7/2016 | Alboszta et al. | |
| 2016/0204202 A1 | 7/2016 | Jain | |
| 2016/0268406 A1 | 9/2016 | Barraud | |
| 2016/0300155 A1 | 10/2016 | Betz | |
| 2017/0147939 A1 | 5/2017 | Dzurak et al. | |
| 2017/0214070 A1 | 7/2017 | Wang | |
| 2017/0300808 A1 | 10/2017 | Ronagh | |
| 2018/0122336 A1 | 5/2018 | Kunitake | |
| 2018/0260732 A1 | 9/2018 | Bloom | |
| 2018/0279429 A1 | 9/2018 | Sadwick | |
| 2019/0044049 A1 | 2/2019 | Thomas et al. | |
| 2019/0044050 A1 | 2/2019 | Pillarisetty et al. | |
| 2019/0044542 A1 | 2/2019 | Hogaboam | |
| 2019/0080256 A1 | 3/2019 | Irwin | |
| 2019/0130298 A1 | 5/2019 | Pioro-Ladriere | |
| 2019/0164959 A1 | 5/2019 | Thomas | |
| 2019/0181256 A1 | 6/2019 | Roberts | |
| 2019/0198618 A1 | 6/2019 | George | |
| 2019/0214385 A1* | 7/2019 | Roberts | H01L 27/0694 |
| 2019/0266509 A1 | 8/2019 | Hutin | |
| 2019/0266511 A1 | 8/2019 | Pillarisetty | |
| 2019/0273197 A1 | 9/2019 | Roberts | |
| 2019/0334020 A1* | 10/2019 | Amin | H01L 29/423 |
| 2019/0392341 A1 | 12/2019 | Leipold | |
| 2019/0392352 A1 | 12/2019 | Lampert | |
| 2019/0392912 A1 | 12/2019 | Leipold et al. | |
| 2019/0392913 A1 | 12/2019 | Leipold et al. | |

(56) References Cited

U.S. PATENT DOCUMENTS

| | | |
|---|---|---|
| 2019/0392917 A1 | 12/2019 | Leipold |
| 2019/0393397 A1 | 12/2019 | Leipold |
| 2020/0126980 A1 | 4/2020 | Park |
| 2020/0127096 A1 | 4/2020 | Eendebak |
| 2020/0160205 A1 | 5/2020 | Leipold |
| 2020/0169396 A1 | 5/2020 | Neven |
| 2020/0285947 A1 | 9/2020 | Gunnels |
| 2020/0311525 A1 | 10/2020 | Kachman |
| 2020/0312846 A1 | 10/2020 | Rachmady |
| 2020/0328277 A1 | 10/2020 | Jain |
| 2020/0412532 A1 | 12/2020 | Shi |
| 2021/0342730 A1 | 11/2021 | Redmond |
| 2022/0067563 A1 | 3/2022 | Bonderson |

FOREIGN PATENT DOCUMENTS

| | | |
|---|---|---|
| EP | 2421043 | 2/2012 |
| EP | 3505490 | 1/2018 |
| EP | 3869421 | 8/2021 |
| KR | 20180112833 A | 10/2018 |
| WO | 2018004554 | 1/2018 |
| WO | 2020/245013 A1 | 12/2020 |

OTHER PUBLICATIONS

Alkhalil et al., "Realization of Fully Tunable FinFET Double Quantum Dots with Close Proximity Plunger Gates," 12th IEEE International Conference on Nanotechnology (IEEE—NANO), 2012.
Kuhlmann et al., "Ambipolar quantum dots in undoped silicon fin field-effect transistors," Applied Physics Letters 113 122107, 2018.
Angus et al., "Gate-Defined Quantum Dots in Intrinsic Silicon," Nano Letters, vol. 7, No. 7, pp. 2051-2055, 2007.
Lansbergen et al., "Transport-based dopant metrology in advanced FinFETs," IEEE, 2008.
Zajac et al, "Resonantly driven CNOT gate for electron spins", Science 359, pp. 439-442, 2018.
Veldhorst et al, "A Two Qubit Logic Gate in Silicon", 2014.
Rashba. "Electron spin operation by electric fields: spin dynamics and spin injection," Physica E 20 (2004) pp. 189-195.
Bernardo-Gavito, R., Bagci, I.E., Roberts, J. et al. Extracting random numbers from quantum tunnelling through a single diode. Sci Rep 7, 17879 (2017). https://doi.org/10.1038/s41598-017-18161-9 Dec. 31, 2017 (Dec. 31, 2017).
Hopkins M, Mikaitis M, Lester DR, Furber S. 2020 Stochastic rounding and reduced-precision fixed-point arithmetic for solving neural ordinary differential equations.Phil. Trans. R. Soc. A 378: 20190052. http://dx.doi.org/10.1098/rsta.2019.0052, Jan. 20, 2020 (Jan. 20, 2020).
I. Bashir et al., "A Single-Electron Injection Device for CMOS Charge Qubits Implemented in 22-nm FS-SOI," in SSC Letters, vol. 3, Jul. 2020, pp. 206-209 Jul. 21, 2020 (Jul. 21, 2020).
I. V. P. D. Reyes, A. M. Sison and R. P. Medina, "A Novel Fused Random Pooling Method for Convolutional Neural Network to Improve Image Classification Accuracy," 2019 IEEE 6th International Conference on Engineering Technologies and Applied Sciences (ICETAS), 2019, pp. 1-5, doi: 10.1109/ICETAS48360.2019.9117323. Dec. 31, 2019 (Dec. 31, 2019).
Krishnakumar, R., & Zeng, W. (2021). Quantum Rounding. arXiv preprint arXiv:2108.05949. Aug. 12, 2021 (Aug. 12, 2021).
Morau et al., "Transport spectroscopy of coupled donors in silicon nano-transistors", Scientific Reports 4 (2014) 6219.
Xia, Lu, et al. "A Simple and Efficient Stochastic Rounding Method for Training Neural Networks in Low Precision." arXiv preprint arXiv:2103.13445 (2021). Mar. 24, 2021 (Mar. 24, 2021).

\* cited by examiner

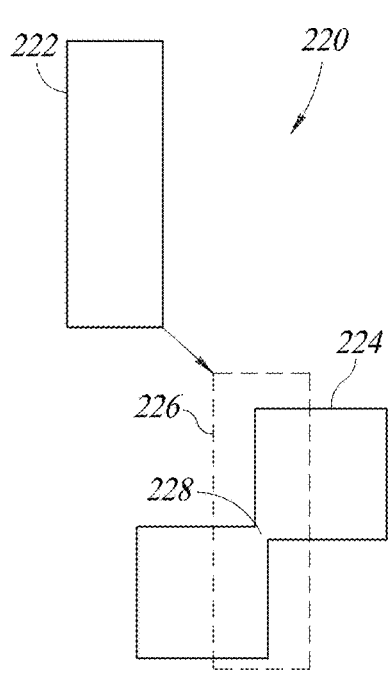
FIG. 8A
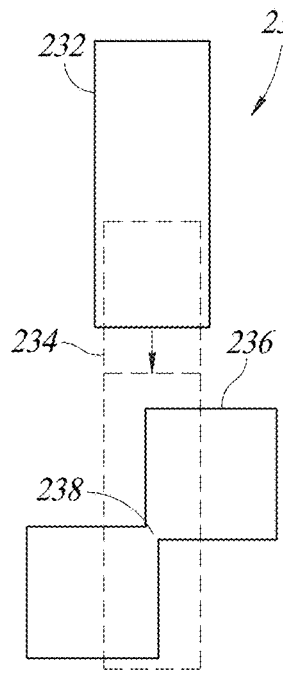
FIG. 8B
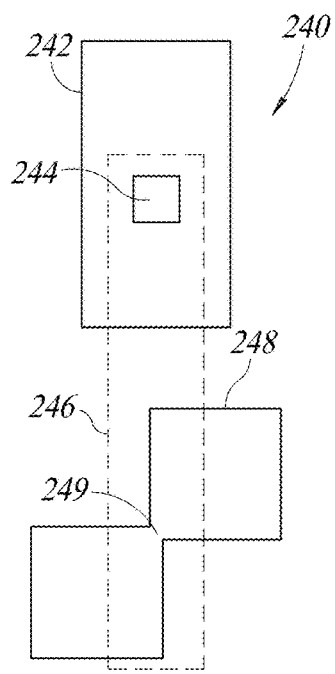
FIG. 8C
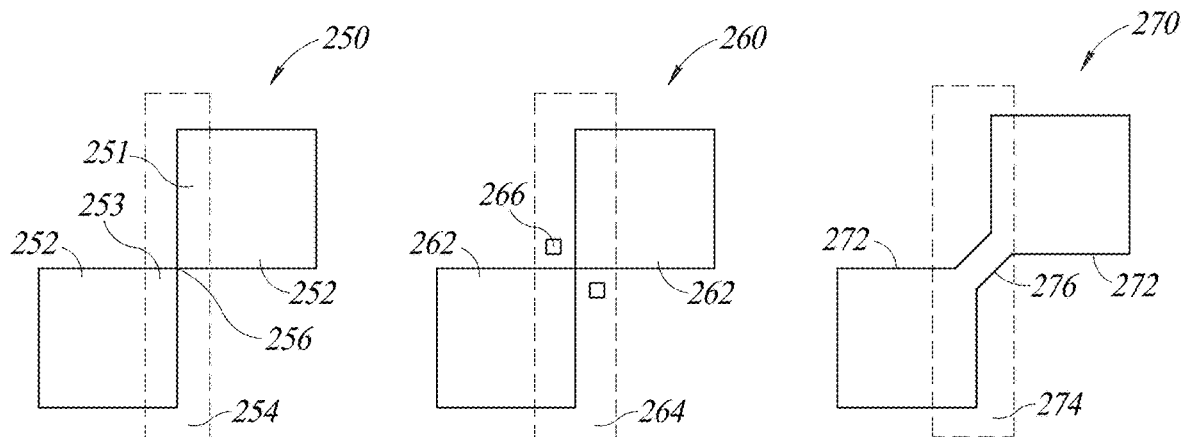
FIG. 9A
FIG. 9B
FIG. 9C

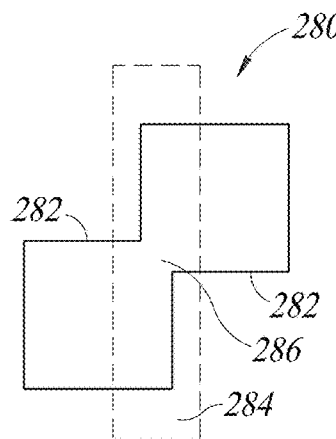
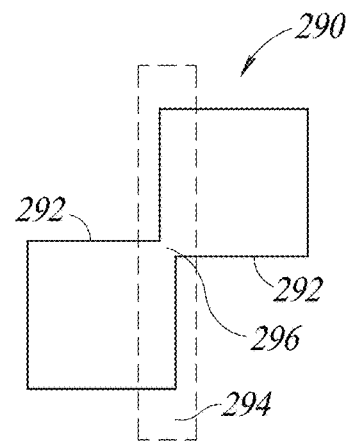
FIG. 9D                FIG. 9E
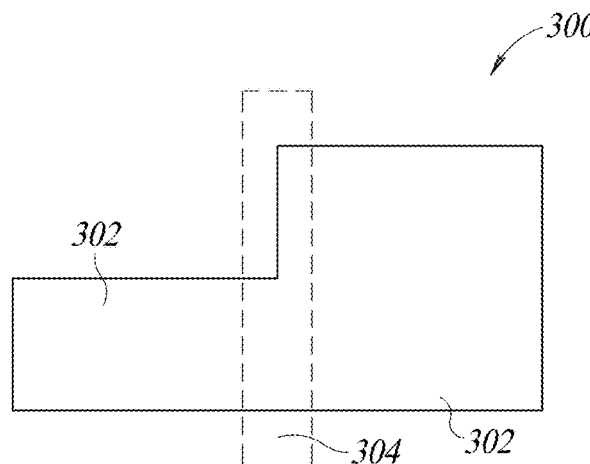
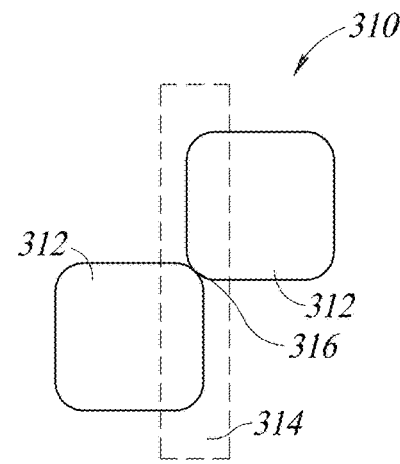
FIG. 9F                FIG. 9G
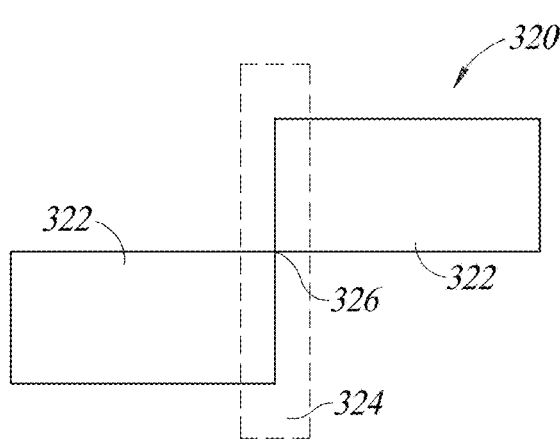
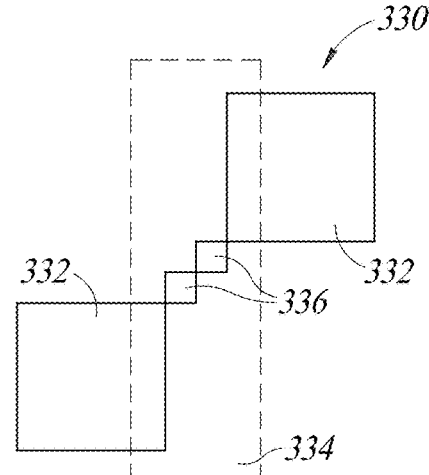
FIG. 9H                FIG. 9I

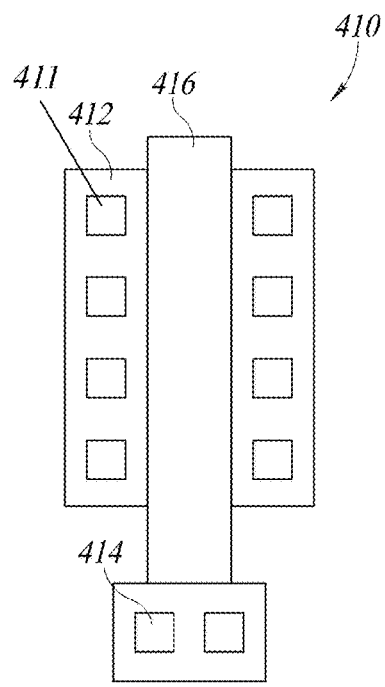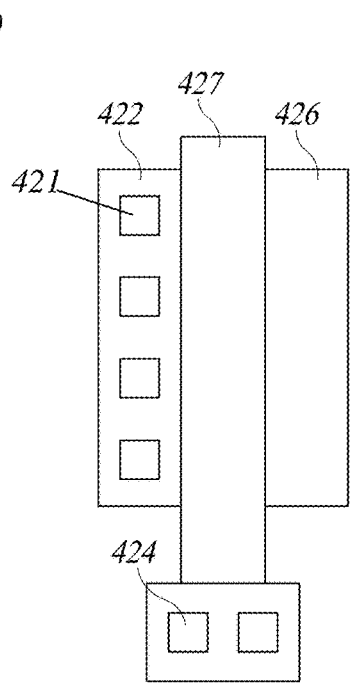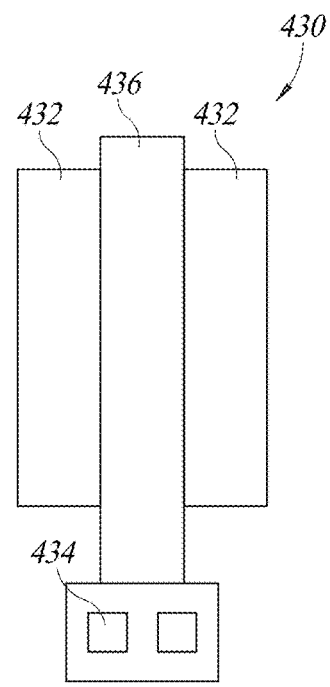
FIG. 9Q          FIG. 9R          FIG. 9S
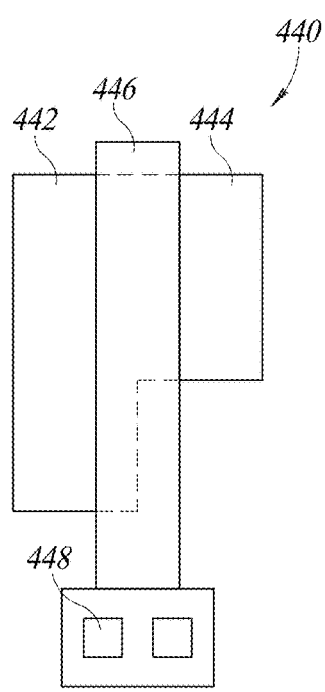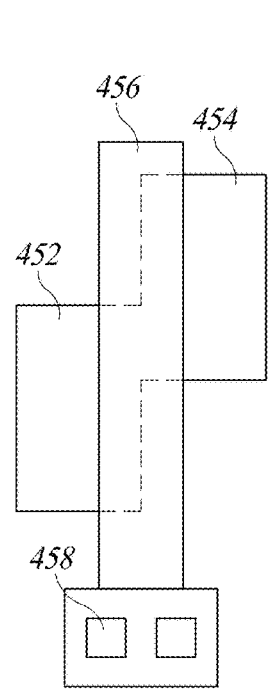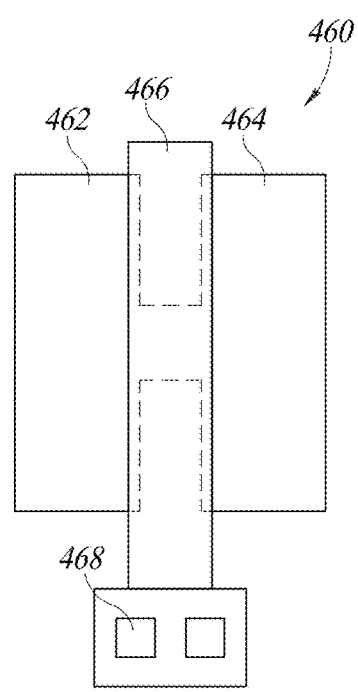
FIG. 9T          FIG. 9U          FIG. 9V

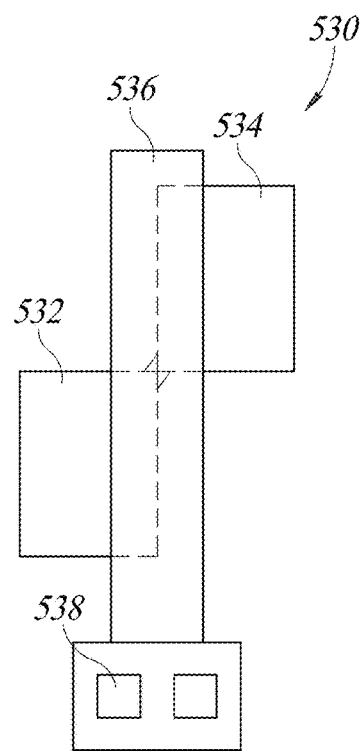 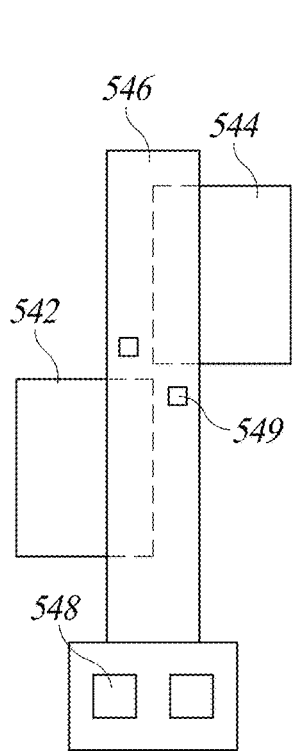 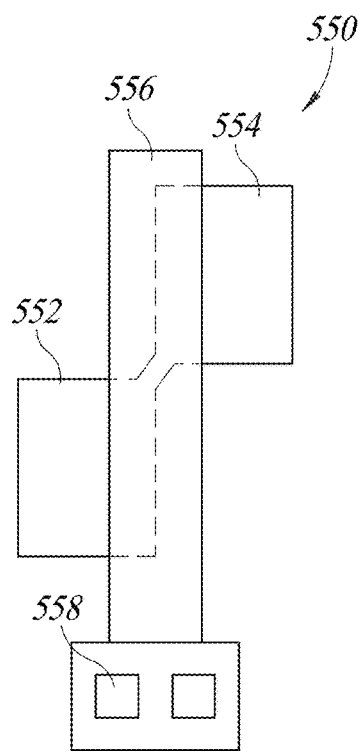
FIG. 9AC  FIG. 9AD  FIG. 9AE
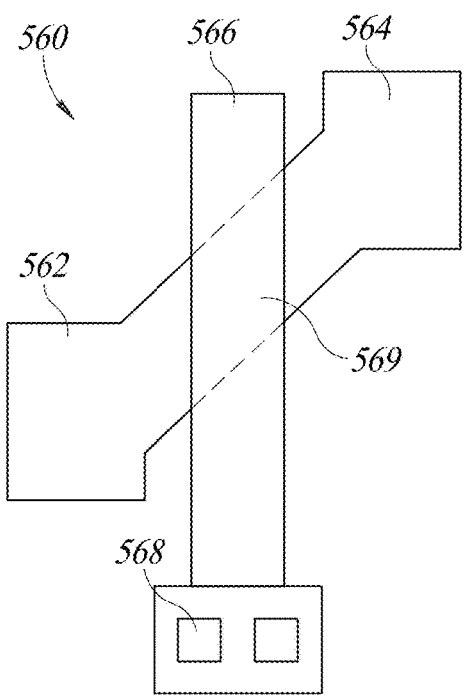 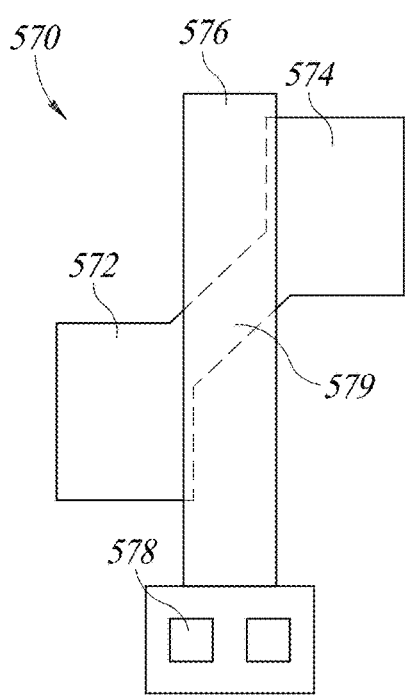
FIG. 9AF  FIG. 9AG

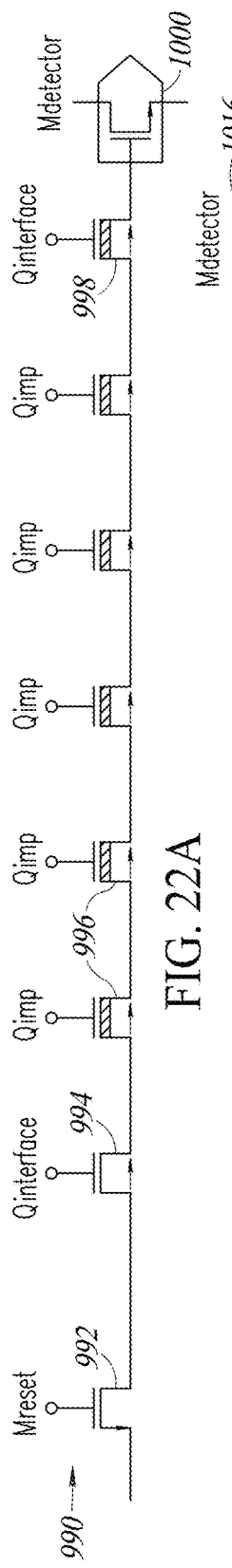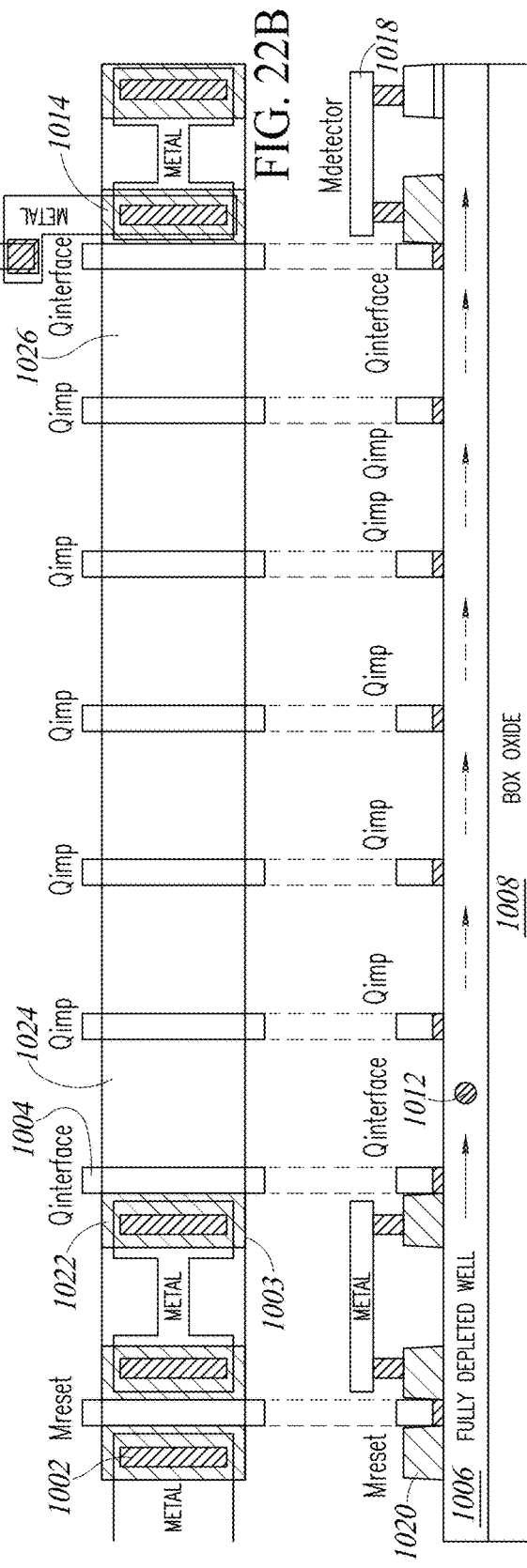

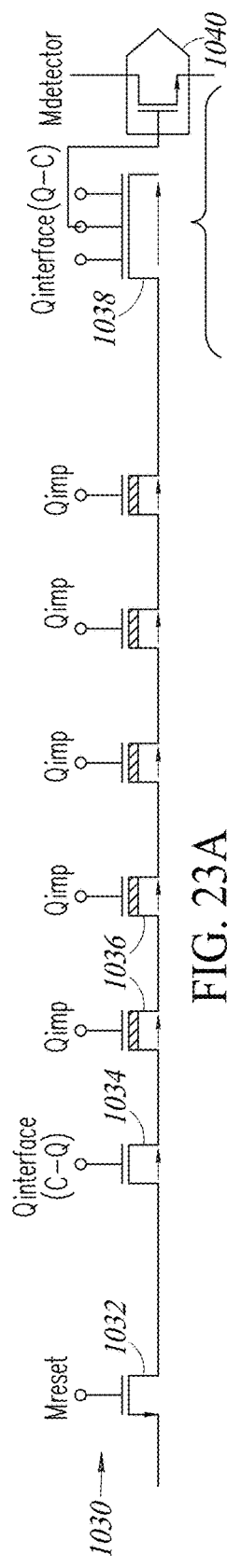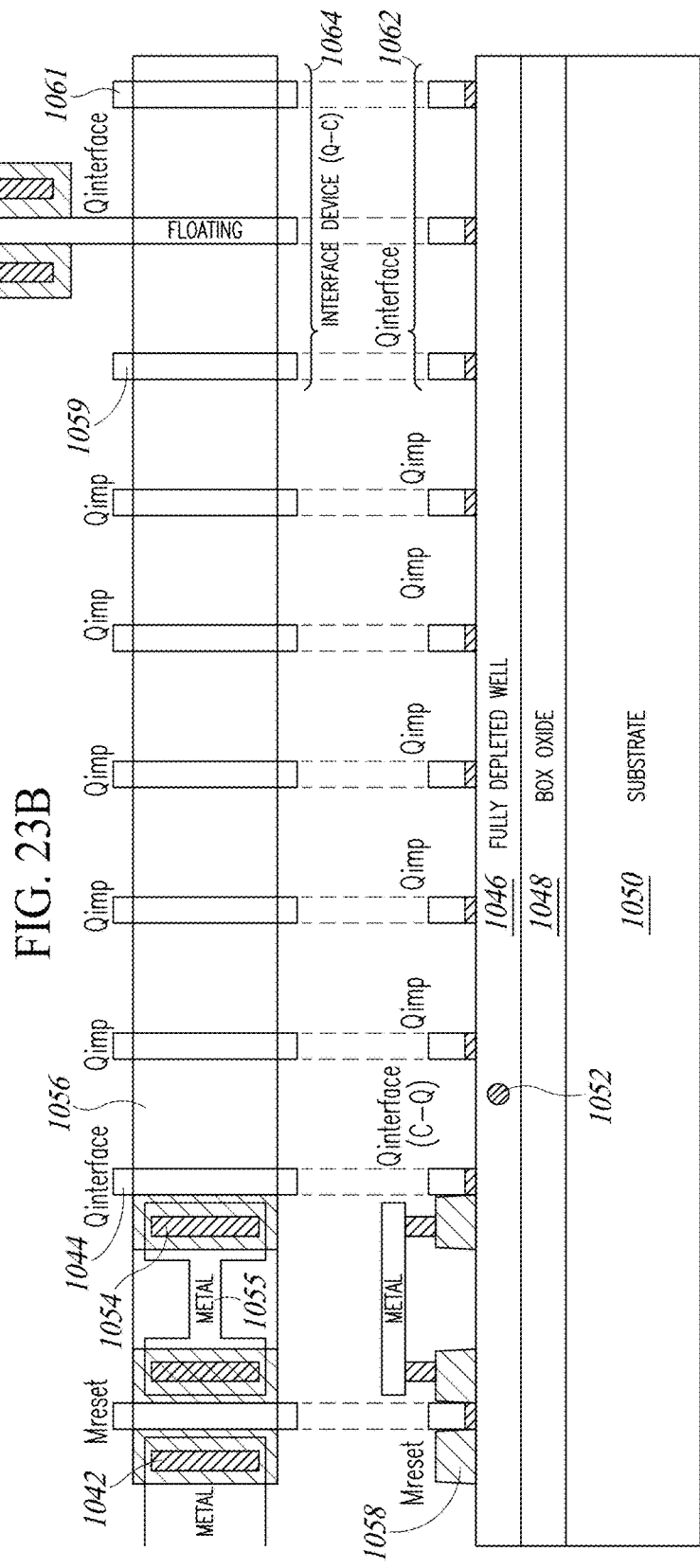
FIG. 23A
FIG. 23B
FIG. 23C

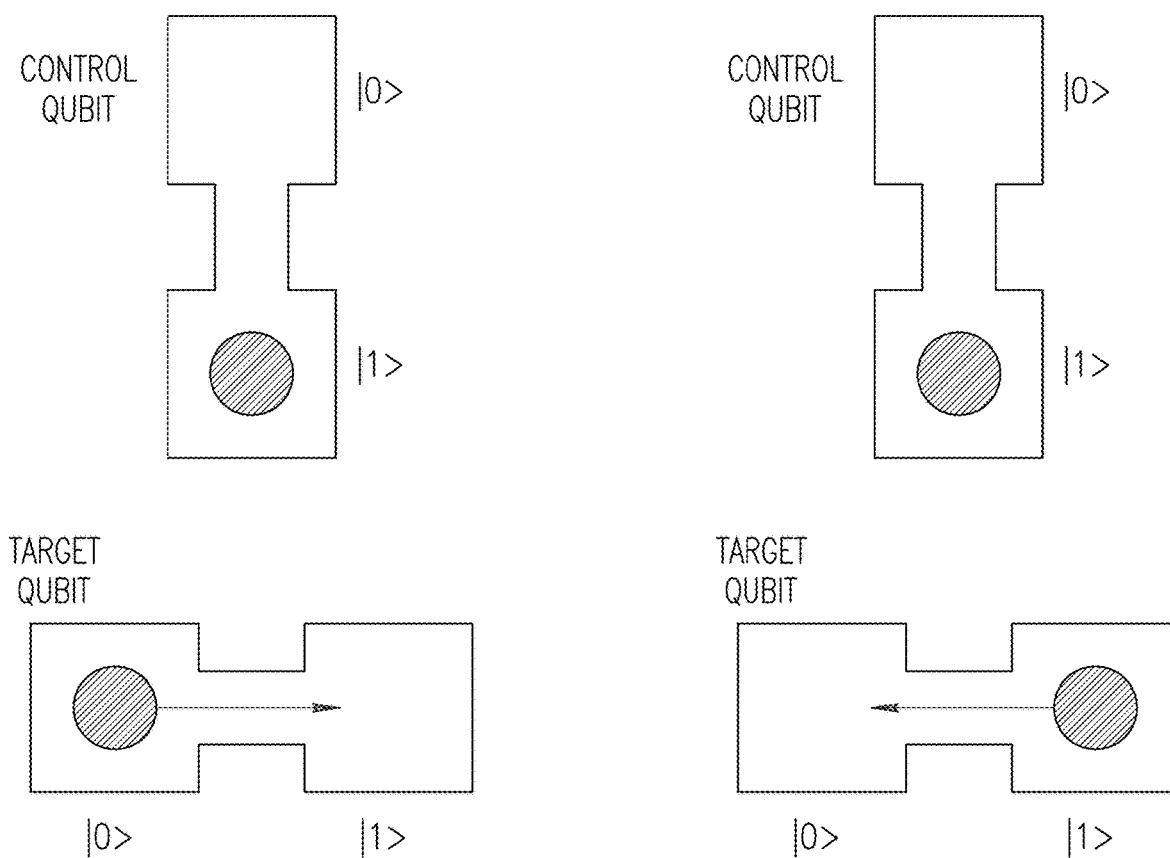
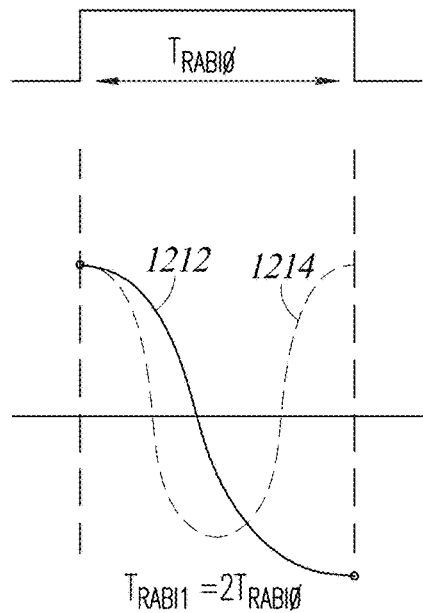
FIG. 39C
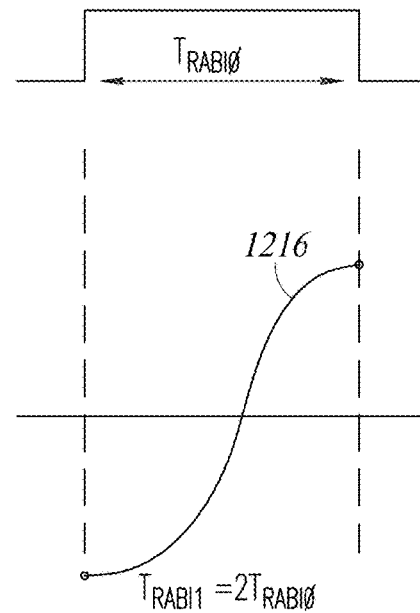
FIG. 39D

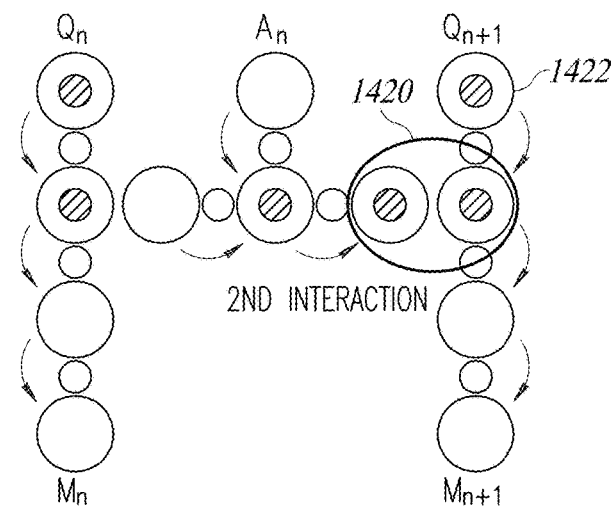
FIG. 48G
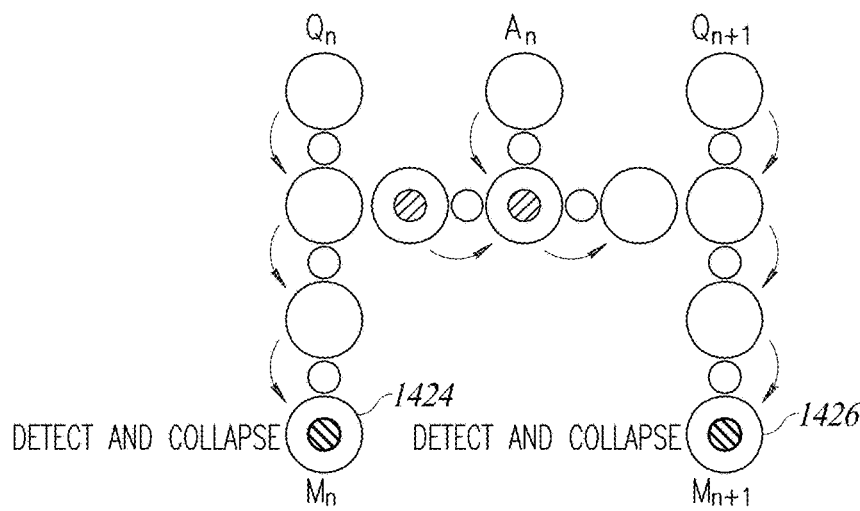
FIG. 48H
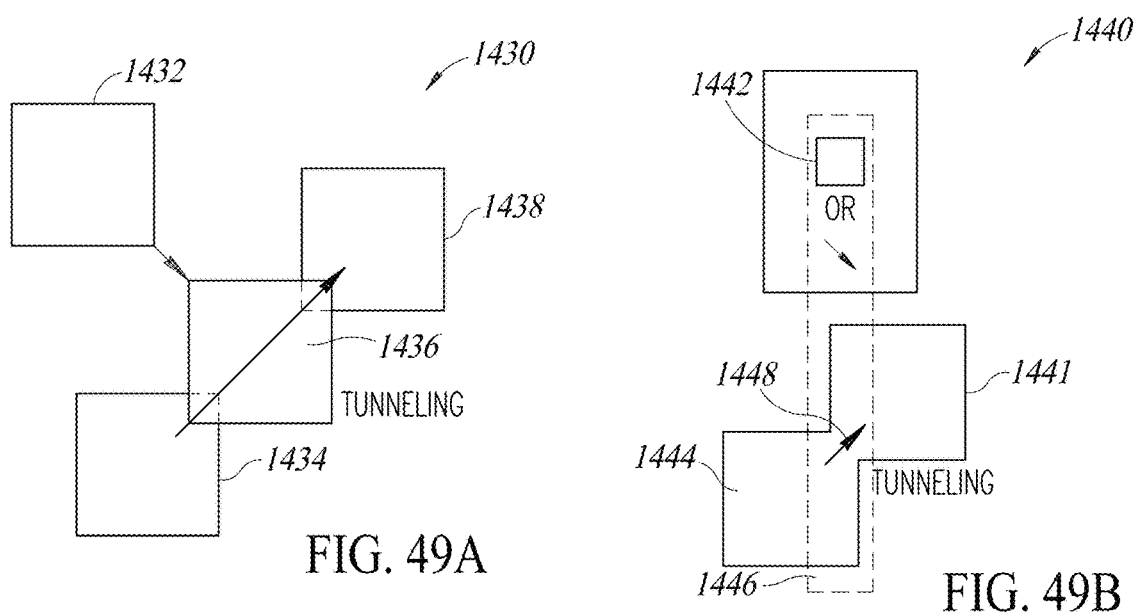
FIG. 49A
FIG. 49B

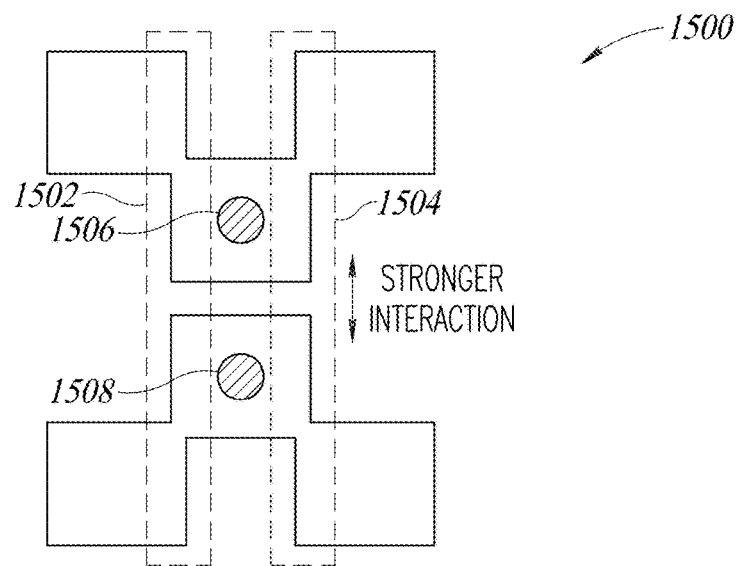
FIG. 49I
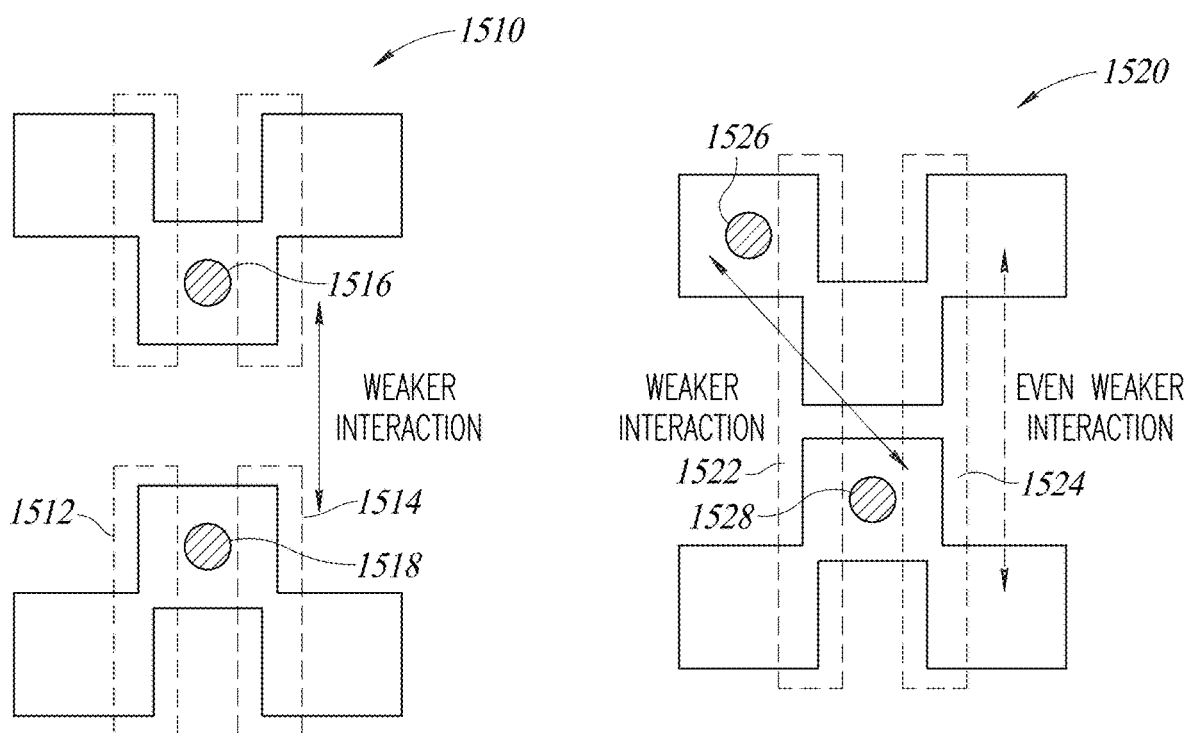
FIG. 49J
FIG. 49K

SEMICONDUCTOR PROCESS OPTIMIZED FOR QUANTUM STRUCTURES

REFERENCE TO PRIORITY APPLICATIONS

This application is a divisional of U.S. application Ser. No. 16/734,337, filed Jan. 5, 2020, entitled "Semiconductor Process Optimized for Quantum Structures," which is a continuation-in-part of U.S. application Ser. No. 16/445,645, filed Jun. 19, 2019, entitled "Semiconductor Controlled Quantum Interaction Gates," now U.S. Pat. No. 10,865,106, which claims the benefit of U.S. Provisional Application No. 62/687,800, filed Jun. 20, 2018, entitled "Electric Signal Pulse-Width And Amplitude Controlled And Re-Programmable Semiconductor Quantum Rotation Gates," U.S. Provisional Application No. 62/687,803, filed Jun. 21, 2018, entitled "Semiconductor Quantum Structures and Computing Circuits Using Local Depleted Well Tunneling," U.S. Provisional Application No. 62/689,100, filed Jun. 23, 2018, entitled "Semiconductor Controlled Entangled-Aperture-Logic Quantum Shift Register," U.S. Provisional Application No. 62/694,022, filed Jul. 5, 2018, entitled "Double-V Semiconductor Entangled-Aperture-Logic Parallel Quantum Interaction Path," U.S. Provisional Application No. 62/687,779, filed Jun. 20, 2018, entitled "Semiconductor Quantum Structures And Gates Using Through-Thin-Oxide Well-To-Gate Aperture Tunneling," U.S. Provisional Application No. 62/687,793, filed Jun. 20, 2018, entitled "Controlled Semiconductor Quantum Structures And Computing Circuits Using Aperture Well-To-Gate Tunneling," U.S. Provisional Application No. 62/688,341, filed Jun. 21, 2018, entitled "3D Semiconductor Quantum Structures And Computing Circuits Using Fin-To-Gate Tunneling," U.S. Provisional Application No. 62/689,035, filed Jun. 22, 2018, entitled "3D Semiconductor Quantum Structures And Computing Circuits Using Controlled Tunneling Through Local Fin Depletion Regions," U.S. Provisional Application No. 62/689,291, filed Jun. 25, 2018, entitled "Semiconductor Quantum Dot And Qubit Structures Using Aperture-Tunneling Through Oxide Layer," U.S. Provisional Application No. 62/689,166, filed Jun. 24, 2018, entitled "Semiconductor Entangled-Aperture-Logic Quantum Ancillary Gates," U.S. Provisional Application No. 62/692,745, filed Jun. 20, 2018, entitled "Re-Programmable And Re-Configurable Quantum Processor Using Pulse-Width Based Rotation Selection And Path Access Or Bifurcation Control," U.S. Provisional Application No. 62/692,804, filed Jul. 1, 2018, entitled "Quantum Processor With Dual-Path Quantum Error Correction," U.S. Provisional Application No. 62/692,844, filed Jul. 1, 2018, entitled "Quantum Computing Machine With Partial Data Readout And Re-Injection Into The Quantum State," U.S. Provisional Application No. 62/726,290, filed Jun. 20, 2018, entitled "Controlled-NOT and Tofolli Semiconductor Entangled-Aperture-Logic Quantum Gates," U.S. Provisional Application No. 62/695,842, filed Jul. 10, 2018, entitled "Entangled Aperture-Logic Semiconductor Quantum Computing Structure with Intermediary Interactor Path," U.S. Provisional Application No. 62/698,278, filed Jul. 15, 2018, entitled "Entangled Aperture-Logic Semiconductor Quantum Bifurcation and Merging Gate," U.S. Provisional Application No. 62/726,397, filed Sep. 3, 2018, entitled "Semiconductor Quantum Structure With Simultaneous Shift Into Entangled State," U.S. Provisional Application No. 62/791,818, filed Jan. 13, 2019, entitled "Semiconductor Process for Quantum Structures with Staircase Active Well," U.S. Provisional Application No. 62/788,865, filed Jan. 6, 2018, entitled "Semiconductor Process For Quantum Structures Without Inner Contacts And Doping Layers," U.S. Provisional Application No. 62/794,591, filed Jan. 19, 2019, entitled "Semiconductor Quantum Structures Using Localized Aperture Channel Tunneling Through Controlled Depletion Region," U.S. Provisional Application No. 62/703,888, filed Jul. 27, 2018, entitled "Aperture Tunneling Semiconductor Quantum Dots and Chord-Line Quantum Computing Structures," U.S. Provisional Application No. 62/726,271, filed Sep. 2, 2018, entitled "Controlled Local Thermal Activation Of Freeze-Out Semiconductor Circuits For Cryogenic Operation," U.S. Provisional Application No. 62/731,810, filed Sep. 14, 2018, entitled "Multi-Stage Semiconductor Quantum Detector with Anti-Correlation Merged With Quantum Core," and U.S. Provisional Application No. 62/794,655, filed Jan. 20, 2019, entitled "Semiconductor Quantum Structures Using Preferential Tunneling Direction Through Thin Insulator Layers." All of which are incorporated herein by reference in their entirety.

FIELD OF THE DISCLOSURE

The subject matter disclosed herein relates to the field of quantum computing and more particularly relates to semiconductor processes for quantum structures, quantum dots, and qubits including modified semiconductor processes optimized for quantum applications.

BACKGROUND OF THE INVENTION

Quantum computers are machines that perform computations using the quantum effects between elementary particles, e.g., electrons, holes, ions, photons, atoms, molecules, etc. Quantum computing utilizes quantum-mechanical phenomena such as superposition and entanglement to perform computation. Quantum computing is fundamentally linked to the superposition and entanglement effects and the processing of the resulting entanglement states. A quantum computer is used to perform such computations which can be implemented theoretically or physically.

Currently, analog and digital are the two main approaches to physically implementing a quantum computer. Analog approaches are further divided into quantum simulation, quantum annealing, and adiabatic quantum computation. Digital quantum computers use quantum logic gates to do computation. Both approaches use quantum bits referred to as qubits.

Qubits are fundamental to quantum computing and are somewhat analogous to bits in a classical computer. Qubits can be in a |0> or |1> quantum state but they can also be in a superposition of the |0> and |1> states. When qubits are measured, however, they always yield a |0> or a |1> based on the quantum state they were in.

One challenge of quantum computing is isolating such microscopic particles, loading them with the desired information, letting them interact and then preserving the result of their quantum interaction. This requires relatively good isolation from the outside world and a large suppression of the noise generated by the particle itself. Therefore, quantum structures and computers operate at very low temperatures (e.g., cryogenic), close to the absolute zero kelvin (K), in order to reduce the thermal energy/movement of the particles to well below the energy/movement coming from their desired interaction. Current physical quantum computers, however, are very noisy and quantum error correction is commonly applied to compensate for the noise.

Most existing quantum computers use superconducting structures to realize quantum interactions. Their main drawbacks, however, are the fact that superconducting structures are very large and costly and have difficulty in scaling to quantum processor sizes of thousands or millions of quantum-bits (qubits). Furthermore, they need to operate at few tens of millikelvin (mK) temperatures, that are difficult to achieve and where it is difficult to dissipate significant power to operate the quantum machine.

In traditional semiconductor transistor structures the gate capacitance has a significant component arising from the gate-to-metal, gate-to-contact, and in some processes gate-to-raised-diffusion. Such additional parasitic capacitances significantly degrade the performance of a semiconductor quantum structure.

Thus, using conventional FET transistor structures and processes to build semiconductor quantum structures results in significant degraded performance. A modified semiconductor process is thus needed in order to build optimized semiconductor quantum structures.

SUMMARY OF THE INVENTION

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

The present invention is a modified semiconductor fabrication technique that can be used to realize reliable semiconductor quantum structures. Such quantum structures require a minimization of the capacitance between the control gate and the quantum well. The modified semiconductor process eliminates the metal, contact, and optionally the raised diffusion from the quantum wells, resulting in much lower gate capacitance and thus larger Coulomb blockade voltages. This allows easier implementation of the electronic control circuits in that they can have larger intrinsic noise and relaxed analog resolution.

Several example modified semiconductor processes are disclosed including implementations of semiconductor quantum structures with tunneling through an oxide layer as well as semiconductor quantum structures with tunneling through a local well depleted region. These techniques can be used in both planar semiconductor processes and 3D, e.g., FinFET, semiconductor processes. A dedicated process masking step is used for realizing the raised diffusions. In addition, the edge of the raised diffusion layer may be placed either in the gate region or the active layer region.

This, additional, and/or other aspects and/or advantages of the embodiments of the present invention are set forth in the detailed description which follows; possibly inferable from the detailed description; and/or learnable by practice of the embodiments of the present invention.

There is thus provided in accordance with the invention, a quantum structure, comprising a substrate, a substantially undoped silicon layer constructed over said substrate, a control gate constructed over said undoped silicon layer whereby a first quantum dot and a second quantum dot are formed on either side thereof, and wherein both said first quantum dot and said second quantum dot are electrically floating.

There is also provided in accordance with the invention, a quantum structure, comprising a substrate, a substantially undoped silicon layer constructed over said substrate, a plurality of control gates constructed over said undoped silicon layer, each control gate forming corresponding quantum dots on either side thereof and functioning as a plurality of imposers, a first interface device electrically connected to a first end of said plurality of imposers, a second interface device electrically connected to a second end of said plurality of imposers, and wherein said first interface device and said second interface device are electrically biased.

There is further provided in accordance with the invention, a method of manufacturing a quantum device, comprising providing a substrate, forming a silicon layer over said substrate and configured to include a first interface device, a plurality of imposer devices, and a second interface device, applying a stop mask configured to prevent doping of said plurality of imposer devices, doping of areas outside said stop mask, and wherein said first interface device and said second interface device are electrically biased.

BRIEF DESCRIPTION OF THE DRAWINGS

The present invention is explained in further detail in the following exemplary embodiments and with reference to the figures, where identical or similar elements may be partly indicated by the same or similar reference numerals, and the features of various exemplary embodiments being combinable. The invention is herein described, by way of example only, with reference to the accompanying drawings, wherein:

FIG. 8A is a diagram illustrating a first example control gate for the quantum structure of the present invention;

FIG. 8B is a diagram illustrating a second example control gate for the quantum structure of the present invention;

FIG. 8C is a diagram illustrating a third example control gate for the quantum structure of the present invention;

FIG. 9B is a diagram illustrating an example quantum structure with double square shape and optical proximity control;

FIG. 9C is a diagram illustrating an example quantum structure with double square and narrow neck shape;

FIG. 9D is a diagram illustrating a first example quantum structure with double overlapping square shape;

FIG. 9E is a diagram illustrating a second example quantum structure with double overlapping square shape;

FIG. 9F is a diagram illustrating an example quantum structure with 'L' shape;

FIG. 9G is a diagram illustrating an example quantum structure with double rounded barely touching square shape;

FIG. 9H is a diagram illustrating an example quantum structure with double rectangular shape;

FIG. 9I is a diagram illustrating an example quantum structure with double square connected via double smaller square shape;

FIG. 9Q is a diagram illustrating an example conventional FET with drain and source doped diffusion and contacts;

FIG. 9R is a diagram illustrating an example half conventional FET and half quantum structure;

FIG. 9S is a diagram illustrating an example quantum structure with rectangular shaped wells;

FIG. 9T is a diagram illustrating an example quantum structure with dissimilar rectangular shaped wells;

FIG. 9U is a diagram illustrating an example quantum structure with offset rectangular shaped wells;

FIG. 9V is a diagram illustrating a first example quantum structure with spaced apart rectangular shaped wells;

FIG. 9AA is a diagram illustrating a fourth example quantum structure with spaced apart rectangular shaped wells offset from each other;

FIG. 9AB is a diagram illustrating a first example quantum structure with corner abutting rectangular shaped wells;

FIG. 9AC is a diagram illustrating a second example quantum structure with corner abutting rectangular shaped wells;

FIG. 9AD is a diagram illustrating a third example quantum structure with corner abutting rectangular shaped wells;

FIG. 9AE is a diagram illustrating a fourth example quantum structure with corner abutting rectangular shaped wells;

FIG. 9AF is a diagram illustrating a fifth example quantum structure with corner abutting rectangular shaped wells;

FIG. 9AG is a diagram illustrating a sixth example quantum structure with corner abutting rectangular shaped wells;

FIG. 22A is a diagram illustrating an example floating well detection circuit;

FIG. 22B is a diagram illustrating the layout for the example floating well detection circuit;

FIG. 22C is a diagram illustrating the cross section for the floating well detection circuit;

FIG. 23A is a diagram illustrating an example floating gate detection circuit;

FIG. 23B is a diagram illustrating the layout for the example floating gate detection circuit;

FIG. 23C is a diagram illustrating the cross section for the floating gate detection circuit;

FIG. 37B is a diagram illustrating an example planar semiconductor quantum structure using tunneling through local depleted well;

FIG. 37C is a diagram illustrating an example 3D process semiconductor quantum structure using tunneling through oxide layer;

FIG. 37D is a diagram illustrating an example 3D process semiconductor quantum structure using tunneling through local depleted well;

FIG. 38A is a diagram illustrating an example CNOT quantum interaction gate using tunneling through oxide layer implemented in planar semiconductor processes;

FIG. 38B is a diagram illustrating an example CNOT quantum interaction gate using tunneling through local depleted well implemented in planar semiconductor processes;

FIG. 38C is a diagram illustrating an example CNOT quantum interaction gate using tunneling through oxide layer implemented in 3D semiconductor processes;

FIG. 38D is a diagram illustrating an example CNOT quantum interaction gate using tunneling through local depleted fin implemented in 3D semiconductor processes;

FIG. 39A is a diagram illustrating a first example controlled NOT double qubit structure and related Rabi oscillation;

FIG. 39B is a diagram illustrating a second example controlled NOT double qubit structure and related Rabi oscillation;

FIG. 39C is a diagram illustrating a third example controlled NOT double qubit structure and related Rabi oscillation;

FIG. 39D is a diagram illustrating a fourth example controlled NOT double qubit structure and related Rabi oscillation;

FIG. 40 is a diagram illustrating a controlled NOT quantum interaction gate for several control and target qubit states;

Figure 41A:
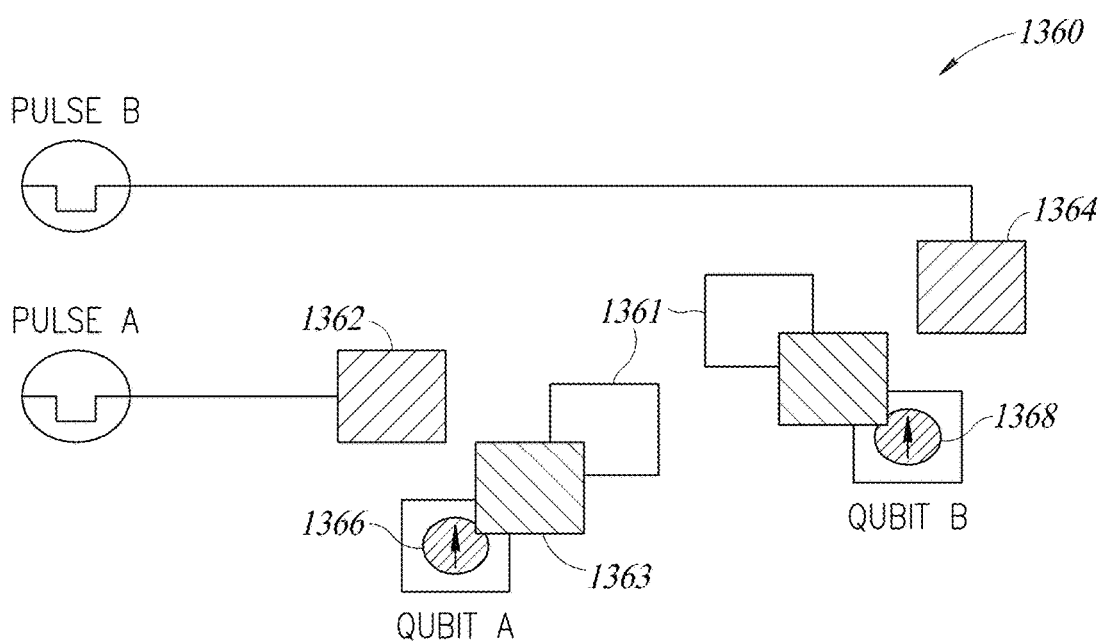
Figure 41B:
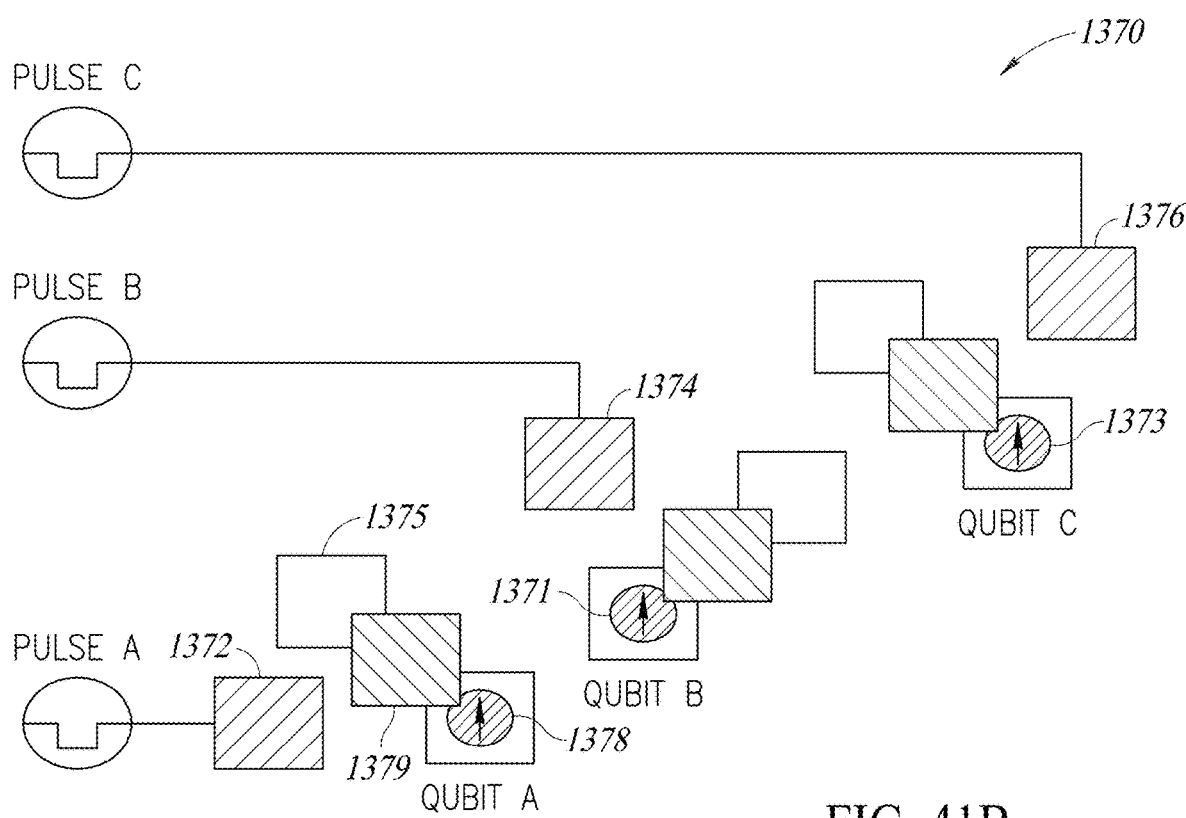
Figure 41C:
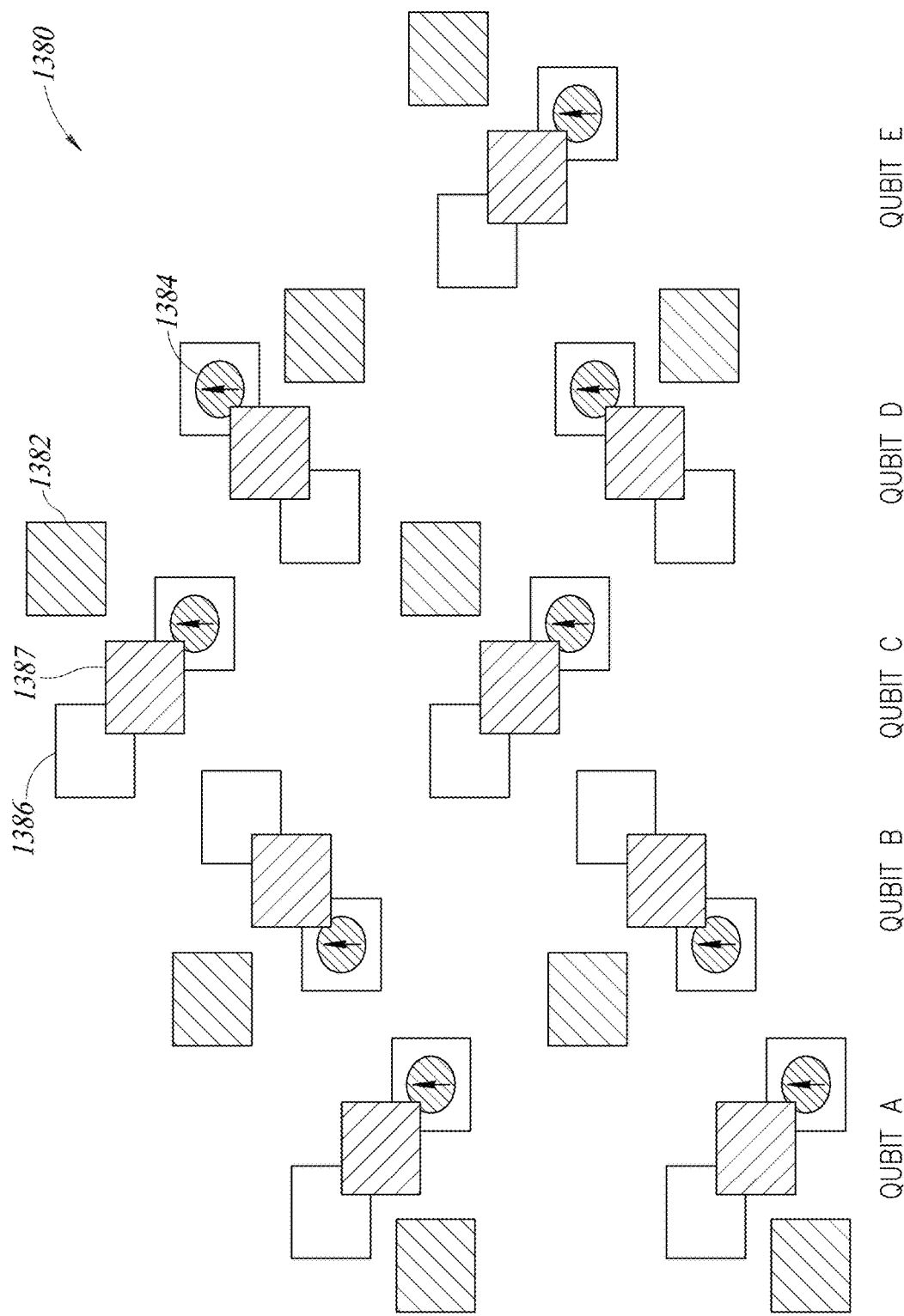
Figure 42A:
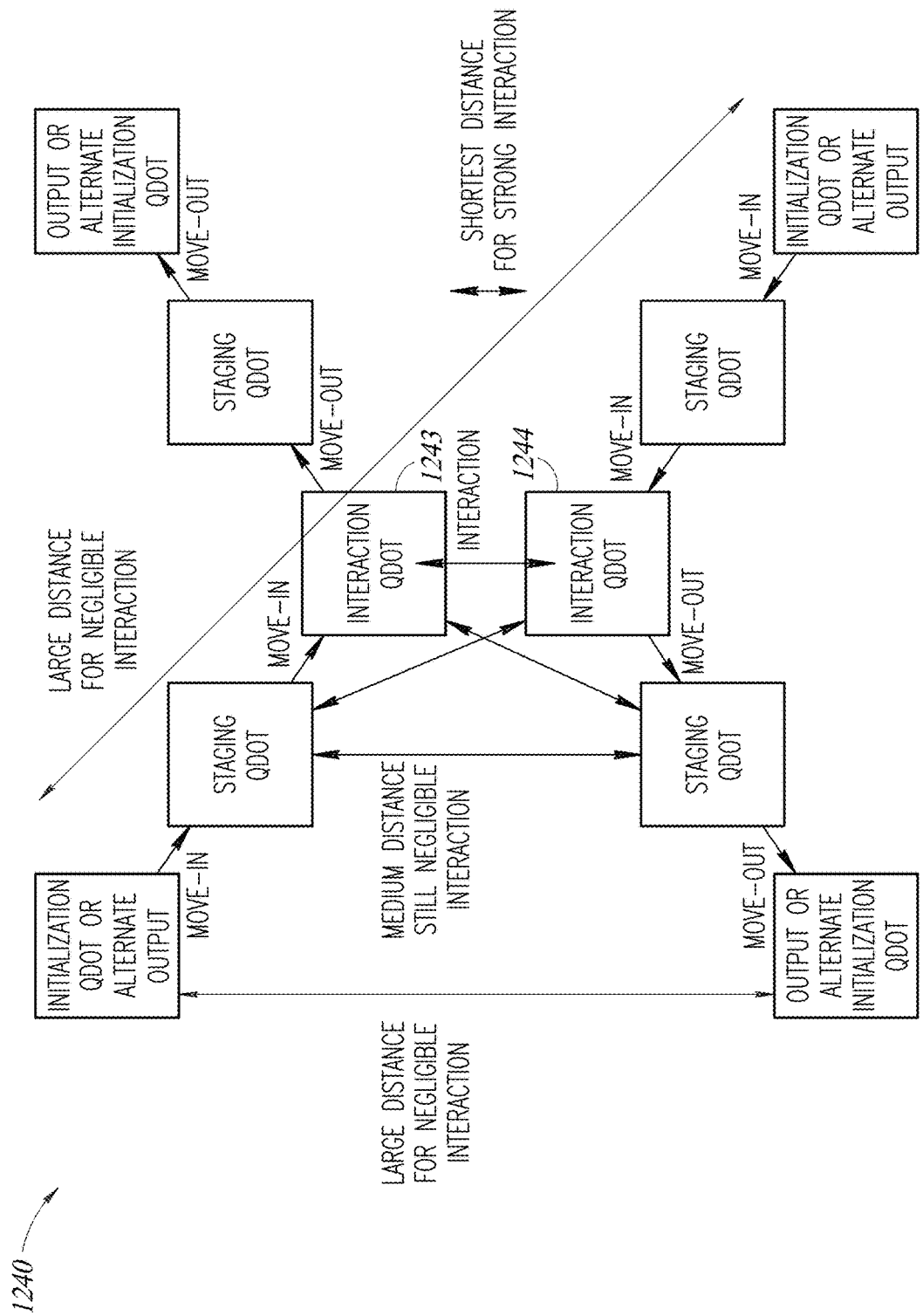
Figure 42B:
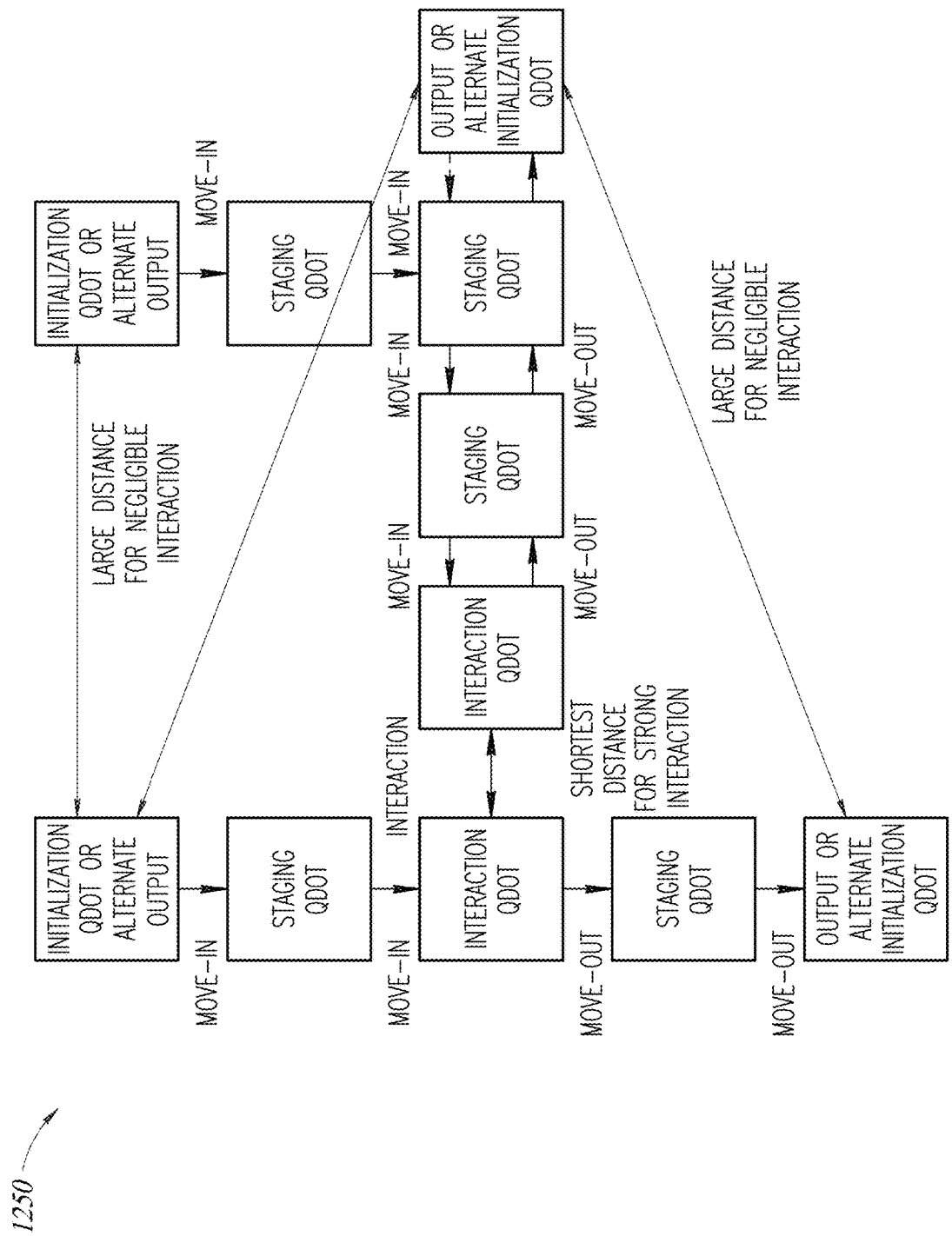
Figure 42C:
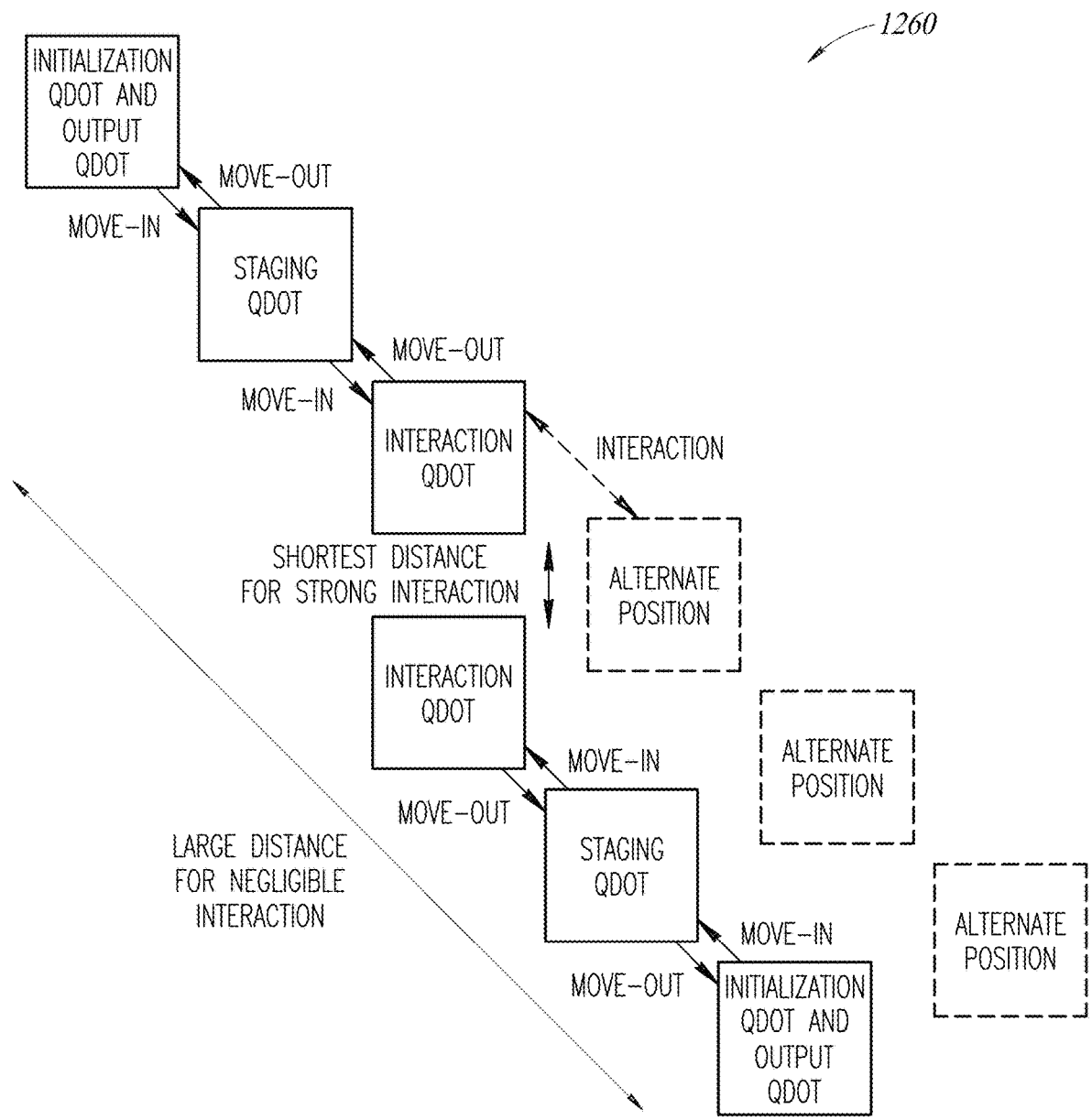
Figure 42D:
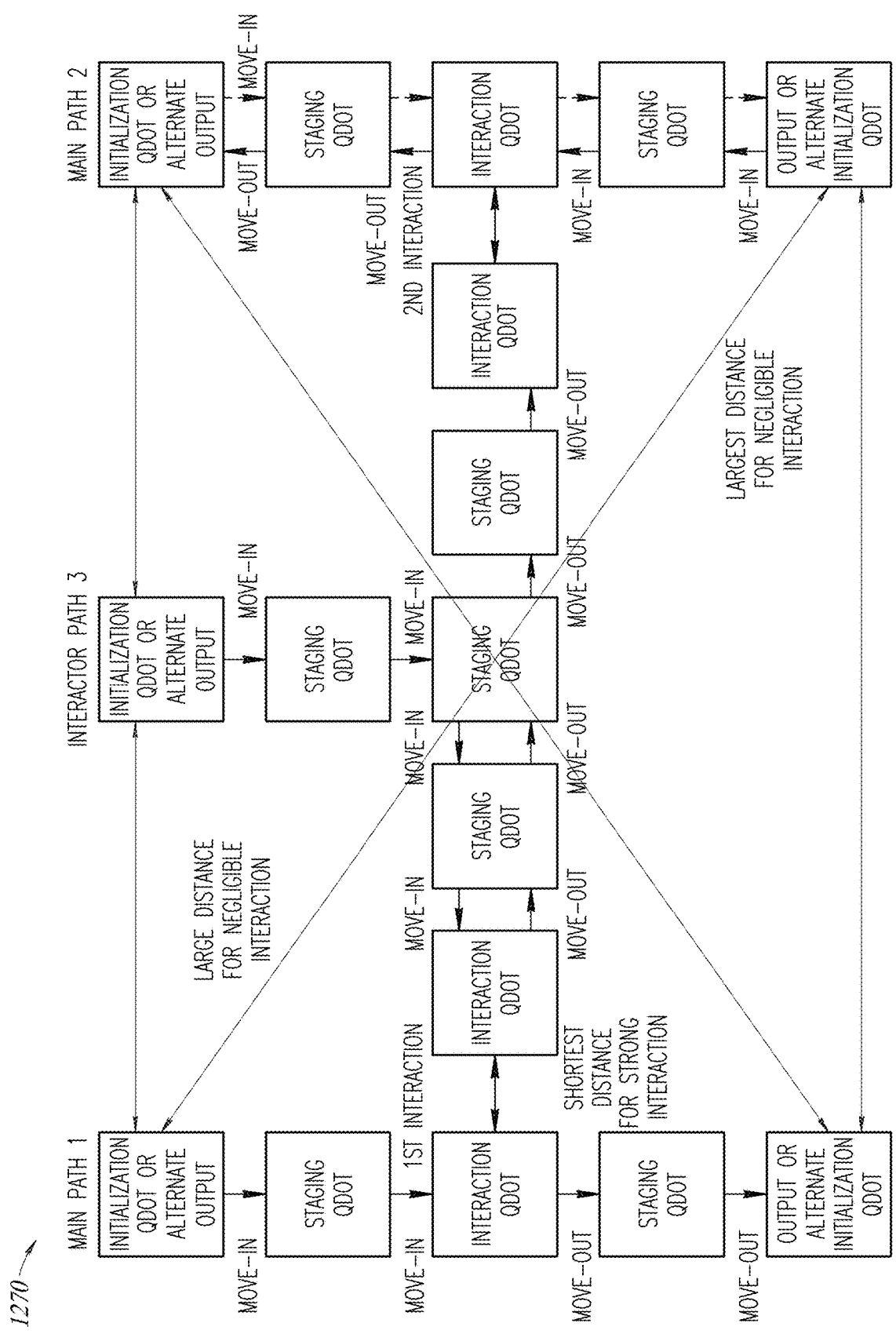
Figure 43A:
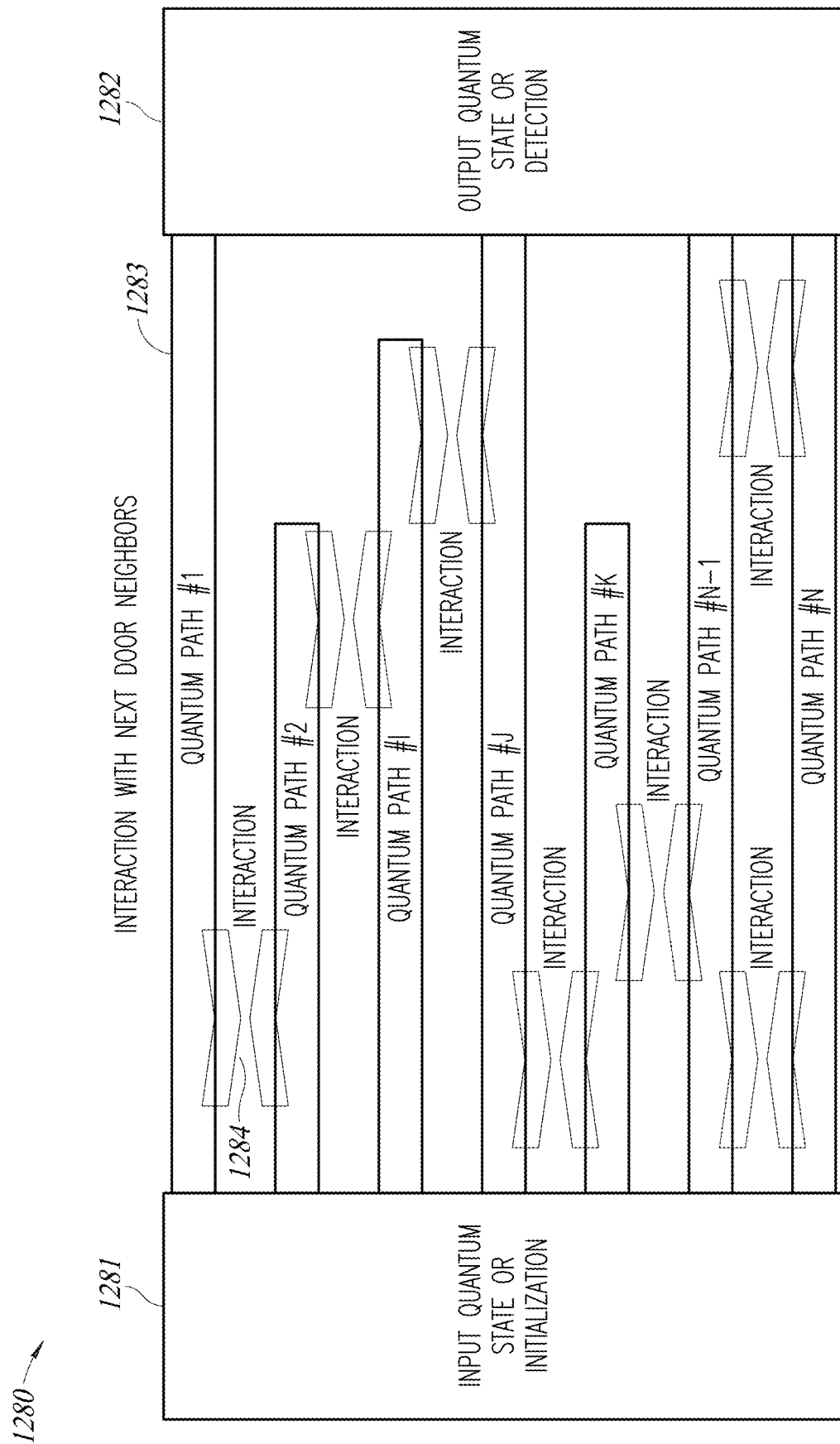
Figure 43B:
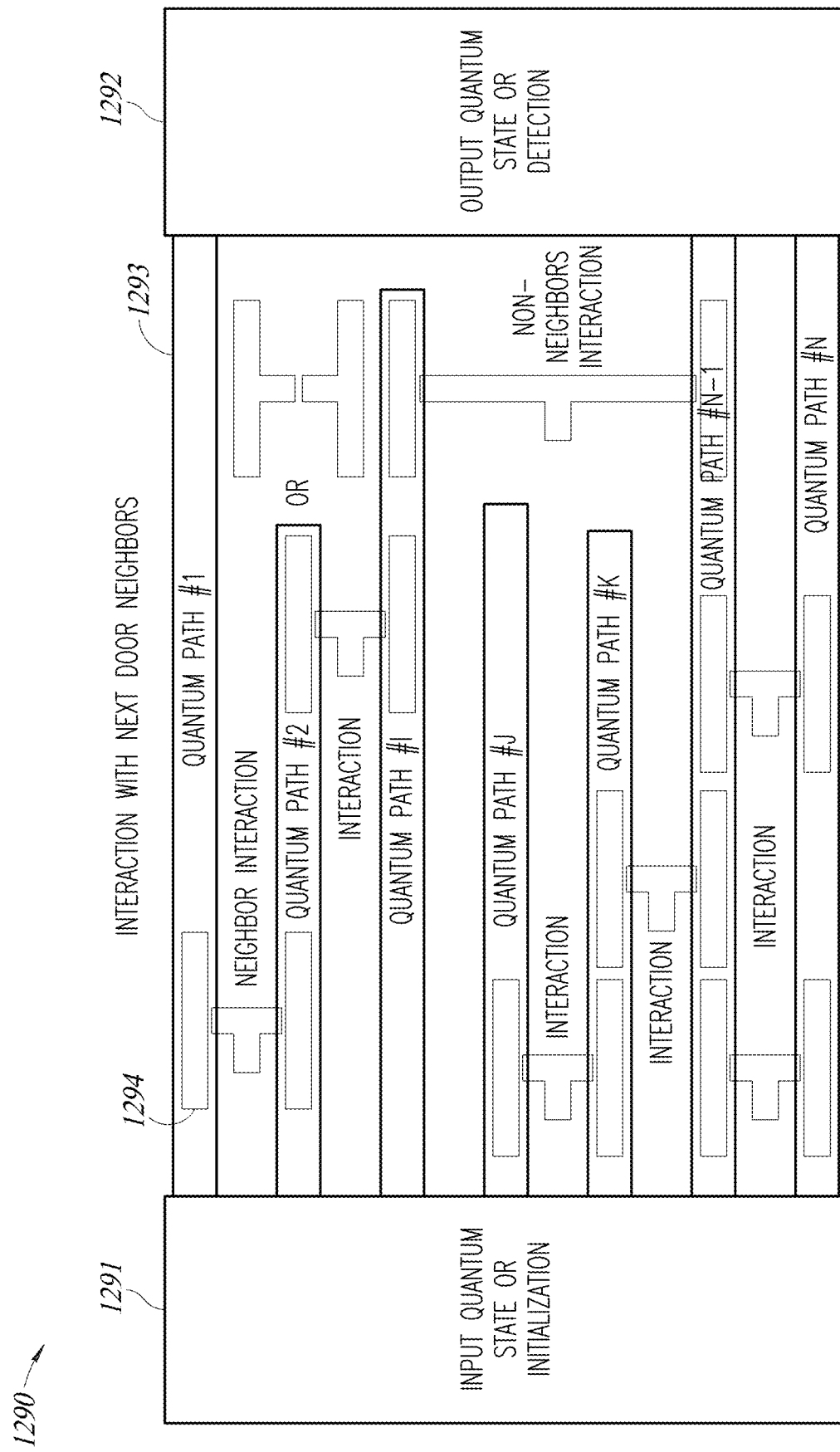
Figure 43C:
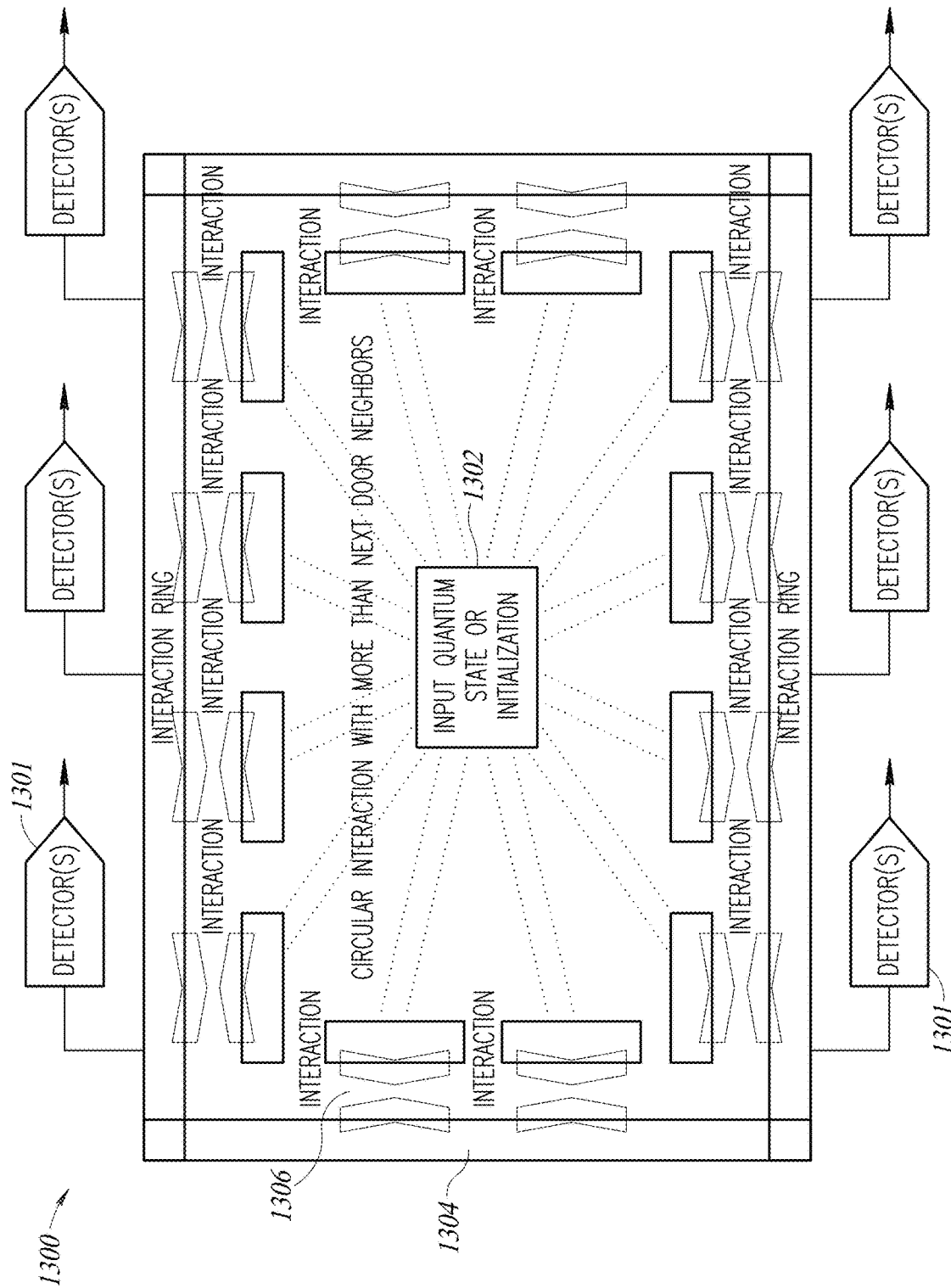
Figure 43D:
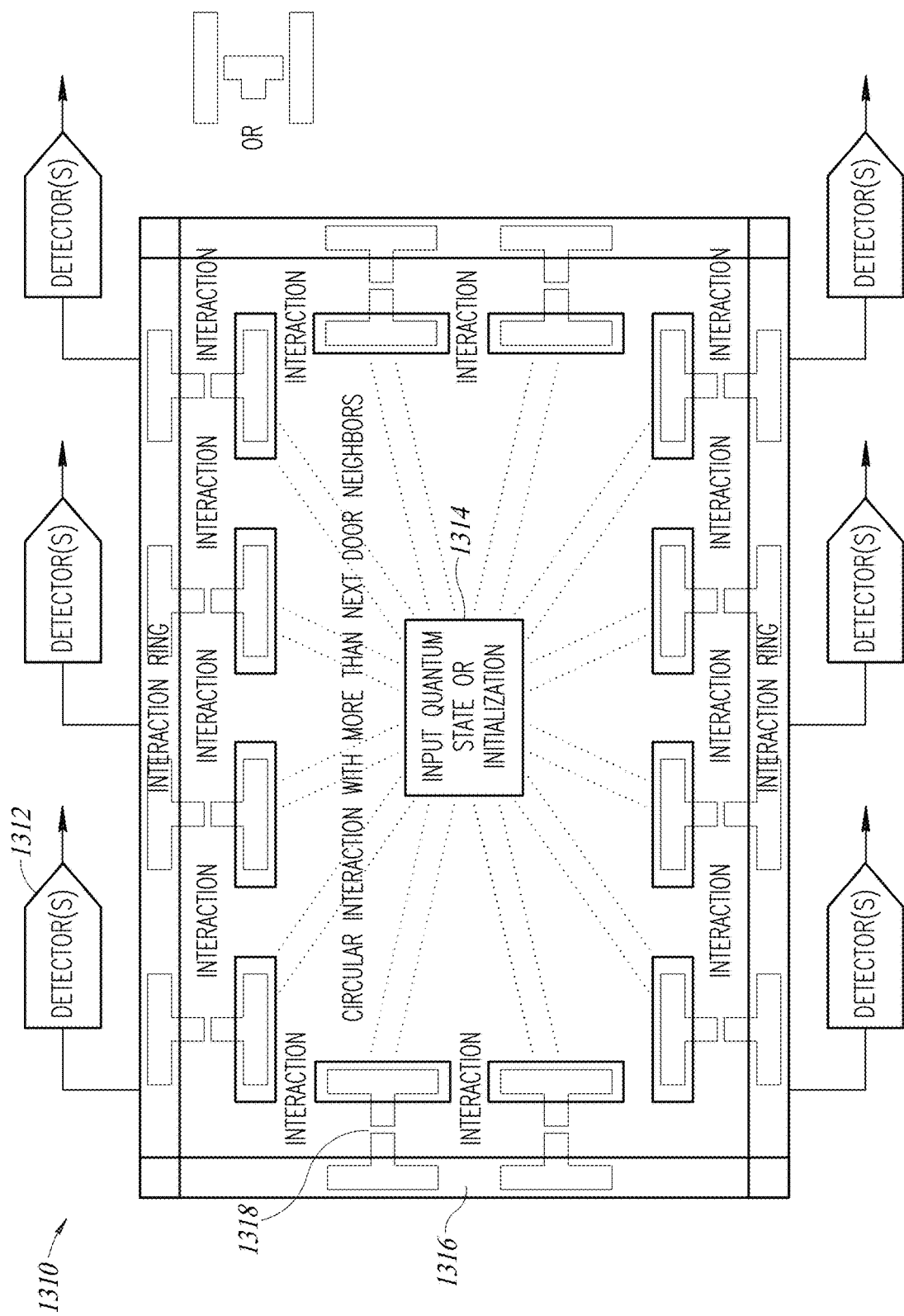
Figure 44A:
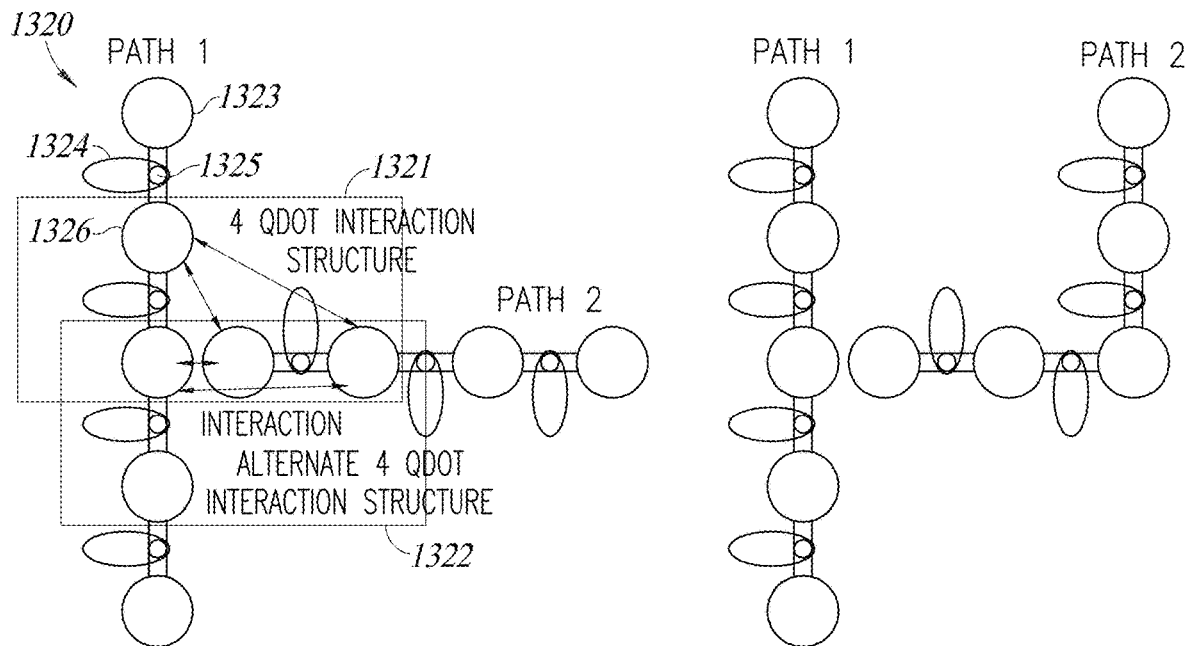
Figure 44B:
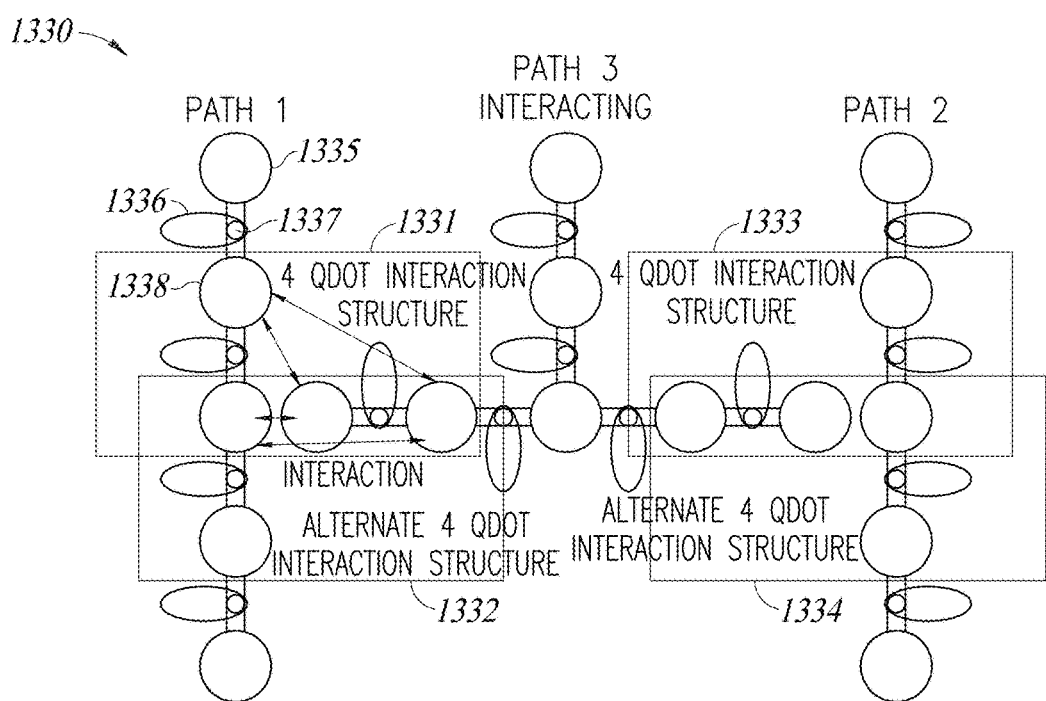
Figure 44C:
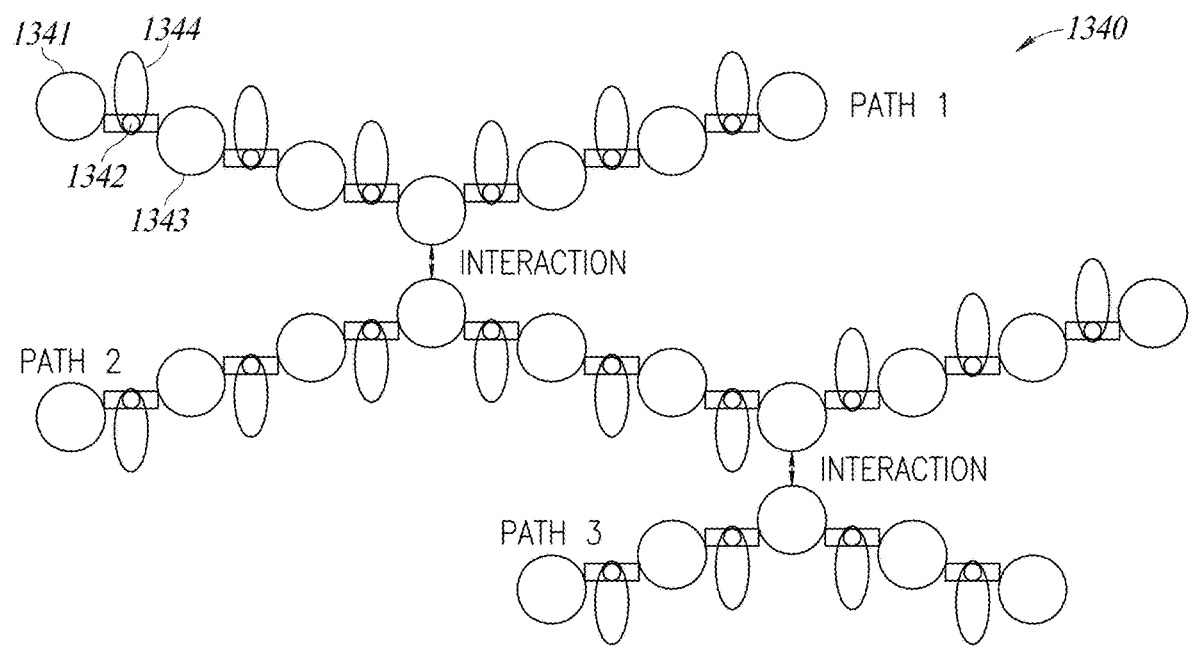
Figure 44D:
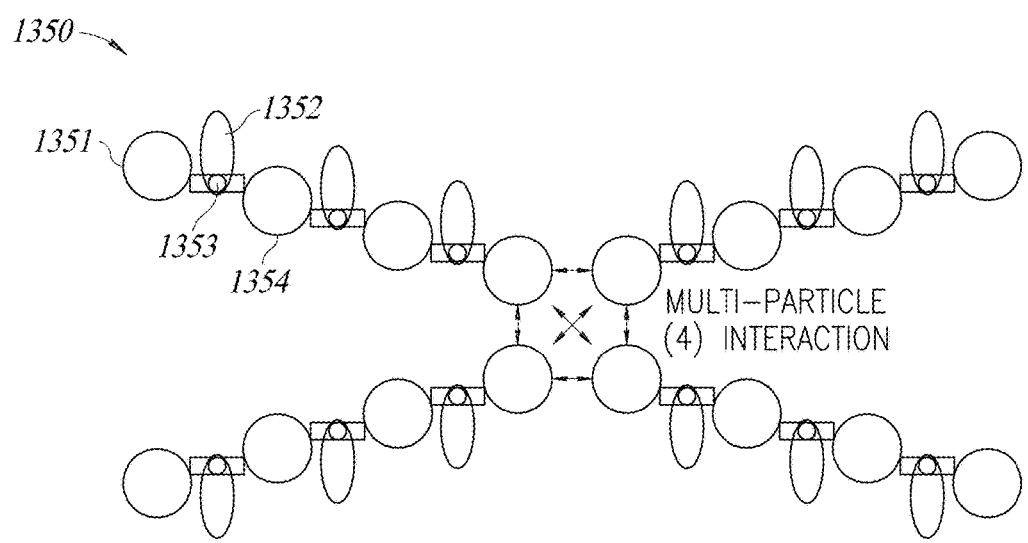
Figure 45A:
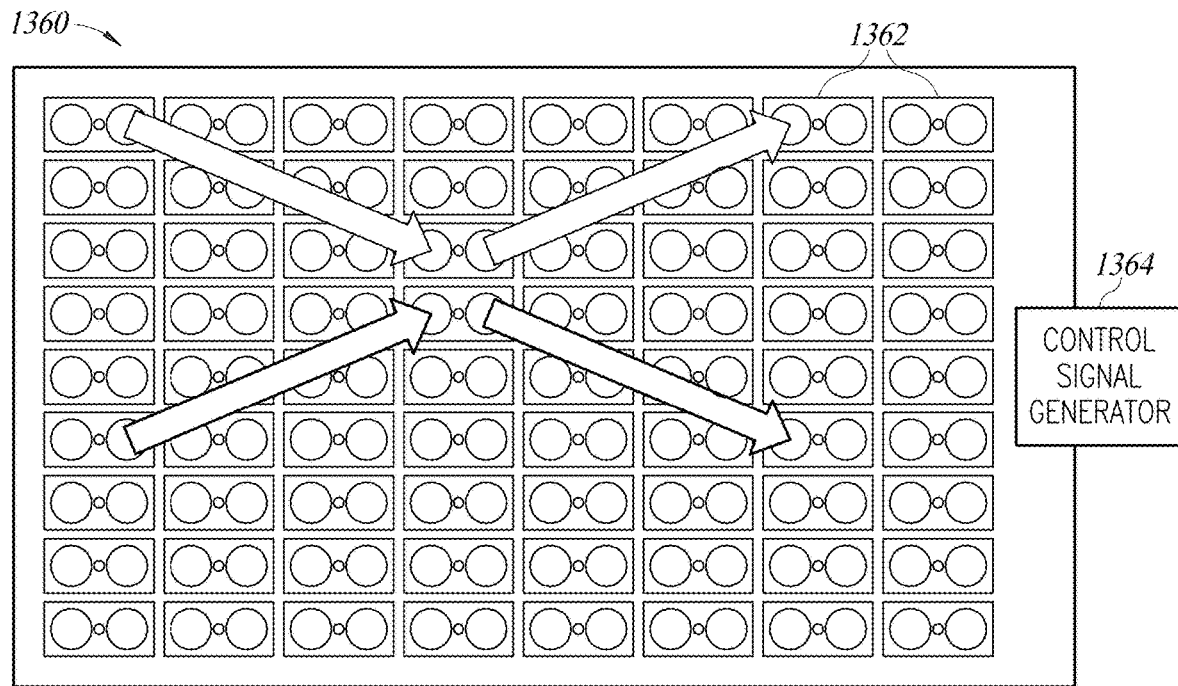
Figure 45B:
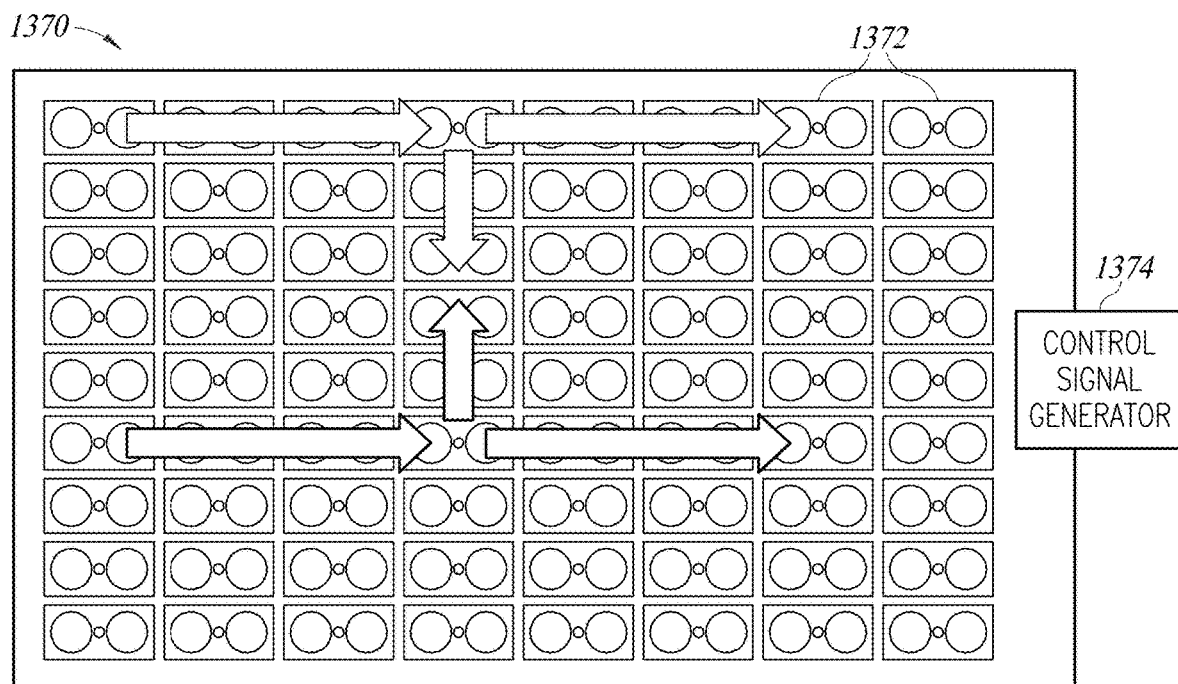
Figure 46:
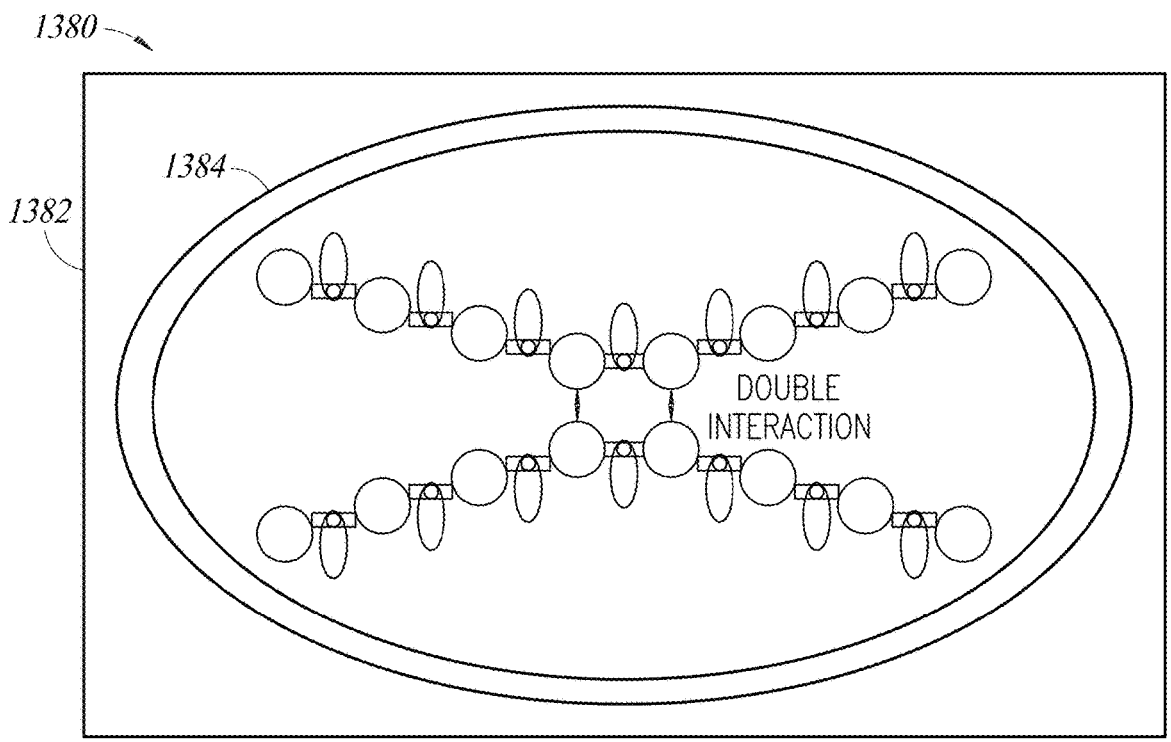
Figure 47:
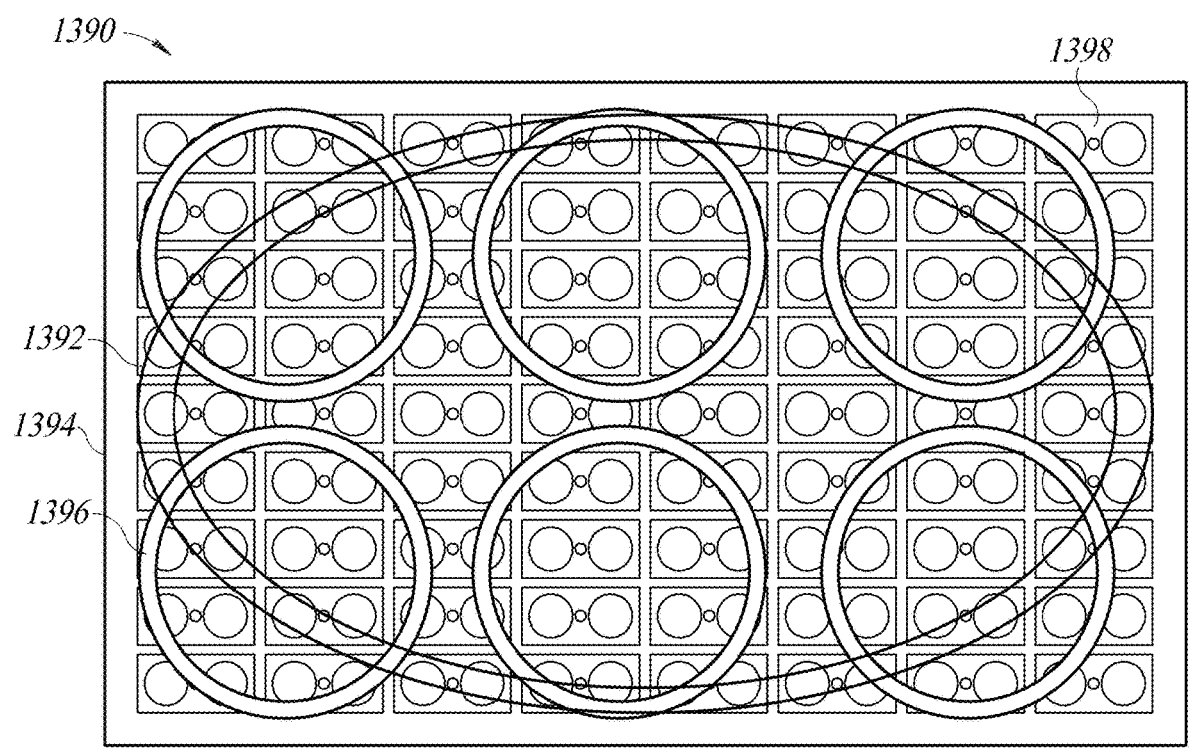
Figure 48A:
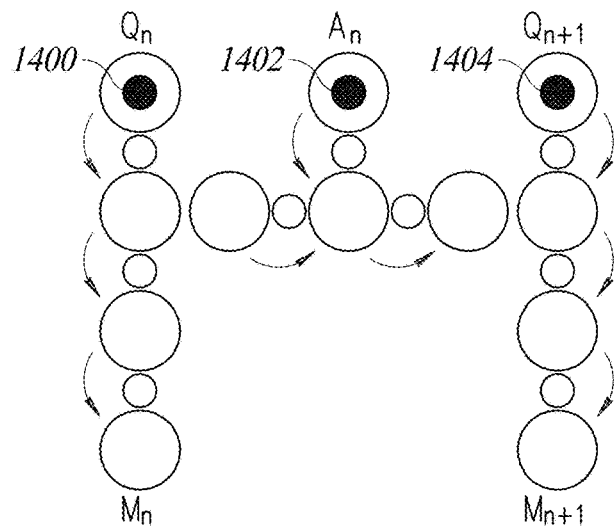
Figure 48B:
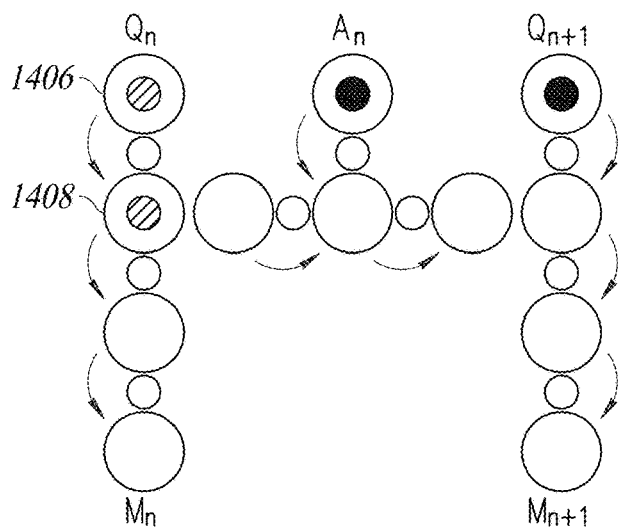
Figure 48C:
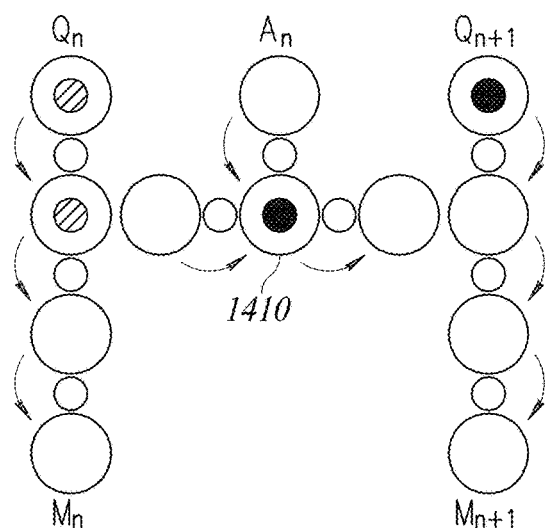
Figure 48D:
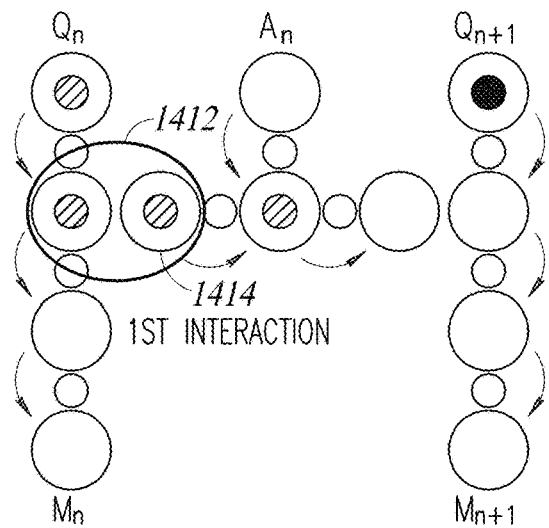
Figure 48E:
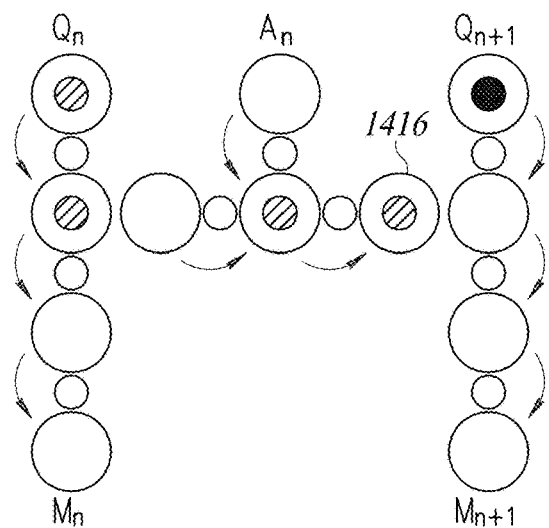
Figure 48F:
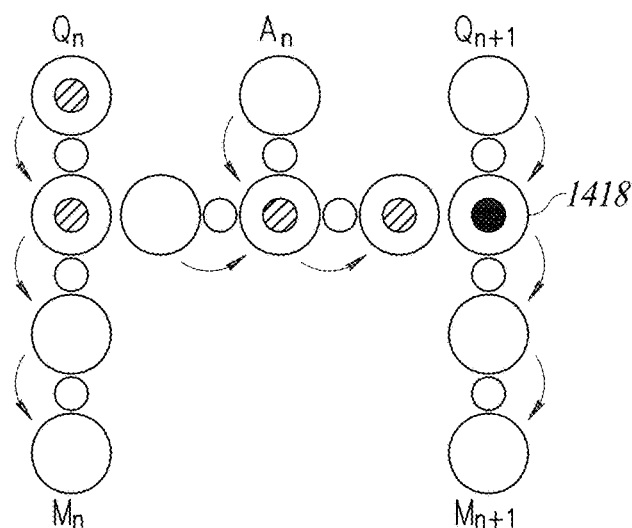
Figure 49C:
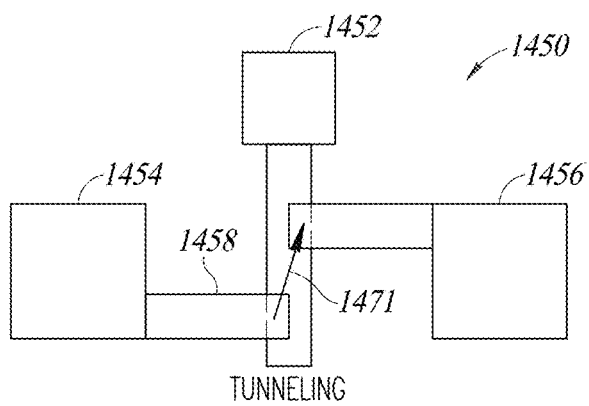
Figure 49D:
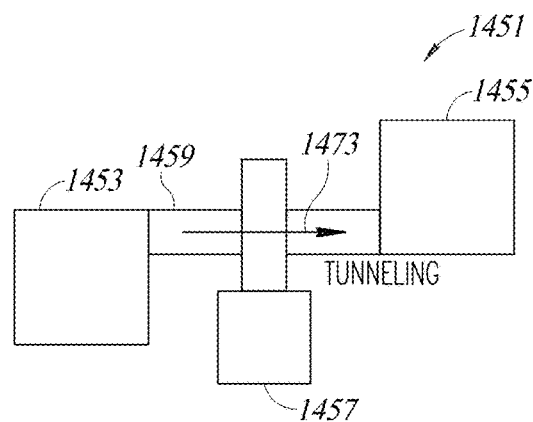
Figure 49E:
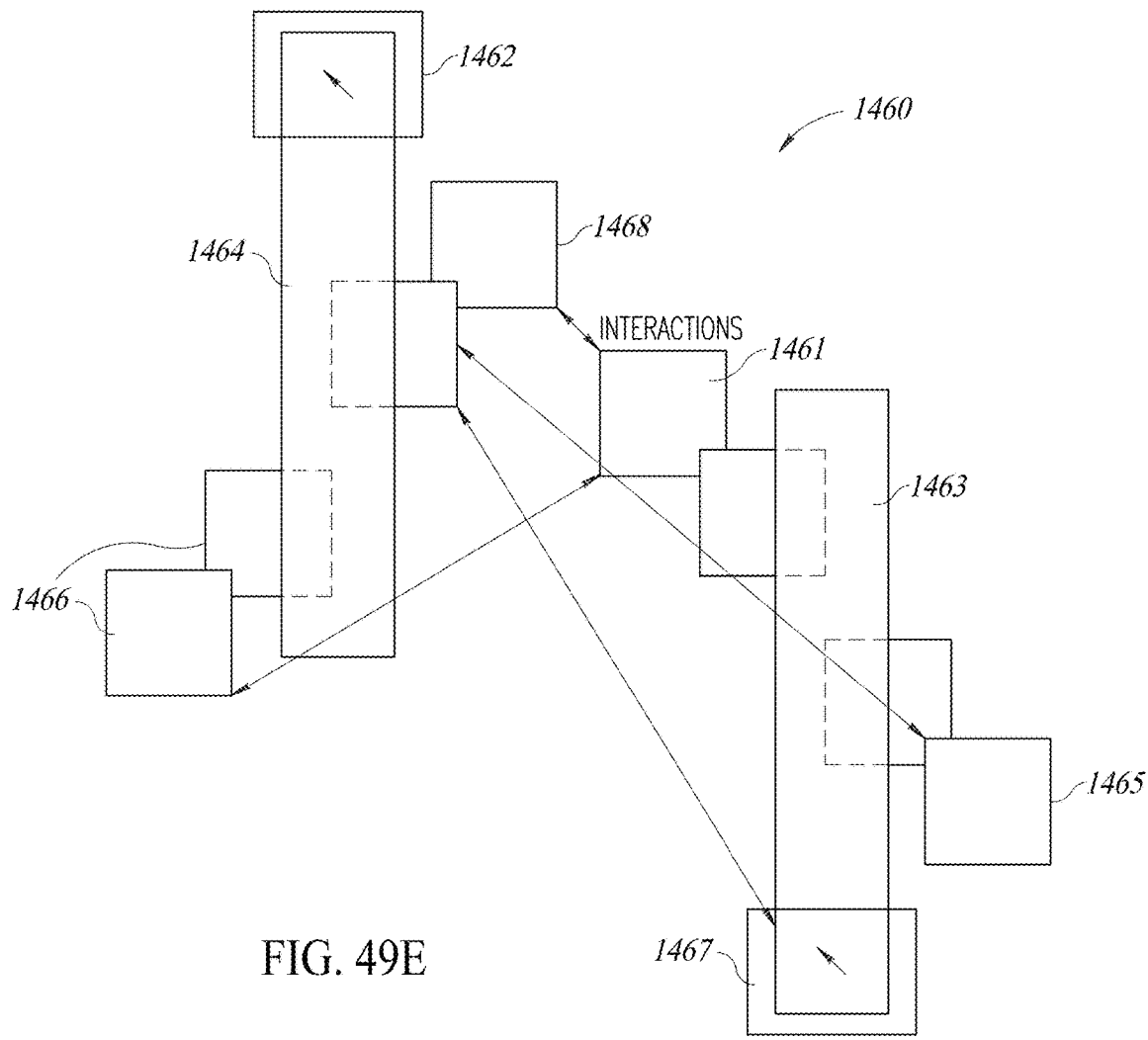
Figure 49F:
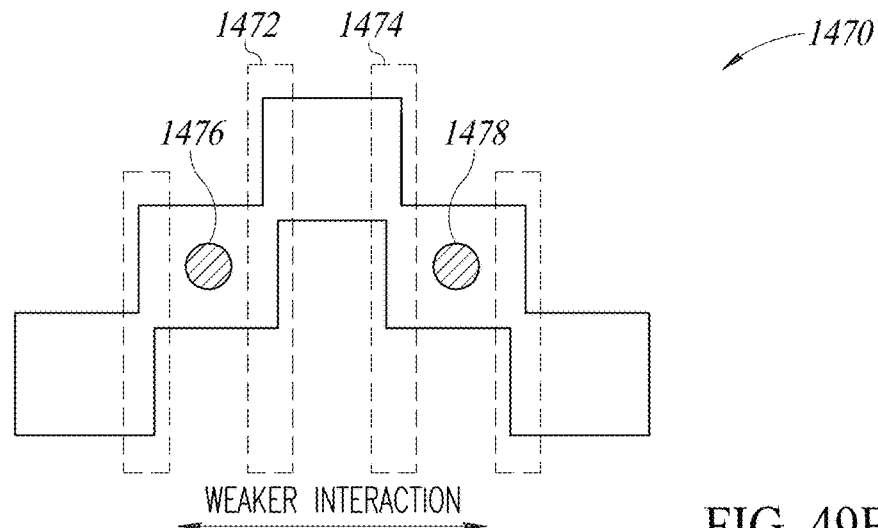
Figure 49G:
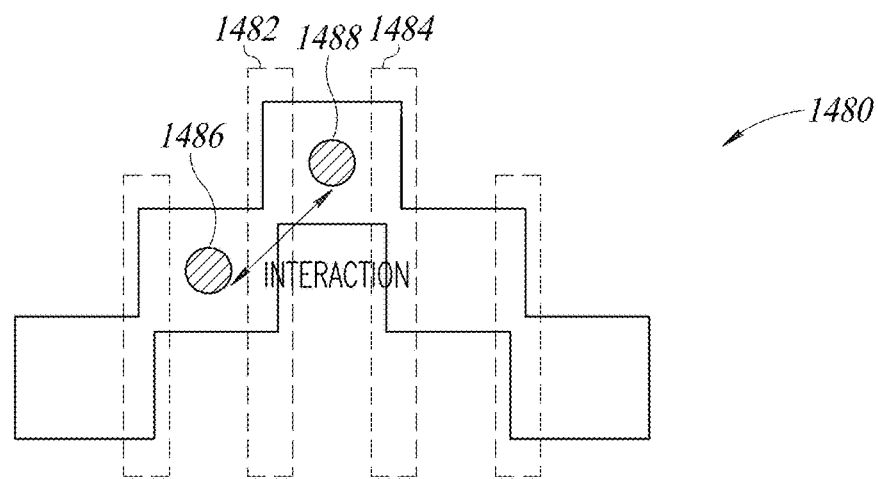
Figure 49H:
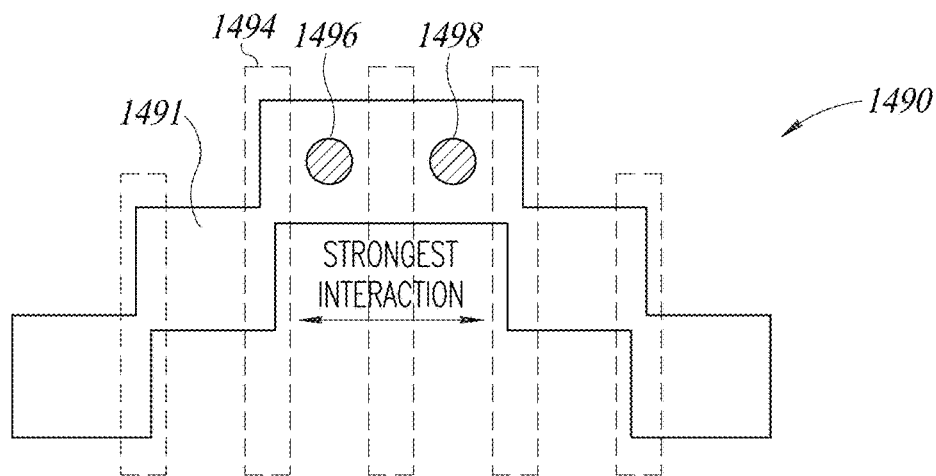
Figure 49L:
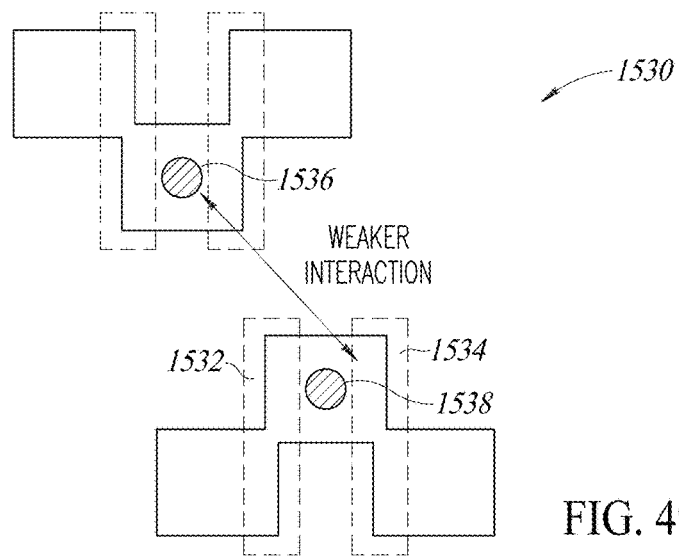
Figure 50A:
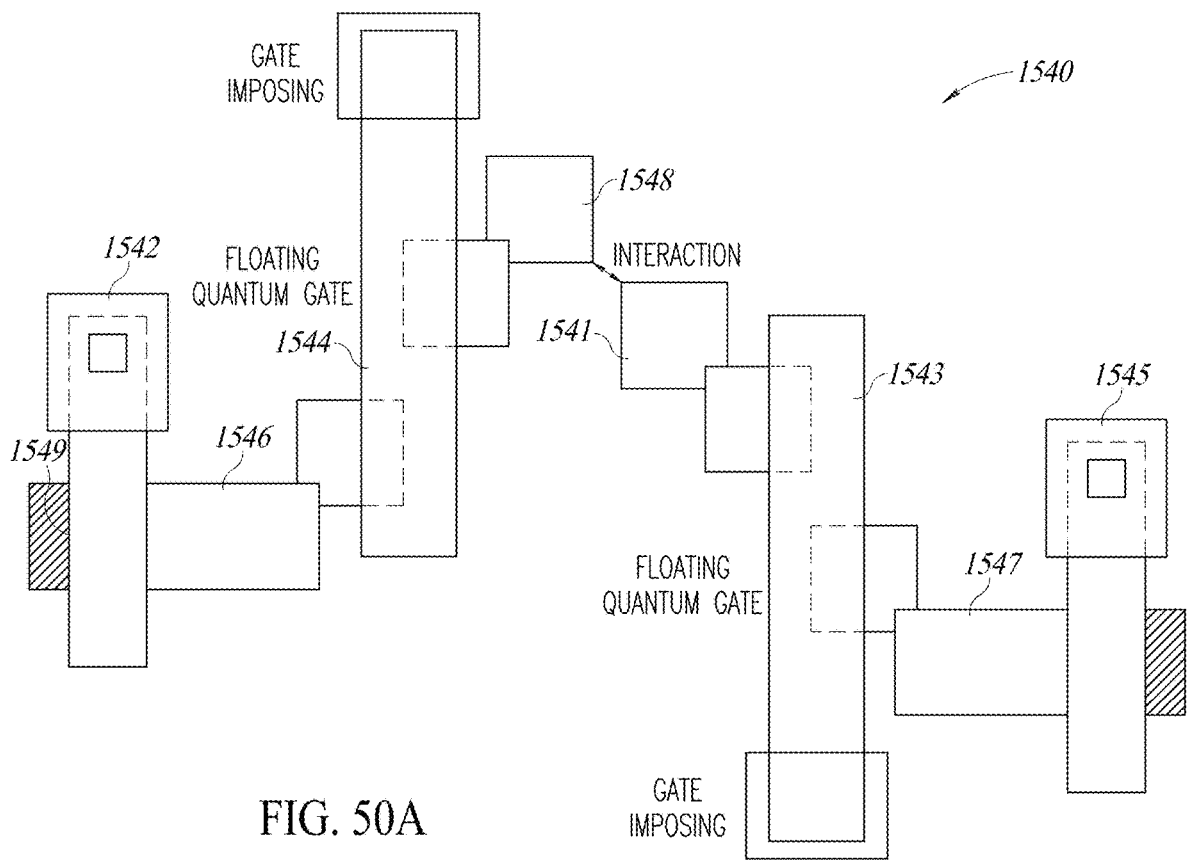
Figure 50B:
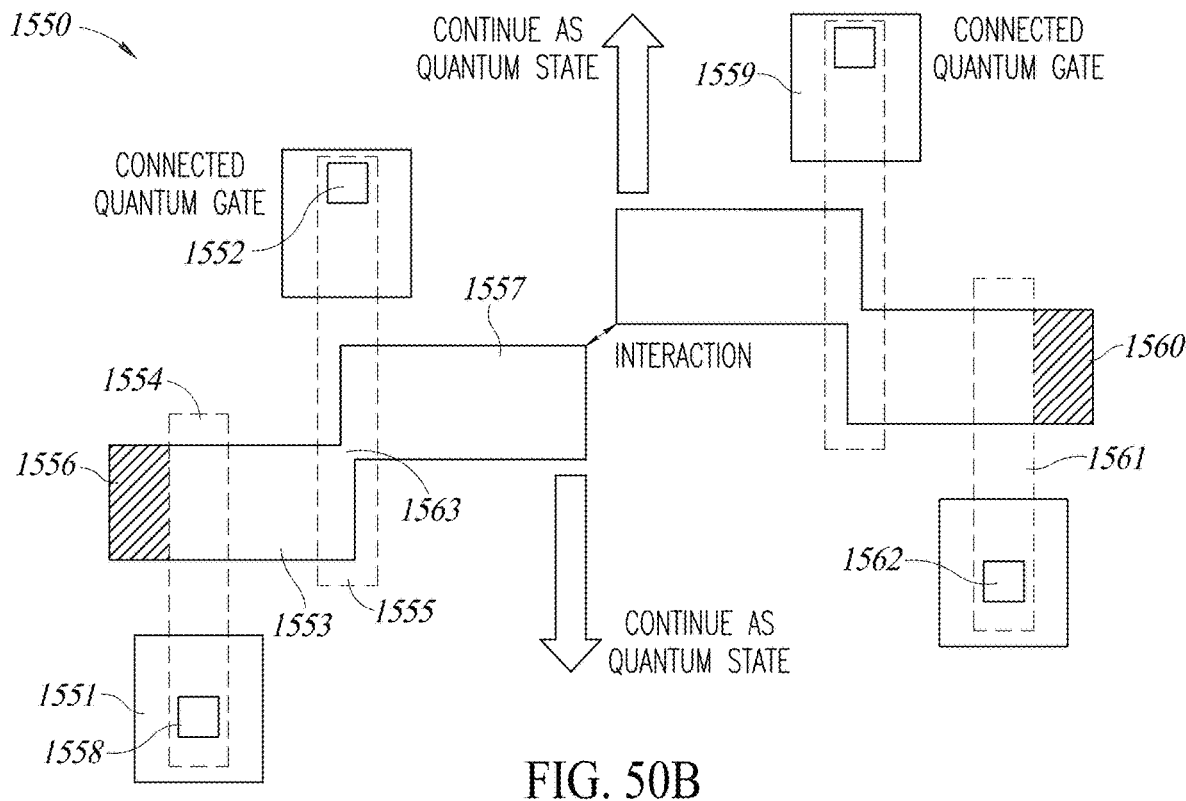
Figure 50C:
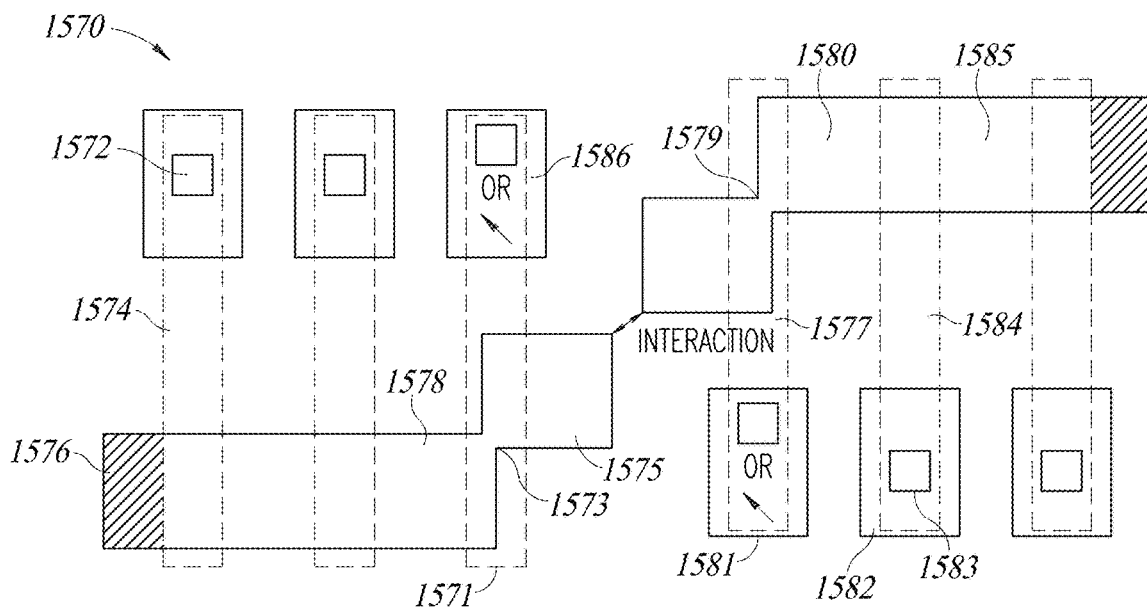
Figure 50D:
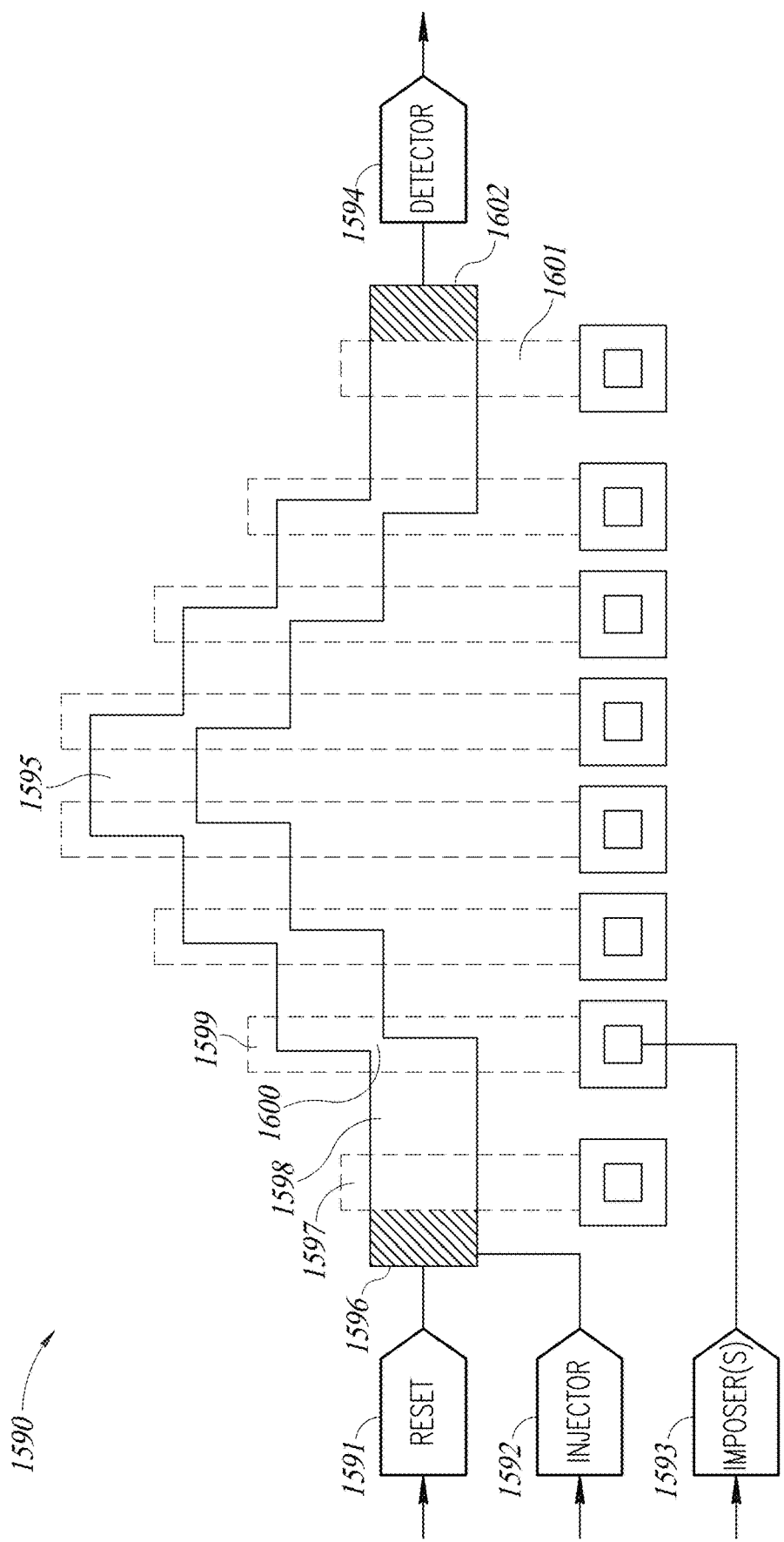
Figure 51A:
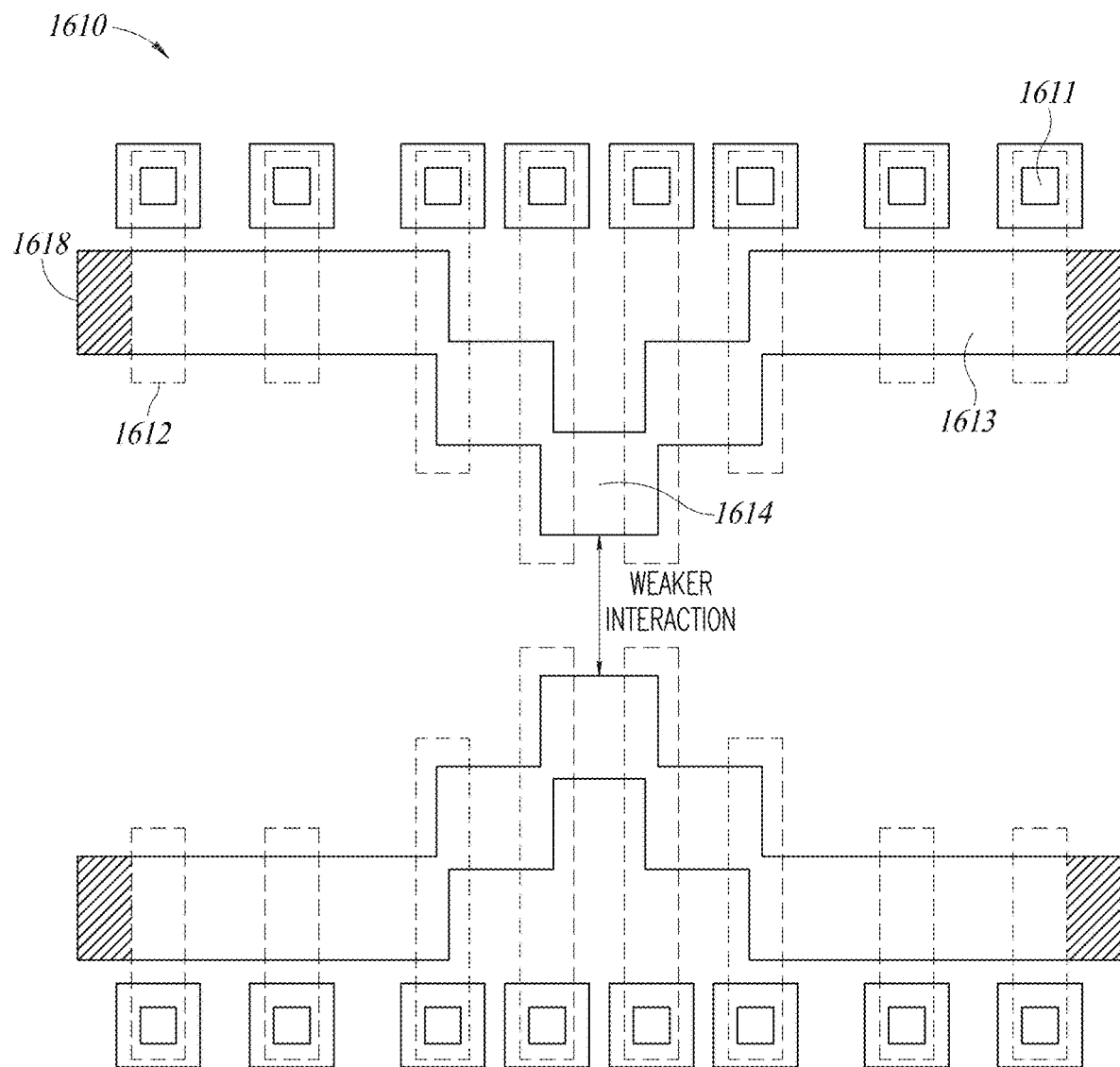
Figure 51B:
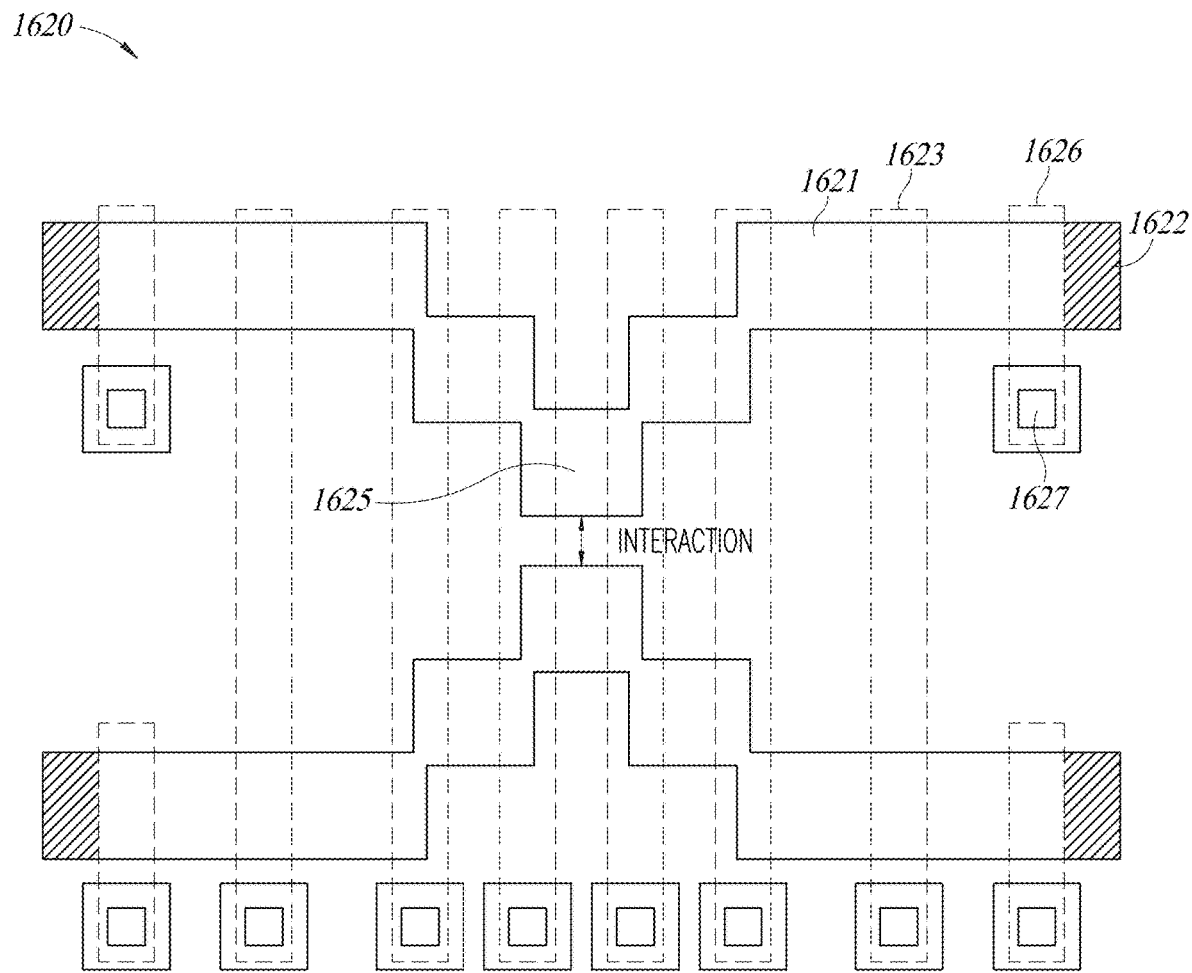
Figure 51C:
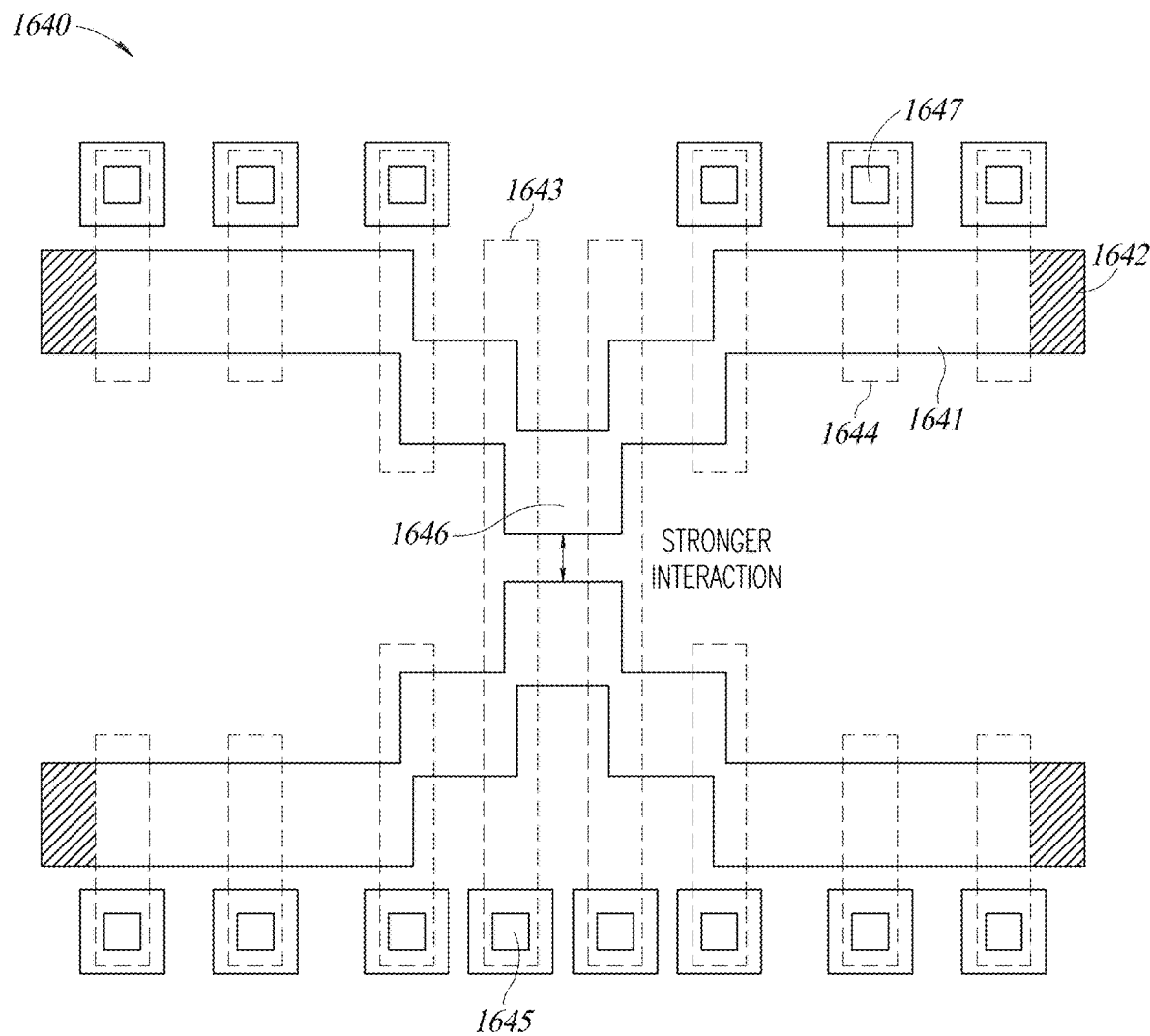
Figure 51D:
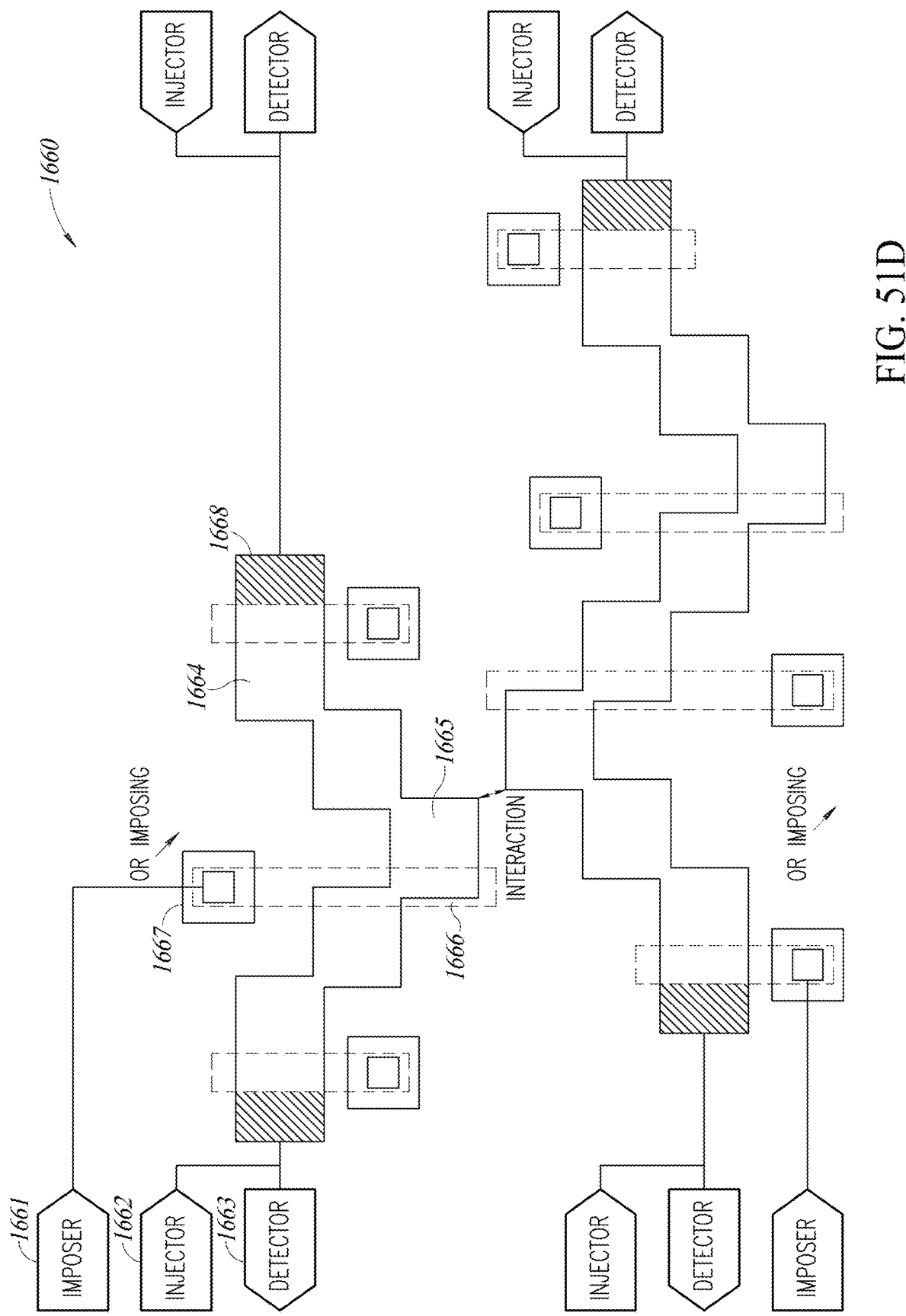
Figure 52A:
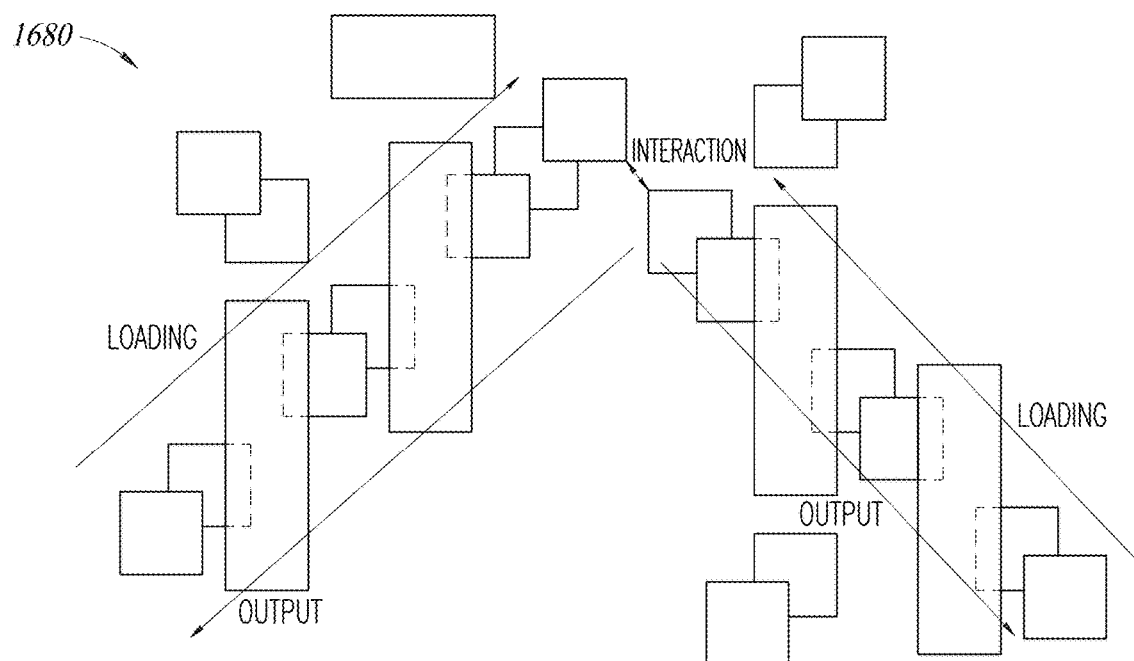
Figure 52B:
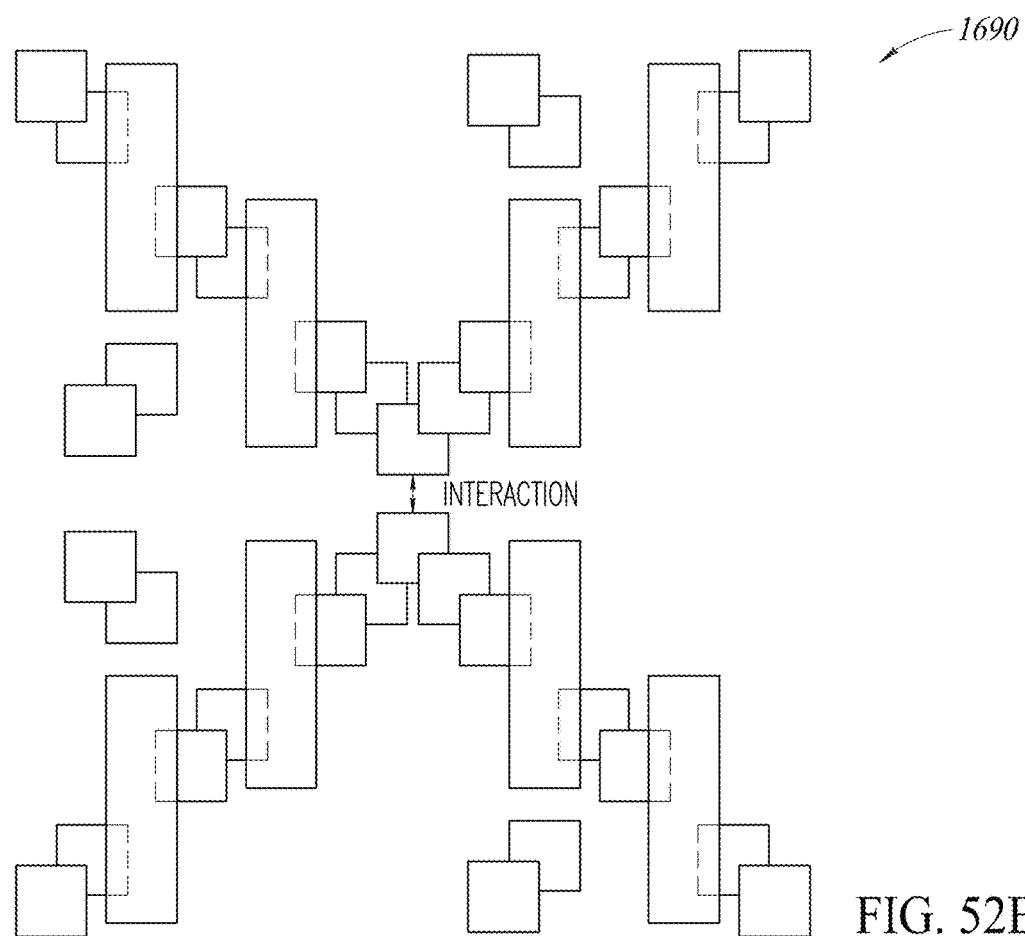
Figure 52C:
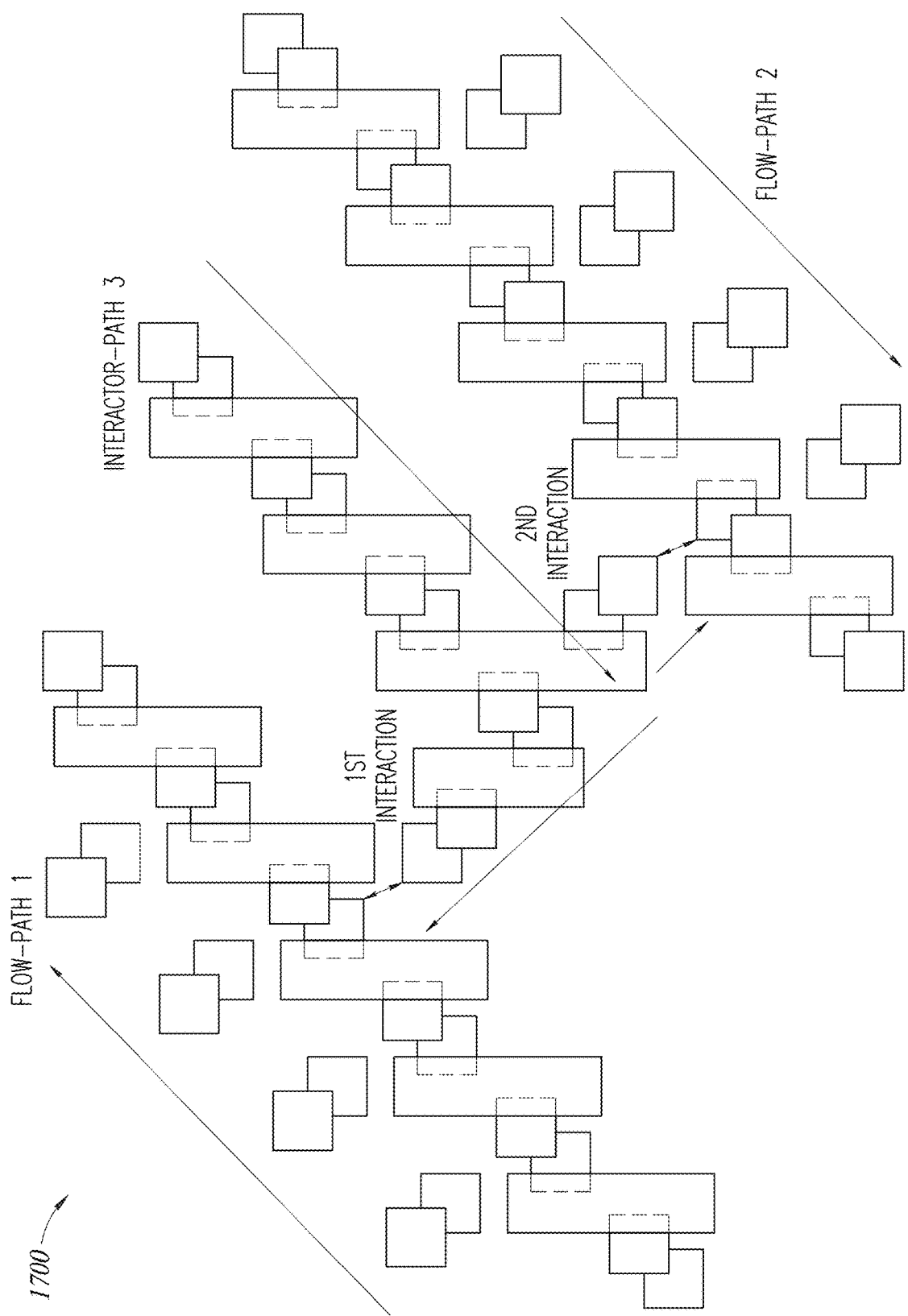
Figure 52D:
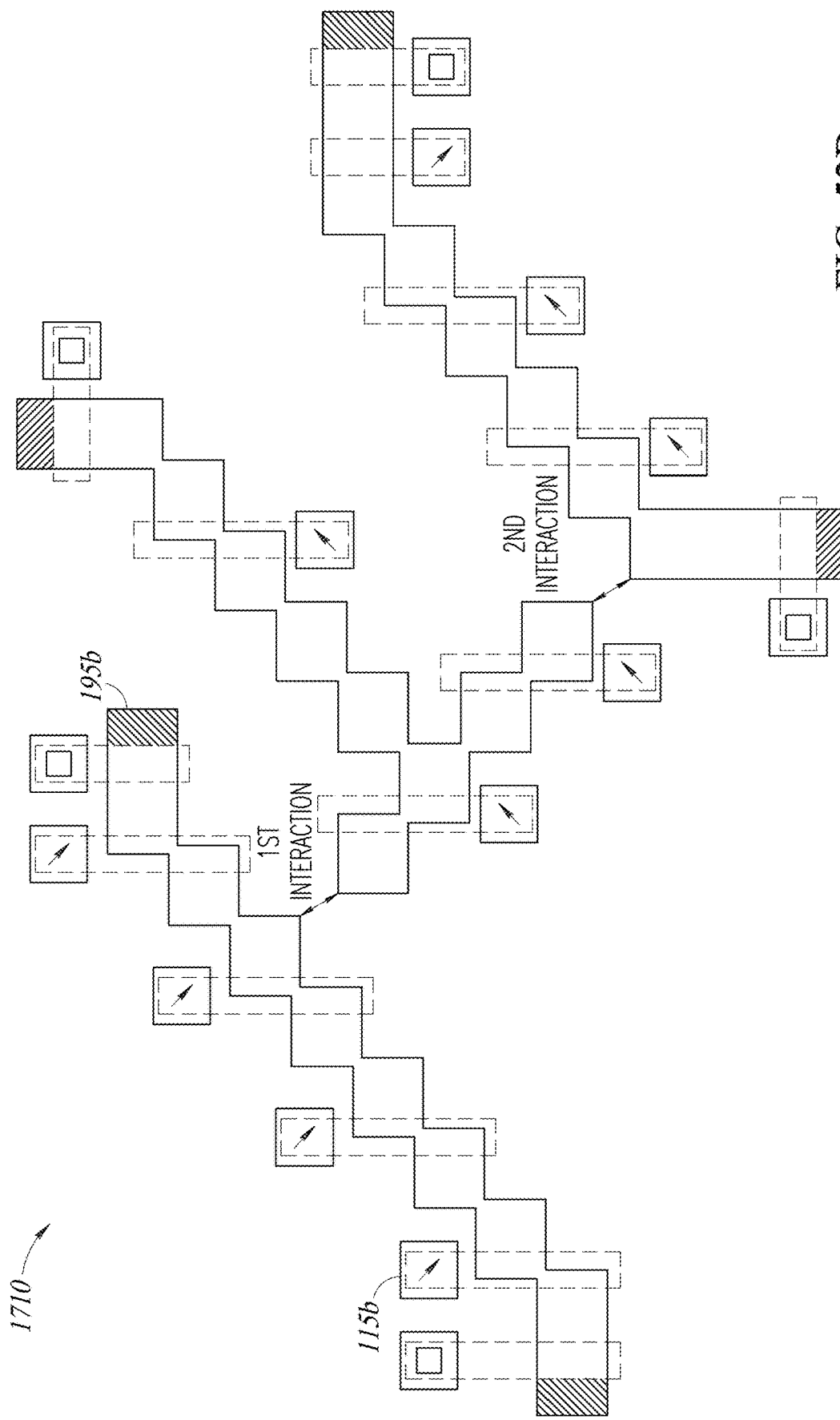
Figure 53A:
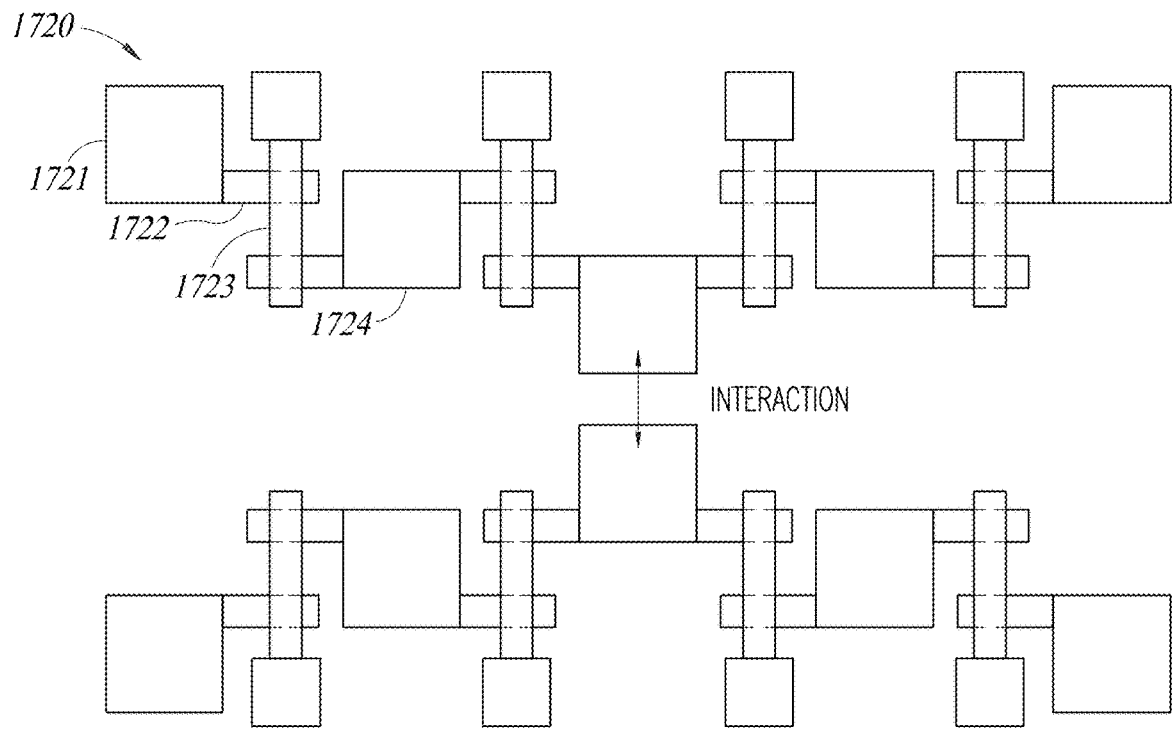
Figure 53B:
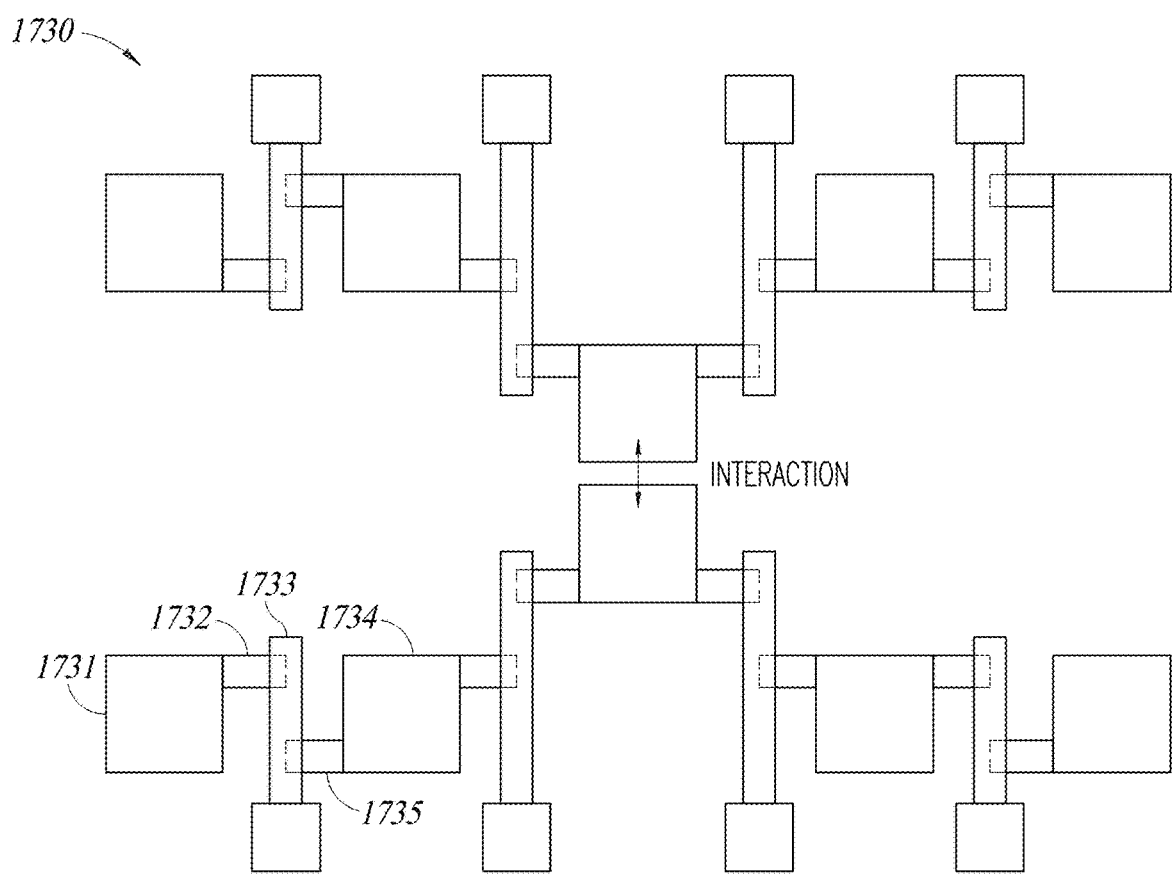
Figure 53C:
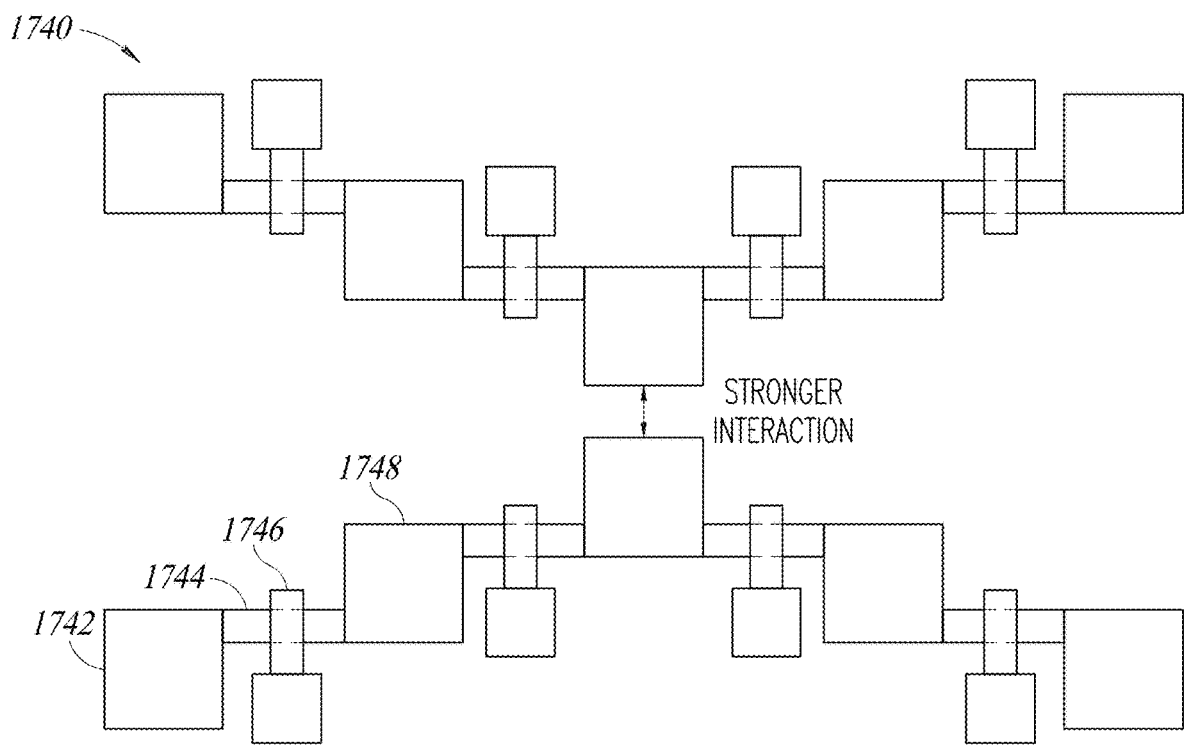
Figure 53D:
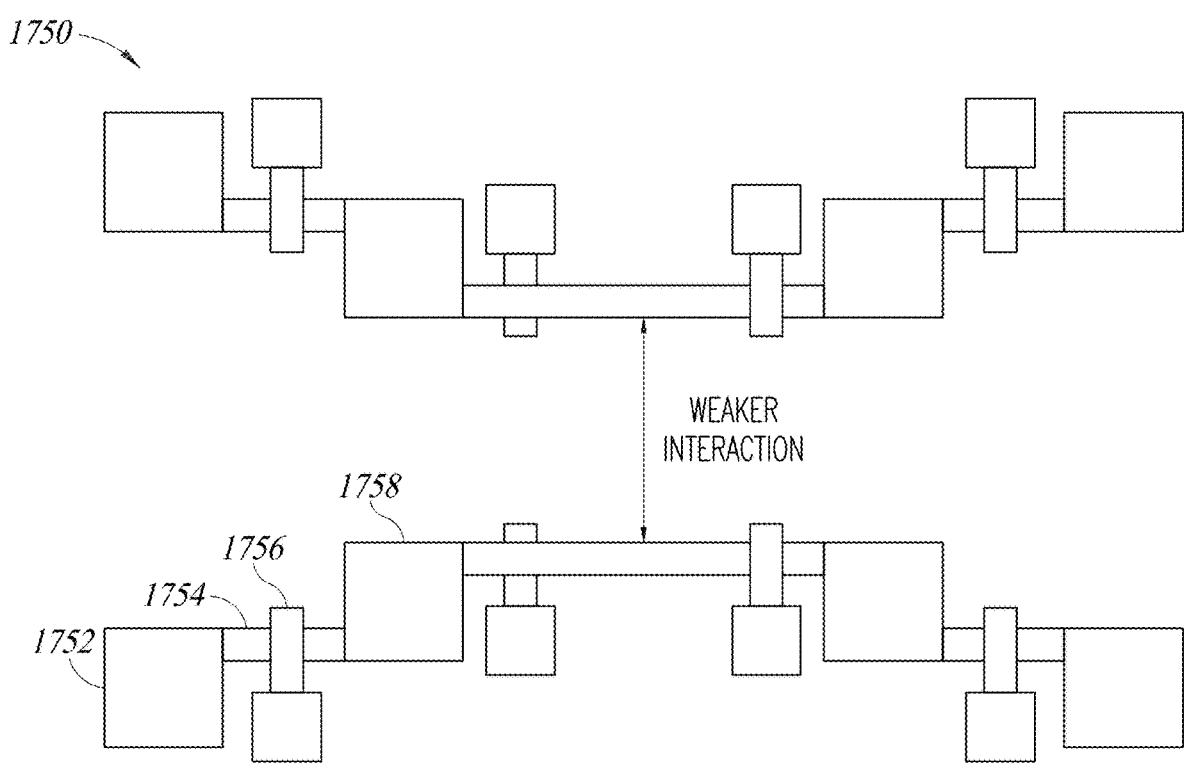
Figure 54:
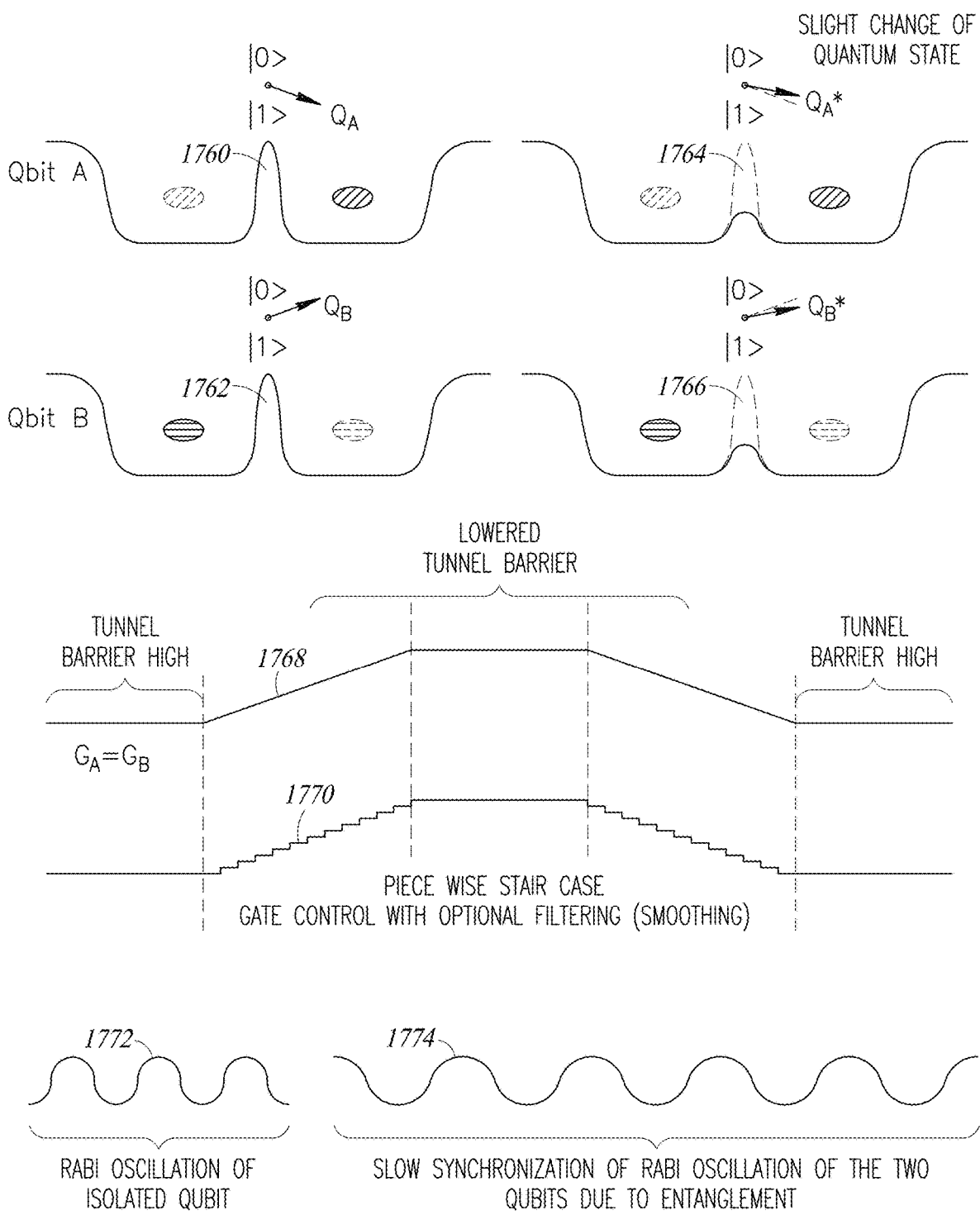
Figure 55:
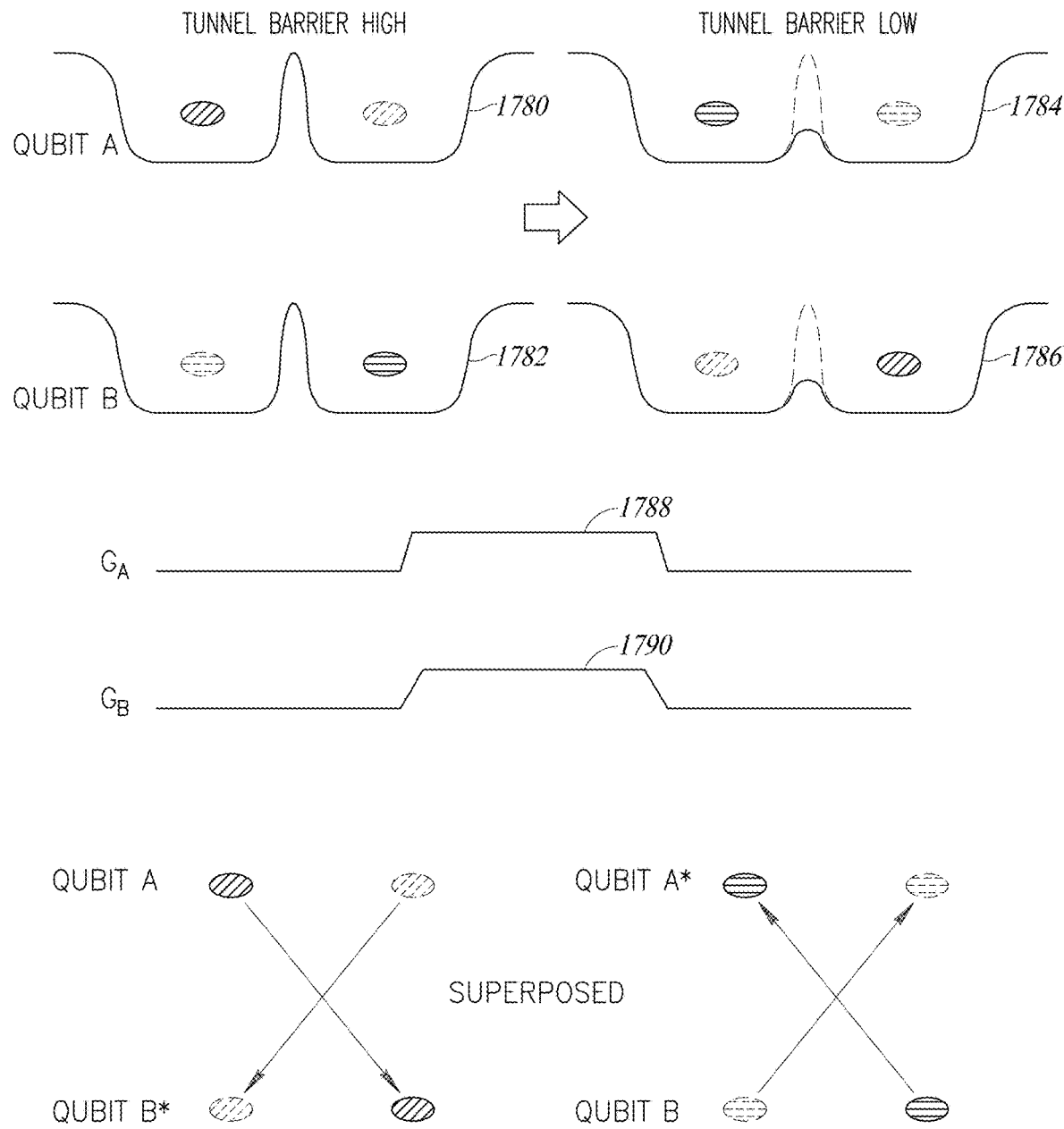
Figure 56:
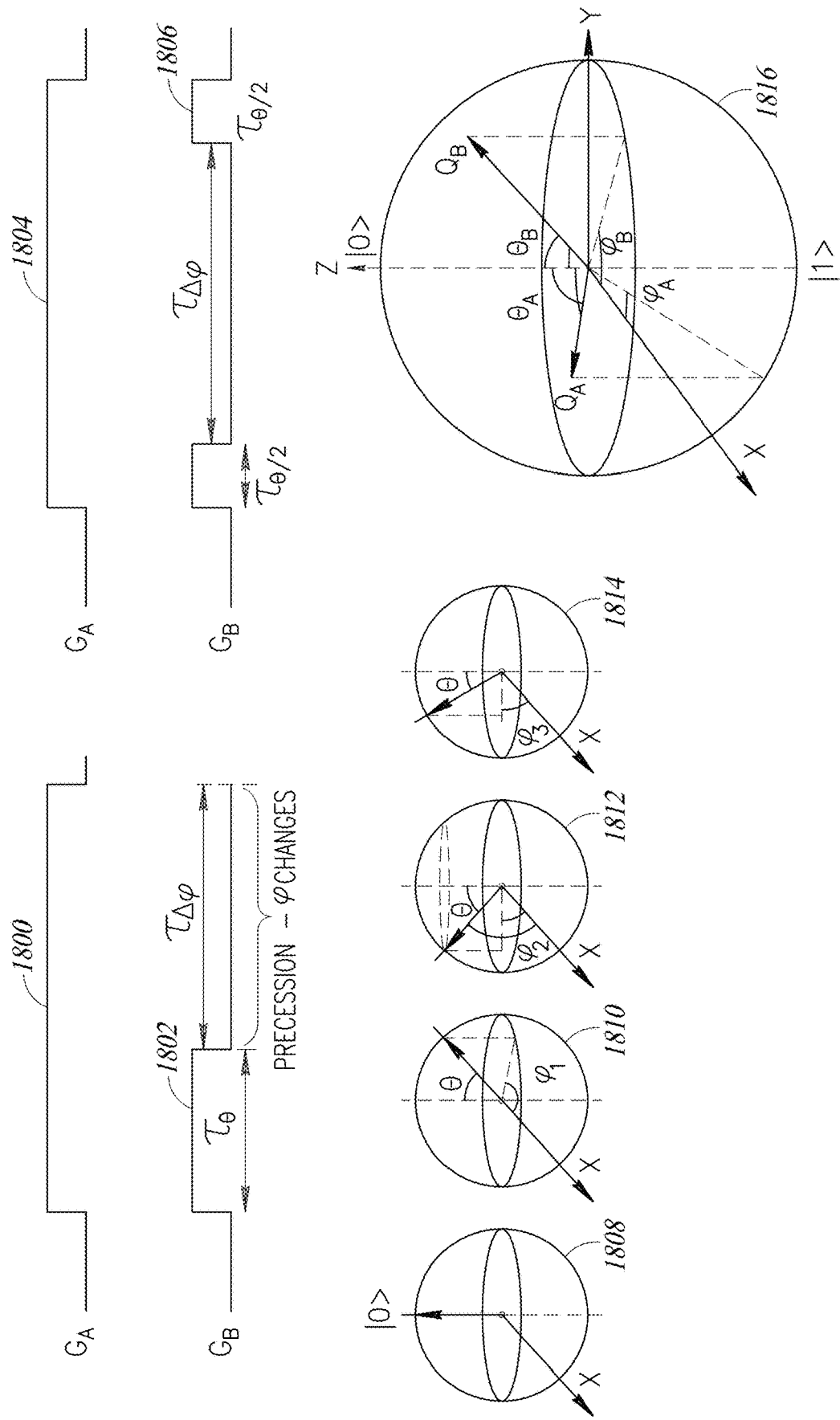
Figure 57:
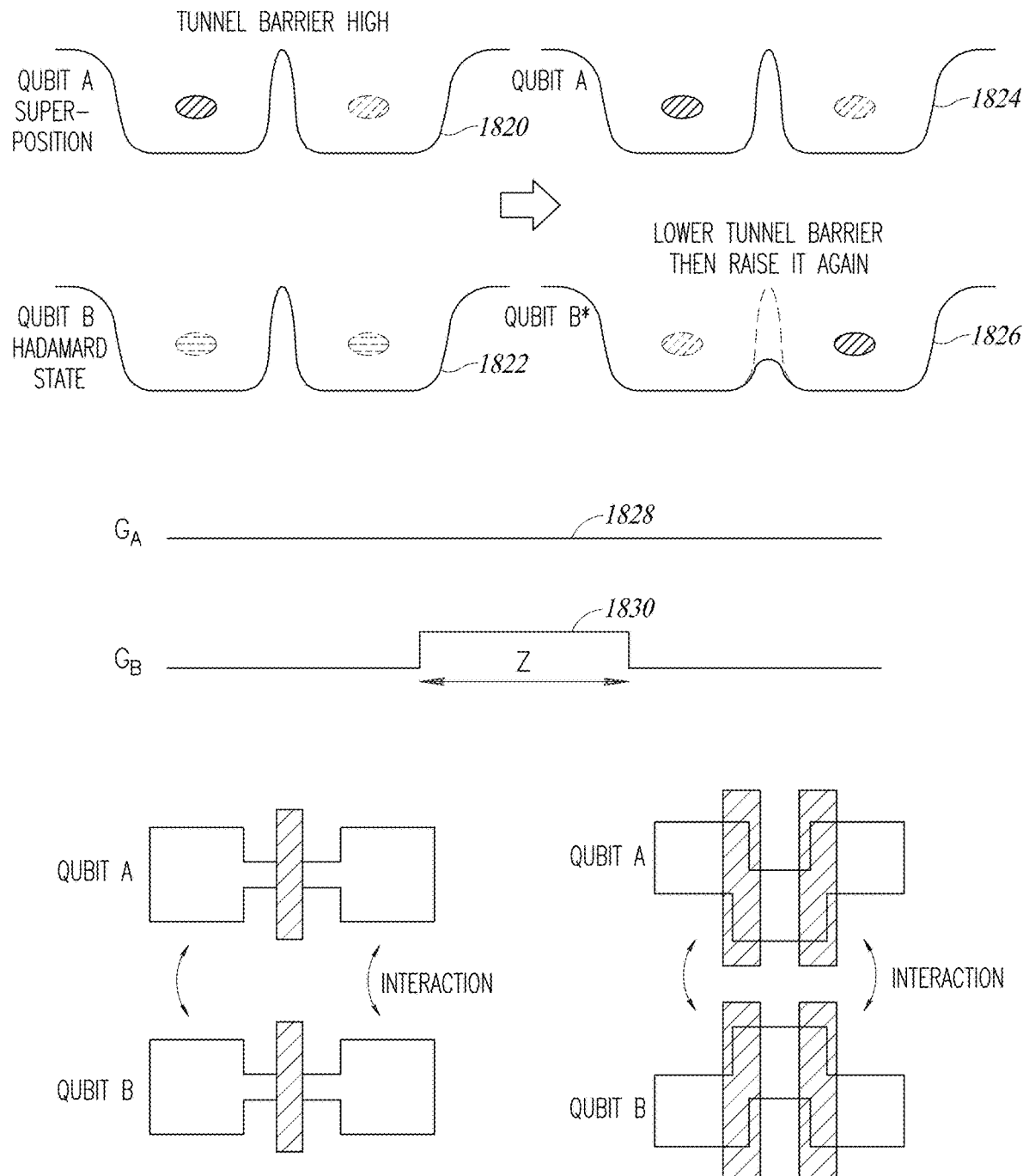
Figure 58:
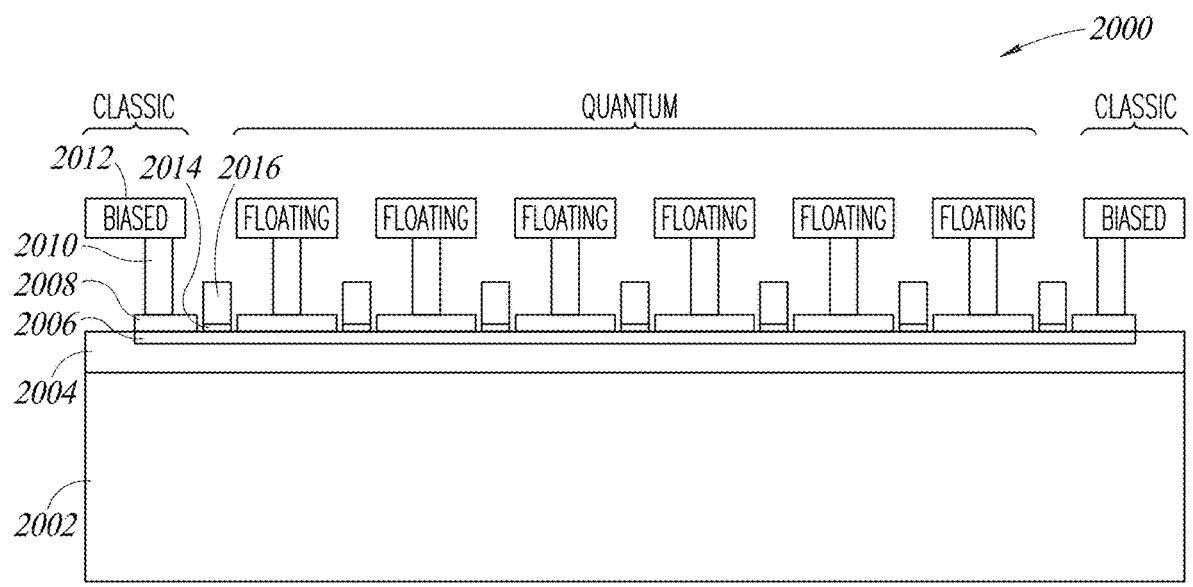
Figure 59:
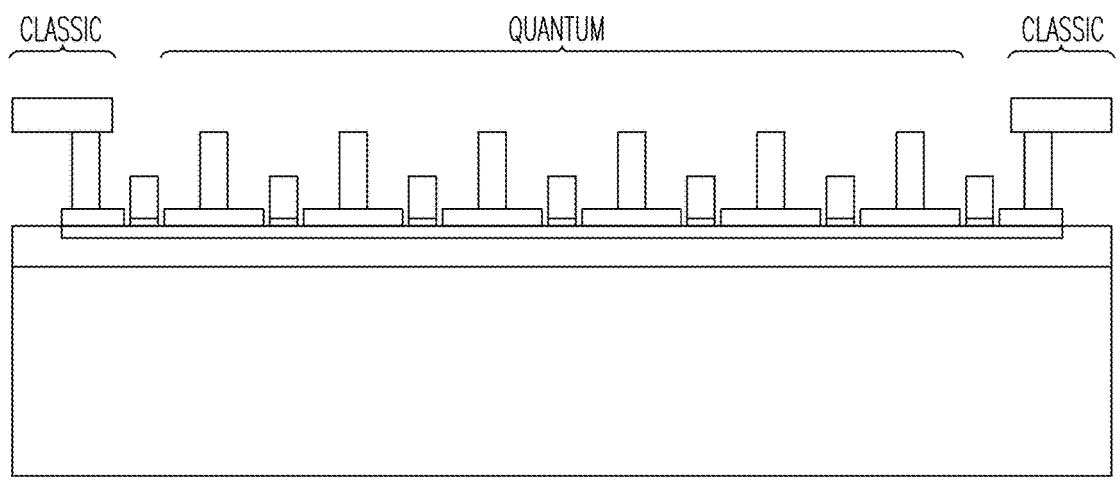
Figure 60:
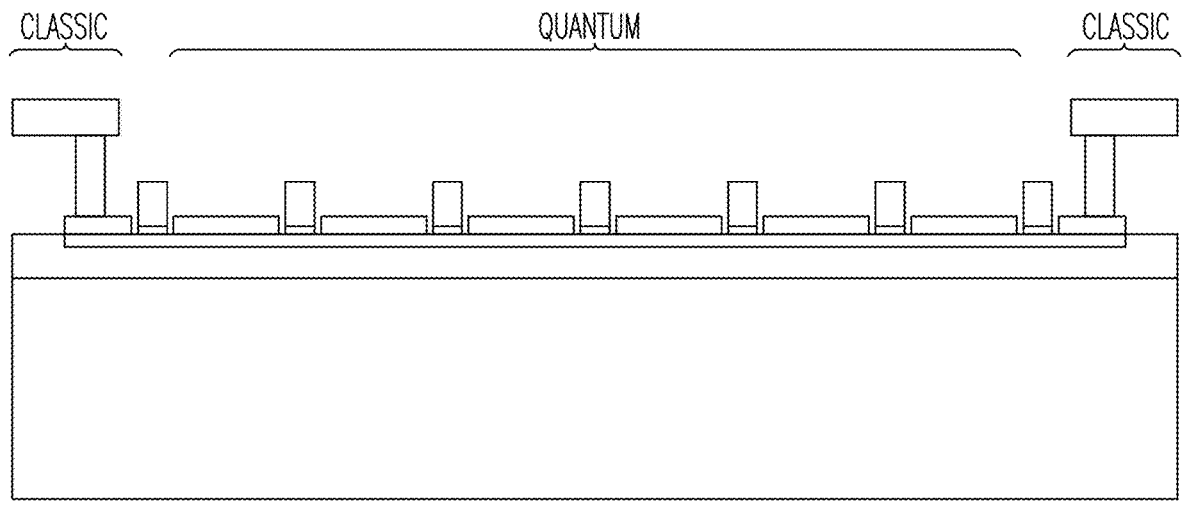
Figure 61:
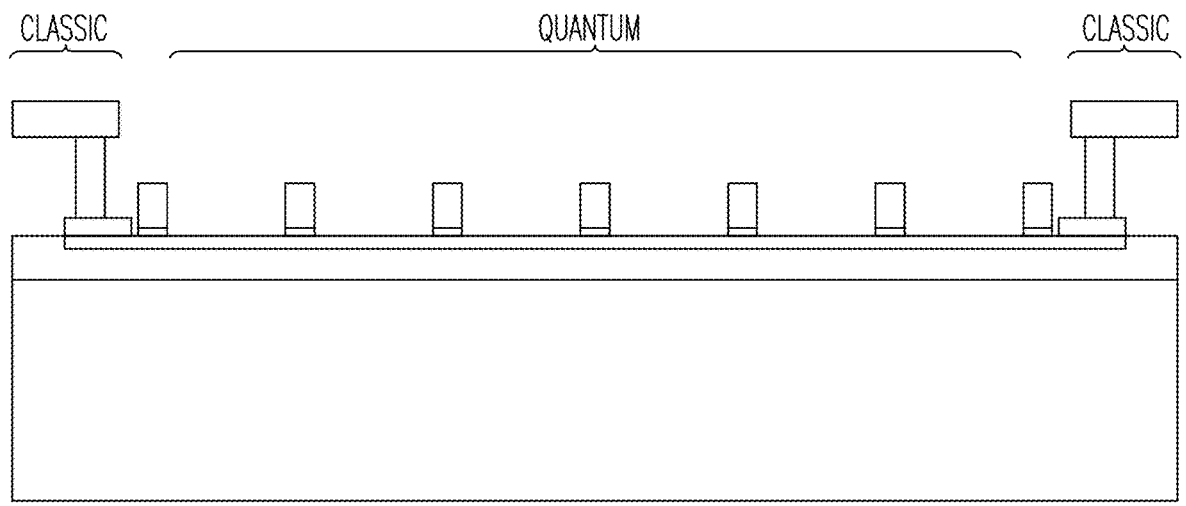
Figure 62:
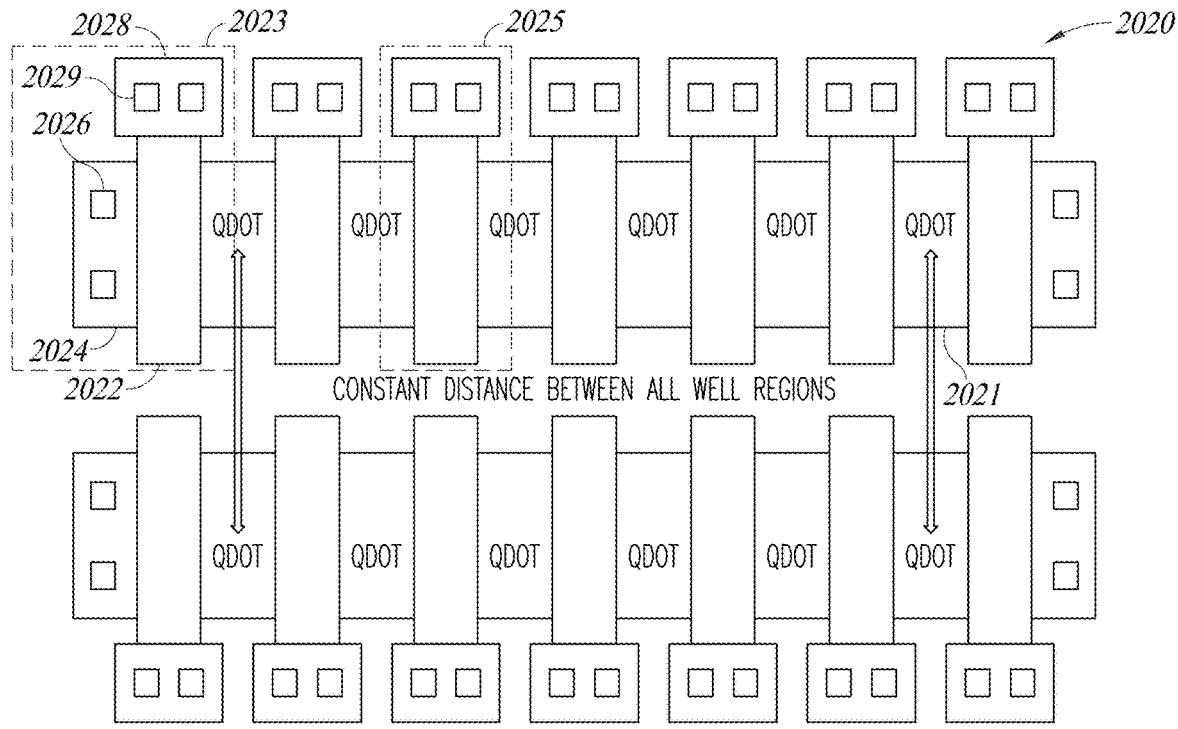
Figure 63:
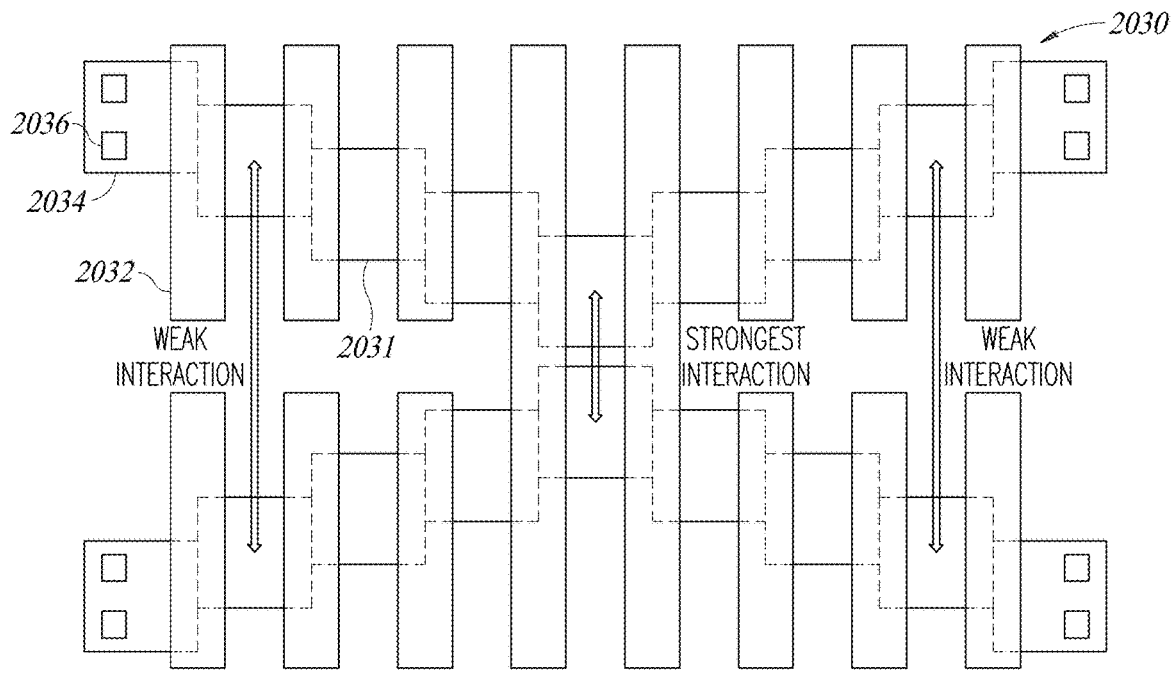
Figure 64:
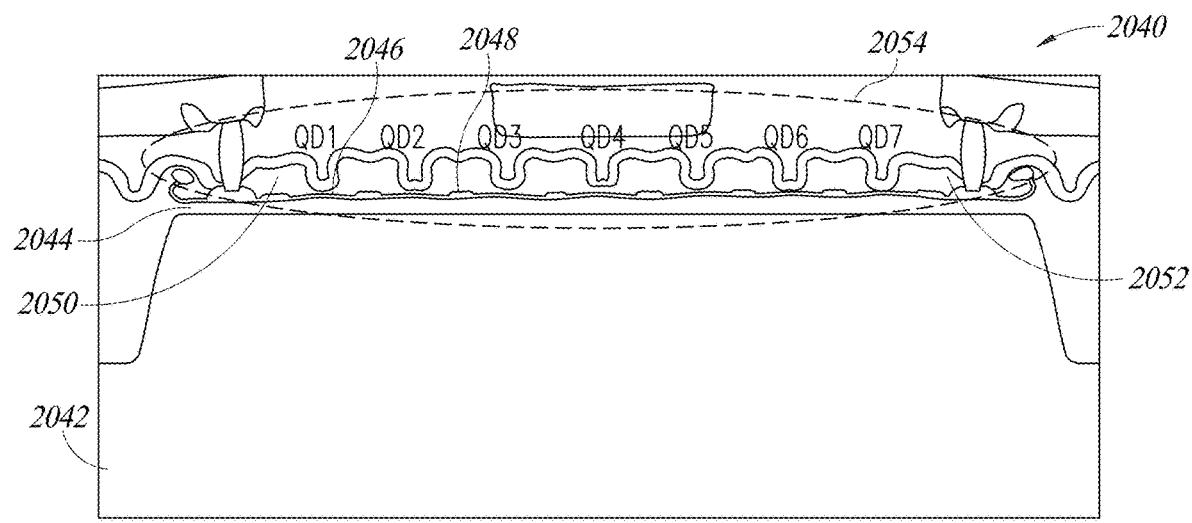
Figure 65:
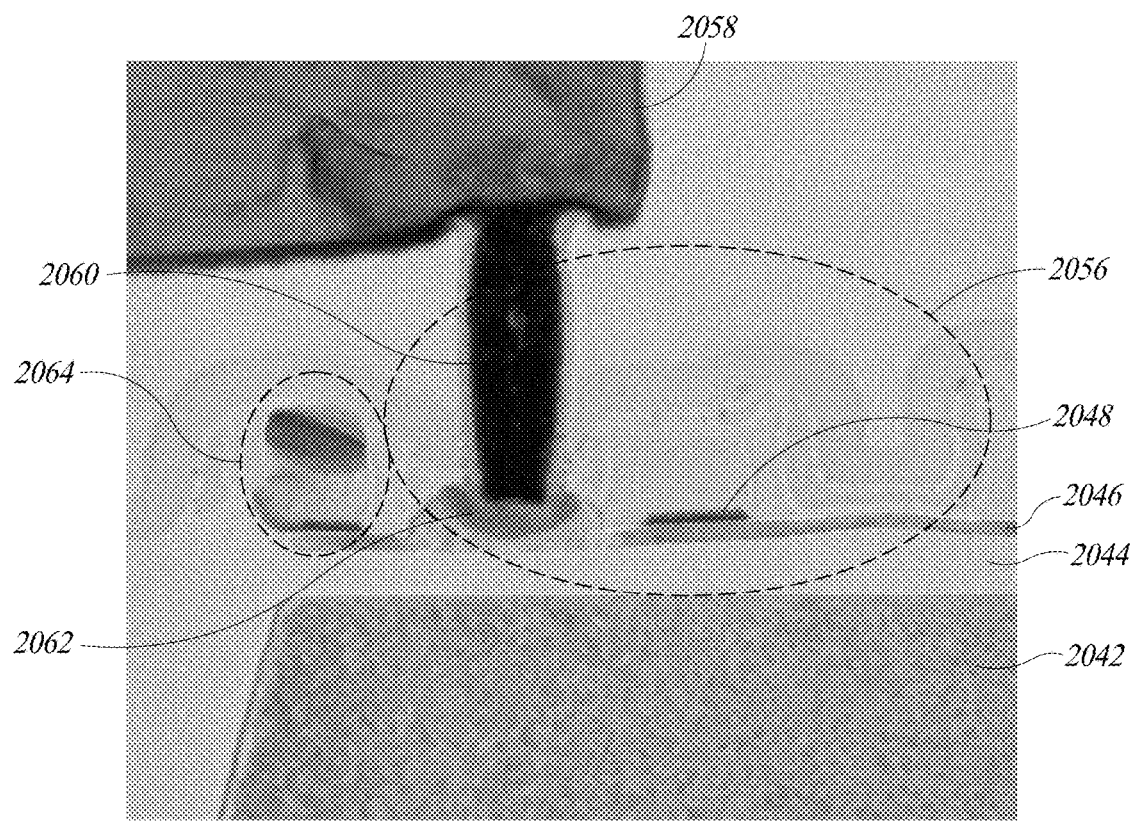
Figure 66:
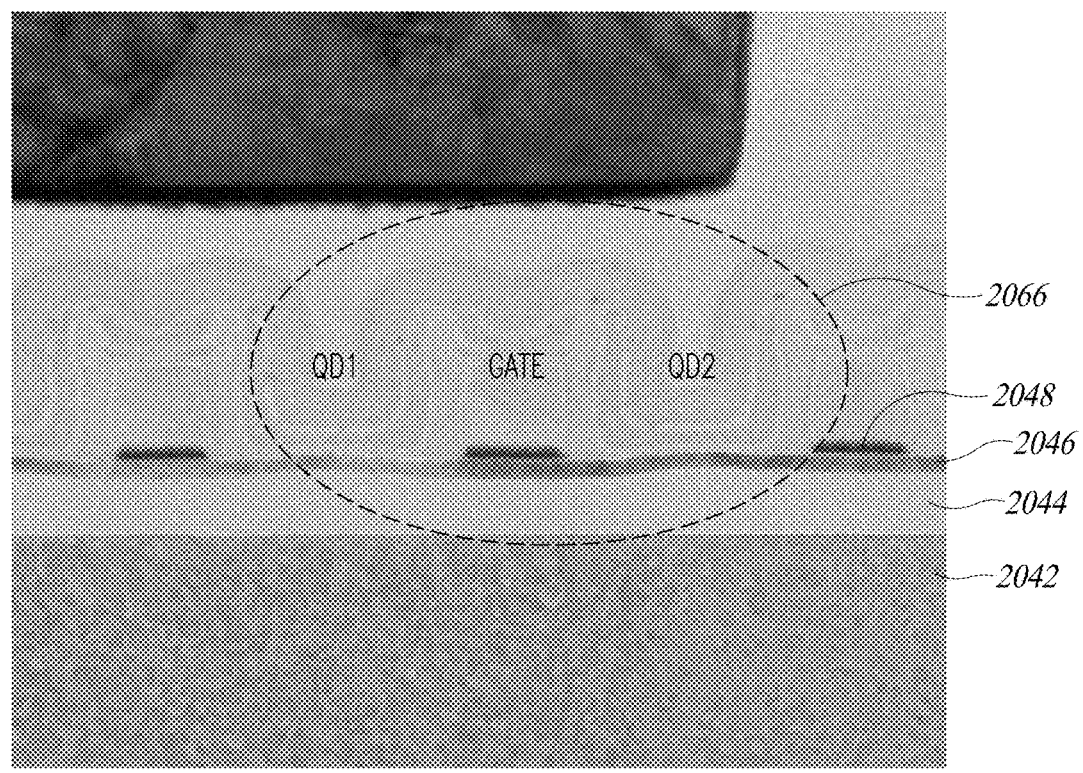
Figure 67:
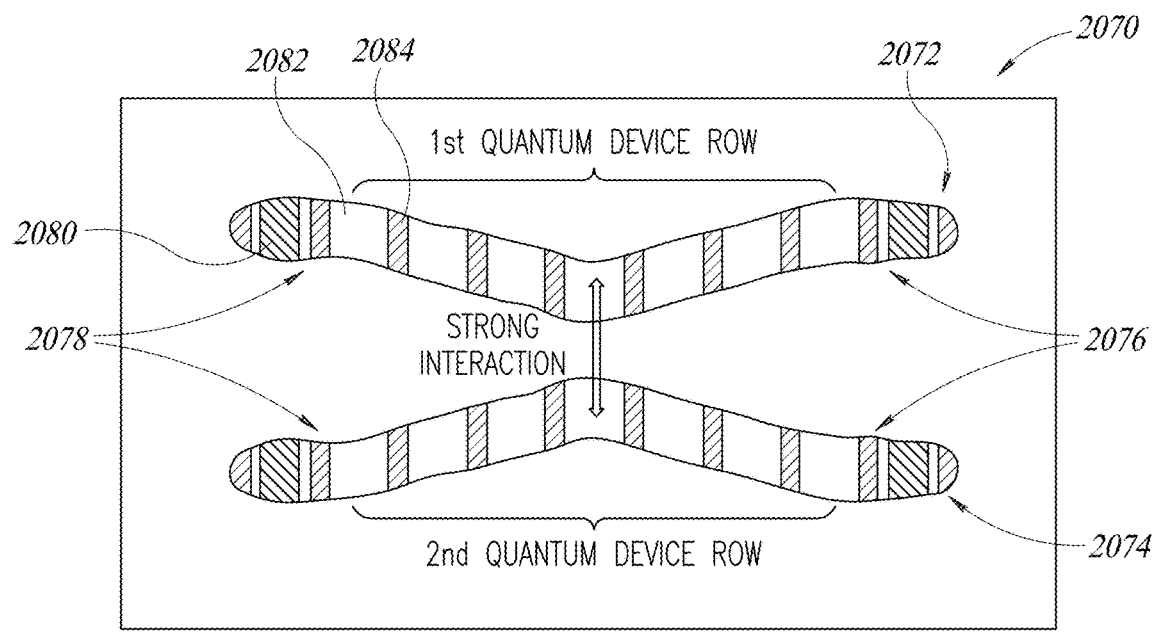
Figure 68:
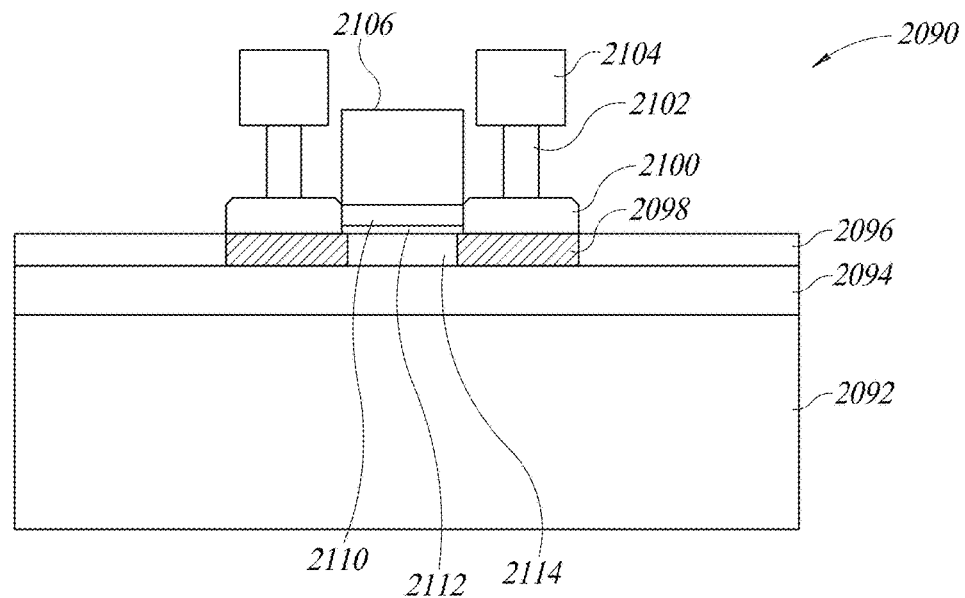
Figure 69:
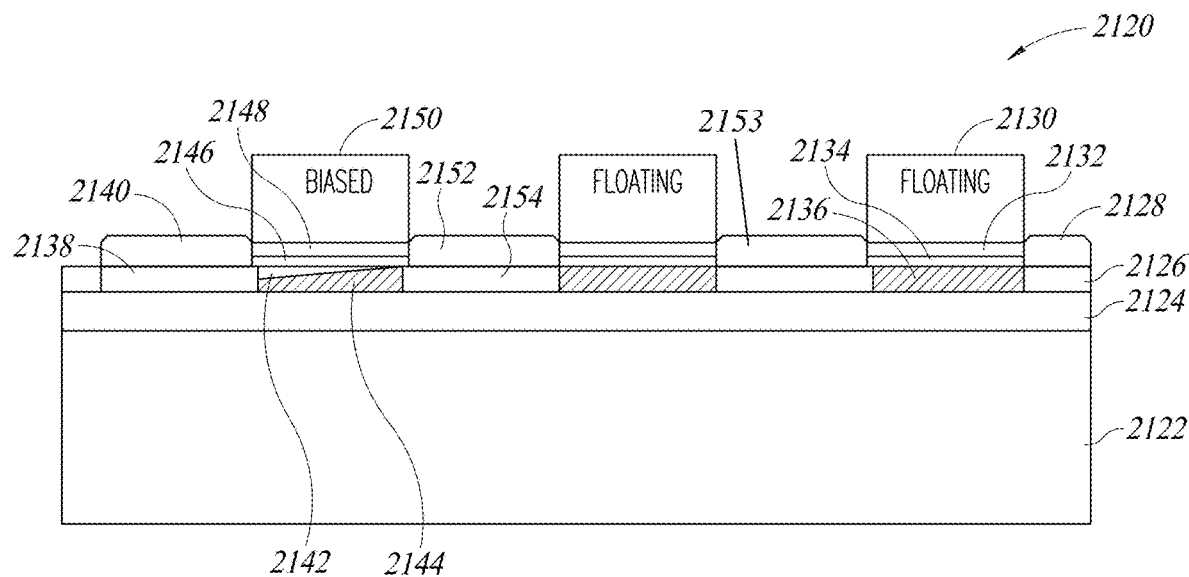
Figure 70:
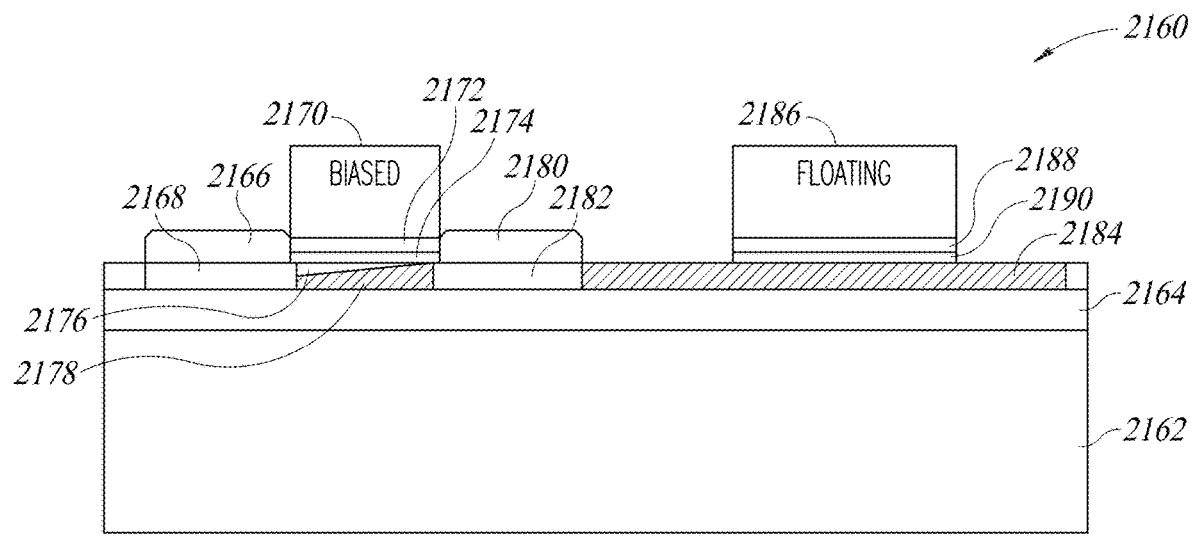
Figure 71:
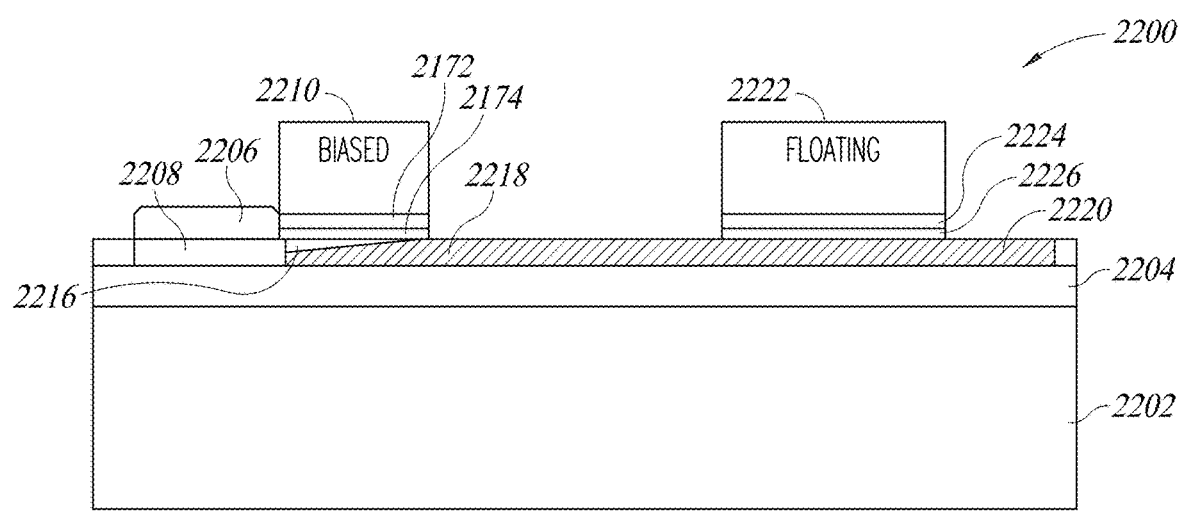
Figure 72:
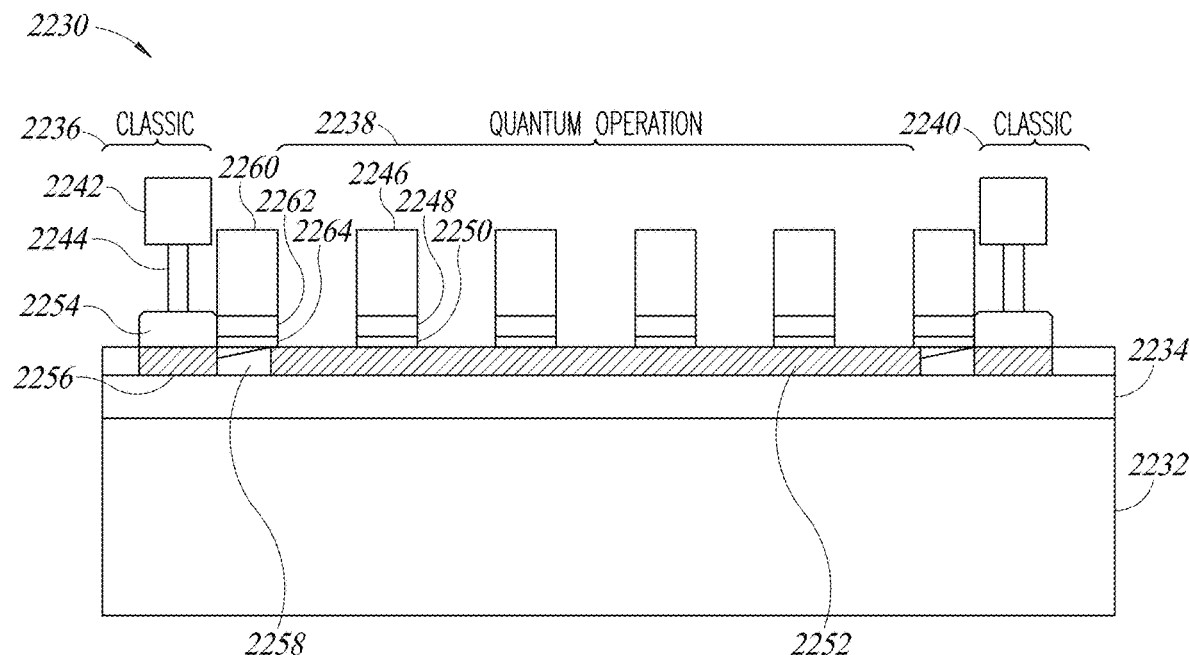
Figure 73:
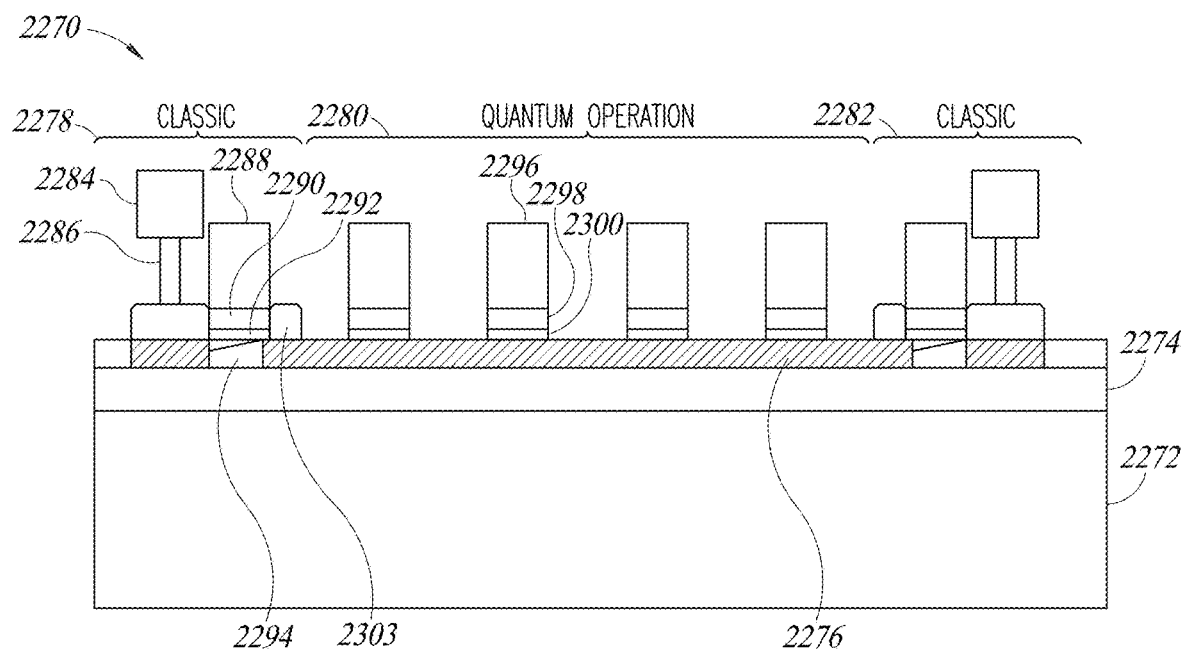
Figure 74:
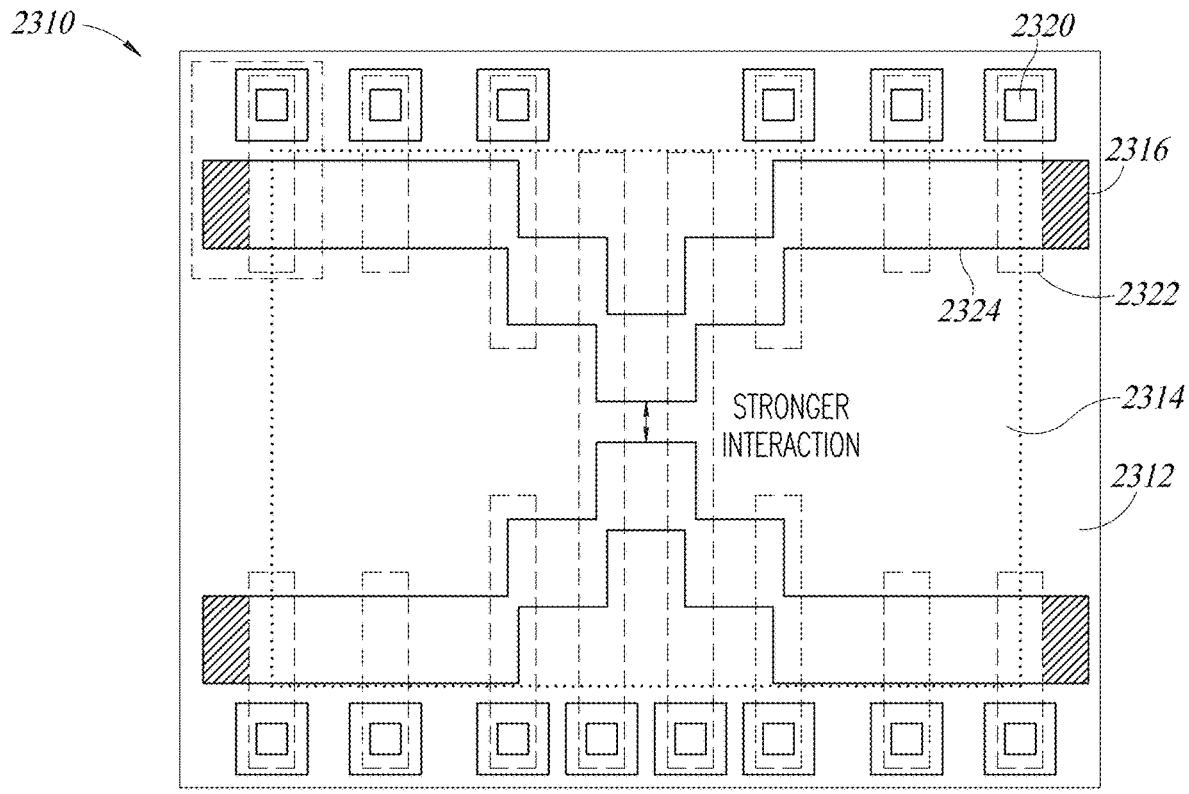
Figure 75:
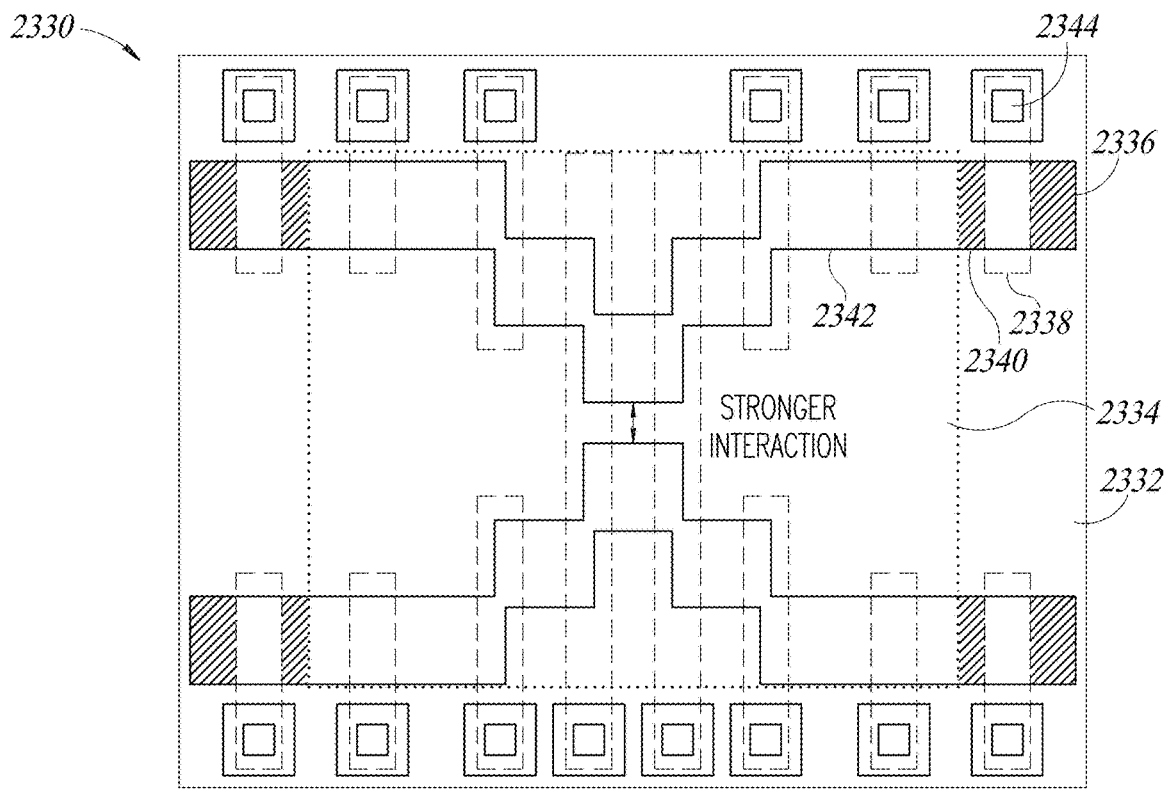
Figure 76:
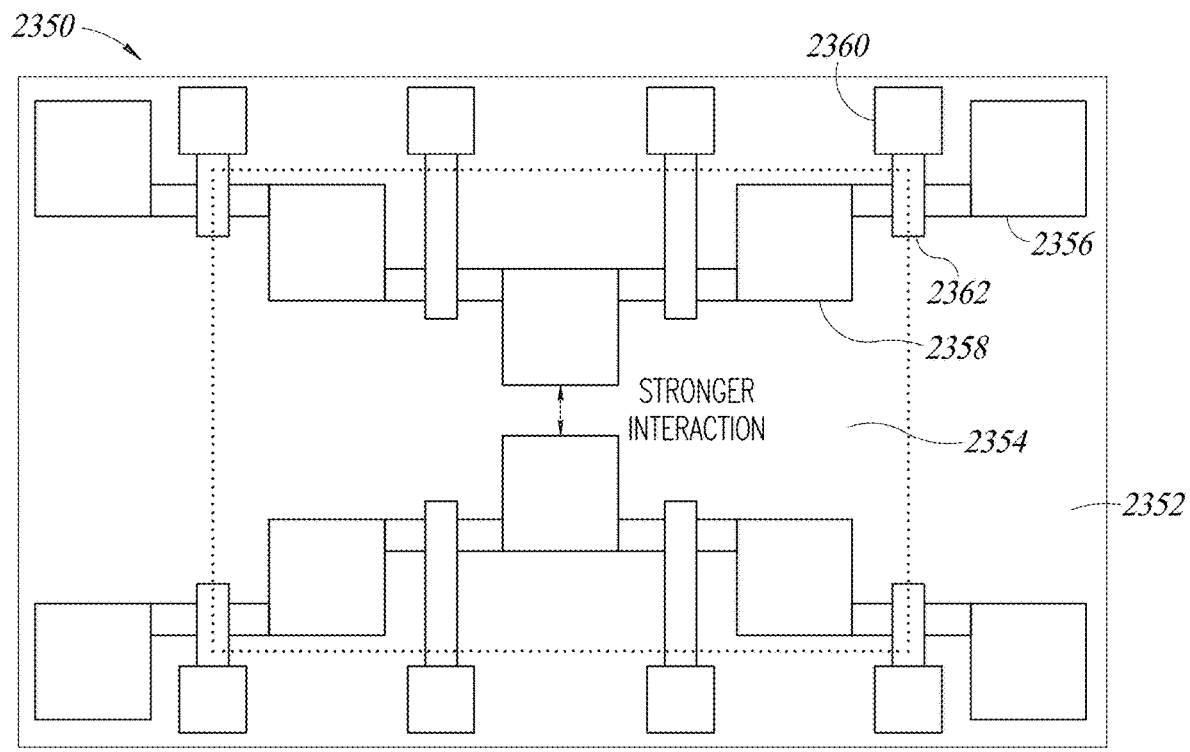
Figure 77:
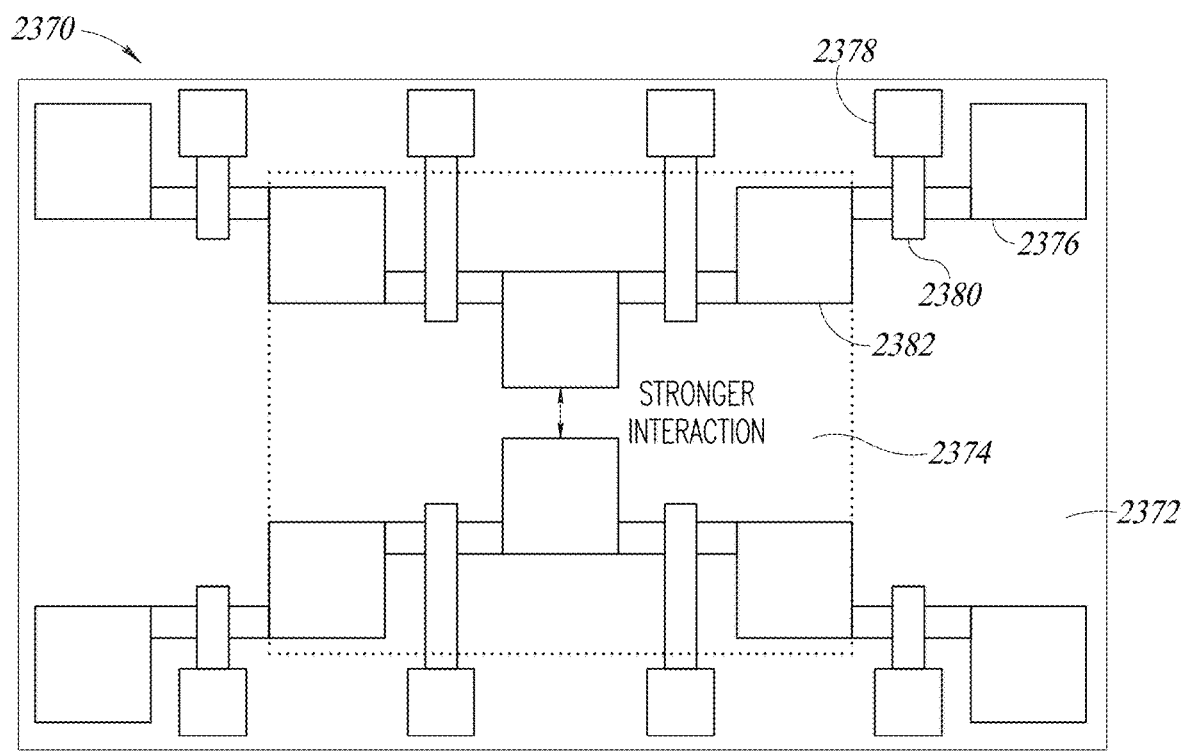
Figure 78:
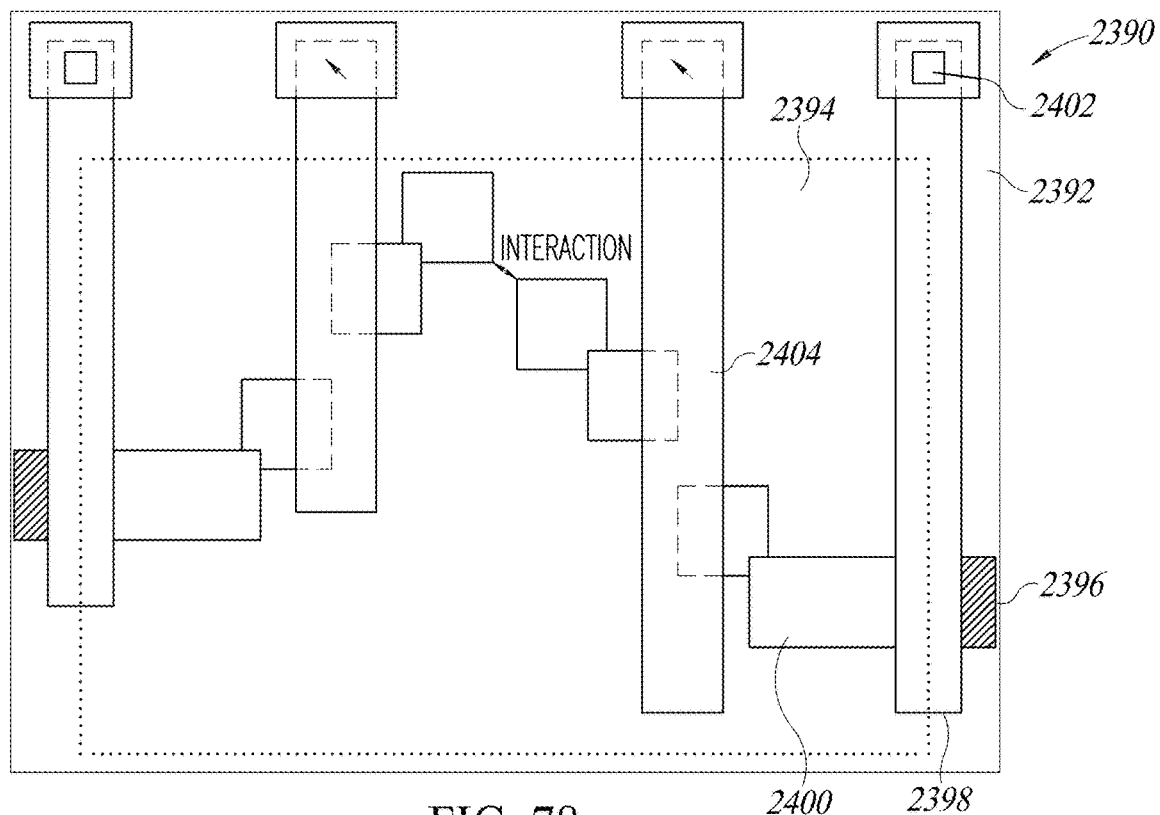
Figure 79:
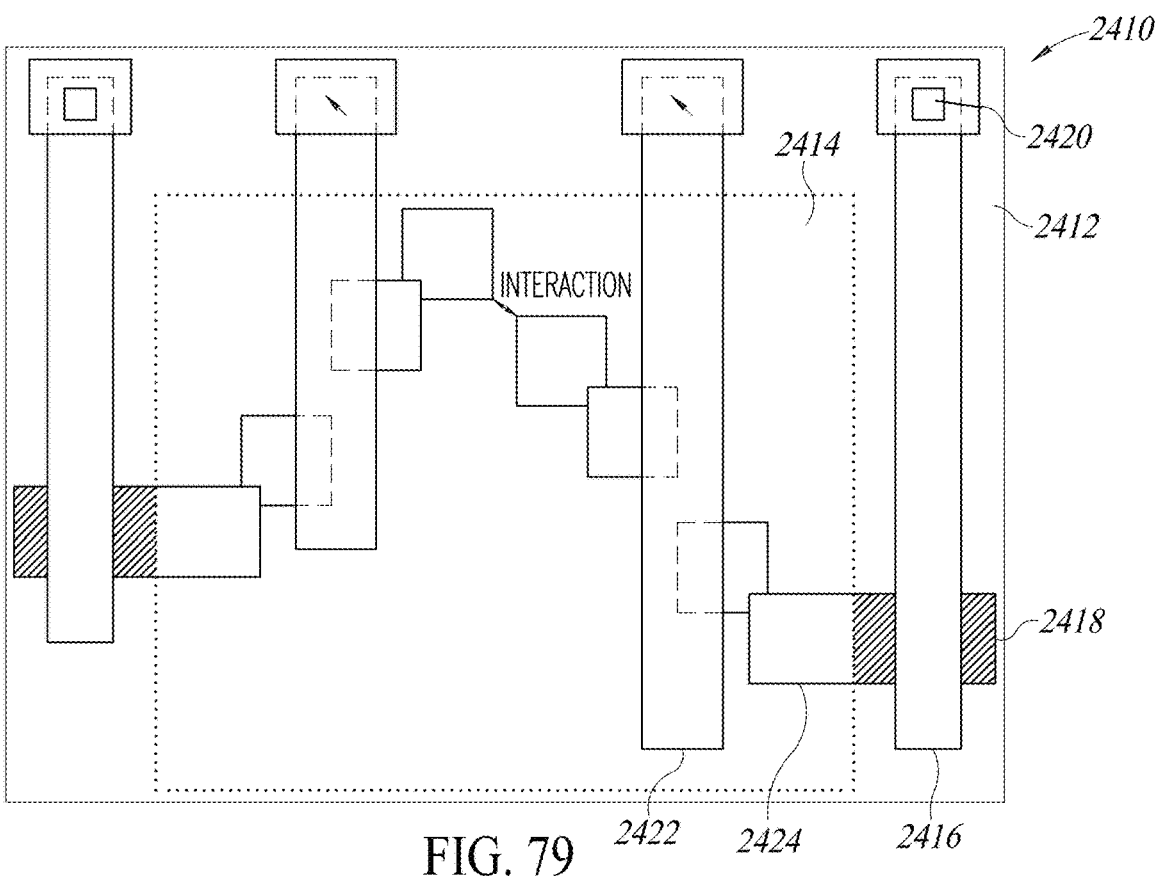
Figure 80:
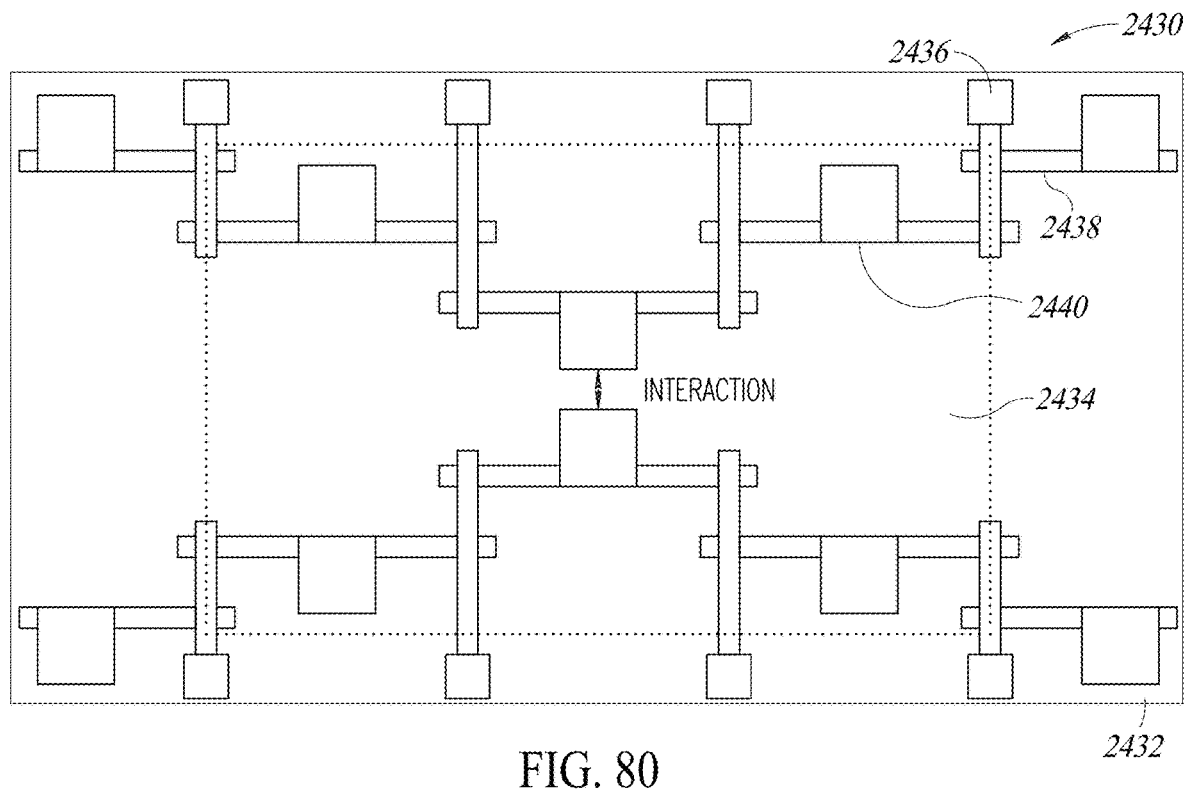
Figure 81:
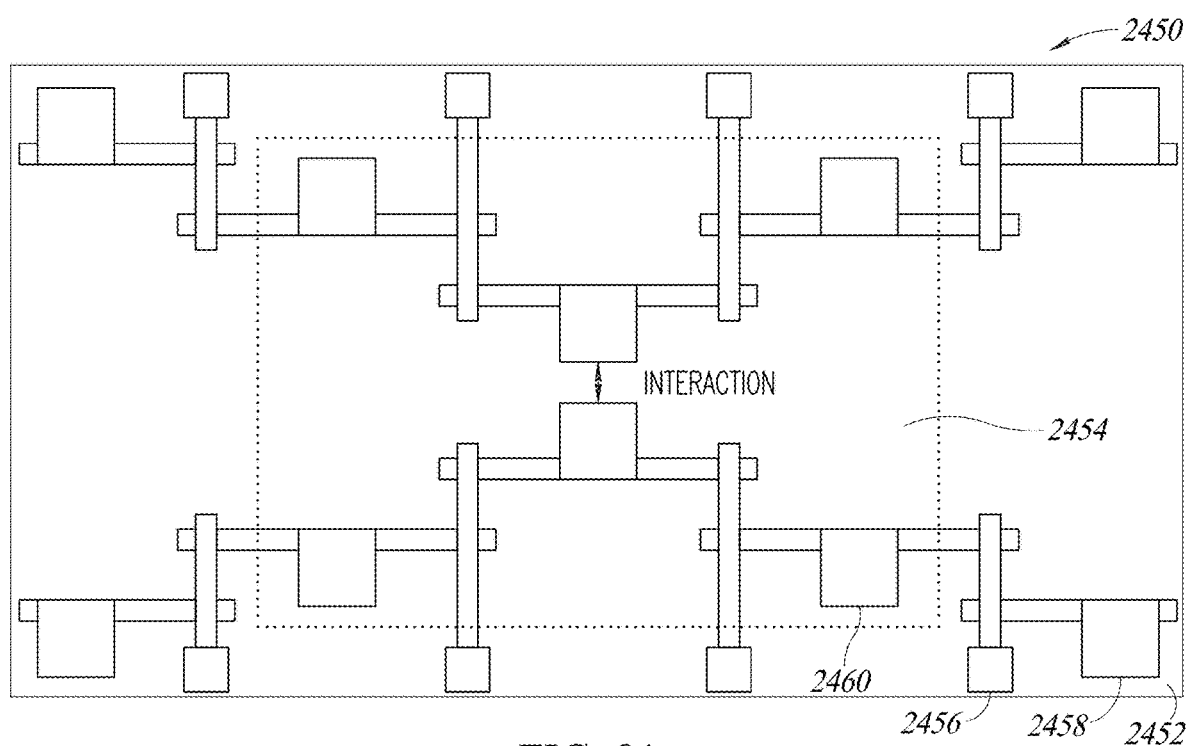
Figure 82:
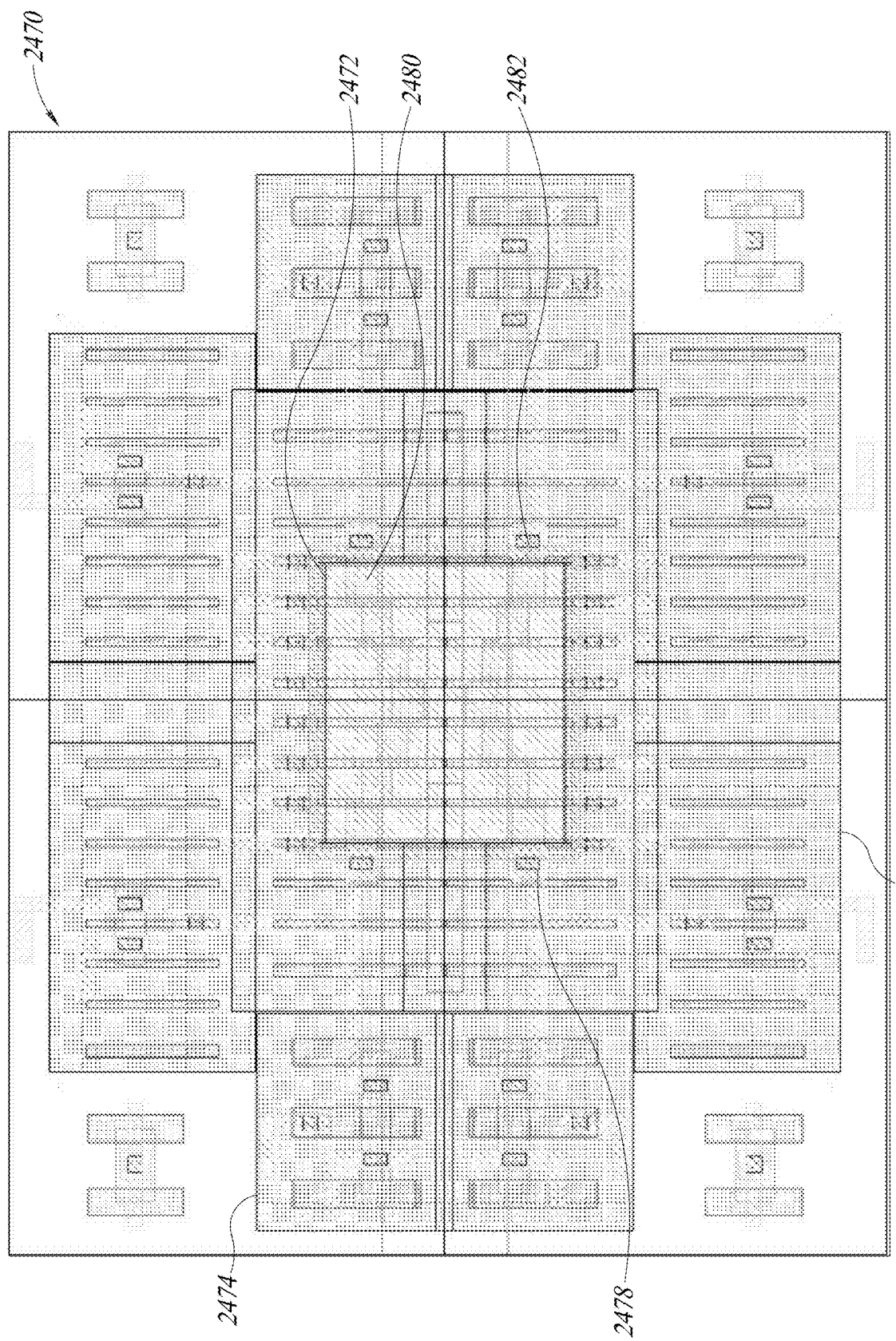

FIG. 41A is a diagram illustrating an example controlled NOT quantum interaction gate using square layers with partial overlap;

FIG. 41B is a diagram illustrating an example Toffoli quantum interaction gate using square layers with partial overlap;

FIG. 41C is a diagram illustrating an example higher order controlled NOT quantum interaction gate using square layers with partial overlap;

FIG. 42A is a diagram illustrating a first example of semiconductor entanglement quantum interaction gate including initialization, staging, interaction, and output locations;

FIG. 42B is a diagram illustrating a second example of semiconductor entanglement quantum interaction gate including initialization, staging, interaction, and output locations;

FIG. 42C is a diagram illustrating a third example of semiconductor entanglement quantum interaction gate including initialization, staging, interaction, and output locations;

FIG. 42D is a diagram illustrating a fourth example of semiconductor entanglement quantum interaction gate including initialization, staging, interaction, and output locations;

FIG. 43A is a diagram illustrating an example quantum interaction gate using double V interaction between neighboring paths;

FIG. 43B is a diagram illustrating an example quantum interaction gate using H interaction between neighboring paths;

FIG. 43C is a diagram illustrating an example quantum interaction ring with star shaped access and double V interaction with multiple next door neighbors;

FIG. 43D is a diagram illustrating an example quantum interaction ring with star shaped access and H interaction with multiple next door neighbors;

FIG. 44A is a diagram illustrating an example T shape quantum interaction gate using tunneling through a local depleted well for interaction between two qubits;

FIG. 44B is a diagram illustrating an example H shape quantum interaction gate using tunneling through a local depleted well for interaction between two qubits;

FIG. 44C is a diagram illustrating an example of a triple V shape quantum interaction gate using tunneling through a local depleted well for interaction between three qubits;

FIG. 44D is a diagram illustrating an example double V shape quantum interaction gate using tunneling through a local depleted well for interaction between two qubits;

FIG. 45A is a diagram illustrating a first example CNOT quantum interaction gate within a grid array of programmable semiconductor qubits;

FIG. 45B is a diagram illustrating a second example CNOT quantum interaction gate within a grid array of programmable semiconductor qubits;

FIG. 46 is a diagram illustrating an example quantum interaction gate constructed with both electric and magnetic control;

FIG. 47 is a diagram illustrating an example grid array of programmable semiconductor qubits with both global and local magnetic;

FIG. 48A is a diagram illustrating a first stage of an example quantum interaction gate particle interaction;

FIG. 48B is a diagram illustrating a second stage of an example quantum interaction gate particle interaction;

FIG. 48C is a diagram illustrating a third stage of an example quantum interaction gate particle interaction;

FIG. 48D is a diagram illustrating a fourth stage of an example quantum interaction gate particle interaction;

FIG. 48E is a diagram illustrating a fifth stage of an example quantum interaction gate particle interaction;

FIG. 48F is a diagram illustrating a sixth stage of an example quantum interaction gate particle interaction;

FIG. 48G is a diagram illustrating a seventh stage of an example quantum interaction gate particle interaction;

FIG. 48H is a diagram illustrating an eighth stage of an example quantum interaction gate particle interaction;

FIG. 49A is a diagram illustrating an example semiconductor qubit using tunneling through a separate layer planar structure;

FIG. 49B is a diagram illustrating an example semiconductor qubit using tunneling through a local depleted well planar structure;

FIG. 49C is a diagram illustrating an example semiconductor qubit using tunneling through a separate layer 3D FIN-FET structure;

FIG. 49D is a diagram illustrating an example semiconductor qubit using tunneling through a local depleted well 3D FIN-FET structure;

FIG. 49E is a diagram illustrating a semiconductor CNOT quantum interaction gate using two qubit double qdot structures with tunneling through a separate structure planar structure;

FIG. 49F is a diagram illustrating a first example quantum interaction gate with interaction between two particles in the same continuous well;

FIG. 49G is a diagram illustrating a second example quantum interaction gate with interaction between two particles in the same continuous well;

FIG. 49H is a diagram illustrating a third example quantum interaction gate with interaction between two particles in the same continuous well;

FIG. 49I is a diagram illustrating a first example quantum interaction gate with interaction between two particles in different continuous wells;

FIG. 49J is a diagram illustrating a second example quantum interaction gate with interaction between two particles in different continuous wells;

FIG. 49K is a diagram illustrating a second example quantum interaction gate with interaction between two particles in different continuous wells;

FIG. 49L is a diagram illustrating a second example quantum interaction gate with interaction between two particles in different continuous wells;

FIG. 50A is a diagram illustrating a CNOT quantum interaction gate using two qubit double qdot structures with tunneling through a separate structure planar structure with gating to classic circuits;

FIG. 50B is a diagram illustrating a CNOT quantum interaction gate with tunneling through a local depleted well using voltage driven gate imposing and gating to classic circuits;

FIG. 50C is a diagram illustrating a CNOT quantum interaction gate with tunneling through a local depleted well using voltage driven gate imposing and multiple gating to classic circuits;

FIG. 50D is a diagram illustrating an example quantum interaction gate with continuous well incorporating reset, inject, impose, and detect circuitry;

FIG. 51A is a diagram illustrating an example double V CNOT quantum interaction gate using separate control gates that mandates larger spacing resulting in a weaker interaction;

FIG. 51B is a diagram illustrating an example double V CNOT quantum interaction gate using common control gates for sections in closer proximity to permit smaller spacing and stronger interaction;

FIG. 51C is a diagram illustrating an example double V CNOT quantum interaction gate using common control gates for two control gates on both sides of the interacting qdots;

FIG. 51D is a diagram illustrating an example double V CNOT quantum interaction gate incorporating inject, impose, and detect circuitry;

FIG. 52A is a diagram illustrating a first example z shift register quantum interaction gate using planar process with partial overlap of semiconductor well and control gate;

FIG. 52B is a diagram illustrating a second example z shift register quantum interaction gate using planar process with partial overlap of semiconductor well and control gate;

FIG. 52C is a diagram illustrating an example of H-style quantum interaction gate implemented with planar semiconductor qdots using tunneling through oxide layer with partial overlap of semiconductor well and control gate;

FIG. 52D is a diagram illustrating an example of H-style quantum interaction gate implemented with planar semiconductor qdots using tunneling through local depleted region in continuous wells;

FIG. 53A is a diagram illustrating a first example CNOT quantum interaction gate using 3D FIN-FET semiconductor process with tunneling through separate layer and interaction from enlarged well islands allowing smaller spacing and stronger interaction;

FIG. 53B is a diagram illustrating a second example CNOT quantum interaction gate using 3D FIN-FET semiconductor process with tunneling through separate layer and interaction from enlarged well islands allowing smaller spacing and stronger interaction;

FIG. 53C is a diagram illustrating a third example CNOT quantum interaction gate using 3D FIN-FET semiconductor process with interaction from enlarged well islands allowing smaller spacing and stronger interaction;

FIG. 53D is a diagram illustrating a fourth example CNOT quantum interaction gate using 3D FIN-FET semiconductor process with fin to fin interaction mandating larger spacing and weaker interaction;

FIG. 54 is a diagram illustrating example operation of a quantum annealing interaction gate structure;

FIG. 55 is a diagram illustrating example operation of a controlled SWAP quantum interaction gate structure;

FIG. 56 is a diagram illustrating example operation of a controlled Pauli quantum interaction gate structure;

FIG. 57 is a diagram illustrating example operation of an ancillary quantum interaction gate structure;

FIG. 58 is a diagram illustrating an example quantum structure with metal, CA, n+ layers;

FIG. 59 is a diagram illustrating an example quantum structure with CA and n+ layers;

FIG. 60 is a diagram illustrating an example quantum structure with n+ layer;

FIG. 61 is a diagram illustrating an example quantum structure without metal, CA, and n+ layers;

FIG. 62 is a diagram illustrating a quantum structure with constant distance between all well regions;

FIG. 63 is a diagram illustrating double V shaped quantum structure with weak and strong interaction areas;

FIG. 64 is a diagram illustrating a cross section of a quantum structure with multiple quantum dots, injector and extractor interface devices;

FIG. 65 is a diagram illustrating a cross section of the interface device of FIG. 64 in more detail;

FIG. 66 is a diagram illustrating a cross section of the quantum dots of FIG. 64 in more detail;

FIG. 67 is a diagram illustrating a top view of a double V shaped quantum structure with multiple quantum dots, injector and extractor interface devices;

FIG. 68 is a diagram illustrating a cross section of a semiconductor device with dopings and contacts on both sides of the gate;

FIG. 69 is a diagram illustrating a cross section of a semiconductor quantum structure using a classic FET on the left side and a qubit with dopings on the quantum wells;

FIG. 70 is a diagram illustrating a cross section of a semiconductor quantum structure using a classic FET on the left side and a qubit without doping and contacts on both sides of the gate;

FIG. 71 is a diagram illustrating a cross section of a semiconductor quantum structure using a half classic, half quantum device on the left side and a qubit without dopings or contacts on both sides of the gate;

FIG. 72 is a diagram illustrating a quantum structure with half classic, half quantum devices on either end and full quantum devices in the middle;

FIG. 73 is a diagram illustrating a quantum structure with full classic devices on either end and full quantum devices in the middle;

FIG. 74 is a diagram illustrating a top view of a planar semiconductor quantum gate using two active wells with aperture tunneling through local depletion region and n+ blocking layer that stops in the middle of the gate;

FIG. 75 is a diagram illustrating a top view of a planar semiconductor quantum gate using two active wells with aperture tunneling through local depletion region and n+ blocking layer that stops in the middle of the active;

FIG. 76 is a diagram illustrating a top view of a 3D semiconductor quantum gate using two active wells with aperture tunneling through local depletion region and n+ blocking layer that stops in the middle of the gate;

FIG. 77 is a diagram illustrating a top view of a 3D semiconductor quantum gate using two active wells with aperture tunneling through local depletion region and n+ blocking layer that stops in the middle of the active;

FIG. 78 is a diagram illustrating a top view of a planar semiconductor quantum gate using two active wells with aperture tunneling through oxide layer and n+ blocking layer that stops in the middle of the gate;

FIG. 79 is a diagram illustrating a top view of a planar semiconductor quantum gate using two active wells with aperture tunneling through oxide layer and n+ blocking layer that stops in the middle of the active;

FIG. 80 is a diagram illustrating a top view of a 3D semiconductor quantum gate using two active wells with aperture tunneling through oxide layer and n+ blocking layer that stops in the middle of the gate;

FIG. 81 is a diagram illustrating a top view of a 3D semiconductor quantum gate using two active wells with aperture tunneling through oxide layer and n+ blocking layer that stops in the middle of the active; and FIG. 82 is a diagram illustrating an example semiconductor quantum gate using staircase shaped wells n+ stopping in the middle of the gate.

DETAILED DESCRIPTION

In the following detailed description, numerous specific details are set forth in order to provide a thorough understanding of the invention. It will be understood by those skilled in the art, however, that the present invention may be practiced without these specific details. In other instances, well-known methods, procedures, and components have not been described in detail so as not to obscure the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Any reference in the specification to a method should be applied mutatis mutandis to a system capable of executing the method. Any reference in the specification to a system should be applied mutatis mutandis to a method that may be executed by the system.

Throughout the specification and claims, the following terms take the meanings explicitly associated herein, unless the context clearly dictates otherwise. The phrases "in one embodiment," "in an example embodiment," and "in some embodiments" as used herein do not necessarily refer to the same embodiment(s), though it may. Furthermore, the phrases "in another embodiment," "in an alternative embodiment," and "in some other embodiments" as used herein do not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

The following definitions apply throughout this document.

A quantum particle is defined as any atomic or subatomic particle suitable for use in achieving the controllable quantum effect. Examples include electrons, holes, ions, photons, atoms, molecules, artificial atoms. A carrier is defined as an electron or a hole in the case of semiconductor electrostatic qubit. Note that a particle (actually its wavefunction) may be split and present in multiple quantum dots. Thus, a reference to a particle also includes split particles.

In quantum computing, the qubit is the basic unit of quantum information, i.e. the quantum version of the classical binary bit physically realized with a two-state device. A qubit is a two base state quantum mechanical system in which the states can be in a superposition. Examples include (1) the spin of the particle (e.g., electron, hole) in which the two levels can be taken as spin up and spin down; (2) the polarization of a single photon in which the two states can be taken to be the vertical polarization and the horizontal polarization; and (3) the position of the particle (e.g., electron) in a structure of two qdots, in which the two states correspond to the particle being in one qdot or the other. In a classical system, a bit is in either one state or the other. Quantum mechanics, however, allows the qubit to be in a coherent superposition of both states simultaneously, a property fundamental to quantum mechanics and quantum computing. Multiple qubits can be further entangled with each other.

A quantum dot or qdot (also referred to in literature as QD) is a nanometer-scale structure where the addition or removal of a particle changes its properties is some ways. In one embodiment, quantum dots are constructed in silicon semiconductor material having typical dimension in nanometers. The position of a particle in a qdot can attain several states. Qdots are used to form qubits and qudits where multiple qubits or qudits are used as a basis to implement quantum processors and computers.

A quantum interaction gate is defined as a basic quantum logic circuit operating on a small number of qubits or qudits. They are the building blocks of quantum circuits, just like the classical logic gates are for conventional digital circuits.

A qubit or quantum bit is defined as a two state (two level) quantum structure and is the basic unit of quantum information. A qudit is defined as a d-state (d-level) quantum structure. A qubyte is a collection of eight qubits.

The terms control gate and control terminal are intended to refer to the semiconductor structure fabricated over a continuous well with a local depleted region and which divides the well into two or more qdots. These terms are not to be confused with quantum gates or classical field effect transistor (FET) gates.

Unlike most classical logic gates, quantum logic gates are reversible. It is possible, however, although cumbersome in practice, to perform classical computing using only reversible gates. For example, the reversible Toffoli gate can implement all Boolean functions, often at the cost of having to use ancillary bits. The Toffoli gate has a direct quantum equivalent, demonstrating that quantum circuits can perform all operations performed by classical circuits.

A quantum well is defined as a low doped or undoped continuous depleted semiconductor well that functions to contain quantum particles in a qubit or qudit. The quantum well may or may not have contacts and metal on top. A quantum well holds one free carrier at a time or at most a few carriers that can exhibit single carrier behavior.

A classic well is a medium or high doped semiconductor well contacted with metal layers to other devices and usually has a large number of free carriers that behave in a collective way, sometimes denoted as a "sea of electrons."

A quantum structure or circuit is a plurality of quantum interaction gates. A quantum computing core is a plurality of quantum structures. A quantum computer is a circuit having one or more computing cores. A quantum fabric is a collection of quantum structures, circuits, or interaction gates arranged in a grid like matrix where any desired signal path can be configured by appropriate configuration of access control gates placed in access paths between qdots and structures that make up the fabric.

In one embodiment, qdots are fabricated in low doped or undoped continuous depleted semiconductor wells. Note that the term 'continuous' as used herein is intended to mean a single fabricated well (even though there could be structures on top of them, such as gates, that modulate the local well's behavior) as well as a plurality of abutting contiguous wells fabricated separately or together, and in some cases might apparently look as somewhat discontinuous when 'drawn' using a computer aided design (CAD) layout tool.

The term classic or conventional circuitry (as opposed to quantum structures or circuits) is intended to denote conventional semiconductor circuitry used to fabricate transistors (e.g., FET, CMOS, BJT, FinFET, etc.) and integrated circuits using processes well-known in the art.

The term Rabi oscillation is intended to denote the cyclic behavior of a quantum system either with or without the presence of an oscillatory driving field. The cyclic behavior of a quantum system without the presence of an oscillatory driving field is also referred to as occupancy oscillation.

Throughout this document, a representation of the state of the quantum system in spherical coordinates includes two angles $\theta$ and $\varphi$. Considering a unitary sphere, as the Hilbert space is a unitary state, the state of the system is completely described by the vector $\Psi$. The vector $\Psi$ in spherical coordinates can be described in two angles $\theta$ and $\varphi$. The angle $\theta$ is between the vector $\Psi$ and the z-axis and the angle $\varphi$ is the angle between the projection of the vector on the XY plane and the x-axis. Thus, any position on the sphere is described by these two angles $\theta$ and $\varphi$. Note that for one qubit angle $\theta$ representation is in three dimensions. For multiple qubits $\theta$ representation is in higher order dimensions.

Semiconductor Processing

Regarding semiconductor processing, numerous types of semiconductor material exist such as (1) single main atom types, e.g., Silicon (Si), Germanium (Ge), etc., and (2) compound material types, e.g., Silicon-Germanium (SiGe), Indium-Phosphide (InP), Gallium-Arsenide (GaAs), etc.

A semiconductor layer is called intrinsic or undoped if no additional dopant atoms are added to the base semiconductor crystal network. A doped semiconductor layer is doped if other atoms (i.e. dopants) are added to the base semiconductor crystal. The type of layer depends on the concentration of dopant atoms that are added: (1) very low doped semiconductor layers having high resistivity, i.e. n-type denoted by n−− and p-type denoted by p−−, having resistivities above 100 Ohm·cm; (2) low doped semiconductor layers, i.e. p-type denoted with p− and n-type denoted with n−, having resistivities around 10 Ohm·cm; (3) medium doped layers, i.e. p for p-type and n for n-type; (4) high doped layers, i.e. p+ and n+; and (5) very highly doped layers, i.e. p++ and n++.

Note that introducing dopants in a semiconductor crystal likely results in defects that introduce energy traps that capture mobile carriers. Traps are detrimental for semiconductor quantum structures because they capture and interact with the quantum particles resulting in decoherence of the quantum information. For realizing semiconductor quantum structures undoped semiconductor layers are preferred.

Classic electronic devices use mostly low, medium, high and very highly doped semiconductor layers. Some layers are ultra-highly doped to behave as metals, such as the gate layer.

Semiconductor processing is typically performed on large semiconductor wafers which have a given thickness for mechanical stability. Circuitry is fabricated on a very thin layer on the top of the wafer where the unused thick portion of the wafer is termed the substrate. In a bulk process, devices are fabricated directly in the semiconductor body of the wafer.

An insulating layer (e.g., oxide) isolates from the substrate the devices used to create circuitry. Semiconductor on insulator process, e.g., silicon on insulator (SOI), uses a layer of insulator (e.g., oxide) between the thin top semiconductor layer where devices are realized and the substrate.

To improve circuit performance, the wafer is processed such that the devices are realized on top of an insulator substrate, e.g., semiconductor-on-glass, semiconductor-on-organic material, semiconductor-on-sapphire, etc.

Alternatively, the semiconductor substrate is eliminated and replaced with a nonelectrical conducting material such as a polymer or other material compatible with a semiconductor process (e.g., substrate-replacement processes). Substrate replacement in realizing semiconductor quantum structures significantly reduces or eliminates substrate decoherence.

High resistivity (i.e. very low doped) substrates are the next best substrate choice for semiconductor quantum structures. Although intrinsic substrates are also suitable for semiconductor quantum structures, there are specific limitations that prevent the use of intrinsic substrates.

Thus, in accordance with the invention, semiconductor quantum structures can be realized in (1) bulk processes, (2) SOI processes, (3) substrate replacement processes, or (4) semiconductor on other materials.

Regarding processing, (1) planar processes may be used where layers have predominantly one orientation, i.e. horizontal; and (2) three-dimensional processes (3D) allow layers with both horizontal and vertical orientation, realizing more complex 3D structures. It is appreciated that although layers are shown in the figures as rectangular prisms for simplicity, physically the layers have more complicated structures. For example, corners are often rounded and distortions are present due to the masking process. In depth dimension, layers tend to have a trapezoidal shape instead of the ideal rectangular one. The semiconductor quantum structures of the present invention can be realized in either planar or 3D processes.

Quantum Computing System

Figure 1:
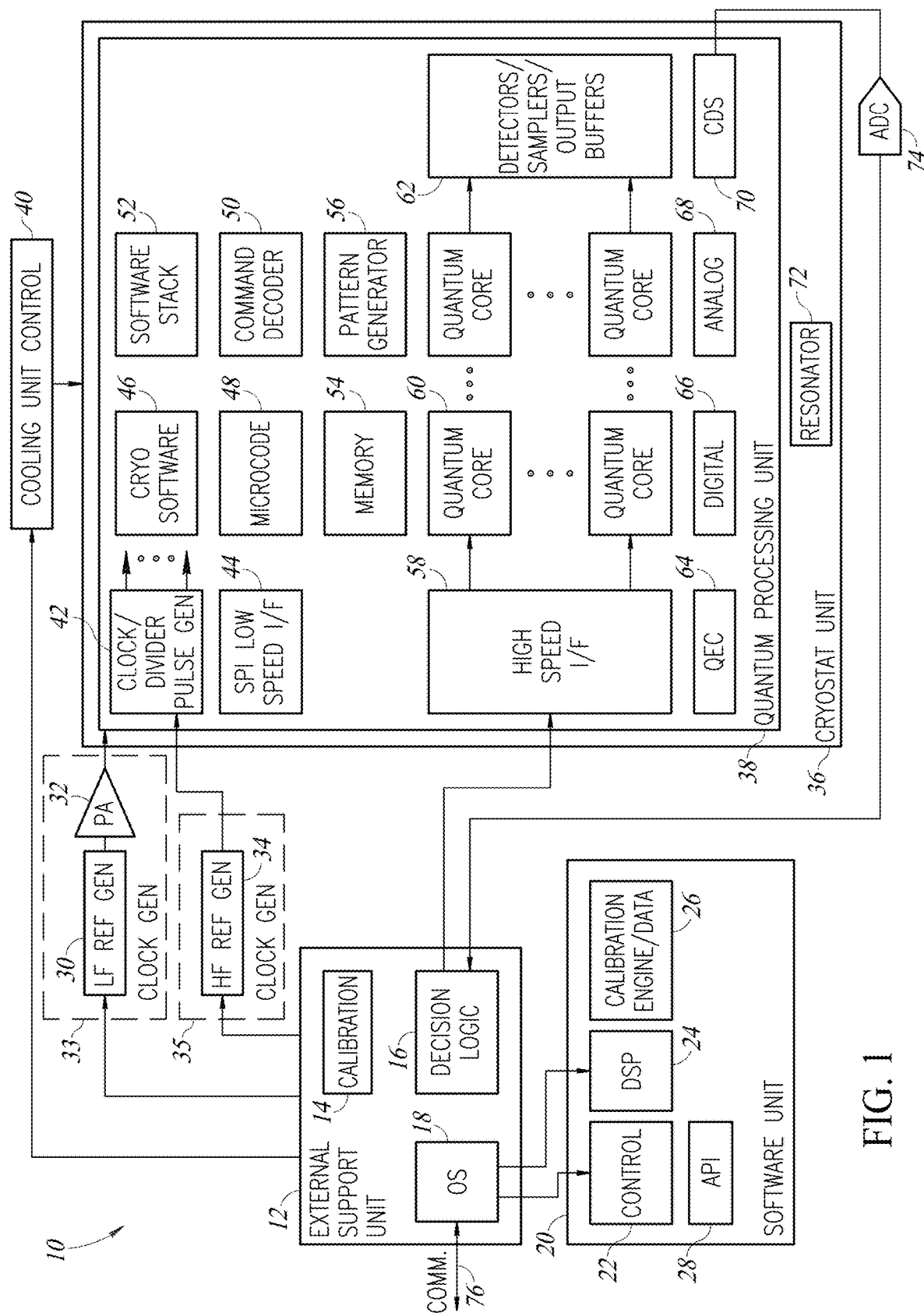
FIG. 1 is a high level block diagram illustrating an example quantum computer system constructed in accordance with the present invention.

A high-level block diagram illustrating a first example quantum computer system constructed in accordance with the present invention is shown in FIG. 1. The quantum computer, generally referenced 10, comprises a conventional (i.e. not a quantum circuit) external support unit 12, software unit 20, cryostat unit 36, quantum processing unit 38, clock generation units 33, 35, and one or more communication busses between the blocks. The external support unit 12 comprises operating system (OS) 18 coupled to communication network 76 such as LAN, WAN, PAN, etc., decision logic 16, and calibration block 14. Software unit 20 comprises control block 22 and digital signal processor (DSP) 24 blocks in communication with the OS 18, calibration engine/data block 26, and application programming interface (API) 28.

Quantum processing unit 38 comprises a plurality of quantum core circuits 60, high speed interface 58, detectors/samplers/output buffers 62, quantum error correction (QEC) 64, digital block 66, analog block 68, correlated data sampler (CDS) 70 coupled to one or more analog to digital converters (ADCs) 74 as well as one or more digital to analog converters (DACs, not shown), clock/divider/pulse generator circuit 42 coupled to the output of clock generator 35 which comprises high frequency (HF) generator 34. The quantum processing unit 38 further comprises serial peripheral interface (SPI) low speed interface 44, cryostat software block 46, microcode 48, command decoder 50, software stack 52, memory 54, and pattern generator 56. The clock generator 33 comprises low frequency (LF) generator 30 and power amplifier (PA) 32, the output of which is input to the quantum processing unit (QPU) 38. Clock generator 33 also functions to aid in controlling the spin of the quantum particles in the quantum cores 60.

The cryostat unit 36 is the mechanical system that cools the QPU down to cryogenic temperatures. Typically, it is made from metal and it can be fashioned to function as a cavity resonator 72. It is controlled by cooling unit control 40 via the external support unit 12. The cooling unit control 40 functions to set and regulate the temperature of the cryostat unit 36. By configuring the metal cavity appropriately, it is made to resonate at a desired frequency. A clock is then driven via a power amplifier which is used to drive the resonator which creates a magnetic field. This magnetic field can function as an auxiliary magnetic field to aid in controlling one or more quantum structures in the quantum core.

The external support unit/software units may comprise any suitable computing device or platform such as an FPGA/SoC board. In one embodiment, it comprises one or more general purpose CPU cores and optionally one or more special purpose cores (e.g., DSP core, floating point, etc.) that that interact with the software stack that drives the hardware, i.e. the QPU. The one or more general purpose cores execute general purpose opcodes while the special purpose cores execute functions specific to their purpose. Main memory comprises dynamic random access memory (DRAM) or extended data out (EDO) memory, or other types of memory such as ROM, static RAM, flash, and non-volatile static random access memory (NVSRAM), bubble memory, etc. The OS may comprise any suitable OS capable of running on the external support unit and software units, e.g., Windows, MacOS, Linux, QNX, NetBSD, etc. The software stack includes the API, the calibration and management of the data, and all the necessary controls to operate the external support unit itself.

The clock generated by the high frequency clock generator 35 is input to the clock divider 42 that functions to generate the signals that drive the QPU. Low frequency clock signals are also input to and used by the QPU. A slow serial/parallel interface (SPI) 44 functions to handle the control signals to configure the quantum operation in the QPU. The high speed interface 58 is used to pump data from the classic computer, i.e. the external support unit, to the QPU. The data that the QPU operates on is provided by the external support unit.

Non-volatile memory may include various removable/non-removable, volatile/nonvolatile computer storage media, such as hard disk drives that reads from or writes to non-removable, nonvolatile magnetic media, a magnetic disk drive that reads from or writes to a removable, nonvolatile magnetic disk, an optical disk drive that reads from or writes to a removable, nonvolatile optical disk such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like.

The computer may operate in a networked environment via connections to one or more remote computers. The remote computer may comprise a personal computer (PC), server, router, network PC, peer device or other common network node, or another quantum computer, and typically includes many or all of the elements described supra. Such networking environments are commonplace in offices, enterprise-wide computer networks, intranets and the Internet.

When used in a LAN networking environment, the computer is connected to the LAN via network interface 76. When used in a WAN networking environment, the computer includes a modem or other means for establishing communications over the WAN, such as the Internet. The modem, which may be internal or external, is connected to the system bus via user input interface, or other appropriate mechanism.

Computer program code for carrying out operations of the present invention may be written in any combination of one or more programming languages, including an object oriented programming language such as Java, Smalltalk, C++, C# or the like, conventional procedural programming languages, such as the "C" programming language, and functional programming languages such as Python, Hotlab, Prolog and Lisp, machine code, assembler or any other suitable programming languages.

Also shown in FIG. 1 is the optional data feedback loop between the quantum processing unit 38 and the external support unit 12 provided by the partial quantum data read out. The quantum state is stored in the qubits of the one or more quantum cores 60. The detectors 62 function to measure/collapse/detect some of the qubits and provide a measured signal through appropriate buffering to the output ADC block 74. The resulting digitized signal is sent to the decision logic block 16 of the external support unit 12 which functions to reinject the read out data back into the quantum state through the high speed interface 58 and quantum initialization circuits. In an alternative embodiment, the output of the ADC is fed back to the input of the QPU.

In one embodiment, quantum error correction (QEC) is performed via QEC block 64 to ensure no errors corrupt the read out data that is reinjected into the overall quantum state. Errors may occur in quantum circuits due to noise or inaccuracies similarly to classic circuits. Periodic partial reading of the quantum state function to refresh all the qubits in time such that they maintain their accuracy for relatively long time intervals and allow the complex computations required by a quantum computing machine.

It is appreciated that the architecture disclosed herein can be implemented in numerous types of quantum computing machines. Examples include semiconductor quantum computers, superconducting quantum computers, magnetic resonance quantum computers, optical quantum computers, etc. Further, the qubits used by the quantum computers can have any nature, including charge qubits, spin qubits, hybrid spin-charge qubits, etc.

In one embodiment, the quantum structure disclosed herein is operative to process a single particle at a time. In this case, the particle can be in a state of quantum superposition, i.e. distributed between two or more locations or charge qdots. In an alternative embodiment, the quantum structure processes two or more particles at the same time that have related spins. In such a structure, the entanglement between two or more particles could be realized. Complex quantum computations can be realized with such a quantum interaction gate/structure or circuit.

In alternative embodiments, the quantum structure processes (1) two or more particles at the same time having opposite spin, or (2) two or more particles having opposite spins but in different or alternate operation cycles at different times. In the latter embodiment, detection is performed for each spin type separately.

Figure 2:
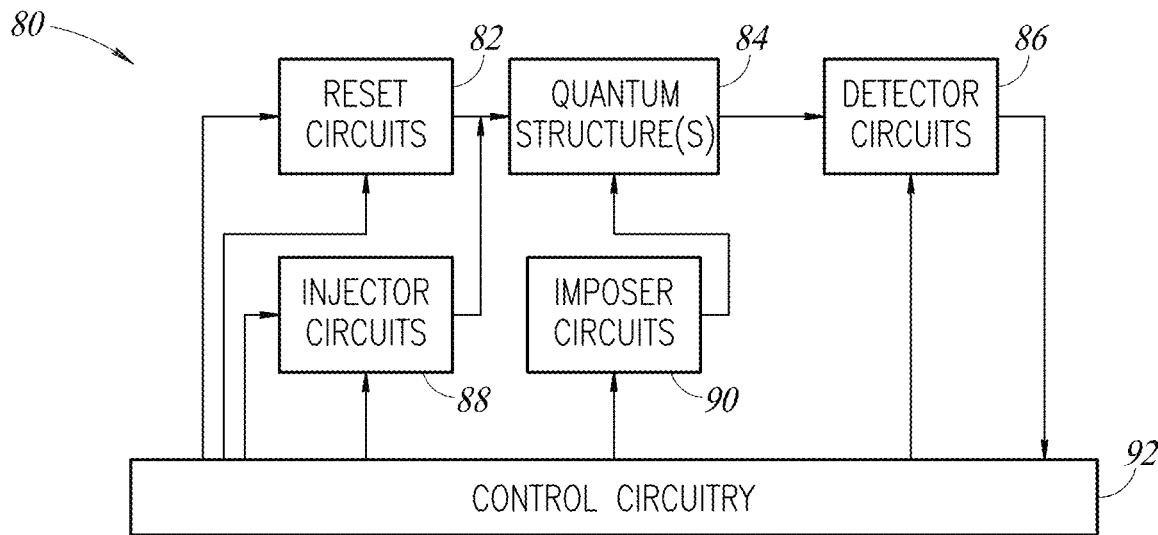
FIG. 2 is a high level block diagram illustrating a quantum structure and its interface using integrated electronic control circuitry.

A high level block diagram illustrating a generalized quantum structure interfaced to classical integrated electronic control circuitry is shown in FIG. 2. The example quantum circuit, generally referenced 80, comprises quantum structure 84 at its core, and support circuitry that in one embodiment is integrated on the same physical realized support or external on a different physical realized support. The support circuitry comprises reset circuits 82 for flushing the quantum structure of any available free carriers before starting the quantum operation and to prepare it for a new quantum operation, injector circuits 88 that function to inject one or more particles into the quantum core structure, imposer circuits 90 that control the quantum operation and the flow of the quantum computation between the injected particles, detector circuits 86 that sense whether a particle is present or not in the output qdots and the particles at the output points of the quantum structure after the quantum operation has been performed, and control circuitry 92. Note that in one embodiment, multiple such quantum structures/quantum cores can be interconnected and/or operated in parallel. Further note that the common electrical node of the reset circuit 82 output and the injector circuit 88 output can be the same as the electrical node of the detector circuit (86) input. In this case, the three circuits time-share their active operations.

To achieve quantum operation, physical structures must be cooled to cryogenic temperatures and be isolated as much as possible from environmental perturbations (e.g., external electric fields and/or magnetic fields, etc.). To perform quantum computing using particles in a semiconductor structure, the particles (e.g., electrons, holes, etc.) need to be able to be excited in quantum states and to stay in such states for a long enough time for the operation and measurement of the quantum operation to be realized. At higher temperatures, the thermal energy of the particle results in the decoherence of its quantum state.

In one embodiment, the semiconductor based quantum structure uses a continuous well with an imposing gate that generates a controlled local depletion region to separate two or more regions of the well that form quantum dots (qdots). By modulating the potential of the imposer gate, controlled tunneling through the local depleted region is enabled between the plurality of sections of the continuous well, realizing the function of a position/charge qubit. It is appreciated that more complex structures having a higher number of qdots per continuous well and a larger number of wells can be built using the techniques of the present invention. Both planar and 3D semiconductor processes can be used to build such well-to-well tunneling quantum structures. By combining a number of such elementary quantum structures/gates, a quantum computing machine is realized.

Quantum Operation

To aid in understanding the principles of the present invention, a brief explanation of quantum operation is presented below.

As stated supra, in classic electronics, the unit of information is a bit that can represent only one of the two states "0" and "1" at a given time. Computations in classical computers are performed sequentially and every bit can hold only one state at a time.

As stated supra, quantum electronics uses the quantum behavior of particles to perform computations. The unit of quantum information is a quantum bit or qubit. A qubit has two or more base states denoted by $\hat{0}$ and $\hat{1}$ (or $|0\rangle$ and $|1\rangle$) but in contrast with a classic bit, a qubit can be in a superposed state that contains some percentage 'a' of state $\hat{0}$, and some percentage 'b' of state $\hat{1}$, denoted by $a\hat{0}+b\hat{1}$. Since a qubit in quantum structures can simultaneously be in multiple superposed states, multiple sets of computations can be performed concurrently, resulting in large quantum computation speed-ups, when compared with classic computations.

A quantum particle is described by its position and/or spin. The particles used in quantum structures are called quantum particles. There are qubits based on the quantum position of the particles, also named charge-qubits, while other qubits use the spin of the quantum particles, also named spin-qubits. In quantum structures, the charge carriers are held in specific regions called quantum dots or qdots. A quantum structure is constructed from one or more qdots.

Performing a quantum computation involves several steps. First the structure needs to be reset, which means that all the free carriers (e.g., electrons or holes) from the structure need to be flushed out. Once the free carriers are removed, the structure is initialized meaning particles are introduced in one of the base states (e.g., $\hat{0}$ or $\hat{1}$). In the case of a charge-qubit (position-qubit) it means that a carrier is loaded in one of the qdots. A free carrier not coming from the quantum initialization process can interact with the quantum particles and result in decoherence, i.e. loss of quantum information. After the particles have been loaded in the corresponding base states they undergo the desired quantum operation under control of gate control terminals. Once the desired quantum operations are complete a detection is performed whereby the presence or absence of a particle in a given qdot at a given time is tested. Detection is usually destructive which means that the quantum particle's wavefunction and its state collapse. Special nondestructive detection/measurement exist that do not collapse the quantum state. In such cases, multiple measurements of the same quantum state can be performed.

The position of a quantum particle is given by the region where the particle wave-function is mostly present. In one embodiment, quantum structures use semiconductor qdots realized with semiconductor wells where the particle transport is done through tunneling which is a quantum effect. The tunneling or particle transport is controlled by control terminals. In one embodiment, the control terminals are realized using gates but they may comprise other semiconductor process layers.

Figure 3A:
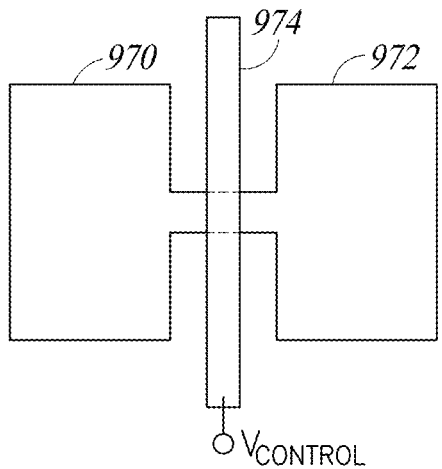
FIG. 3A is a diagram illustrating a quantum structure before initialization.

To illustrate, consider a generic position double qdot structure having a "dog bone" shape shown in FIG. 3A. The structure comprises a control gate 974 giving rise to two qdots 970, 972, that correspond to the |0> and |1> base states, or "left" and "right" base states, when an electrostatic particle happens to be there. Higher order position quantum structures can be realized having more than two base states and thus use more than two qdots. The particle transport from one qdot to the other is done through tunneling. Before initialization both qdots must be cleared of quantum particles since a reset flushes out all free carriers.

Note that a key difference between the classic and quantum structures/circuits is that the structure can not only be in the base states |0> and |1>, but also in a superposed position a|0>+b|1>, with a constraint $|a|^2+|b|^2=1$, meaning the particle is present simultaneously in both qdots of the structure. When the signal on the control terminal causes a lowering of the tunneling barrier, the particle initially loaded in the left qdot 970 will tunnel to the right qdot 972. The position of the particle and thus the corresponding quantum state is given by the pulse width of the signal $V_{control}$ applied to the control gate. If the pulse width is long enough, after the particle has tunneled to the right qdot 972 it will tunnel back to the left qdot 970 and then again to the right qdot 972 and the process repeats itself in an oscillatory fashion. The period of this oscillation, called the Rabi oscillation (especially in case of a time-dependent Hamiltonian), depends on the tunnel current and thus on the control signal $V_{control}$ applied and the configuration and process of the specific structure. The time needed for a particle to tunnel forward and then back to its initial position is called the Rabi period.

Figure 3C:
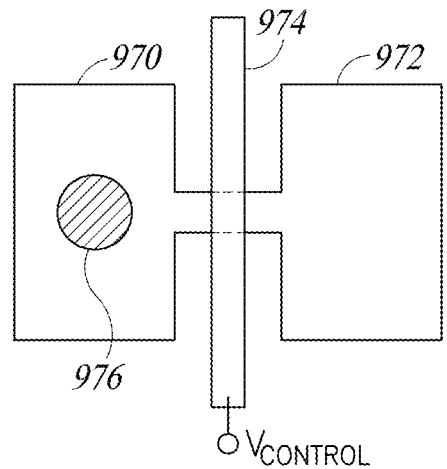
FIG. 3C is a diagram illustrating a quantum structure initialized to a first base state.
Figure 3B:
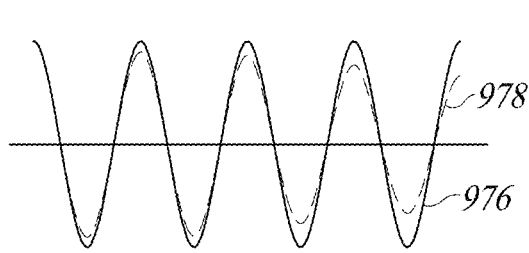
FIG. 3B is a diagram illustrating an example ideal and decoherence Rabi oscillation waveform.

The Rabi oscillation after reset but before initialization is shown in FIG. 3B where waveform 976 represents an ideal oscillation and waveform 978 represents oscillation with some amount of decoherence or leakage of wavefunction.

Figure 3D:
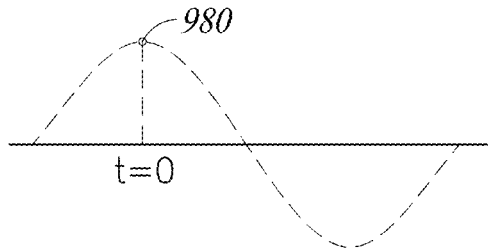
FIG. 3D is a diagram illustrating an example Rabi oscillation waveform at initialization.
Figure 3E:
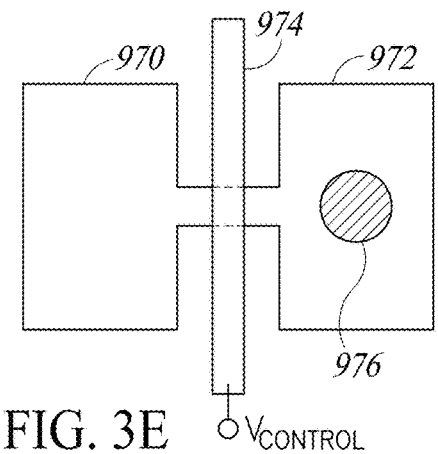
FIG. 3E is a diagram illustrating a quantum structure initialized to a second base state.

Consider a quantum particle 976 loaded in the left qdot 970 with a base state |0>, as shown in FIG. 3C. The Rabi oscillation waveform at initialization (dot referenced 980) is shown in FIG. 3D. In a horizontally oriented double qdot, a quantum particle 976 loaded in the right qdot 972 is considered in the base state |1>, as shown in FIG. 3E. Similarly, the up and down qdots correspond to the |0> and |1> base states in a vertically oriented double qdot. The control terminal (typically the gate) determines the height of the tunnel barrier. If the potential barrier is high then tunneling is blocked (i.e. negligible). On the other hand, if the potential barrier is low then tunneling is allowed and the particle moves from one qdot to the other, resulting in a change in quantum state.

Figure 3G:
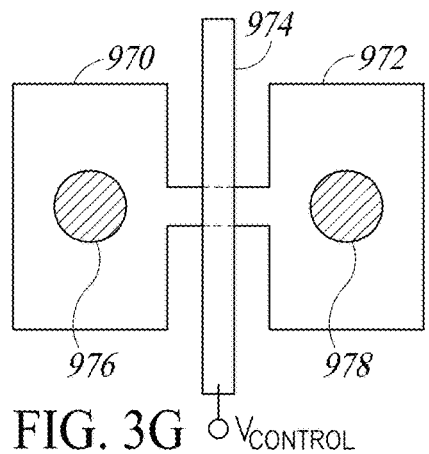
FIG. 3G is a diagram illustrating a quantum structure with a particle in two qdots at the same time.
Figure 3F:
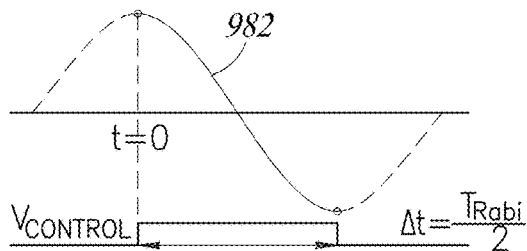
FIG. 3F is a diagram illustrating an example waveform having half the Rabi oscillation period.

If the control signal pulse width is equal to half the Rabi period as shown in FIG. 3F, then the particle will tunnel from the left qdot 970 to the right qdot 972, i.e. transition from the |0> base state to the |1> base state also known as a quantum inversion, trajectory of which is represented by waveform solid portion 982.

Figure 3H:
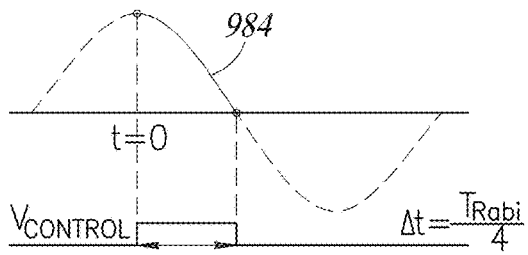
FIG. 3H is a diagram illustrating an example waveform having one quarter the Rabi oscillation period.

If the control pulse width is equal to one quarter of the Rabi period as represented by waveform solid portion 984 trajectory in FIG. 3H, then the particle will be present equally in the left qdot 970 and in the right qdot 972 as shown in FIG. 3G. This equal distribution quantum state is called the Hadamard state and is fundamental for quantum computation. The double qdot with a quarter Rabi period control signal performs the function of a fundamental Hadamard quantum gate. Considering the sinewave of an oscillatory effect, the Hadamard state corresponds to the zero crossings, while the peak of the positive cycle corresponds to the base state |0> and the peak of the negative cycle corresponds to the base state |1>. All points between the positive and negative peaks correspond to superposition states.

Figure 3I:
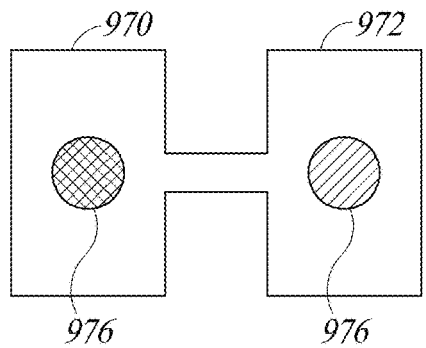
FIG. 3I is a diagram illustrating a first quantum structure with a particle split between two qdots at the same time.
Figure 3K:
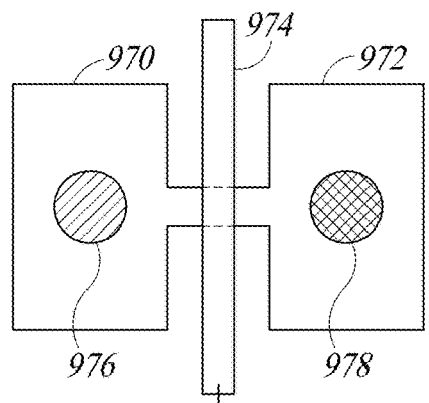
FIG. 3K is a diagram illustrating a second quantum structure with a particle split between two qdots at the same time.
Figure 3J:
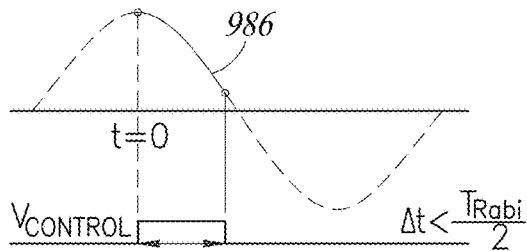
FIG. 3J is a diagram illustrating an example waveform having a period less than one quarter the Rabi oscillation period.
Figure 3L:
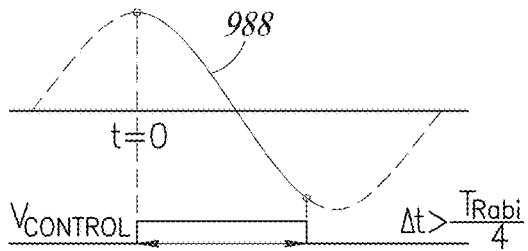
FIG. 3L is a diagram illustrating an example waveform having a period more than one quarter the Rabi oscillation period.

If the pulse width of the control signal is less than one quarter the Rabi period as represented by solid waveform portion 986 in FIG. 3J, then the quantum particle is split between the two qdots as shown in FIG. 3I but it will have a larger presence in the left qdot 970 versus the right qdot 972. Similarly, if the pulse width is larger than one quarter the Rabi period as represented by solid waveform portion 988 in FIG. 3L, than the quantum particle is split as shown in FIG. 3K but will have a larger presence in the right qdot 972.

If the position of the particle is represented as a vector of constant length in a circular coordinate system, a vector pointing up represents the |0> base state, while a vector pointing down represents the |1> base state. Any other position is a superposed state that constitutes a quantum rotation operation. As such the double qdot quantum structure with a variable control signal pulse width constitutes a controlled quantum rotation gate.

The initialization of a quantum structure is realized by an interface device (described in more detail infra) having one side connected to classical circuitry and the other side connected to quantum circuitry, i.e. half classic, half quantum. On the classic side, the carriers (e.g., electrons or holes) have a collective behavior, sometimes called a sea of electrons (or holes). On the quantum side, the carriers exhibit single charge carrier or a few carrier behavior and their interaction is based on the laws of quantum mechanics. Injecting exactly a single particle in the quantum structure at a given qdot can be realized through the tunneling effect in the interface device. Once a single particle has tunneled, the electric field changes such that it opposes the tunneling of a subsequent particle. Such behavior of the interface device is critical to be able to inject one or multiple single particles into one or multiple qdots of a given quantum structure.

The pulse width of the control signals can be digitally controlled on the classical side of the circuits and thus determine what kind of quantum operation is performed, resulting in a programmable quantum machine. In this case, the same hardware implementation is able to perform different quantum operations based on the specific control signal applied.

Note that each quantum particle injected into the quantum structure represents a qubit. In the position qubit at least two qdots are needed to implement a qubit. In the general case, structures with N qubits and M qdots can be constructed. The number of injectors, however, should be equal to N if all particles are injected at the same time, or it can be lower than N if the particles are injected at different times.

Figure 4A:
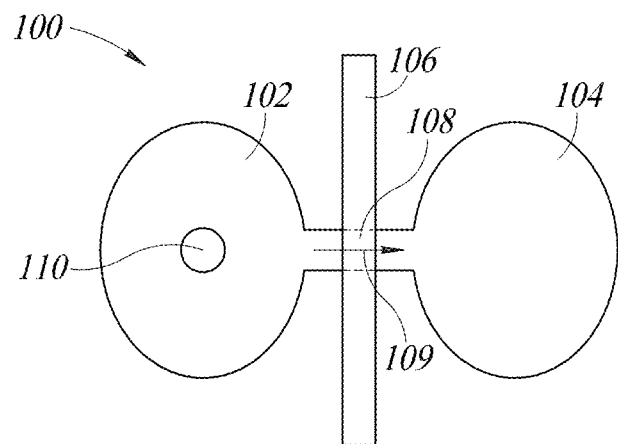
FIG. 4A is a diagram illustrating a circular shaped quantum structure incorporating local depleted well tunneling.

A diagram illustrating a circular shaped semiconductor quantum structure incorporating local depleted well tunneling is shown in FIG. 4A. The quantum structure, generally referenced 100, comprises a continuous well with a local depleted region with a control gate 106 fabricated over it that functions to separate the well into two or more portions each implementing a qdot. In this example, the continuous well is split into two qdots 102, 104 with a tunneling path 108 formed between them for the quantum particle 110, e.g., electron, to tunnel through. The tunneling path 108 is considered to effectively connect the two wells 102 and 104 in a quantum manner. The quantum operation is controlled by the gate 106 fabricated over the tunneling path 108. The gate functions to modulate the energy barrier created by the local depleted region. The two sections of the well, the tunneling path with the local depleted region, and the control gate can take any number of different shapes (described infra) allowed by the particular semiconductor process used (planar or 3D).

In one embodiment, the two qdots 102, 104 are linked by a region 108 that is partially or completely locally depleted and in which tunneling occurs as indicated by arrow 109 through the tunneling path. The control gate typically overlaps the tunneling path in order to maintain well-controlled depletion of the entire linking region between the two qdots. This prevents direct electric conduction between the two qdots.

The depletion region is required for quantum operation of the structure. If there were no depletion region, the operation would revert to a classical transistor operation in on/off modes and the particle can normally move from one side to the other. Note that the probability of a particle tunneling through the depletion region is approximately exponentially linked to the width of the depletion region. If the depletion region is very narrow, the particle will tunnel and the quantum operation is achieved. If the depletion region is wide, then there is no tunneling or the tunneling is so weak that it can be neglected. This is also dependent on the tunneling barrier height. For a p-type semiconductor material, placing a positive potential on the gate will repel the holes and create a depletion region. Note that the voltage is necessarily lower than the level that results in the creation of an inversion channel.

The control signals that need to be applied to the gate depend on whether the semiconductor material is p or n type. Consider for example p-type semiconductor material, with no potential on the gate, the particle may be free to tunnel. Placing a positive potential on the gate will repel the particles (i.e. holes) and create the depletion region thereby hindering tunneling. If the potential on the gate is removed or brought closer to zero to zero or made negative, the particles are permitted to tunnel in relation to the potential applied. The operation of the quantum structure is significantly different than that of a conventional transistor.

In one embodiment, the two qdots 102, 104 are realized by a single semiconductor well having a polysilicon gate on top. The tunneling happens laterally or horizontally through the depleted region that isolates the two qdots.

Note also that in one embodiment the well is surrounded by oxide, isolating layers, and/or one or more wide depletion regions that prevent the quantum particle from escaping from the well.

Figure 4B:
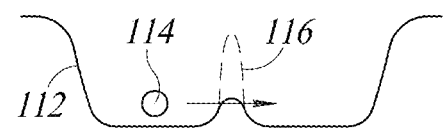
FIG. 4B is a diagram illustrating the change in the aperture tunnel barrier from a wide depletion region to a narrow depletion region.

A diagram illustrating the change in the aperture tunnel barrier from a wide depletion region to a narrow depletion region is shown in FIG. 4B. To contain or trap the quantum particle 114, the barrier potential 112 between the two wells is made high (dashed line 116). Lowering the barrier potential between the two wells (solid line below the dashed line) enables the quantum particle to tunnel from one qdot to the other.

Figure 4C:
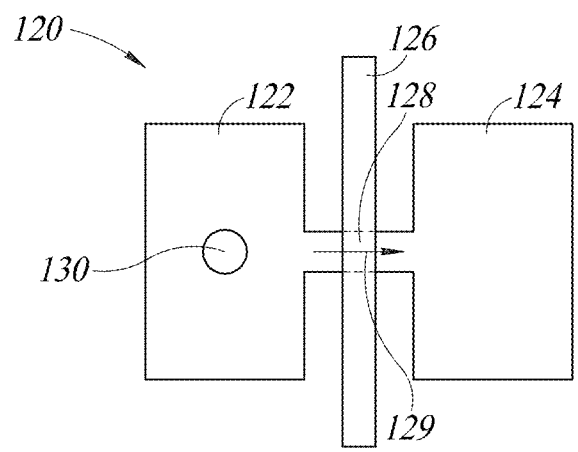
FIG. 4C is a diagram illustrating a first rectangular shaped quantum structure incorporating local depleted well tunneling.

A diagram illustrating a first rectangular shaped semiconductor quantum structure incorporating local depleted well tunneling is shown in FIG. 4C. The quantum structure, generally referenced 120, is similar to structure 100 of FIG. 4A apart from the dog bone shape of the continuous local depleted well. Control gate 126 is fabricated over the well and functions to separate the well into two qdots 122, 124 with tunneling path 128 formed between them for the quantum particle 130 to tunnel through. The quantum operation is controlled by the gate 126 fabricated over the tunneling path 128. The gate functions to modulate the barrier created by the local depleted region.

The two qdots 122, 124 are linked by a region 128 that is partially or completely locally depleted and in which tunneling occurs as indicated by arrow 129 through the tunneling path. The control gate typically overlaps the tunneling path in order to maintain well-controlled depletion of the entire linking region between the two Qdots. This prevents direct electric conduction between the two qdots.

Figure 4D:
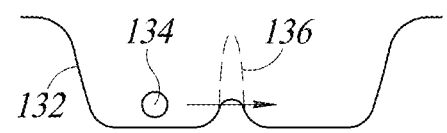
FIG. 4D is a diagram illustrating the change in the aperture tunnel barrier from a wide depletion region to a narrow depletion region.

A diagram illustrating the change in the aperture tunnel barrier from a wide depletion region to a narrow depletion region is shown in FIG. 4D. To contain or trap the quantum particle 134, the barrier potential 132 between the two wells is made high (dashed line 136). Lowering the barrier potential (solid line) enables the quantum particle to tunnel from one qdot to the other.

Figure 5:
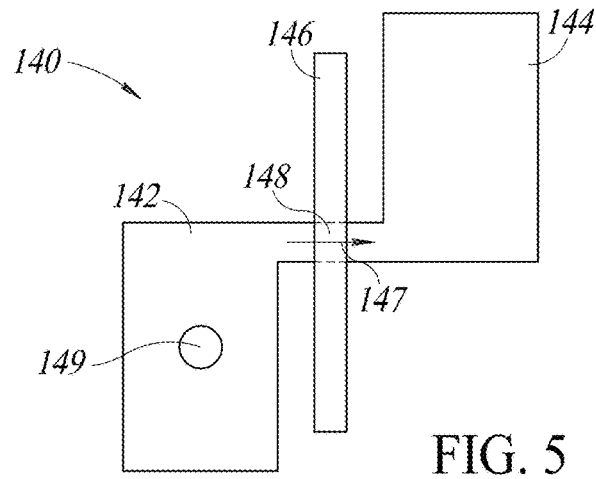
FIG. 5 is a diagram illustrating a second rectangular shaped quantum structure incorporating local depleted well tunneling.

A diagram illustrating a second rectangular shaped semiconductor quantum structure incorporating local depleted well tunneling is shown in FIG. 5. The quantum structure, generally referenced 140, is similar to structure 100 of FIG. 4A apart from the 'S' shape of the continuous well with local depleted region. Control gate 146 is fabricated over the well and functions to separate the well into two qdots 142, 144 with tunneling path 148 formed between them for the quantum particle 149 to tunnel through. The quantum operation is controlled by the gate 146 fabricated over the tunneling path 148. The gate functions to modulate the barrier created by the local depleted region.

The two qdots 142, 144 are linked by a region 148 that is partially or completely locally depleted and in which tunneling occurs as indicated by arrow 147 through the tunneling path. The control gate typically overlaps the tunneling path in order to maintain well-controlled depletion of the entire linking region between the two Qdots. This prevents direct electric conduction between the two qdots.

Figure 6:
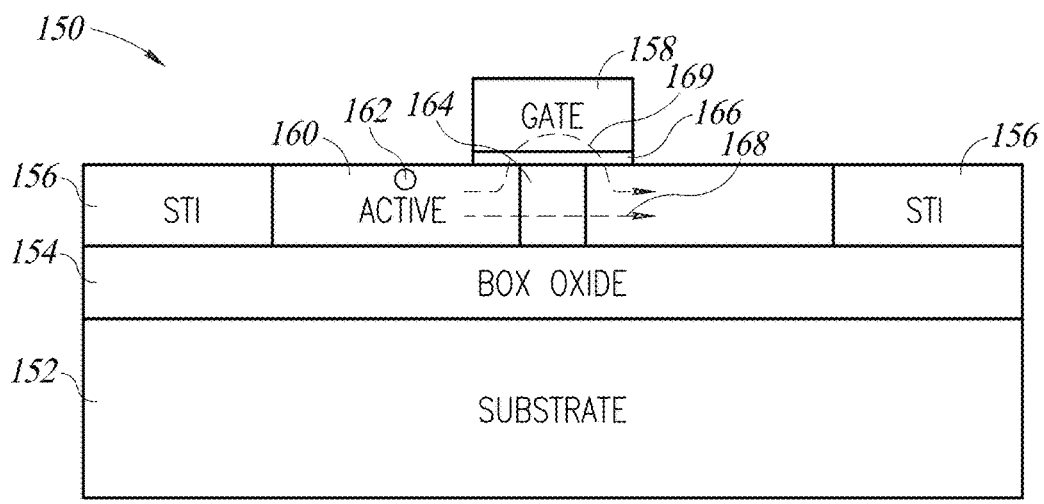
FIG. 6 is a diagram illustrating a cross section of an example quantum structure.

A diagram illustrating a cross section of an example semiconductor quantum structure 150 is shown in FIG. 6. An exemplary cross section in a silicon-on-insulator (SOI) process is shown in which the substrate 152 is low doped (i.e. high resistivity) and is isolated from the quantum device with a buried oxide layer (BOX) 154. This reduces the decoherence of the quantum particle. In one embodiment, the semiconductor quantum device employs tunneling through the local depleted region. In another embodiment, tunneling occurs through the oxide layer between the semiconductor well 160 (low doped or undoped) and the partially overlapping gate 158 and oxide layer 166. The active layer 160 is isolated using oxide from adjacent structures, e.g., shallow trench isolation (STI) 156, reducing further the quantum particle decoherence.

Note that the substrate may comprise (1) a semiconductor, (2) silicon on insulator (SOI) substrate, where the substrate comprises sapphire, glass, organic material, etc., (3) an insulating substrate replacement, for example, sapphire, glass, organic material, plastic, polymer, etc., or (4) any other insulating material compatible with a semiconductor process.

Note that regardless of the substrate used, the quantum structure must be electrically isolated from the substrate for the structure to operate properly. Otherwise, the quantum particle may escape thus preventing quantum operation of the structure.

Several ways to electrically isolate the quantum structure include: (1) utilizing an SOI or low doped substrate where the oxide layer electrically isolates the quantum structure from the substrate; (2) using substrate replacement such as an insulator material, e.g., polymer, glass, etc.; and (3) using a fixed depletion region, as the quantum particle can tunnel only through a relatively narrow insulating region such as very thin oxide or a thin depletion region. If the depletion region is too wide, the quantum particle is prevented from traveling. Note that this last option can be fabricated using bulk processes.

The quantum operation is controlled by the gate located over the tunneling path that modulates the barrier created by the local depletion region.

In one embodiment, a low doped substrate interacts with the quantum particle with far and weak interactions. Tunneling of the quantum particle 162 occurs in region 164 between the two qdots formed in the active layer 160 and the tunnel path may be straight through from one qdot to the other (see dashed arrow 168) or may take a path through the gate and back to the active layer (see dashed arrow 169). Alternatively, the substrate may comprise a substrate replacement that includes non-conducting material, e.g., polymer, glass, sapphire, without free charge or ions that can interact with the quantum particle.

In both cases, the active well is preferably isolated on all sides (i.e. typically with oxide) where the particles are permitted to travel only through a narrow link where tunneling occurs.

Alternatively, bulk semiconductor processes are used where the substrate 152 is isolated from the quantum device using a large depleted region under the quantum gate instead of BOX. In another alternative embodiment, the quantum device is placed directly into the substrate. The quantum device can be isolated laterally from other devices using oxide layers 156 (e.g., STI or another preferably low doped well). In another alternative embodiment, a bulk semiconductor quantum structure replaces the substrate with an isolator material 152 having no free carriers or ions that can interact with the quantum particle. In an alternative embodiment, a substrate replacement process or a semiconductor on insulator process can also be used.

The cross section 150 shows the quantum structure with well-to-well tunneling through the local depleted region. It is noted that if the depleted region 164 is wide, then no or negligible tunneling 168 is present. If under the control of the gate the tunneling barrier is lowered and the depletion region gets narrower, a sizeable tunneling current may occur, resulting in the quantum particle tunneling from one qdot to the other.

Note that tunneling is also possible from the well to the gate and then from the gate to the adjacent well, bypassing the local depleted area (arrow 169). The width of the depleted area, however, can be made narrower than the thin gate oxide and thus the predominant tunneling can be made to be through the local depleted region.

In some cases, the gate oxide thickness is reduced using special materials such as hafnium oxide. The tunneling barrier height, however, is still high and tunneling is likely to happen through the depletion layer.

In accordance with the present invention, the quantum structure may comprise numerous shapes and sizes constrained only by design rule check (DRC) of the particular semiconductor process used to fabricate the structure. Several examples of quantum structure shapes, e.g., circles, squares, rectangles, polygons, etc. will now be described. In each case, these shapes can be used for the constituent layers and for one or more qdots making up the quantum structure.

A double qdot quantum structure which is the elementary structure for position qubit quantum computing contains two quantum dots and a tunneling path (often narrow) between them.

Quantum Structure Shapes

Figure 7A:
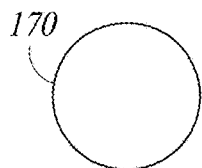
FIG. 7A is a diagram illustrating an example circular shape for the quantum structure of the present invention.
Figure 7B:
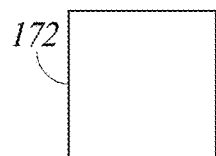
FIG. 7B is a diagram illustrating an example square shape for the quantum structure of the present invention.
Figure 7C:
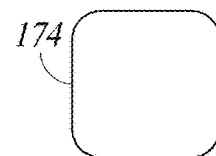
FIG. 7C is a diagram illustrating an example square shape with rounded corners for the quantum structure of the present invention.
Figure 7D:
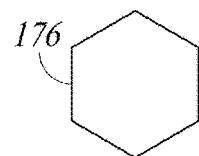
FIG. 7D is a diagram illustrating an example hexagonal shape for the quantum structure of the present invention.
Figure 7E:
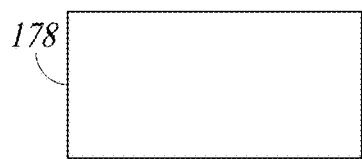
FIG. 7E is a diagram illustrating an example rectangular shape for the quantum structure of the present invention.

A diagram illustrating an example circular shape 170 for the quantum structure of the present invention is shown in FIG. 7A. A diagram illustrating an example square shape 172 for the quantum structure of the present invention is shown in FIG. 7B. A diagram illustrating an example square shape with rounded corners 174 for the quantum structure of the present invention is shown in FIG. 7C. A diagram illustrating an example hexagonal shape 176 for the quantum structure of the present invention is shown in FIG. 7D. A diagram illustrating an example rectangular shape 178 for the quantum structure of the present invention is shown in FIG. 7E.

Figure 7F:
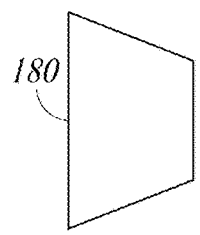
FIG. 7F is a diagram illustrating an example trapezoidal shape for the quantum structure of the present invention.
Figure 7G:
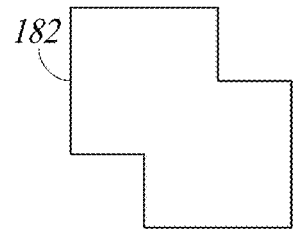
FIG. 7G is a diagram illustrating a first example overlapping square shape for the quantum structure of the present invention.
Figure 7H:
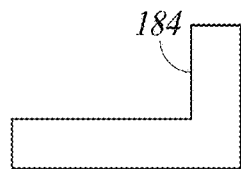
FIG. 7H is a diagram illustrating a first example 'L' shape for the quantum structure of the present invention.
Figure 7I:
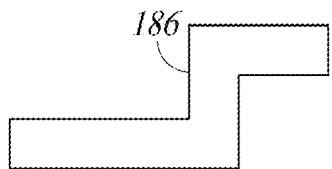
FIG. 7I is a diagram illustrating an example 'Z' shape for the quantum structure of the present invention.
Figure 7J:
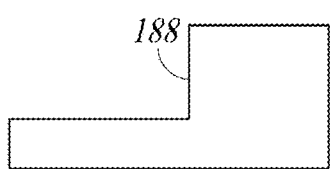
FIG. 7J is a diagram illustrating a second example 'L' shape for the quantum structure of the present invention.

A diagram illustrating an example trapezoidal shape 180 for the quantum structure of the present invention is shown in FIG. 7F. A diagram illustrating a first example overlapping square shape 182 for the quantum structure of the present invention is shown in FIG. 7G. A diagram illustrating a first example 'L' shape 184 for the quantum structure of the present invention is shown in FIG. 7H. A diagram illustrating an example 'S' shape 186 for the quantum structure of the present invention is shown in FIG. 7I. A diagram illustrating a second example 'L' shape 188 for the quantum structure of the present invention is shown in FIG. 7J.

Figure 7K:
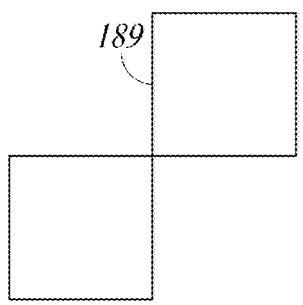
FIG. 7K is a diagram illustrating an example barely touching square shape for the quantum structure of the present invention.

A diagram illustrating an example barely touching squares shape 189 for the quantum structure of the present invention is shown in FIG. 7K. Note that in this example shape and others it is preferable that the squares overlap as little as possible since it is desirable to have as narrow a tunneling region as possible to maximize control. A large tunneling area is more difficult to control and to deplete sufficiently to prevent partial or complete tunneling.

Figure 7L:
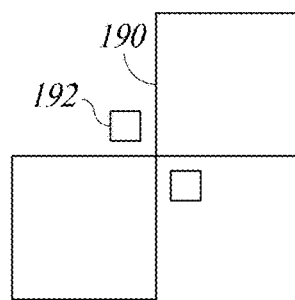
FIG. 7L is a diagram illustrating an example barely touching square shape with optical proximity control for the quantum structure of the present invention.
Figure 7M:
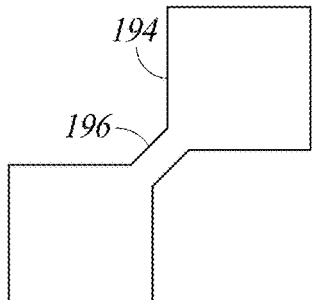
FIG. 7M is a diagram illustrating an example double square with narrow neck shape for the quantum structure of the present invention.
Figure 7N:
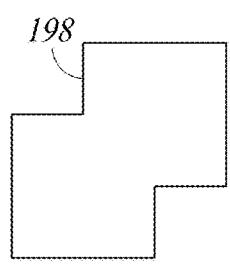
FIG. 7N is a diagram illustrating a second example overlapping square shape for the quantum structure of the present invention.
Figure 7O:
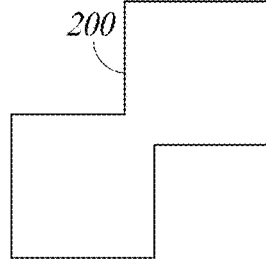
FIG. 7O is a diagram illustrating a third example overlapping square shape for the quantum structure of the present invention.

A diagram illustrating an example barely touching square shape 190 with optical proximity control 192 for the quantum structure of the present invention is shown in FIG. 7L. A diagram illustrating an example double squares 194 with narrow neck 196 shape for the quantum structure of the present invention is shown in FIG. 7M. A diagram illustrating a second example overlapping square shape 198 for the quantum structure of the present invention is shown in FIG. 7N. A diagram illustrating a third example overlapping square shape 200 for the quantum structure of the present invention is shown in FIG. 7O.

Figure 7P:
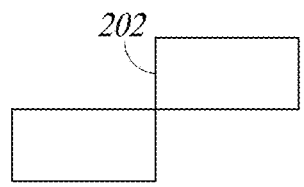
FIG. 7P is a diagram illustrating an example barely touching rectangular shape for the quantum structure of the present invention.
Figure 7Q:
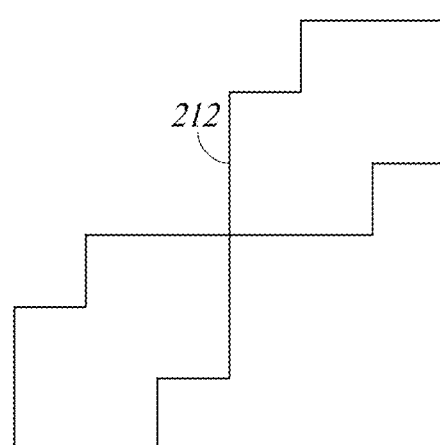
FIG. 7Q is a diagram illustrating an example barely touching double overlapping square shape for the quantum structure of the present invention.
Figure 7R:
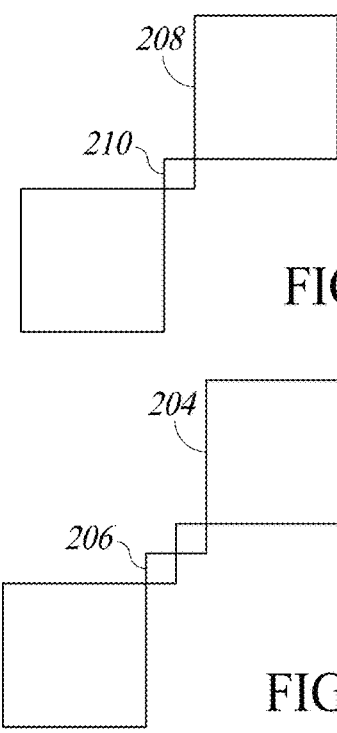
FIG. 7R is a diagram illustrating an example double square connected via single smaller square shape for the quantum structure of the present invention.
Figure 7S:
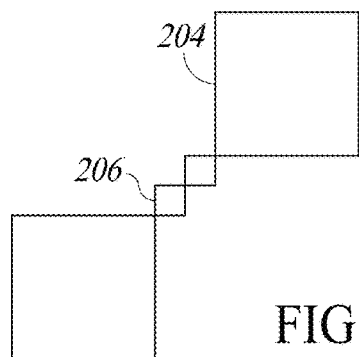
FIG. 7S is a diagram illustrating an example double square connected via double smaller square shape for the quantum structure of the present invention.

A diagram illustrating an example barely touching rectangular shape 202 for the quantum structure of the present invention is shown in FIG. 7P. A diagram illustrating an example barely touching double overlapping squares shape 222 for the quantum structure of the present invention is shown in FIG. 7Q. A diagram illustrating an example double squares connected via single smaller square shape 208 for the quantum structure of the present invention is shown in FIG. 7R. A diagram illustrating an example double squares connected via double smaller squares shape 204 for the quantum structure of the present invention is shown in FIG. 7S.

Several alternative ways of imposing the potential on the control gate will now be described. For illustration purposes only, double overlapping square shapes are used for the qdots. It is appreciated that other shapes may be used with each technique without departing from the scope of the invention. Note that the width of the tunneling section of the continuous well in each case is preferably as small as possible, but can vary in size based on the given DRC of the semiconductor process used.

Control Gate

A diagram illustrating a first example control gate for the quantum structure of the present invention is shown in FIG. 8A. The quantum structure, generally referenced 220, comprises a floating control gate 226 with an adjacent gate 222 that is in close proximity thereto that imposes potential to the gate 226 of the double overlapping square shaped qdots 224 with tunnel path 228. Note that changing the potential of the overlapping control gate is operative to modulate the tunnel barrier height.

A diagram illustrating a second example control gate for the quantum structure of the present invention is shown in FIG. 8B. The quantum structure, generally referenced 230, comprises a metal control gate 232 imposing on the floating control gate 234 using adjacent or overlap positioning over the control gate 234 of the double overlapping square shaped qdots 236 with tunnel path 238.

A diagram illustrating a third example control gate for the quantum structure of the present invention is shown in FIG. 8C. The quantum structure, generally referenced 240, comprises a contact 244 from a metal feed 242 to a control gate 246 over double overlapping square shaped qdots 248 with tunnel path 249. The control gate is driven directly with an electrical signal (e.g., pulsed electric signal).

Quantum Structures With Control Gates

As described supra, the quantum structure may comprise numerous shapes and sizes constrained only by design rule check (DRC) of the particular semiconductor process used to fabricate the structure. Several examples of quantum structures having one or more control gates will now be described. It is important to note that there is a difference between the shapes drawn in the figures and the physical realized shapes. Further, several factors such as the semiconductor process used contribute to determining the physical shapes realized. Note also that in most cases, the link channel is mandatory for the quantum structures employing tunneling through the depletion region. The link channel, however, may not be present on the layers drawn in the figures.

Each semiconductor quantum structure disclosed uses well-to-well tunneling through a local depleted region. In order to exercise good control over the tunneling effect, the tunneling path section of the well is preferably relatively narrow when compared with the dimensions of the rest of the well that constitutes the qdots. A gate is placed on top of the tunneling path section of the well in which the local depleted region is induced. A complete overlap of the control gate on the tunneling path is preferable in order to have good control over the entire width of the tunneling path and achieve reliable isolation between the two or more sections of the continuous well that implements the quantum dots. The potential on the control gate functions to modulate the width of the local depletion region and to control the tunneling between the two adjacent sections of the well that represent two separate qdots (i.e. well-to-well tunneling). As described supra, this potential is imposed, for example, by another metal layer with no contact to gate 226 (i.e. a floating gate) as shown in FIG. 8A or with a metal layer contacted to the gate (i.e. directly driven gate) as shown in FIG. 8C. The overlapping gate is positioned such that a smaller overlap with the two adjacent sections of the well is realized resulting in a larger Coulomb blockade voltage.

Figure 9J:
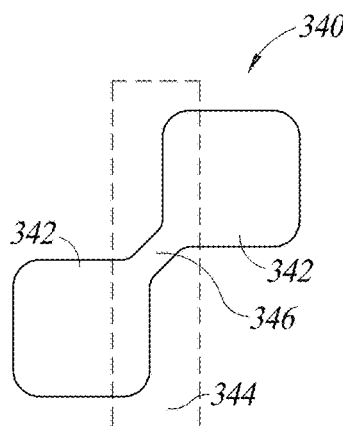
FIG. 9J is a diagram illustrating an example quantum structure with double rounded square with narrow neck shape.
Figure 9K:
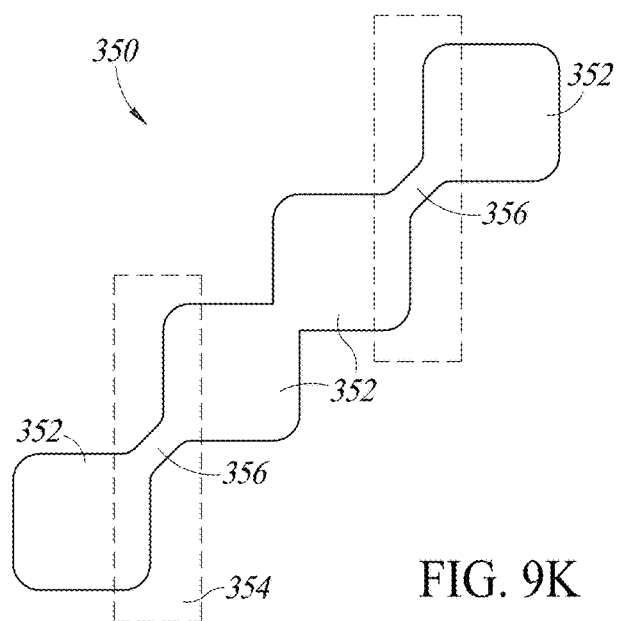
FIG. 9K is a diagram illustrating an example quantum structure with an overlapping pair of double rounded squares with narrow neck shape.
Figure 9L:
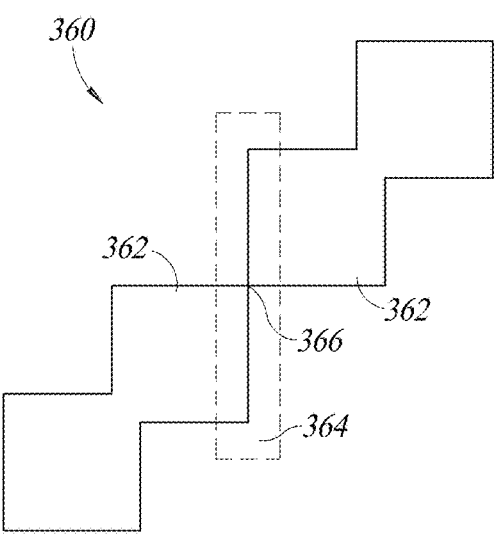
FIG. 9L is a diagram illustrating a first example quantum structure with a pair of barely touching double overlapping square shape.
Figure 9M:
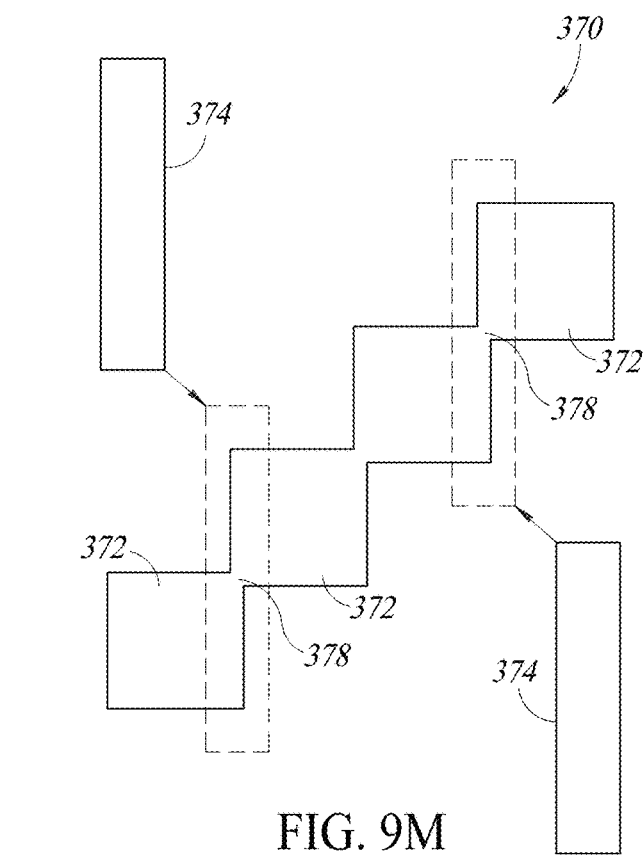
FIG. 9M is a diagram illustrating a second example quantum structure with a pair of barely touching double overlapping square shape.
Figure 9N:
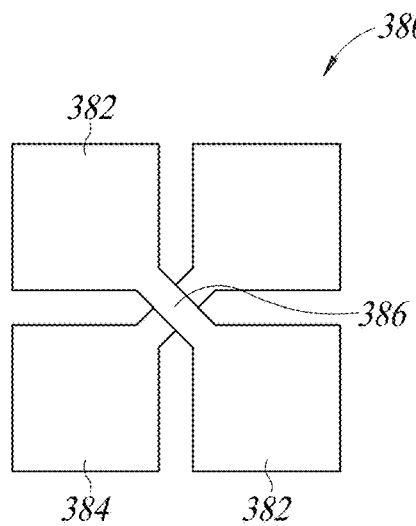
FIG. 9N is a diagram illustrating a first example quantum structure with a double square shape with narrow neck and butterfly shaped control gate.
Figure 9O:
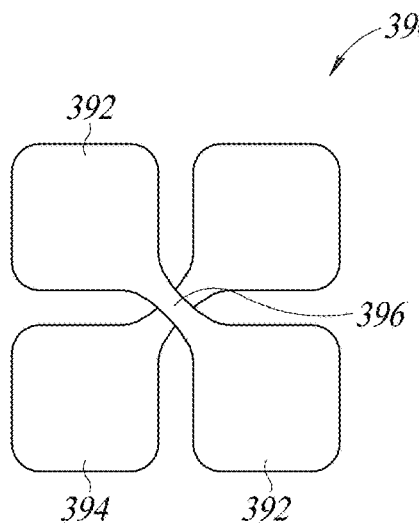
FIG. 9O is a diagram illustrating a second example quantum structure with a double square shape with narrow neck and butterfly shaped control gate.
Figure 9P:
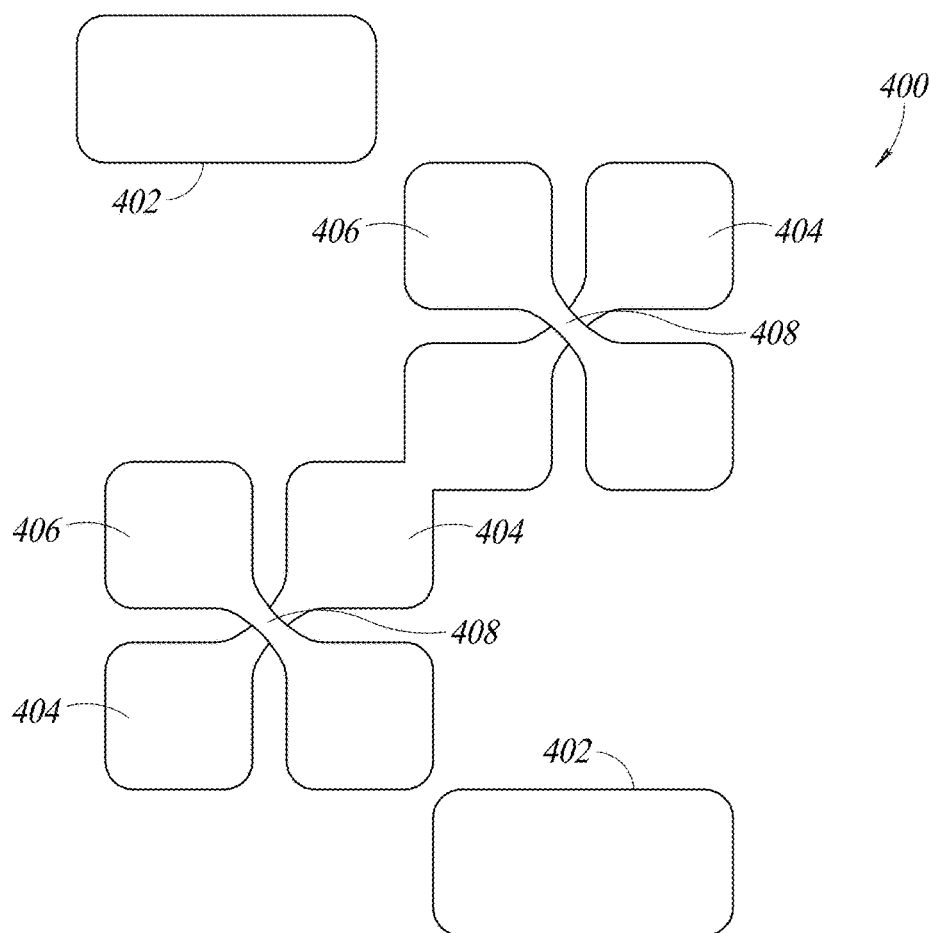
FIG. 9P is a diagram illustrating an example quantum structure with a pair of overlapping double square shapes with narrow neck and butterfly shaped control gates.
Figure 9W:
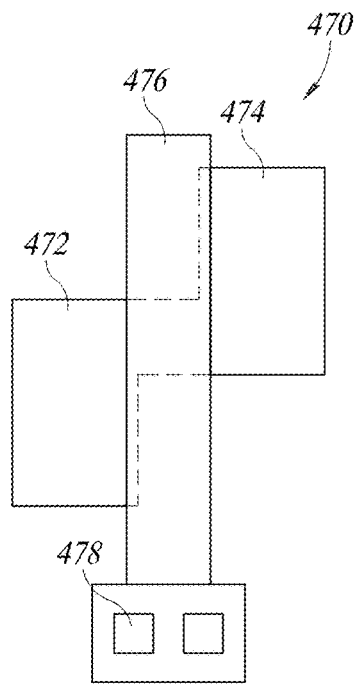
FIG. 9W is a diagram illustrating a first example quantum structure with spaced apart rectangular shaped wells offset from each other.
Figure 9X:
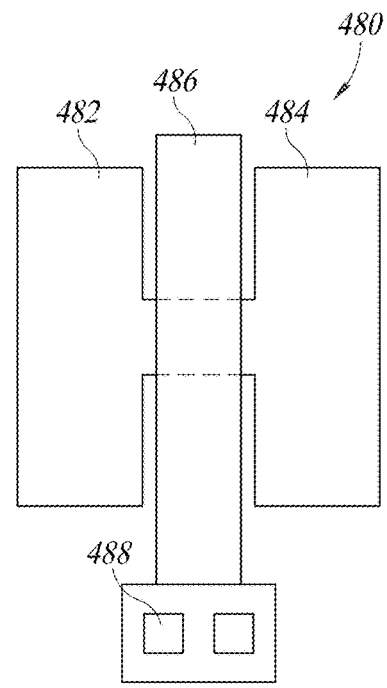
FIG. 9X is a diagram illustrating a second example quantum structure with spaced apart rectangular shaped wells.
Figure 9Y:
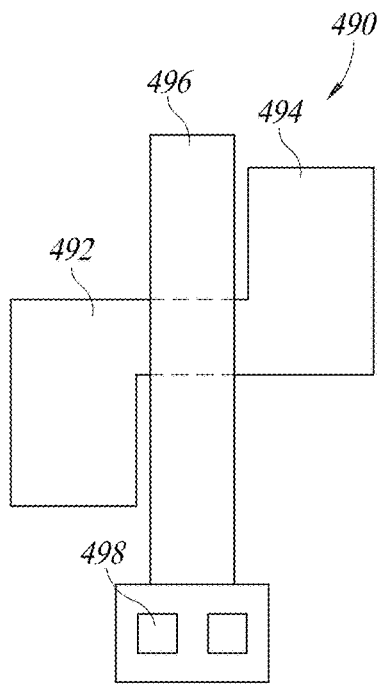
FIG. 9Y is a diagram illustrating a second example quantum structure with spaced apart rectangular shaped wells offset from each other.
Figure 9Z:
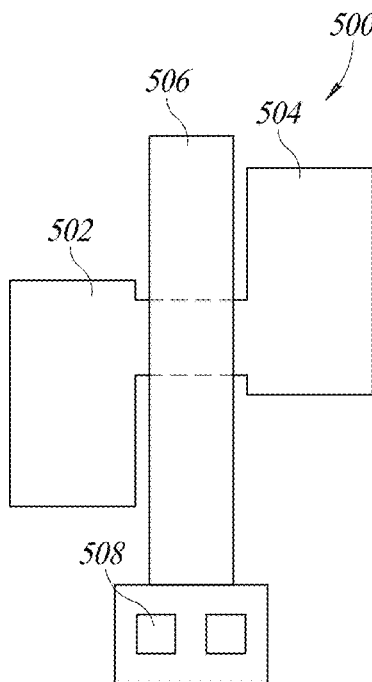
FIG. 9Z is a diagram illustrating a third example quantum structure with spaced apart rectangular shaped wells offset from each other.
Figure 9A:
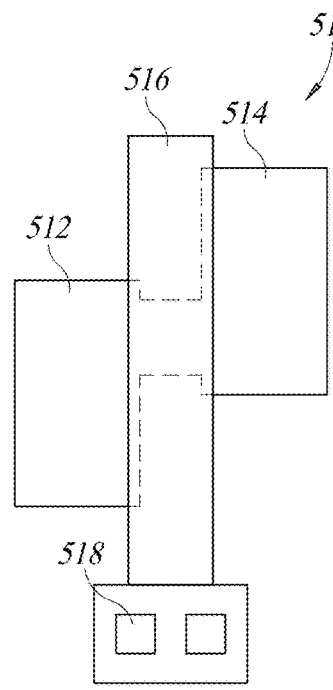
FIG. 9A is a diagram illustrating an example quantum structure with double square shape.
Figure 9A:
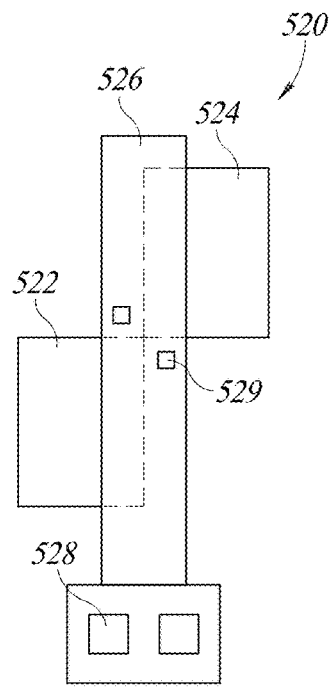

A diagram illustrating an example quantum structure with double square corner touching shape is shown in FIG. 9A. The quantum structure, generally referenced 250, comprises a continuous well with control gate 254 placed over edge portions 251, 253 of the square shapes to form two qdot regions 252.

A diagram illustrating an example quantum structure with double square shape and optical proximity control is shown in FIG. 9B. The quantum structure, generally referenced 260, comprises a continuous well with control gate 264 placed over edge portions of the square shapes to form two qdot regions 262. Optical proximity control 266 is used to improve the tunnel path. As is known in the semiconductor processing arts, optical proximity correction can be used within the vicinity of the local depleted tunneling well to aid in improving the resulting structures fabricated on the substrate. Note that optical proximity correction techniques may be used with any of the structures disclosed in this document to improve the resulting structures. Note that the squares 266 shown only exist on one or more masks used in the fabrication of the structure and do not reflect any structures actually built on the substrate. These squares, however, typically have an effect on the shape of such structures constructed nearby. The desired effects include width and length adjustments of the tunneling path.

Note that in general, nanometer semiconductor processes natively yield distortions around corners and the narrow features. Optical correction helps realize physical shapes close to the desired shapes.

A diagram illustrating an example quantum structure with double square and narrow neck shape is shown in FIG. 9C. The quantum structure, generally referenced 270, comprises a continuous well with control gate 274 placed over narrow tunnel path 276 and edge portions of the square shapes to form two qdot regions 272.

A diagram illustrating a first example quantum structure with double overlapping square shape is shown in FIG. 9D. The quantum structure, generally referenced 280, comprises a continuous well with control gate 284 placed over narrow tunnel path 286 (but wider than tunnel path 296 in FIG. 9E) and edge portions of the square shapes to form two qdot regions 282.

A diagram illustrating a second example quantum structure with double overlapping square shape is shown in FIG. 9E. The quantum structure, generally referenced 290, comprises a continuous well with control gate 294 placed over narrow tunnel path 296 and edge portions of the square shapes to form two qdot regions 292.

A diagram illustrating an example quantum structure with 'L' shape is shown in FIG. 9F. The quantum structure, generally referenced 300, comprises a continuous well with control gate 304 placed over the transition portion of the rectangular shapes to form two qdot regions 302.

A diagram illustrating an example quantum structure with double rounded barely touching square shape is shown in FIG. 9G. The quantum structure, generally referenced 310, comprises a continuous well with control gate 314 placed over narrow tunnel path 316 and edge portions of the rounded square shapes to form two qdot regions 312.

A diagram illustrating an example quantum structure with double rectangular shape is shown in FIG. 9H. The quantum structure, generally referenced 320, comprises a continuous well with control gate 324 placed over narrow tunnel path 326 and edge portions of the rectangular shapes to form two qdot regions 322.

A diagram illustrating an example quantum structure with double square connected via double smaller square shape is shown in FIG. 9I. Optical proximity correction is used here to turn the small feature connecting shapes into a narrow continuous link channel. The quantum structure, generally referenced 330, comprises a continuous well with control gate 334 placed over double small square tunnel path 336 and edge portions of the square shapes to form two qdot regions 332.

A diagram illustrating an example quantum structure with double rounded square with narrow neck shape is shown in FIG. 9J. The quantum structure, generally referenced 340, comprises a continuous well with control gate 344 placed over contoured narrow tunnel path 346 and edge portions of the rounded square shapes to form two qdot regions 342.

A diagram illustrating an example quantum structure with an overlapping pair of double rounded squares with narrow neck shape is shown in FIG. 9K. The quantum structure, generally referenced 350, comprises a continuous well with two control gates 354 placed over a contoured narrow tunnel path 356 and edge portions of the rounded square shapes to form three qdot regions 352. Note that the middle qdot is longer, being comprised of two semiconductor squares.

A diagram illustrating a first example quantum structure with a pair of barely touching double overlapping square shape is shown in FIG. 9L. The quantum structure, generally referenced 360, comprises a continuous well with control gate 364 placed over tunnel path 366 and edge portions of the double square shapes to form two qdot regions 362.

A diagram illustrating a second example quantum structure with a pair of double corner overlapping square shape is shown in FIG. 9M. The quantum structure, generally referenced 370, comprises a continuous well with two floating control gates 374 with adjacent imposing gate potential placed over tunnel paths 378 and edge portions of the square shapes to form three qdot regions 372. Note that the middle qdot is formed by two squares of active silicon.

A diagram illustrating a first example quantum structure with a double square shape with narrow neck and butterfly shaped control gate is shown in FIG. 9N. Note that most of the quantum structures described supra comprise square or rectangular shaped gates. Some available semiconductor processes, however, allow for composed shapes for the gate. In these cases, both the well and the gate have a narrow connecting channel. The quantum structure, generally referenced 380, comprises a continuous well with control gate 382 placed over narrow tunnel path 386 to form two qdot regions 384. Here, the gate and the well both have narrow connecting channels. This structure results in a much smaller gate to well overlap resulting in a much higher Coulomb blockade voltage for the structure. This enables a higher performance of the quantum structure since a larger signal to noise ratio is achieved.

A diagram illustrating a second example quantum structure with a double square shape with narrow neck and butterfly shaped control gate is shown in FIG. 9O. Similar to the structure of FIG. 9N, the quantum structure, generally referenced 390, comprises a continuous well with control gate 392 placed over contoured narrow necked tunnel path 396 to form two rounded square qdot regions 392. Here too, the gate and the well both have narrow connecting channels.

A diagram illustrating an example quantum structure with a pair of overlapping double square shapes with narrow neck and butterfly shaped control gates is shown in FIG. 9P. The quantum structure, generally referenced 400, comprises a continuous well with two floating control gates 402 electrostatically coupled to adjacent imposing gates 406 placed over contoured narrow necked tunnel paths 408 to form three rounded square qdot regions 404 with the gates 406 and the wells having narrow connecting channels.

A diagram illustrating an example conventional field effect transistor (FET) with drain and source doped diffusion and contacts is shown in FIG. 9Q. Using a conventional field effect transistor (FET) structure to build semiconductor quantum structures results in significantly degraded performance. In one embodiment, a modified semiconductor process is used to construct optimized semiconductor quantum structures.

Conventional wells have rectangular shapes disposed parallel to each other. In one embodiment, the quantum structure uses (1) staircase well shapes that provide pairs of locations where the interaction between quantum particles/states is very strong and (2) other pairs of locations that have weak or negligible interaction between the particles situated at those locations.

The conventional FET structure, generally referenced 410, comprises drain and source doped diffusion with contacts 412 with metal on top, and gate 416 with contacts 414. This structure results in significantly higher parasitic gate capacitance since it includes the gate-to-metal, gate-to-contact and gate-to diffusion additional components. Note that in classic FET structures, carriers move either through drift under an external electric field or through diffusion due to a gradient of concentration. An inversion channel is created by a relatively large gate voltage.

A diagram illustrating an example half conventional FET and half (potentially) quantum structure is shown in FIG. 9R. In accordance with the present invention, a modified semiconductor process enables an active layer without any diffusion, contact and metal on top. The structure, generally referenced 420, comprises a conventional doped side 422 with diffusion contacts, an undoped or lightly doped quantum side 426, and gate 427 with contacts 424. Such a structure has a half-classic, half-quantum structure with one side of the gate without any n or p doping and without contacts. This type of device can be used, for example, at the interface between classic circuits and quantum circuits. In this case, the carriers move through tunneling from the classic side to the quantum side.

A diagram illustrating an example quantum structure with rectangular shaped wells is shown in FIG. 9S. The full quantum structure, generally referenced 430, does not have any n or p doping or contacts on either side. Both sides 432 of the gate 436 with contacts 434 have the same active layer width which is approximately equal to the gate width. This results in a larger gate capacitance. To reduce the parasitic gate capacitance, the width of the active layer may be made smaller than the gate width on one or both sides.

A diagram illustrating an example quantum structure with dissimilar rectangular shaped wells is shown in FIG. 9T. The structure, generally referenced 440, comprises an asymmetric aperture tunneling well with gate 446 and gate contacts 448 placed thereover to generate two qdots 442, 444 with reduced parasitic capacitance on the right side qdot.

A diagram illustrating an example quantum structure with offset rectangular shaped wells is shown in FIG. 9U. The structure, generally referenced 450, comprises an asymmetric aperture tunneling well with gate 456 and gate contacts 458 placed thereover to generate two qdots 452, 454 with both qdots having reduced parasitic capacitance.

Using active wells having different widths on the both sides of the gate reduces the parasitic gate capacitance. A more significant reduction in gate capacitance can be achieved, however, by having an active well structure having a narrow region under the gate and wider regions on either side of the gate.

A diagram illustrating a first example quantum structure with spaced apart rectangular shaped wells is shown in FIG. 9V. The structure, generally referenced 460, comprises a symmetric dog bone aperture tunneling well with gate 466 having gate contacts 468 placed thereover to generate two qdots 462, 464 with reduced parasitic capacitance on both sides. Note, however, that there remains a residual overlap of the gate and the wider active wells on the two sides of the gate. Note that the aperture refers to the narrowed link channel between the two wider well regions.

A diagram illustrating a first example quantum structure with spaced apart rectangular shaped wells offset from each other is shown in FIG. 9W. The structure, generally referenced 470, comprises an asymmetric dog bone aperture tunneling well with gate 476 and gate contacts 478 placed thereover to generate two qdots 472, 474 with reduced parasitic capacitance on both sides. Note, however, that there remains a residual overlap of the gate and the wider active wells on the two sides of the gate.

In one embodiment, to further reduce gate capacitance the overlap between the gate and the wider wells on the sides are eliminated. A diagram illustrating a second example quantum structure with spaced apart rectangular shaped wells is shown in FIG. 9X. The structure, generally referenced 480, comprises a symmetric dog bone aperture tunneling well with gate 486 and gate contacts 488 placed thereover to generate two qdots 482, 484 with reduced parasitic capacitance on both sides and no well-gate overlap in the wider regions.

A diagram illustrating a second example quantum structure with spaced apart rectangular shaped wells offset from each other is shown in FIG. 9Y. The structure, generally referenced 490, comprises an asymmetric dog bone aperture tunneling well with gate 496 and gate contacts 498 placed thereover to generate two qdots 492, 494 with reduced parasitic capacitance on both sides and no well-gate overlap in the wider regions.

As described supra, the quantum structure may be symmetric or asymmetric. The "dog-bone" quantum structure has some overhang of the wider wells passed the edge of the narrow link. The asymmetric dog bone quantum structure does not have any overhang on the narrow link side. A diagram illustrating a third example quantum structure with spaced apart rectangular shaped wells offset from each other is shown in FIG. 9Z. The structure, generally referenced 500, comprises an asymmetric dog bone aperture tunneling well with partial overlap of the gate on the wide wells and overhang passed the narrow link edges, and with gate 506 and gate contacts 508 placed thereover to generate two qdots 502, 504.

A diagram illustrating a fourth example quantum structure with spaced apart rectangular shaped wells offset from each other is shown in FIG. 9AA. The structure, generally referenced 510, comprises an asymmetric dog bone aperture tunneling well with partial overlap of the gate on the wide wells and overhang passed the narrow link edges, and with gate 516 and gate contacts 518 placed thereover to generate two qdots 512, 514 with increased gate to well capacitance, but which may ease the fabrication process.

Narrow links between the two wider wells may be realized without having them drawn as such. In one embodiment, two wells have a punctual drawn contact but during fabrication a narrow link channel is formed between the two wells using optical proximity correction. A diagram illustrating a first example quantum structure with corner abutting rectangular shaped wells is shown in FIG. 9AB. The structure, generally referenced 520, comprises an aperture tunneling well with punctual drawn link between the two wells, and with gate 526 and contacts 528 placed thereover to generate two qdots 522, 524.

A diagram illustrating a second example quantum structure with corner abutting rectangular shaped wells is shown in FIG. 9AC. The structure, generally referenced 530, comprises the physical realization of the structure of FIG. 9AB with a narrow link channel formed between the two wells using a suitable technique such as optical proximity correction channel, and with gate 536 and contacts 538 placed thereover to generate two qdots 532, 534.

Note that it is not mandatory that the two wide wells have a punctual contact in order to obtain a narrow link channel between them. In some cases, it is sufficient that they are placed in very close proximity, and optical proximity correction results in a link channel in the physically realized shapes.

A diagram illustrating a third example quantum structure with corner abutting rectangular shaped wells is shown in FIG. 9AD. The structure, generally referenced 540, comprises an aperture tunneling well without contact between the two wells but in very close proximity, and with gate 546 and contacts 548 placed thereover to generate two qdots 542, 544.

A diagram illustrating a fourth example quantum structure with corner abutting rectangular shaped wells is shown in FIG. 9AE. The structure, generally referenced 550, comprises the physical realization of the structure of FIG. 9AD with a narrow link channel formed between the two wells using a suitable technique such as optical proximity correction channel, and with gate 556 and contacts 558 placed thereover to generate two qdots 552, 554.

Note that the narrow channel link of the induced depletion region separating the two wider quantum wells can have any given orientation, e.g., horizontal, vertical, or any arbitrary angle. In addition, the control gate may overlap the narrow channel link, or it may also overlap the edges of the adjacent wider quantum wells. The former is preferred since it results in a smaller parasitic capacitance and thus a larger Coulomb blockade voltage.

A diagram illustrating a fifth example quantum structure with corner abutting rectangular shaped wells is shown in FIG. 9AF. The structure, generally referenced 560, comprises an aperture tunneling well with an angled drawn link between the two wells and gate overlap only on the link channel 569, and with gate 566 and gate contacts 568 placed thereover to generate two qdots 562, 564.

A diagram illustrating a sixth example quantum structure with corner abutting rectangular shaped wells is shown in FIG. 9AG. The structure, generally referenced 570, comprises an aperture tunneling well with an angled drawn link between the two wells and gate overlap on both the link channel 579 and the wells themselves, and with gate 576 and contacts 578 placed thereover to generate two qdots 572, 574.

It is appreciated that the fabrication of the quantum structure examples described supra is not limited to one process only but can be fabricated using any number of semiconductor processes. Examples include (1) planar semiconductor processes with depletion tunneling, (2) planar semiconductor processes with oxide tunneling, (3) 3D (FinFET) semiconductor processes with depletion tunneling, and (4) 3D (FinFET) semiconductor processes with oxide tunneling.

Single Particle Operation

It is important to note that to achieve quantum operation: (1) carriers (electrons or holes) need to be isolated, (2) information needs to be conveyed to the electrons in either their position or spin (or both), and (3) multiple carriers are allowed to interact (i.e. entangle) before a reading (referred to as detection) of the quantum state is performed.

First, single carriers are separated out of the collectivities of carriers that usually exist in semiconductor layers in classic circuits. A semiconductor layer is formed of a network of semiconductor atoms that contribute carriers to a collective of carriers described by an energy band. Dopants are introduced into semiconductor layers in order to enhance the concentration of a given type of carriers. Donor dopants increase the number of electrons yielding an N-type semiconductor layer while acceptor dopants increase the number of holes yielding a P-type semiconductor layer.

When the semiconductor contains a very large number of carriers acting as a collectivity, adding one carrier to the collectivity or subtracting one carrier from the collectivity does not change the potential. To achieve a single carrier (e.g., single electron) behavior it is best that the considered particle does not have a large collectivity of carriers that it can interact with.

An undoped semiconductor or undoped semiconductor layer has a very low concentration of carriers. It still contains a large number of carriers compared with the single carrier that is needed for quantum operations. Doped semiconductor layers have even more carriers and thus are less attractive for single electron operation.

To achieve single carrier behavior in semiconductor layers it is preferable to first deplete them of carriers before performing the single electron operations. It is relatively easy to deplete an intrinsic (i.e. undoped) semiconductor and even a low doped semiconductor. Depleting a higher doped semiconductor layer is harder and requires much larger potentials to achieve depletion. Furthermore, it is easier to deplete a thin layer of semiconductor than it is to deplete a thick layer of semiconductor. Thus, for building semiconductor quantum structures based on single electron behavior, an SOI process having a thin top active layer and an oxide layer to isolate the top layer from the substrate is preferred.

In such processes, the body of the devices is relatively easy to fully deplete. In most cases even the work function between the gate and the thin active layer is enough to generate a full depletion of the thin layer. In other cases a certain gate voltage may be needed to fully deplete the body of the device. In fully depleted processes, the thin semiconductor layer is depleted of free carriers due to the presence of one or more control gates on top.

Once the semiconductor layer is fully depleted, there are no other free carriers that can interact with the quantum particle(s) and quantum effects can come forth. In a fully depleted well (which may have initially been undoped or low doped), the potential on the control gates on top determines the its profile. Such potential profile may, for example, have valleys and peaks. The valleys is where a carrier may be likely located and the peaks constitute tunneling barriers that may prevent the particle(s) from moving from one position to another.

In such a fully depleted semiconductor layer (CAD drawn layer may be undoped or low doped) a single carrier (e.g., electron) may be injected using an interface device. The particle may be trapped in a given location in the depleted well where the potential has a valley bounded on both ends by tunnel barriers. By appropriately changing the control signals on the gate, the potential in the well and the heights of the barriers can be modified and thus the single particle may move from one location to another in the fully depleted well. This is the basis of the operation of the charge/position quantum qubit.

Classic FET transistors, on the other hand, have higher doped regions for the source and drain. In bulk processes, the higher doped source and drain regions are formed directly in the body well by implanting or diffusing dopants. In fully depleted SOI processes where a thin semiconductor film is deposited on top of the BOX oxide that provides isolation from the substrate, the source and drain regions are realized by depositing another layer of high doped semiconductor on top of the undoped thin layer.

The interface devices have on one side of the gate a higher doped layer that behaves classically and carriers that behave collectively, while under the gate and on the opposite side thereof is the original undoped layer which is fully depleted. The gate terminal determines the height of the tunnel barrier and may allow a single particle to be injected in the fully depleted well. The particle will be localized in the fully depleted well in a region where a valley of the potential is present. From this point on a quantum operation may be performed on the single carrier that was separated from the classic collectivity of carriers present on the classic well of the device.

Half Classic/Half Quantum Interface Device and Example Structures

The interface device disclosed herein is operative to provide a link between classic electronic circuits and quantum circuits. A well is a fairly isolated semiconductor layer that can be part of a device. A classic well is contacted with metal layers to other devices and usually has a large number of free carriers that behave in a collective way, sometimes denoted as a "sea of electrons." A quantum well, however, is not connected to classic devices that may have a sea of electrons. The quantum well may or may not have contacts and metal on top, but such metal is left floating. A quantum well holds one free carrier at a time or at most a few carriers that have single carrier behavior.

The ability to inject one single carrier at a time is needed to operate a quantum structure. The charge of a carrier (i.e. electron or hole) is $1.6 \times 10^{-19}$ Coulomb. The charge is the integral of the current over a given time interval. Classic devices operate with current that are usually in the 0.1 uA and higher level. If a 0.1 uA current is used to inject a single electron, the pulse width of the current needs to be $1.6 \times 10^{-12}$ sec. A pulse in the 1 ps range could require clock frequencies in the THz range if implemented straightforwardly with clocks, which are not available in current integrated semiconductor processes. Furthermore, the dependence of the transistor current on the applied voltage is relatively moderate, e.g., quadratic or even linear. Thus, in order to stop the current flow a large voltage difference is required. Such a voltage is much larger than what a typical Coulomb blockade voltage is in currently available semiconductor processes.

To stop the flow of current with a Coulomb blockade voltage, the current dependence on the voltage needs to be very steep, e.g., exponential. Such current to voltage dependencies are achieved in deep subthreshold regimes when a tunneling current is present in the device.

To inject a single electron with a pulse in the 100 ps range requires a current of 1 nA. Such a current puts the small nanometer devices in deep subthreshold mode of operation. In this regime a tunnel current with exponential voltage dependence is established between the two wells/sides of the device.

In classic electronic circuits operating at room temperature if the interface device generates a 1 nA current multiple carriers (i.e. electrons) will be transferred to the second well provided that a closed path is established for the device current. If the second well is connected electrically, there is no force that will oppose the flow of additional carriers in the second well. When the second well is left floating, a different behavior is ensured.

To achieve quantum operation the devices are cooled down to deep cryogenic temperatures such that the thermal noise or thermal agitation of the carriers is minimal. Also, the quantum devices need to use dimensions in the nanometer range, such that the capacitance of the structure is in the 100 aF range. In such cases the Coulomb blockade voltage becomes multimillivolt level. This is needed since the transport of a single carrier from the classic well to the quantum well requires a change of potential (Coulomb blockade) large enough that the tunnel current is reduced significantly and no further carrier will tunnel to the quantum well. The dependence of the tunnel current on the potential difference between the gate and the well is exponential. Therefore, voltage changes of a few to tens of millivolts can readily stop the further tunneling of subsequent particles.

In a half-classic, half-quantum interface device the Coulomb blockade generated by the tunneling of a single carrier to the quantum well prevents other carriers from tunneling. In order to establish the initial tunneling current from the classic well to the quantum well, a potential difference is established between the well and the control gate. In one embodiment, the interface device is realized by placing a control gate over a continuous well. The potential of the gate which is directly driven or has its potential imposed for example by a capacitor divider such that a depletion region is established under the control gate thereby separating the well into two sections: one classic and one quantum. The classic well is connected to other classic devices using metal layers. In order to control the device with the gate signal, the potential of the classic well needs to be set at a certain reference value. This is done with a classic FET transistor that resets the potential of the classic well during a rest time period.

With the classic well sitting at a $V_{classic\_ref}$ potential, the potential of the gate is changed by a control signal such that a subthreshold tunnel current is generated in the interface device. The sign of the gate potential depends on the doping type, the level of the well, and the material of the gate and oxide which in turn set the work function difference. In the case of a P-type well the gate voltage needs to be more positive than the classic well potential, assuming a zero work function difference.

In this manner a pulse signal applied at the gate of the interface device determines the tunneling of precisely one particle (e.g., electron) from the classic to the quantum well. The pulse duration does not need to be very precise. It just needs to be longer than what is needed to securely tunnel a single particle. No further particle will be tunneled, even though the pulse may be longer because of the Coulomb blockade voltage that will exponentially reduce the tunnel current level.

Once a single carrier (e.g., electron or hole) is injected into the quantum well, a pure quantum operation can be performed. Using additional control gates on top of the continuous well which further isolates quantum dots in the structure, the carrier may be transported in a discrete fashion from one qdot to another. If appropriate control signal pulse widths are applied, the particle (actually, its wavefunction) may be split between two or more qdots. In one embodiment, a quantum structure can have a plurality of wells with a plurality of qdots. If the wells are brought in close proximity at least in a certain location, interaction (i.e. entanglement) between quantum particles can occur.

In one embodiment, a quantum structure comprises one or more half-classic, half-quantum interface devices. Each interface device injects a single carrier or multiple carriers but at different time instants, with one carrier at a given time.

The gate-to-classic well potential difference needed to realize the tunneling of the single carrier varies with process and location of the device. It also varies with the temperature of the structure. To mitigate such variability, the gate control signal has adjustability built-in such as via a digital to analog converter (DAC) and a calibration engine to set the appropriate voltage level for each individual injection device (i.e. half-classic, half-quantum interface device).

Figure 10A:
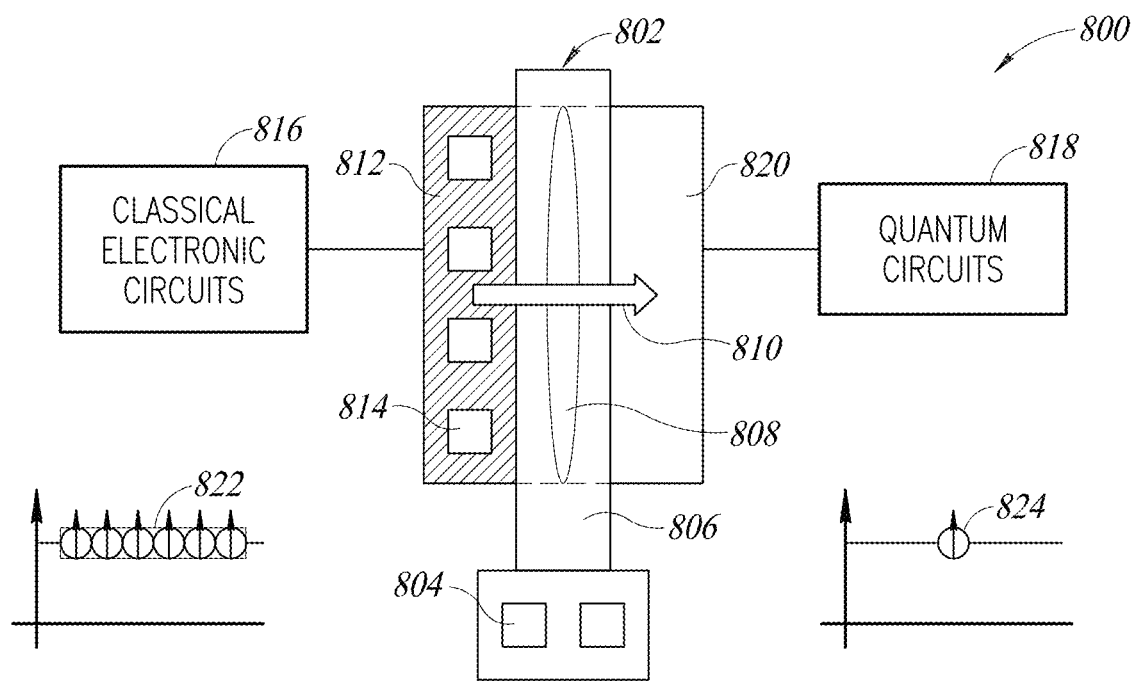
FIG. 10A is a diagram illustrating a first example interface device of the present invention in more detail.

A diagram illustrating a first example interface device of the present invention in more detail is shown in FIG. 10A. The device, generally referenced 802, comprises a conventionally doped diffusion region 812 and one or more metal contacts 814, gate 806 and gate contacts 804, and a non-doped (intrinsic or no diffusion) or very low doped (n--, p--) region 820 having no or low n- or p- doping, diffusion, and no contacts nor metal. The doped diffusion region 812 is either low doped (n-, p-), medium doped (n, p), high doped (n+, p+), or highly doped (n++, p++). The doped semiconductor side 812 of the gate 806 connects to classical semiconductor electronic circuity 816, which can comprise a particle (e.g., electron) injector controller, a gate imposer controller, and a particle detector in addition to various other control, detection and processing functionalities (see FIG. 2). The gate 806 can also connect to the circuitry 816 (not shown). The non-doped side 820 of the gate 806 connects to quantum semiconductor circuits 818. Thus, half the device contains classic carriers in energy bands and the other half contains quantum carriers in discrete energy levels. The transport of carriers from the classic side to the quantum side of the device is realized through tunneling through highlighted region 808. An appropriate potential applied to the gate is operative to connect a particle from the quantum side to the classic side of the interface device. This way, the quantum particle can electrically join the potential sea of carriers. Note that the labels 'quantum side' and 'classic side' are for convenience sake since at the fundamental level there is nothing inherently quantum or classic with the two sides of the gate.

In operation, the interface device 802 functions to provide an interface from conventional electronic circuitry located on (or off) the integrated circuit to quantum circuits and vice versa. In particular, the interface device is operative to separate a single quantum particle 824, e.g., electron, etc., from a plurality of particles 822. A single quantum particle is allowed to tunnel (indicated by arrow 810) through the depletion region 808 in an injector mode of operation. An appropriate gate control signal is applied to the gate 806 to establish the energy barrier and to control the tunneling through the depletion region. Note that an appropriate potential might need to be set on doped region 812 prior to this operation. Thus, the interface device functions as an injector tunneling device that allows the tunneling of a single quantum particle, or alternatively a controllable number of particles. When the gate potential is carefully lowered, a single quantum particle (e.g., electron) is allowed to tunnel from the left to the right side of the device.

In addition, in one embodiment, the logical flow of electrons can be provisioned to function in the opposite direction whereby the interface device is part of a circuit that senses and detects the presence of a single particle. In this case, the interface device can serve as the sensor which is coupled to additional classical circuitry (not shown) to detect the presence of single particles. In particular, if the capacitance on the classic side of the device is sufficiently low enough, the presence of a single particle (e.g., electron) on the quantum side of the device can be sensed or detected on the classical side of the device using conventional electronic circuitry, such as 816. This is achieved by detecting the rise in voltage magnitude on the classical side caused by the presence of the single particle on the quantum side upon lowering the barrier of the gate 806. Thus, the interface device is capable of operating bidirectionally as both an injector of a single particle and a detector of a single particle.

Note that in operation, on the classic side of the interface device, the quantum particles, e.g., electrons, are in energy bands, i.e. conduction band and valence band, which enables current flow in classic semiconductor devices. On quantum side of the interface device, the quantum particle is in discrete energy levels with one or two electrons (spin up and down) in each level.

Figures 10B, 10C:
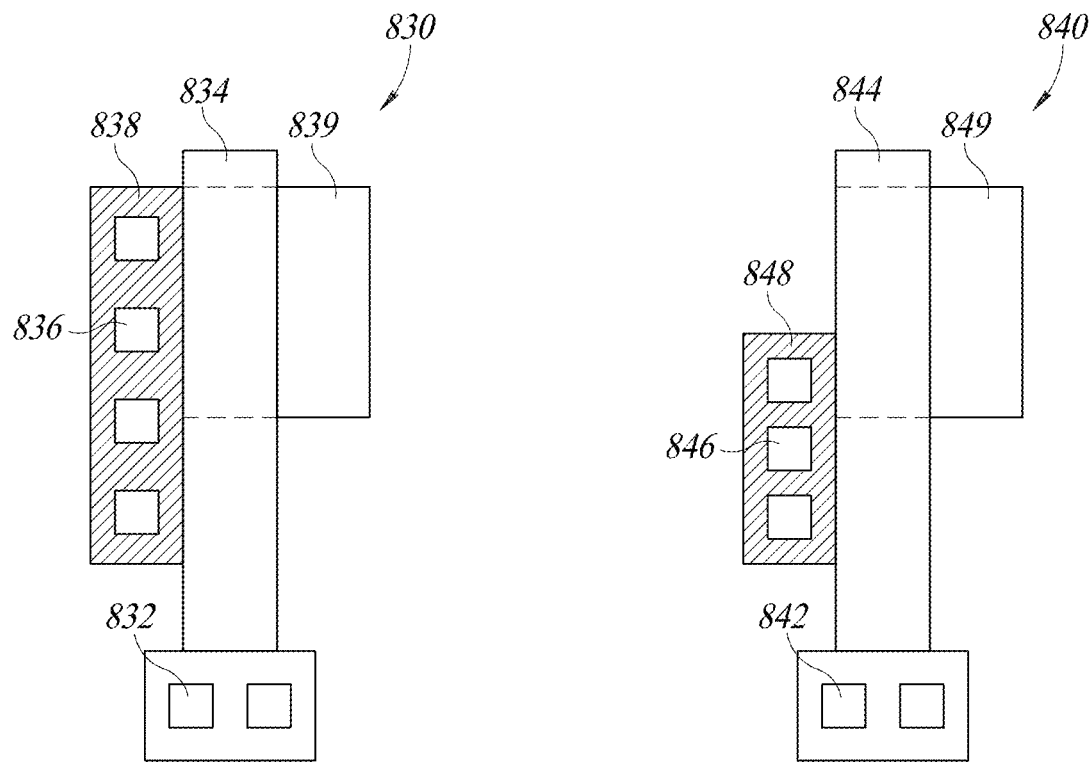
FIG. 10B is a diagram illustrating a second example interface device of the present invention.
FIG. 10C is a diagram illustrating a third example interface device of the present invention.

A diagram illustrating a second example interface device of the present invention is shown in FIG. 10B. It is appreciated that the interface device can have many shapes depending on the particular implementation of the invention. In this example, the interface device, generally referenced 830, has an 'L' shape and comprises a conventionally low, medium, high, or highly doped region 838 with one or more metal contacts 836, gate 834 and gate contacts 832, and a smaller non-doped (intrinsic) or very low doped region 839 without n+ or p+ doping, contacts, or metal. Note that the 'L' shape helps provide shifting on the y-axis and thus increases the distance from other structures.

A diagram illustrating a third example interface device of the present invention is shown in FIG. 10C. In this example, the interface device, generally referenced 840, has a diagonal shape and comprises a conventionally low, medium, high, or highly doped region 848 with one or more metal contacts 846, gate 844 and gate contacts 842, and a smaller non-doped (intrinsic) or very low doped region 849 with n-- or p-- doping.

Figure 11:
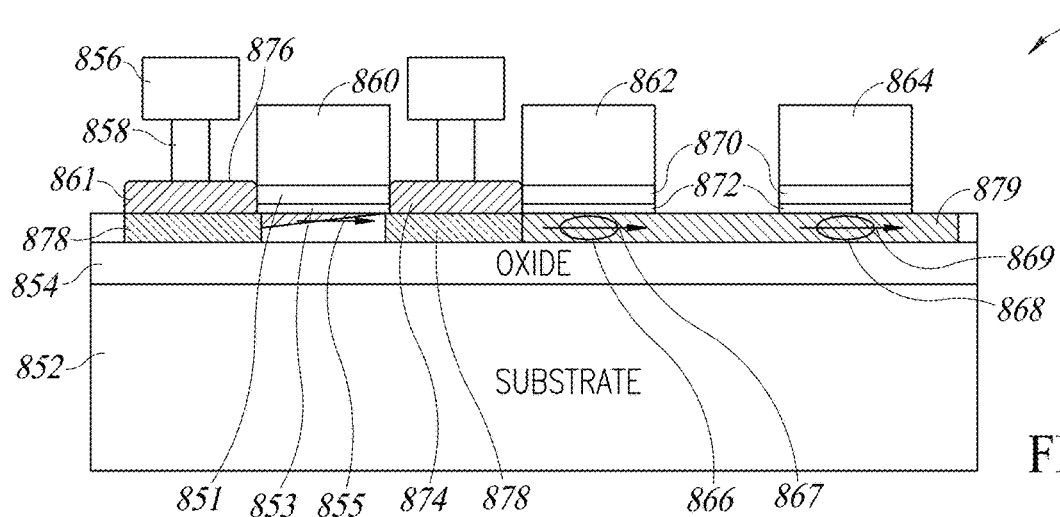
FIG. 11 is a diagram illustrating a cross section of a first example quantum structure and conventional FET.

A diagram illustrating a cross section of a first example semiconductor quantum structure and conventional FET is shown in FIG. 11. The structure, generally referenced 850, comprises a conventional classic FET on the left, a fully quantum device on the right, and a half classic/half quantum interface device in the middle. All three devices are fabricated on substrate 852 and oxide layer 854. It is appreciated that other types of substrates are possible as well.

The classic FET on the left comprises source, drain, and gate including p or n doped well 878, 861 connected to contact 858 and metal 856 structures located on either side of metal or polysilicon (or metal) gate 860 built over oxide layers 851, 853. In classic FET operation, mobile carriers travel from source to drain through inversion channel 855 in accordance with the potential applied to the gate, source and drain terminals. Note that the inversion channel may be pinched wherein carriers are swept by the electric field through the pinched area.

The fully quantum device on the right comprises two qdots in well 879 separated by metal or polysilicon gate 864 and oxide layers 870, 872 over depletion region 868. The gate modulates tunneling (arrow 869) between the two qdots as described in detail supra. Note that the two qdots on either side of gate 864 have no diffusion, contacts or metal.

The half classic/half quantum interface device in the middle comprises metal or polysilicon gate 862 and oxide layers 870, 872 over depletion region 866. The gate modulates tunneling (arrow 867) to allow a single quantum particle to tunnel between doped region 878, 874 on the left side of the gate 862 and the qdot on the right side of the gate. The half classic/half quantum interface structure thus functions to provide an interface mechanism between classic electronic circuitry on the left and quantum circuitry on the right.

Figure 12:
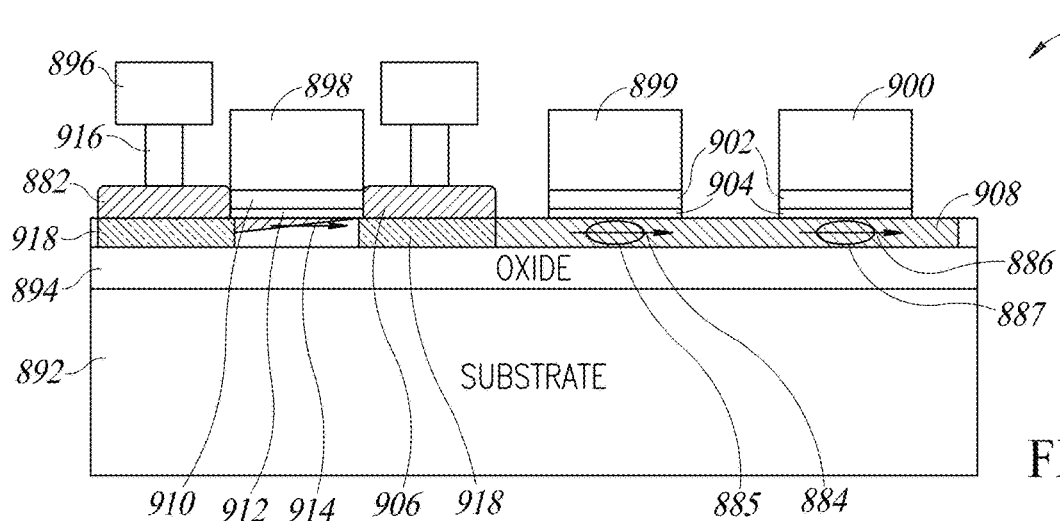
FIG. 12 is a diagram illustrating a cross section of a second example quantum structure and conventional FET.

A diagram illustrating a cross section of a second example semiconductor quantum structure and conventional FET is shown in FIG. 12. The structure, generally referenced 880, comprises a conventional (i.e. classic) FET on the left, a fully quantum device on the right, and a half classic/half quantum interface device in the middle. All three devices are fabricated on substrate 892 and oxide layer 894.

The classic FET on the left comprises source, drain, and gate including doped well 882, 918 connected to contact 916 and metal 896 structures located on either side of metal or polysilicon gate 898 built over oxide layers 910, 912. In classic FET operation, mobile carriers travel from source to drain through inversion channel 914 in accordance with the potential applied to the gate, source and drain terminals.

The fully quantum device on the right comprises two qdots in well 908 separated by metal or polysilicon gate 900 and oxide layers 902, 904 over depletion region 887. The gate modulates the tunneling (arrow 886) between the two qdots as described in detail supra. Note that the two qdots on either side of gate 900 have no diffusion, contacts or metal.

The half classic/half quantum interface device in the middle comprises metal or polysilicon gate 899 and oxide layers 902, 904 over depletion region 885. The gate modulates the tunneling (arrow 884) between the region on the left of the gate to the region on the right. In this embodiment of the interface device, the doped region 918, 906 of drain of the classic FET is moved closer to the gate 898 and a non-diffusion region is inserted on the left side of the gate 899 in order to reduce parasitic capacitance. The half classic/half quantum interface device functions to provide an interface mechanism between classic electronic circuitry on the left and quantum circuitry on the right.

Figure 13:
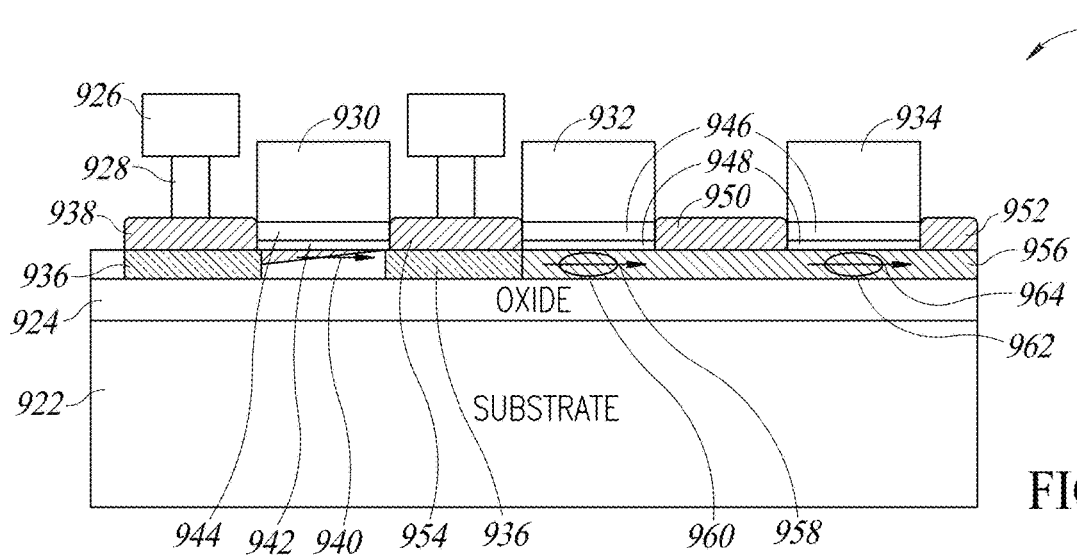
FIG. 13 is a diagram illustrating a cross section of a third example quantum structure and conventional FET.

A diagram illustrating a cross section of a third example semiconductor quantum structure and conventional FET is shown in FIG. 13. The structure, generally referenced 920, comprises a conventional (i.e. classic) FET on the left, a fully quantum device on the right, and a half classic/half quantum interface device (i.e. interface device) in the middle. All three devices are fabricated on substrate 922 and oxide layer 924.

The classic FET on the left comprises source, drain, and gate including doped well 938, 936, 954 connected to contact 928 and metal 926 structures located on either side of metal or polysilicon gate 930 built over oxide layers 942, 944. In classic FET operation, mobile carriers travel from source to drain through inversion channel 940 in accordance with the potential applied to the gate, source and drain terminals.

The fully quantum device on the right comprises two qdots in well 956 separated by metal or polysilicon gate 934 and oxide layers 946, 948 over depletion region 962. The gate modulates tunneling (arrow 964) between the two qdots as described in detail supra. Note that the two qdots 950, 952 on either side of gate 934 have diffusion but no contacts or metal.

The half classic/half quantum interface device in the middle comprises metal or polysilicon gate 932 and oxide layers 946, 948 over depletion region 960. The gate modulates tunneling (arrow 958) between the diffusion region 936, 954 on the left side of the gate 932 and well 956 with diffusion 958 on the right side of the gate. The half classic/half quantum interface device functions to provide an interface mechanism between classic electronic circuitry on the left and quantum circuitry on the right. Note that in one embodiment, similar structures can be built using bulk processes with no oxide layer under the quantum structure but with a depletion region instead.

As described supra, the quantum processor of the present invention comprises a mix of structures including quantum structures, conventional/classic FET structures, and interface devices comprising half classic and half quantum operation which are used to move information from the conventional FET (i.e. non-quantum) domain to the full quantum domain.

Figure 14:
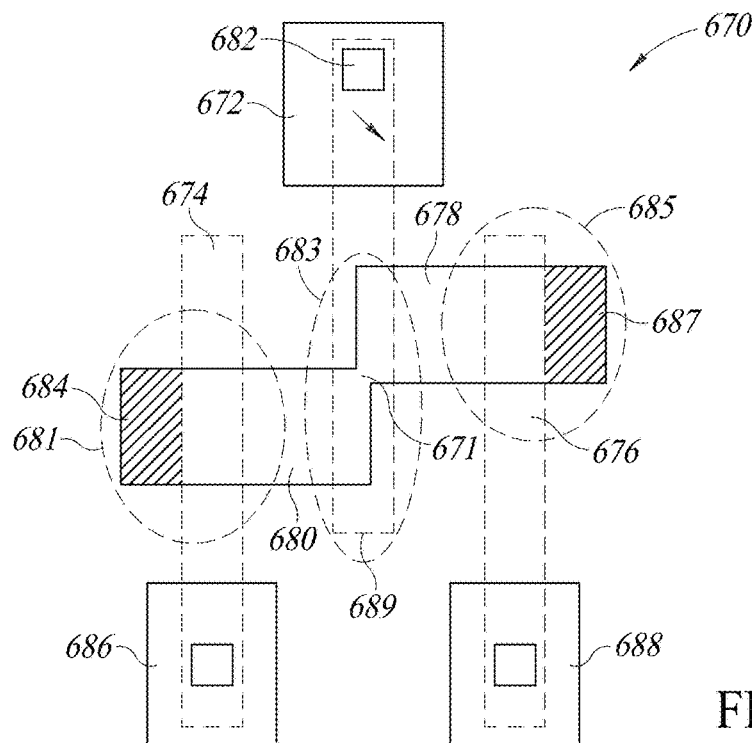
FIG. 14 is a diagram illustrating an example quantum structure with interface devices.

A diagram illustrating an example quantum structure with interface devices is shown in FIG. 14. The example structure, generally referenced 670, comprises a middle full quantum structure (dashed circle 683) having gate 689 sandwiched by a left side interface device structure (dashed circle 681) with gate 674 and a right side interface device structure (dashed circle 685) with gate 676. The interface devices 681, 685 comprise a conventional FET (darkened areas 684, 687) on one side of their gate and quantum device on the other side.

The structure 670 comprises two qdots and utilizes well-to-well tunneling through local depleted region. An interface device is located at each end for interfacing with conventional electronic circuits. The potential on the control gate can be applied either with a direct voltage drive network or via a floating impedance division. The well is realized with two rectangular wells having an overlap to create the narrow tunneling channel 671.

Figure 15A:
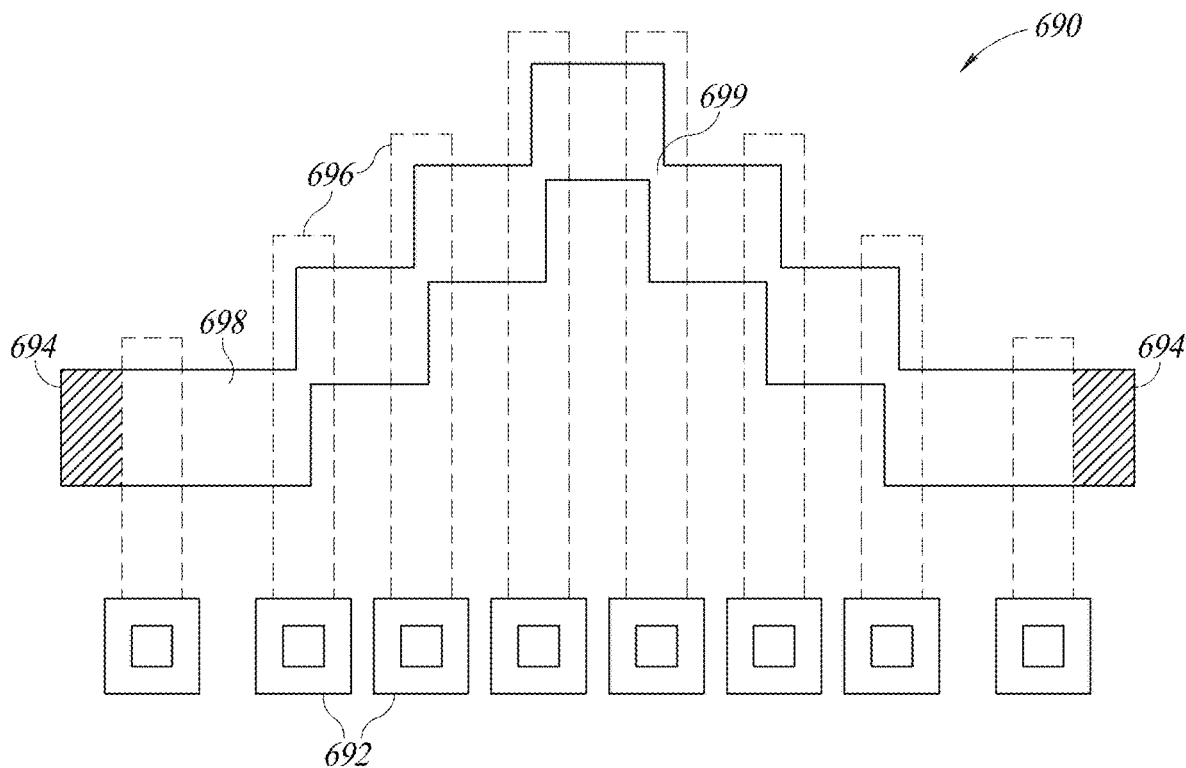
FIG. 15A is a diagram illustrating a first example multiple qdot quantum structure with interface devices on either end thereof.

A diagram illustrating a first example multiple qdot quantum structure with interface devices on either end thereof is shown in FIG. 15A. The higher complexity semiconductor quantum structure, generally referenced 690, comprises a continuous well with a plurality of imposing control gates 696 and gate contacts 692 that separate it into a plurality of qdots 698. In this example, the well comprises a plurality of overlapping squares connected at their corners to create a narrow tunnel path 699. Located at either ends of the well are interface devices 694 that allow the connection of the reset, injection and detection circuits. The imposer gates 696 receive pulsed control signals that determine the specified quantum operation.

Figure 15B:
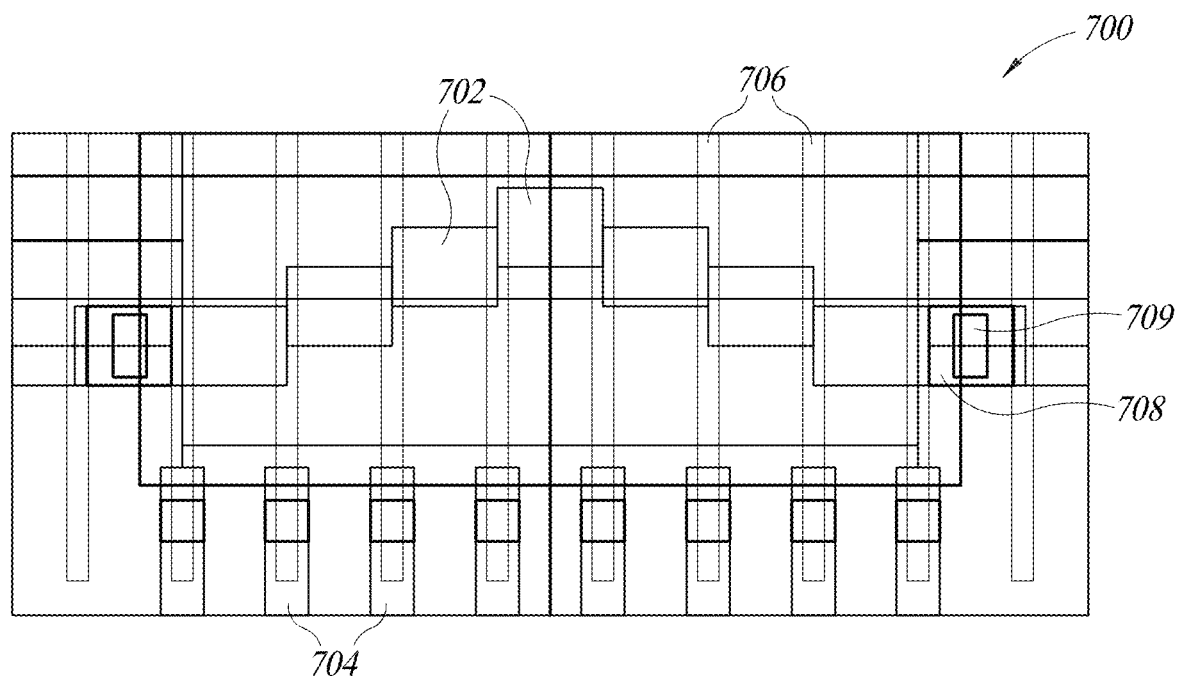
FIG. 15B is a diagram illustrating an example layout of an example quantum structure.

A diagram illustrating a CAD layout of an example quantum structure is shown in FIG. 15B. The layout, generally referenced 700, comprises a continuous well with a plurality of control gates 706 and gate contacts 704 that form a plurality of qdots 702. In this example, the well comprises a plurality of abutting squares connected at their edges to create a tunnel path. Located at either ends of the well are interface devices 708 with contacts 709 that allow the connection of the reset, injection and detection circuits (not shown). Note that these three circuits can be all electrically connected to the same node, for example, 812 in FIG. 10A.

Figure 16:
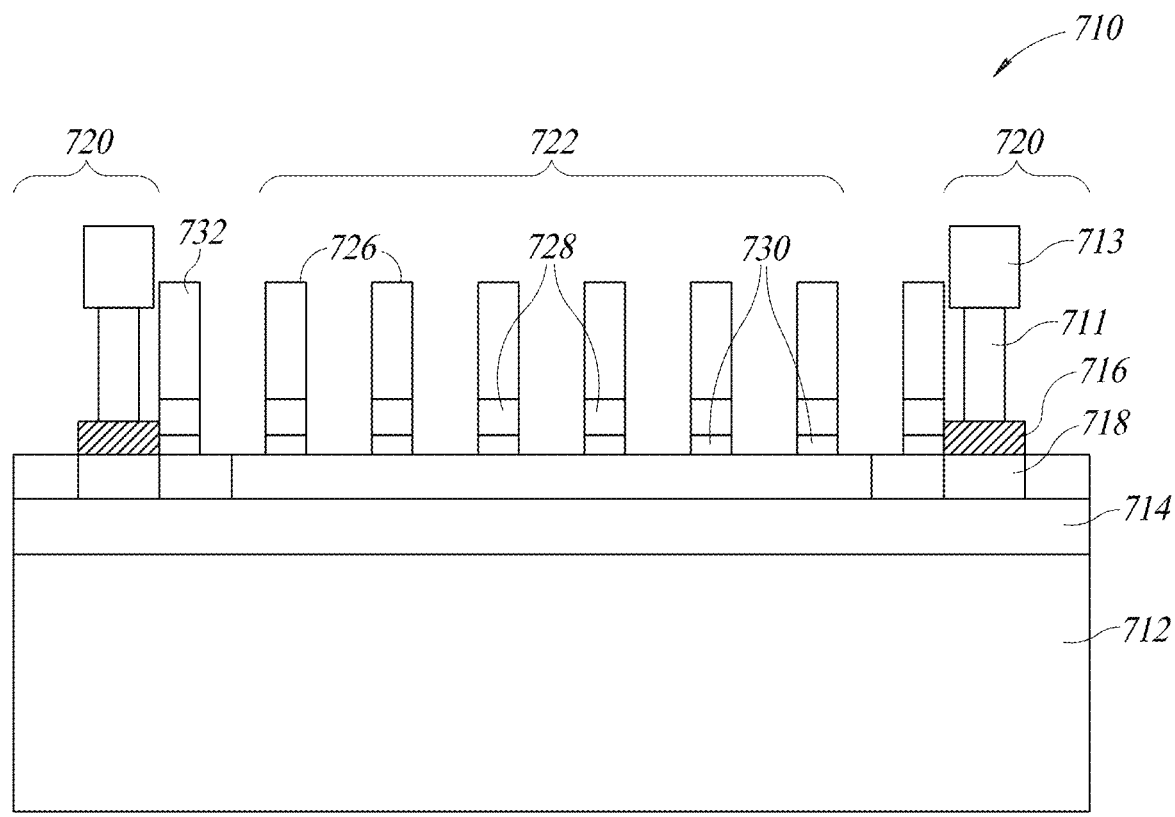
FIG. 16 is a diagram illustrating a cross section of the quantum structure of FIG. 15A.

A diagram illustrating a cross section of the quantum structure of FIG. 15A is shown in FIG. 16. The quantum structure has multiple qdots with interface devices at both ends of the well. The single continuously drawn well is separated into a plurality of qdots by the local depletion regions induced by a plurality of control gates. The cross section 710 comprises a substrate 712 and oxide layer 714 on which are fabricated seven qdots 722 comprising six control gates 722 each including oxide layers 728, 730, and polysilicon or metal layer 726, two interface devices 720 each including n or p doped regions 718, 716, contact 711, and metal layer 713, and gate 732.

To illustrate the operation of the quantum structure of the present invention, a series of diagrams are presented that show the steps involved in an example quantum operation starting with a single quantum particle where the local depletion region is under control of the gate.

Figure 17A:
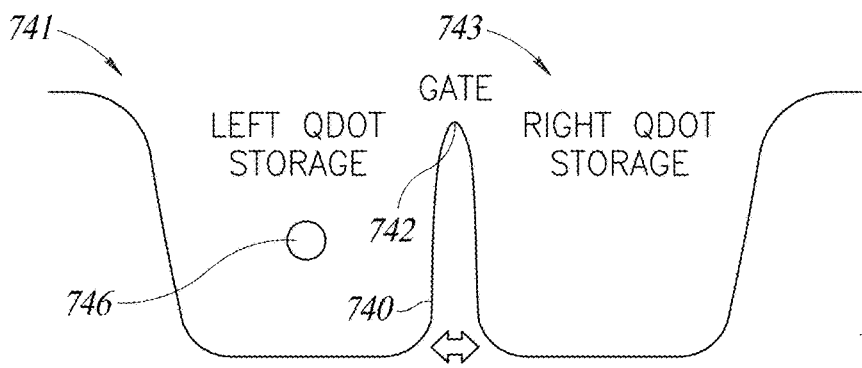
FIG. 17A is a diagram illustrating the aperture tunnel barrier for a two quantum dot structure.

A diagram illustrating the aperture tunnel barrier for a two quantum dot structure is shown in FIG. 17A. The local depletion region under the control gate divides the structure into two qdots, namely a left qdot storage 741 and a right qdot storage 743. The tunnel barrier imposed by the local depletion region is represented by trace 740. In this phase, the depletion region is wide and the tunnel barrier is high (referenced 742) and the particle 746 cannot tunnel to the right qdot storage and is trapped in the left qdot storage.

Figure 17B:
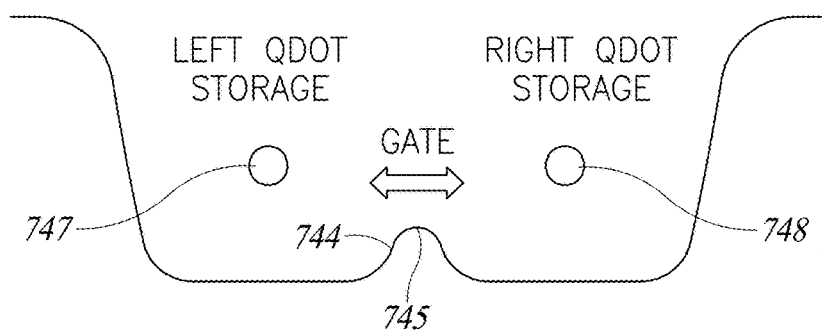
FIG. 17B is a diagram illustrating a first example change in the aperture tunnel barrier for the two quantum dot structure.

A diagram illustrating a first example change in the aperture tunnel barrier for the two quantum dot structure is shown in FIG. 17B. The tunnel barrier imposed by the local depletion region is represented by trace 744. In this phase, an appropriate potential is applied to the control gate to cause the depletion region to narrow thus lowering the tunnel barrier (referenced 745). This permits the particle 748 to travel to the right qdot storage and the particle is in the left and right qdots at the same time.

Figure 17C:
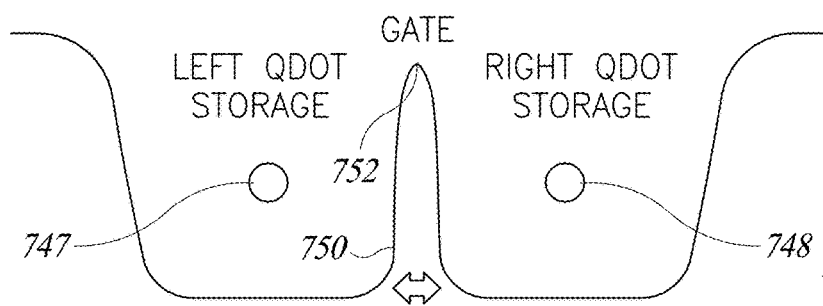
FIG. 17C is a diagram illustrating a second example change in the aperture tunnel barrier for the two quantum dot structure.

A diagram illustrating a second example change in the aperture tunnel barrier for the two quantum dot structure is shown in FIG. 17C. The tunnel barrier imposed by the local depletion region is represented by trace 750. In this phase, the potential applied to the control gate is adjusted to cause the depletion region to widen again thus raising the tunnel barrier (referenced 752). This effectively traps the two split particles 747, 748 (i.e. the wavefunction of the particle is split) and prevents them from traveling from one qdot to the other through the tunnel barrier. In quantum fashion, the charge carrier is split between the two qdots. When performing detection, however, the carrier will only be on one side with a corresponding probability.

Figure 18:
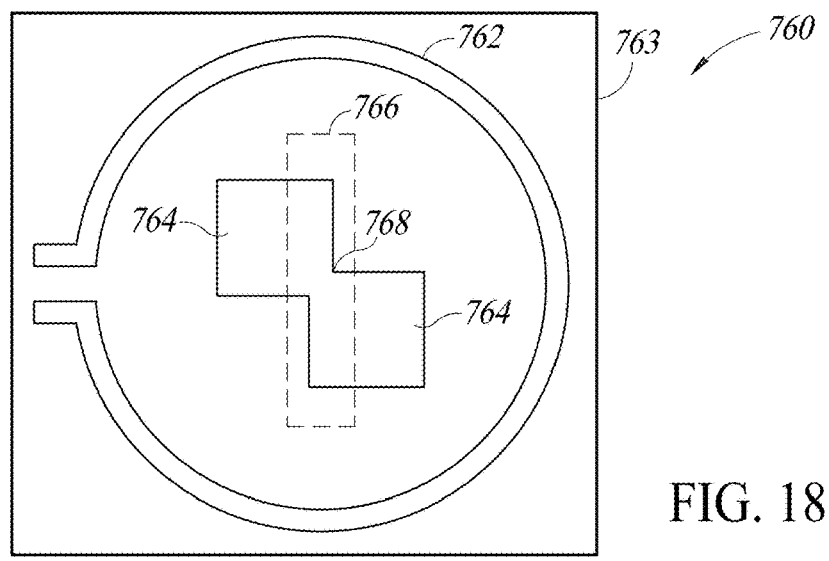
FIG. 18 is a diagram illustrating an example quantum structure surrounded by a spin control magnetic coil.

Thus far only electric control of semiconductor quantum structures has been presented wherein the spin of the quantum particle is ignored. An alternative manner of controlling the semiconductor quantum structure is to control/select the spin of the quantum particle using a magnetic field from an inductor/coil or a resonator. A property of particles is that they tend to align their spins to any external relatively strong magnetic field. A diagram illustrating an example quantum structure surrounded by a spin control magnetic coil is shown in FIG. 18.

The structure, generally referenced 760, comprises a resonator 763 or one or more turns of a coil 762 surrounding a continuous well divided into two qdots 764 by control gate 766 and connected by tunnel path 768. Along with the electrical control of the imposing gate, this structure also uses the magnetic field generated either by (1) an inductor 762 or (2) a resonator 763 that surrounds the entire quantum structure to select the spin of the particle. Note that both are shown in the figure but in practice typically only one is implemented. Note also that both static and ac magnetic fields can be generated and used. In addition, the inductor may overlap only a local area including one or several quantum structures or it can overlap the global area where the quantum core is implemented. In this manner, local magnetic control or global magnetic control can be implemented.

As described supra, the quantum computer operating environment employs cooling at cryogenic temperatures. In addition, electric and magnetic field shielding is provided. The cryostats used typically comprise relatively large metal structures that act as good shields. In one embodiment, the metal cavity of the cryostat creates a high quality resonator that generates a magnetic field to control the semiconductor quantum structures at its interior.

Figure 19:
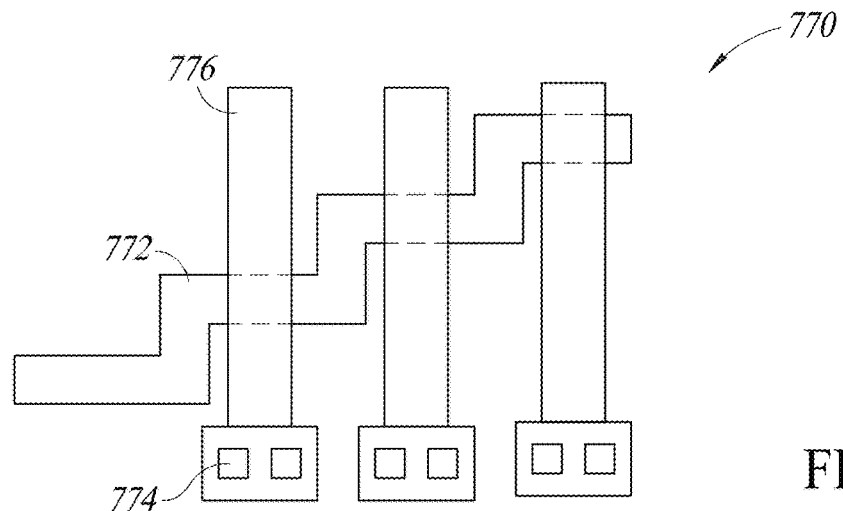
FIG. 19 is a diagram illustrating a second example multiple qdot quantum structure.

A diagram illustrating a second example multiple qdot quantum structure is shown in FIG. 19. The structure, generally referenced, 770, comprises a blended continuous well path 772 overlapped by a plurality of control gates 776 with contacts 774 (three in this example). Here the width of the vertical segments of the control gates and the vertical and horizontal segments of the well are the same, i.e. a "boomerang" structure in which the width of the wider well regions is made equal to the width of the narrow channel links. Such a structure results in a more compact realization of the quantum structure. Note that the regions between control gates form the quantum dots, while the regions under the control gates realize the induced depletion regions through which tunneling occurs. It is appreciated that any number of qdot structures can be realized depending on the number of control gates implemented. Note that in one embodiment, such structures can be implemented using either planar or 3D semiconductor processes.

Figure 20:
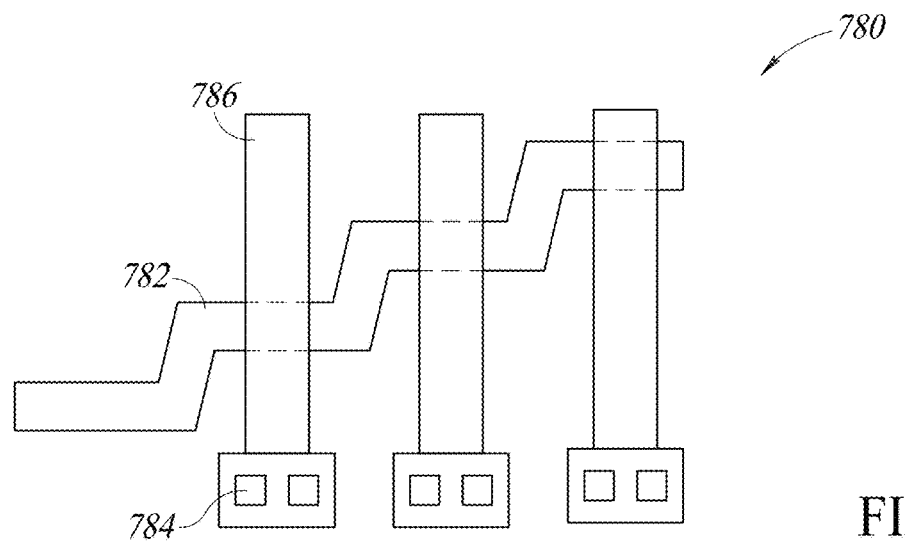
FIG. 20 is a diagram illustrating a third example multiple qdot quantum structure.

A diagram illustrating a third example multiple qdot quantum structure is shown in FIG. 20. In an alternative embodiment, the semiconductor structure comprises a bended well path overlapped by gates using horizontal and inclined well segments. Note that vertical segments also possible. In particular, the structure, generally referenced, 780, comprises a blended continuous well path 782 overlapped by a plurality of control gates 786 with contacts 784 (three in this example) using horizontal and inclined well segments. Here too the width of the vertical segments of the control gates and the vertical and horizontal segments of the well are the same, i.e. a "boomerang" structure in which the width of the wider well regions is made equal to the width of the narrow channel links. Such a structure results in a more compact realization of the quantum structure. Note that the regions between control gates form the quantum dots, while the regions under the control gates realize the induced depletion regions through which tunneling occurs. It is appreciated that any number of qdot structures can be realized depending on the number of control gates implemented.

Figure 21:
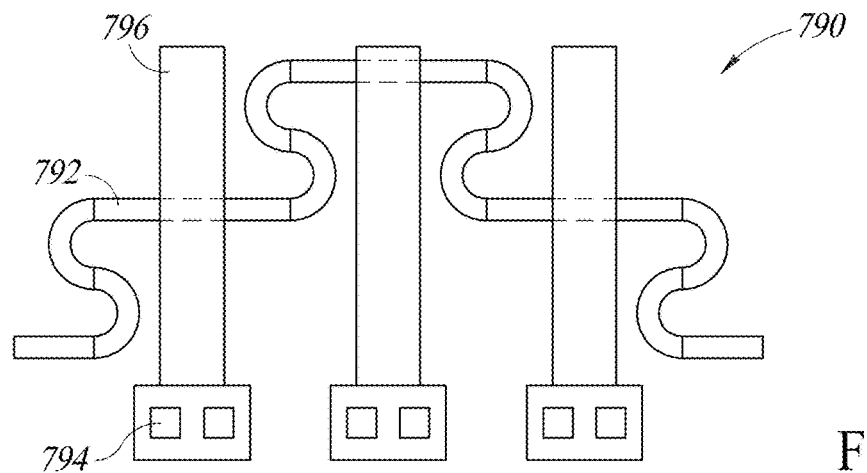
FIG. 21 is a diagram illustrating a fourth example multiple qdot quantum structure.

A diagram illustrating a fourth example multiple qdot quantum structure is shown in FIG. 21. In an alternative embodiment, the semiconductor structure comprises a bended well path overlapped by gates using horizontal and rounded well segments. Note that vertical segments also possible. In particular, the structure, generally referenced, 790, comprises a blended continuous well path 792 overlapped by a plurality of control gates 796 with contacts 794 (three in this example) using horizontal and rounded well segments. Note that the regions between control gates form the quantum dots, while the regions under the control gates realize the induced depletion regions through which tunneling occurs. It is appreciated that any number of qdot structures can be realized depending on the number of control gates implemented.

Quantum State Detection

In semiconductor quantum structures and circuits, the qubits (i.e. elementary quantum information units) are encoded by the state of particles or carriers inside one or more semiconductor layers. To help to achieve the single carrier behavior, the semiconductor layers are usually fully depleted. In the case of spin qubits the detection includes determining the spin orientation of a given carrier (e.g., electron or hole), while in the case of charge qubits (i.e. position qubits) the detection includes determining if the carrier is present or not in a given qdot.

Classically, a bit can have only two values "0" and "1". In the quantum domain, however, a qubit can have a large number of values given by any constrained combination of the two base quantum states |0> and |1>. This is provided by the superposition character of the quantum states.

When a quantum state is detected, the quantum state is collapsed into a base state which corresponds to a classic state with a given probability associated with it. For example, in the detection of a charge qubit, the outcome can be either: (1) the carrier is present in the detection qdot which corresponds to the base state |1>; or (2) the carrier is not present in the detection qdot which corresponds to the base state |0>. To determine the value of a quantum state, a number of successive quantum experiments are performed to get the average presence probability of the detected carrier. By computing the number of |0>s and |1>s that are obtained in the detection, the probability of the quantum state is determined.

For example, consider the Hadamard equal distribution quantum state denoted by 0.707|0>+0.707|1> where the carrier is split equally into two qdots of the quantum gate. From the quantum perspective, this means the carrier is present simultaneously in both qdots. In the classic view, the electron cannot be split and it either is present in a given qdot or it is absent from that qdot. When detecting a Hadamard state multiple times it is expected to obtain an equal number of collapses to the |0> base state (i.e. the carrier is absent) and to the |1> base state (i.e. the carrier is present) in the detected qdot. If the quantum state has a given rotation and it has a larger |1> base state component (a|0>+b|1> with b>a) then at detection more collapses to the base state |1> should occur. If in contrast, the quantum state has a rotation towards the |0> base state (a|0>+b|1> with a>b) then more collapses to the base state |0> should occur.

In order to perform detection of a quantum state contained in a quantum device, the quantum structure is connected to classic devices. This is achieved using an interface device, described in detail supra. Such interface devices are half-quantum and half-classic in their nature or interpretation. In one embodiment, the detector circuit itself comprises classic devices that process charge, current, and voltage. The quantum devices operate with single carrier (e.g., electron or hole), or a small controllable number thereof, while the interface device extracts a single carrier from a sea of collective electrons in the classic world or vice versa injects a single carrier into a classic world sea of collective carriers.

In one embodiment, the classic device of the detector is connected at a quantum structure using a floating well, in which the interface device has a quantum well on one side and a floating classic well on the other. Since the classic well is set to be floating, the injection of a single carrier may result in a noticeable well potential change that can be amplified further.

In another embodiment, the classic device of the detector is connected at a quantum structure using floating gate detection. In this case, the interface device is realized by a device having a plurality of gates, one of them being shared with a classic FET detector device. When the carrier arrives under the floating gate of the interface device it changes the potential of the gate, which in turn can be measured by the classic FET of the detector which shares the gate with the interface device.

Floating Well Detection

In floating well detection, the quantum particle is injected from the quantum device (if it happens to be present there) into a classic floating well that is in turn connected to the input of the classic detector circuit. An equivalent schematic of the quantum circuit, generally referenced 990, together with its associated interface and classic circuits is shown in FIG. 22A. A top plan layout view of the circuit is shown in FIG. 22B and a cross section of the circuit is shown in FIG. 22C. The quantum circuit 990 comprises several layers including substrate 1010, BOX oxide 1008, and undoped fully depleted layer 1006. Doped regions 1020 are fabricated over the fully depleted layer.

In one embodiment, before starting a quantum operation, the entire quantum structure is reset, i.e. the entire quantum well is flushed of any free carriers. Since the quantum well is fully depleted, there are no carriers in it. A reset operation is performed by one or more classic Mreset devices 992 by appropriately controlling the interface quantum gates (Qinterface) 994 and imposer quantum gates (Qimp) 996. The classic Mreset device comprises metal contacts 1002 on its terminals realized by doped semiconductor layers 1020. Considering the SOI semiconductor process as an example, the source and drain doped diffusions are fabricated above the undoped fully depleted device body 1006. The Mreset device establishes a reference potential for the classic side of the classic to quantum interface device on the left. During the quantum operation it is assumed that this potential does not change much due to leakage currents.

In one embodiment, quantum operation begins by initially resetting the classic well to a reference potential then setting it floating during the detection time interval. A single carrier (e.g., electron or hole, if one happens to be present there) is injected from a classic well 1022 where a sea of carriers have a collective behavior, into a quantum well 1024 where single carrier behavior can occur. An appropriate potential is applied to the gate 1004 of the Qinterface device 994 to control the tunneling of a single particle 1012 to the quantum side by lowering the tunneling barrier. Once the single particle is injected into the fully depleted well 1024, it moves according to the potential distribution change determined by the plurality of quantum imposing gates (Qimp) 996. In one embodiment, the Qimp gates determine the creation of valleys in the potential distribution that is progressively shifted from left to right and thus determine the movement of the particle 1012. Depending on the timing and pulse widths of the Qimp signals, a carrier may be split between different locations in the fully depleted well in which two or more potential valleys may be realized. This is the base of generating the superposition quantum states (a|0>+b|1>).

At the opposite end of the well, a second interface device 998 provides the interface in the other direction from the quantum well 1026 to the classic well 1014. In one embodiment, the classic well is left floating (no dc path to ground) such that the potential injection or transfer (by virtue of the connecting transistor 998) of a single carrier can generate a measurable change in potential that is further processed by the detector classic circuit 1000. Since the particle is injected (or transferred) from the quantum well into a classic well, the quantum state collapses. This detection is destructive since the quantum state is destroyed during the measurement process. It is destroyed specifically during the instance the particle sees a low resistance path, i.e. is connected, to the sea of carriers on the classic side. It is noted that such destructive detection can be performed only once per quantum operation. Furthermore, it is noted that another reset device similar to 992 can be connected to the same node 1014 as that connected to the detector 1000. Likewise another detector similar to 1000 can be connected to the reset device 992 (node 1003). These two types of circuits operate in a time shared manner in which the active time slots allocated to them can be different. Their high resistance during the inactive time slots ensures no conflicts.

The floating classic well 1014 is connected to the gate 1016 of a detection device 1000. The floating well and the gate 1016 of the detector Mdetector have a certain total capacitance. The voltage change in the signal at the gate 1016 of Mdetector is given by $\Delta V = e/C$ where e is the carrier charge $1.6 \times 10^{-19}$ Coulomb and C is the total capacitance of the floating well (1014 and possible 1026) and gate. In one embodiment, the charge to voltage conversion is followed by classic voltage or transconductance amplifiers depending on the voltage mode or current mode operation of the classic detector circuit 1000. Note that the entire single carrier (e.g., electron) injection, quantum processing/imposing and detection is short in comparison with the decoherence time of the particle in the given semiconductor structure.

Note that other classic analog, mixed signal or digital circuits are preferably kept an exclusion distance away from the quantum structure 990 in order to avoid undesired parasitic interaction with the quantum particle(s) that could lead to quantum decoherence.

Floating Gate Detection

The second option for the detection of the quantum state is to use a floating gate. In this case the classic device of the detector Mdetector is connected to the same floating gate that goes over the quantum well. An equivalent schematic of the quantum circuit, generally referenced 1030, together with its associated interface and classic circuits is shown in FIG. 23A. A top plan layout view of the circuit is shown in FIG. 23B and a cross section of the circuit is shown in FIG. 23C. The quantum circuit 1030 comprises several layers including substrate 1050, BOX oxide 1048, and undoped fully depleted layer 1046. Doped regions 1058 are fabricated over the fully depleted layer.

Similar to the floating well detection circuit 990 described supra, the quantum procedure starts with the reset of the structure 1030 using one or more classic Mreset devices 1032 along with appropriate control of the interface quantum gates (Qinterface) 1034 and imposer quantum gates (Qimp) 1036 such that all free carriers in the quantum structure are flushed out. The classic to quantum Qinterface device 1034, operative to inject a single carrier 1052 into the quantum structure, has a half-classic and half-quantum operation. It comprises a doped and metal contacted classic well 1054 on the left side of its gate 1044 and a floating quantum well 1056 on the other side. In one embodiment, the connection between the Mreset and Qinterface devices on the classic side is realized with contacts and metal layers 1055. Note that the Mreset and Qinterface devices may share the same active layer or may be done in separate active layers.

The quantum imposer (Qimp) devices 1036 determine the specific quantum computation performed. There is at least one Qimp quantum control gate. Alternatively, the circuit may comprise any number of Qimp devices as large as feasible in the actual implementation using a given semiconductor process.

The last three gates over the quantum well on the right side of the circuit 1030 form a quantum to classic Qinterface device 1038, 1064, 1062. Note that alternatively, the Qinterface device may be located in the middle of a quantum well. One of the three gates (1060) is the floating gate which connects to the Mdetector classic detector device 1040. In one embodiment, the carrier is moved under the floating gate by controlling the potential distribution with the two adjacent gates 1059, 1061. The presence of the quantum carrier under the floating gate causes a change of the potential of the quantum gate which is sensed by the Mdetector detector device 1040 and amplified further.

After the first measurement is performed, the quantum carrier can be moved away from under the floating gate 1060 of the interface device. The floating gate initial potential is set during the reset time to a level that allows the proper operation of the Mdetector classic detector device. Such potential may be reset for example with a second classic Mreset device (not shown) connected to the gate of the Mdetector device.

Figure 24:
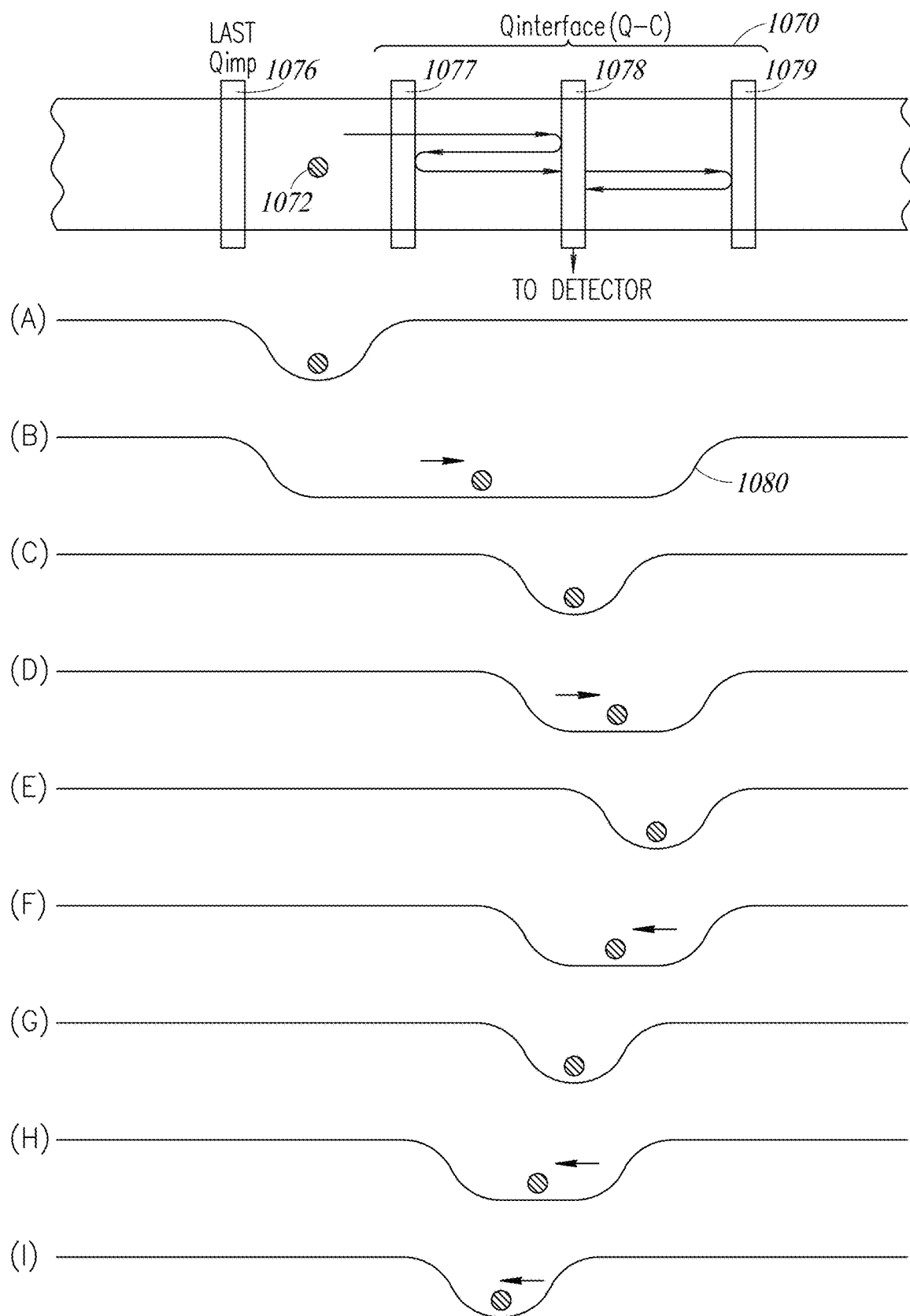
FIG. 24 is an example potential diagram for the floating gate detection circuit.

An example potential diagram for the floating gate detection circuit is shown in FIG. 24. The last quantum imposer gate Qimp 1076 together with the three gates 1077, 1078, 1079 of the quantum to classic interface device (Qinterface) 1070 are shown. In this example, two 'helper' gates (left gate 1077 and right gate 1079) are controlled and not floating while only the middle gate 1078 is floating and used for actual detection. The middle floating gate 1078 is connected to the detector circuit 1040 (FIG. 23A). It is appreciated that the Qinterface device may comprise more or less than three gates. For example, the detection can be performed using only two interface device gates, i.e. one floating and one controlled.

In operation, the particle is moved one or more times under the floating gate to perform detection (i.e. nondestructive measurement). Multiple measurements are performed under the detection gate for the same quantum experiment. A measurement is made each time the particle moves under the floating gate 1078. Note that the movement is speculative in nature since it is not known a priori whether there is a particle present or not as this is what is being measured. If no particle is detected, then of course no movement actually takes place.

With floating gate detection, a gate overlaps the last region of a quantum well where the presence of a particle is to be detected. Note that the potential of the floating well can be set initially, for example during the reset process, to a reference value appropriate for the detector circuitry. It should, however, be subsequently allowed to be floating such that it can sense the presence or absence of a particle under it, e.g., carrier, electron, hole, etc.

In the floating gate detection process the quantum state or qubit is allowed to move under the floating gate. If a particle is present than the potential of the gate changes from the reference potential it was initially set to, while the particle is not present than the potential of the gate does not change due to the quantum state moving under the gate.

Note that in idealized circuits there are no parasitic leakage currents and the potential of a floating gate can remain for relatively long periods, ideally to infinity or until it is again reset to the potential it achieved at the end of processing. In real circuits, however, parasitic leakage currents typically exist (e.g., a gate over a well may have a certain leakage current from the gate to the well). Such current changes the potential of the floating gate independent of the presence or absence of the quantum particle.

To prevent such floating gate potential change due to leakage, numerous well-known circuit techniques can be applied, including performing the detection quickly such that there is not enough time for the floating gate potential to change significantly due to leakage. In this case a significant potential change is a fraction of the potential change determined by the presence of the quantum particle, e.g., 10% or 20%. Another technique is to use a replica floating gate that never gets a quantum particle but has similar leakage current with the detection floating gate. By measuring the differential signal between the detection floating gate and the replica floating gate, the voltage change due only to the presence or absence of the quantum particle can be detected, while any parasitic voltage change due to leakage current is rejected as a common mode signal.

In one embodiment, the actual operation of the floating gate detection consists in modifying the potential in the proximity of the floating gate such that the quantum particle is moved in a controlled fashion under the floating gate and then away from it.

Since the quantum particle can be moved multiple times under the floating gate and then away from it, this detection is non-destructive and can be performed multiple times. By performing the detection multiple times any parasitic effect due to inherent noise in the system is eliminated or attenuated. Note that the number of consecutive non-destructive detections that can be performed, however, depends on the decoherence time of the quantum state in the given process technology and given physical structure.

With reference to FIG. 24, to impact the potential around the floating gate and thus allow the quantum particle to move under the floating gate and then away, multiple additional helper control gates are used. In one embodiment, a single helper control gate is used located on one side of the main floating detection gate. In another embodiment, two helper control gates are used, one on each side of the main detection floating gate, as shown. Alternatively, additional helper control gates can be placed around the main detection floating gate. The further away the helper gate is placed, however, the less impact it has on the potential profile around the detection floating gate. This is why the most effective are the helper gates directly to the left and right of the main detection gate.

A quantum structure includes a number of control gates, also called imposers that determine the specific quantum operation performed. After the last imposer has performed its function, the desired quantum computation has finished and the quantum state is ready for detection.

In position based semiconductor quantum structures the detection entails determining whether or not the particle is present in the last quantum dot of the structure, past the last imposer. If the quantum state is one of the base states, i.e. particle present or absent, then the detection can be done only once (in the absence of system noise). When noise is present, multiple detections may be desired to reject or attenuate the impact of the system noise.

If the quantum state is a general superposed state, the particle has a certain probability of being present in the last detection quantum dot. To measure the quantum state, the detection is performed multiple times. The percentage of positive (i.e. present) outcomes versus the total number of measurements represents the probability corresponding to the measurement of the corresponding quantum state. Similarly, the percentage of negative (i.e. absent) outcomes may be used.

In trace (A) the control signals on the left and right helper control gates are such that the energy profile is high and the quantum particle is not allowed to move towards the floating detection gate. The particles flow towards the positions with lower energy. If a potential profile is drawn instead, the electrons go to higher potential level locations. The situation is reversed for the holes that go to the regions of higher energy. From the potential perspective, the holes go to the lower potential levels.

Trace (B) illustrates the case when the control signals on the left and right helper control gates are modified such that the energy profile level is lowered (1080) in the area surrounding the floating detection gate. This allows the quantum particle to extend over the entire physical location where the energy profile is low. This also includes the region under the floating detection gate.

Trace (C) shows the control signals of the left and right helper control gates changed such that the region of low energy profile is restricted to a narrow region essentially under the floating detection gate. Now that the quantum particle is localized in a very narrow region under the floating detection gate. This results in a relatively large (i.e. measurable) change in the potential of the floating gate. When the quantum particle is distributed over a wide area, the change in potential is much smaller, making it harder to measure. Having the particle located directly under the floating gate generates a change in potential of the floating gate which can be measured and amplified by the Mdetector circuit 1040 (FIG. 23A) using one or multiple classic FET devices.

The quantum particle is then moved away from the floating detection gate. As shown in trace (D), first the right helper control gate is used to enlarge the area of low energy towards the right side, away from the floating detection gate. In this case the energy profile is still low under the floating detection gate which allows the quantum particle to spread both under the floating gate and away from the floating gate.

In a second step as shown in trace (E), the helper control gates are used to raise the energy profile in close proximity of the floating detection gate, allowing the quantum particle to extend away from the floating detection gate. In this manner, the quantum particle is moved away from the floating gate and the first detection has ended. The quantum state is still intact. It has not been destroyed through the first detection. A second detection may be performed by moving the quantum particle under the floating detection gate again.

Trace (F) shows how the control signals on the two helper control gates are again enlarging the region with low energy profile, allowing the quantum particle to move again under the floating detection gate. The low energy level area remains wide and the quantum particle is spread both under the floating detection gate and away from the floating gate. As such the change in potential of the detection gate is low and harder to measure.

In trace (G) the control signals on the helper control gates again determine the narrowing of the energy valley where the quantum particle is allowed to spread to a relatively narrow region under the main floating detection gate. As such the quantum particle moves a second time under the gate and a second non-destructive quantum detection is performed.

The detection process can continue with multiple subsequent detections. In trace (H) the helper control gates are used to again widen the low energy level where the quantum particle is present. In this way the quantum particle is spread under and away from the floating detection gate.

In trace (I) the helper control gates restrict the area of low energy level where the quantum particle can be present to a region away from the floating detection gate.

In this manner, the process can continue with further subsequent movements of the quantum particle under the floating detection gate and away from the floating detection gate, both on the left side and on the right side.

A key advantage of floating gate detection is that it allows multiple detection of the same quantum state, without the need of repeating the entire quantum computation since the particle's wavefunction does not collapse in the detection process. Therefore, instead of performing the entire quantum experiment multiple times, the quantum experiment is performed once but the results are measured multiple times. This shortens the overall computation time thus increasing the speed of quantum computation, and thus provides accelerated quantum computation.

In the case of the destructive floating well detection, the quantum particle is lost with each detection. Thus, performing multiple floating well detections require multiple executions of the entire quantum operation, which in turn takes a longer time. The more time spent on detection reduces the speed of quantum operation and thus reduces the effective quantum acceleration factor with respect to a classical computation.

In another embodiment, the floating gate detection may be followed by a floating well detection which finally collapses the quantum state. By using both methods of detection, a more sophisticated detection scheme can be built with lower error rate. By looking at the correlation between the two types of detection, built-in detection error correction can be realized.

3D Semiconductor Quantum Structures

The present invention provides a semiconductor quantum structure that uses a 3D semiconductor process with very thin semiconductor fins having much smaller parasitic capacitance to the gate. This results in higher Coulomb blockade voltages and thus quantum circuits that are easier to control with classic electronic circuits with more noise floor margin. Two semiconductor islands are isolated in a continuously drawn fin using an overlapping control gate that induces a local depletion region in the fin. The tunneling between one island in the fin to the other is controlled by the control gate that imposes the potential on the fin. By modulating the potential applied to the control gate, a controlled fin-to-fin tunneling through the local depletion region is achieved, realizing the function of a position/charge qubit. More complex structures with higher number of qdots per continuous fin and larger number of fins can be constructed. 3D semiconductor processes can be used to build such fin-to-fin tunneling quantum structures. Hybrid 3D and planar structures can be built as well. By combining a number of such elementary quantum structures a quantum computing machine is realized.

Figure 25:
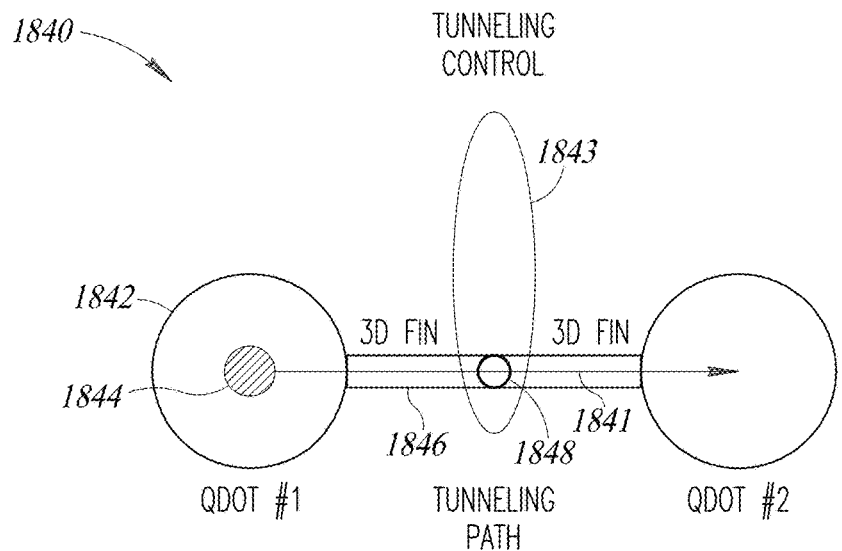
FIG. 25 is a diagram illustrating an example 3D semiconductor quantum structure using fin to fin tunneling through local depletion region.
Figure 26:
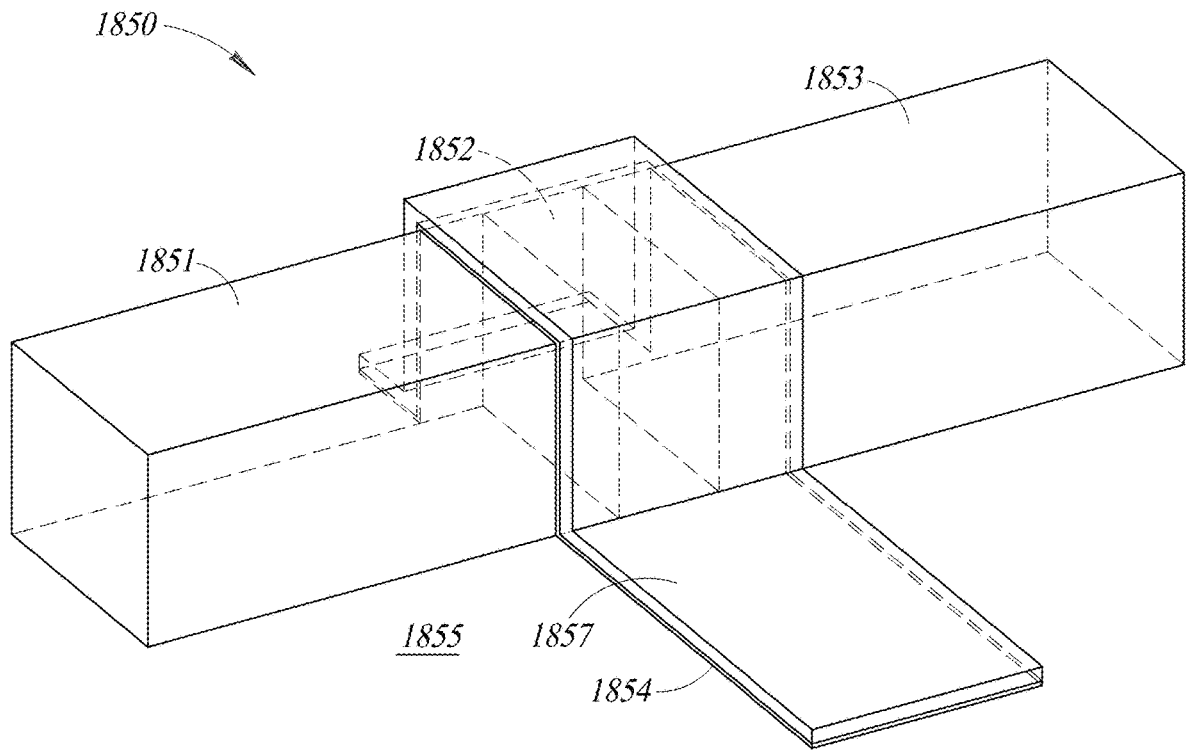
FIG. 26 is a diagram illustrating a three dimensional view of an example 3D semiconductor quantum structure with fin to fin tunneling under control of a control gate.

A diagram illustrating an example 3D semiconductor quantum structure using fin to fin tunneling through local depletion region is shown in FIG. 25. The quantum structure, generally referenced 1840, comprises a continuously drawn fin 1846, overlapping control gate 1843, two isolated semiconductor well and fin structures realize qdots #1 and #2 1842, local depletion region 1848, tunneling path 1841, and particle, e.g., electron or hole, 1844. A diagram illustrating a three dimensional view of an example 3D semiconductor quantum structure with fin to fin tunneling under control of a control gate is shown in FIG. 26. The quantum structure, generally referenced 1850, comprises fins with portions 1851, 1853, overlapping control gate 1854 with thin oxide layer 1857, substrate 1855, and local depletion region 1852. Note that the well may be omitted and the qdot realized by the semiconductor fin area only.

With reference to FIGS. 25 and 26, the control gate layer overlaps the fin on three sides and creates a local depleted region which isolates the two sides when the potential barrier is high. Note that overlapping the fin provides better control over the structure. A thin oxide layer separates the semiconductor fin from the control gate. When the control terminal lowers the potential barrier, tunneling can occur from one side of the fin to the other side. The tunneling is controlled by the control terminal that imposes the potential in the semiconductor fin. If the tunnel barrier is high, the quantum particle is locked in its prior state. When the potential on the control terminal lowers the barrier, the quantum particle can tunnel from one qdot to the other. Depending on the pulse width of the control signal, the quantum particle completely or partially tunnels. In the latter case, the quantum particle (precisely, its wavefunction) is distributed between the two qdots, i.e. spatial entanglement. Note that in real implementations, the quantum structure generally has a deformed complex 3D shape where the depletion region depends on the particular implementation and semiconductor process used. The structures shown herein are for illustration purposes only.

Figure 27A:
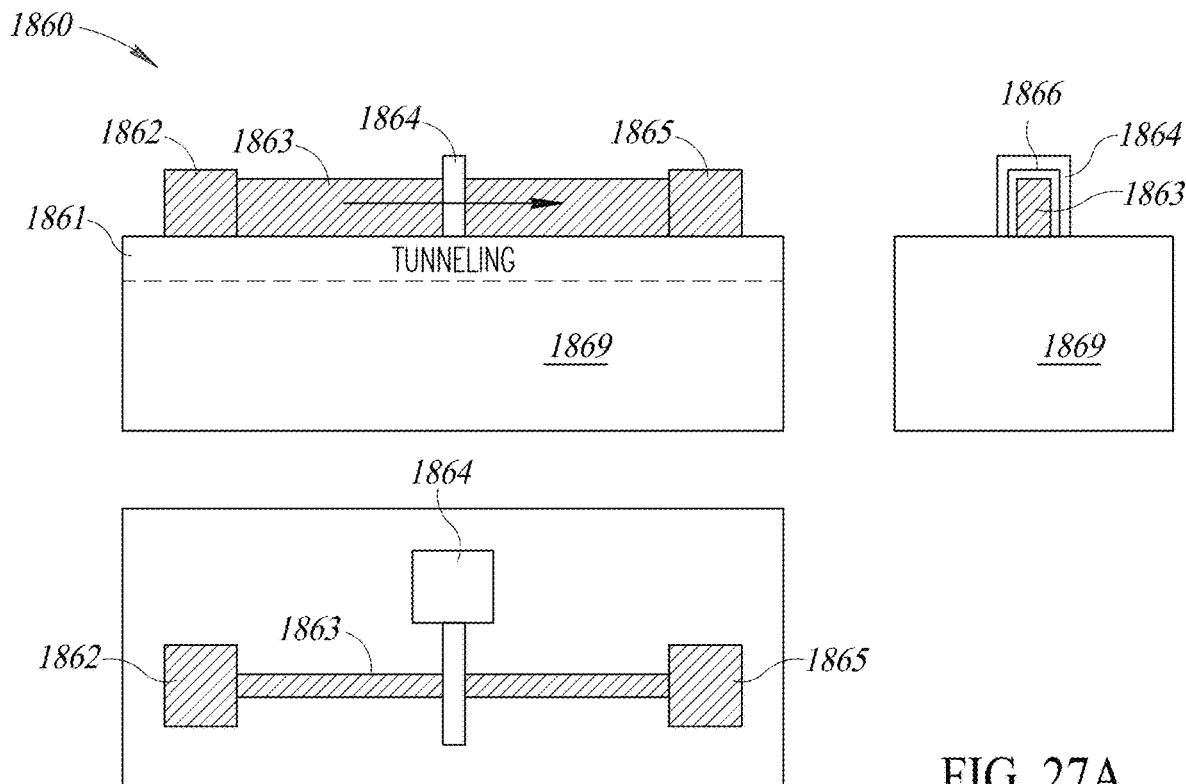
FIG. 27A is a diagram illustrating a cross section, side view, and top view of an example 3D two qdot quantum structure using local fin depletion tunneling.

A diagram illustrating a cross section, side view, and top view of an example 3D two qdot quantum structure using local fin depletion tunneling is shown in FIG. 27A. The quantum structure, generally referenced 1860, comprises substrate 1869, optional oxide layer 1861, wells 1862, 1865, fin 1863, gate oxide 1866, and overlapping control gate 1864. Note that the dashed line indicates the optional oxide layer that isolates the 3D quantum structure from the substrate. The substrate may comprise standard resistivity, high resistivity, or isolating substrates.

The tunneling through a local depletion region in the quantum structure is induced in a fin by the overlapping control gate. When the barrier is high, the local depleted region is wide and virtually no tunneling current is allowed. When the barrier is lowered, the local depleted region shrinks in width and a sizeable leakage tunneling current appears, which allows the particle to move from one qdot to the other. If the particle has not completed the move from one qdot to the other, it will spread (equally or non-equally) between the two qdots to achieve spatial particle entanglement.

Figure 27B:
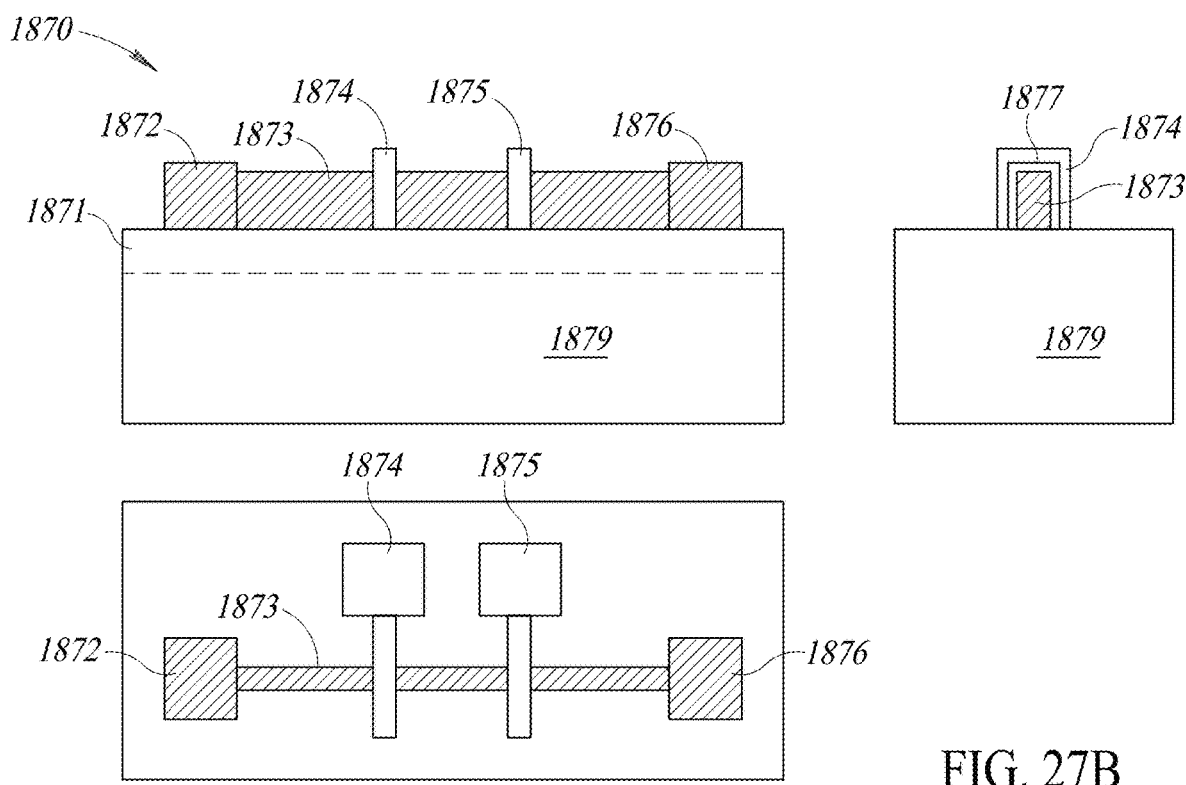
FIG. 27B is a diagram illustrating a cross section, side views, and top view of an example 3D multiple qdot quantum structure using local fin depletion tunneling.

A diagram illustrating a cross section, side views, and top view of an example 3D multiple qdot quantum structure using local fin depletion tunneling is shown in FIG. 27B. The quantum structure, generally referenced 1870, comprises substrate 1879, optional oxide layer 1871, wells 1872, 1876, fin 1873, gate oxide 1877, and overlapping control gates 1874, 1875. Note that the dashed line indicates the optional oxide layer that isolates the 3D quantum structure from the substrate. The substrate may comprise standard resistivity, high resistivity, or isolating substrates. The quantum structure 1870 is useful when quantum transport is needed, i.e. quantum shift and particle spatial entanglement, and can be realized in bulk 3D semiconductor processes, e.g., FinFET, or in SOI 3D semiconductor processes.

Figure 28A:
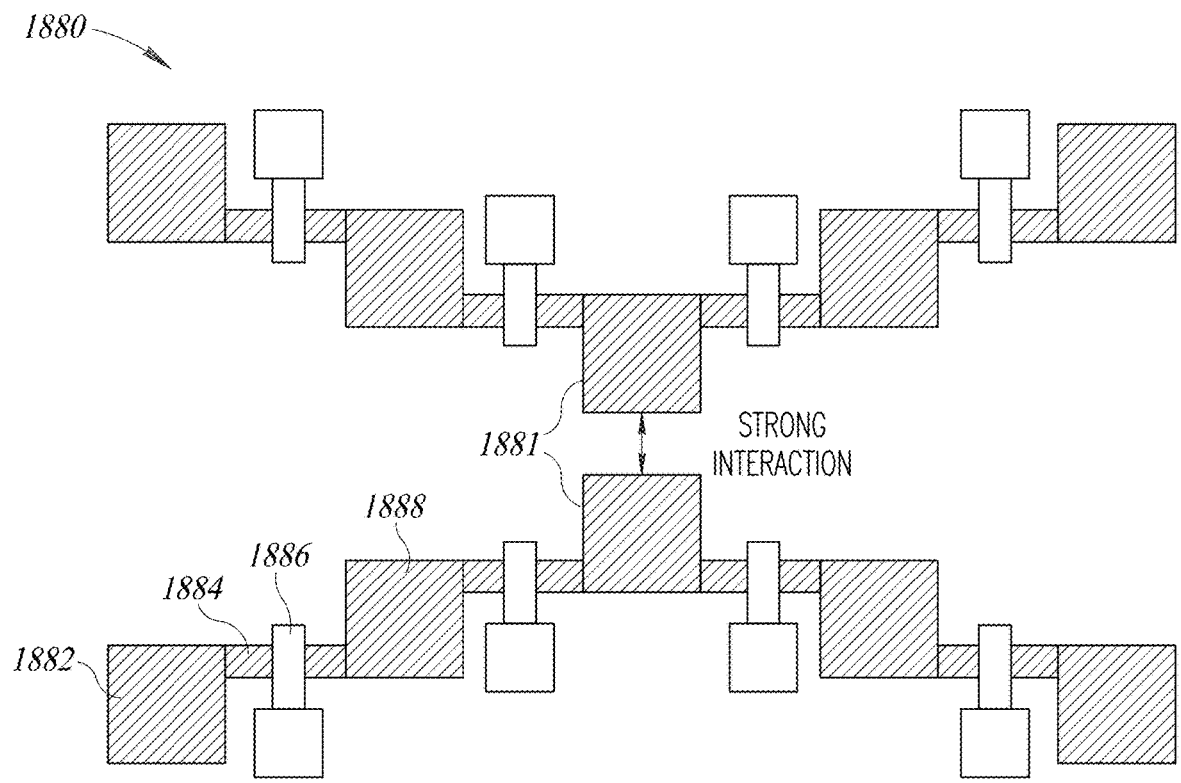
FIG. 28A is a diagram illustrating two example double V fin-gate-fin structures having two wells placed in close proximity allowing quantum particles to interact.

A diagram illustrating two example double V fin-gate-fin structures having two wells placed in close proximity allowing quantum particles to interact is shown in FIG. 28A. The quantum interaction gate, generally referenced 1880, comprises two 3D structures comprising a plurality of qdots 1882, 1888, fins 1884, control gates 1886, and interaction qdots 1881.

In this embodiment, the inner two semiconductor wells 1881 come in very close proximity thereby allowing a strong interaction between particles or distributed particles in the two qdots. The distance between other pairs of qdots is significantly larger and thus the interaction between corresponding particles is much smaller, ideally negligible. In this manner, the double V quantum structure shifts two or more particles into specific positions for a well controlled interaction and then transports them apart. The preparation of the quantum state also happens when particles are further away and thus can be done largely independent one from the other. This also allows a well-controlled interaction between particles only when they are in specific qdots and when the control signals are configured to enable the interaction.

Figure 28B:
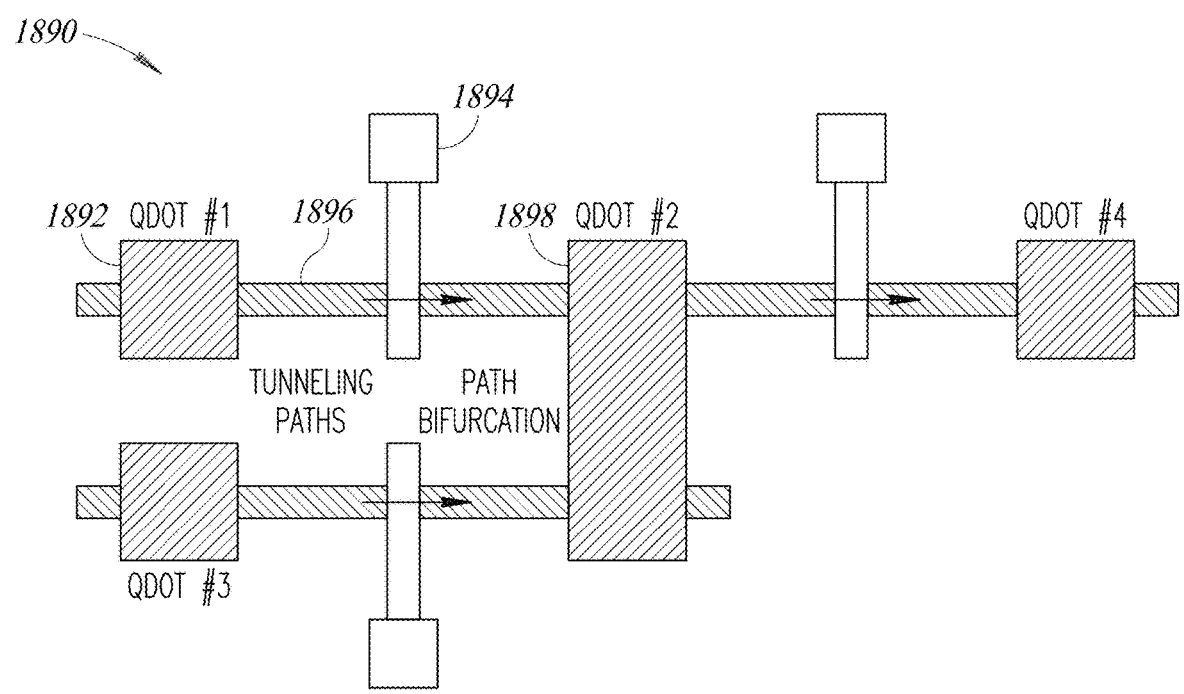
FIG. 28B is a diagram illustrating an example 3D semiconductor quantum structure using fin-to-fin tunneling through a local depleted region with a shared well between two fin paths providing bifurcation.

A diagram illustrating an example 3D semiconductor quantum structure using fin-to-fin tunneling through a local depleted region with a shared well between two fin paths providing bifurcation is shown in FIG. 28B. The quantum structure, generally referenced 1890, comprises a plurality of qdots 1892, namely qdots #1, #2, #3, #4, fins 1896, and control gates 1894. The well of qdot #2 1898 overlaps two fins to provide path bifurcation whereby particles can move between qdots #1 and #4 and between qdots #3 and #4.

Note that this quantum structure can realize either a bifurcation of the quantum operation path or a merger of the quantum operation path. This structure is useful in creating more complex quantum structures. Note also that the control gates overlapping the two fins and separating qdots #1 and #3 can be separated (as shown) or can be shared (not shown).

Figure 28C:
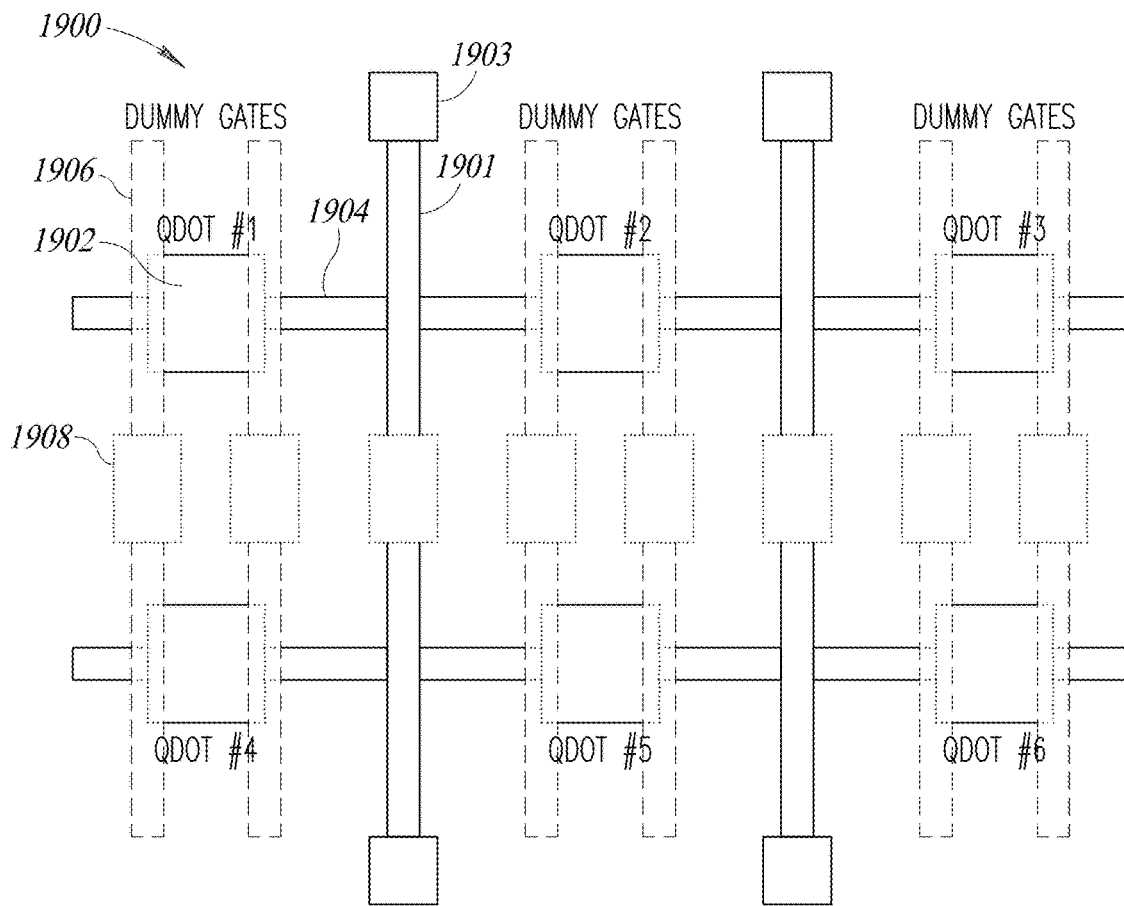
FIG. 28C is a diagram illustrating an example quantum structure with dummy gates and gate cuts that separate control and dummy gates.

A diagram illustrating an example quantum structure with dummy gates and gate cuts that separate control and dummy gates is shown in FIG. 28C. The quantum structure, generally referenced 1900, comprises qdots 1902, namely qdots #1 to #6, fins 1904, control gates 1901, contacts 1903, dummy gates 1906 not used in operation of the circuit, and gate cuts 1908. Depending on the actual 3D semiconductor process used, dummy gates may be needed but they remain floating with no potential. The gates need to be equally spaced and on the edges of the well. In addition, they may need to be cut in order to prevent unwanted interactions. The cutting may be done on top of a dummy fin, or alternatively without the fin. Although 12 control gates are shown, only four are active.

Figure 28D:
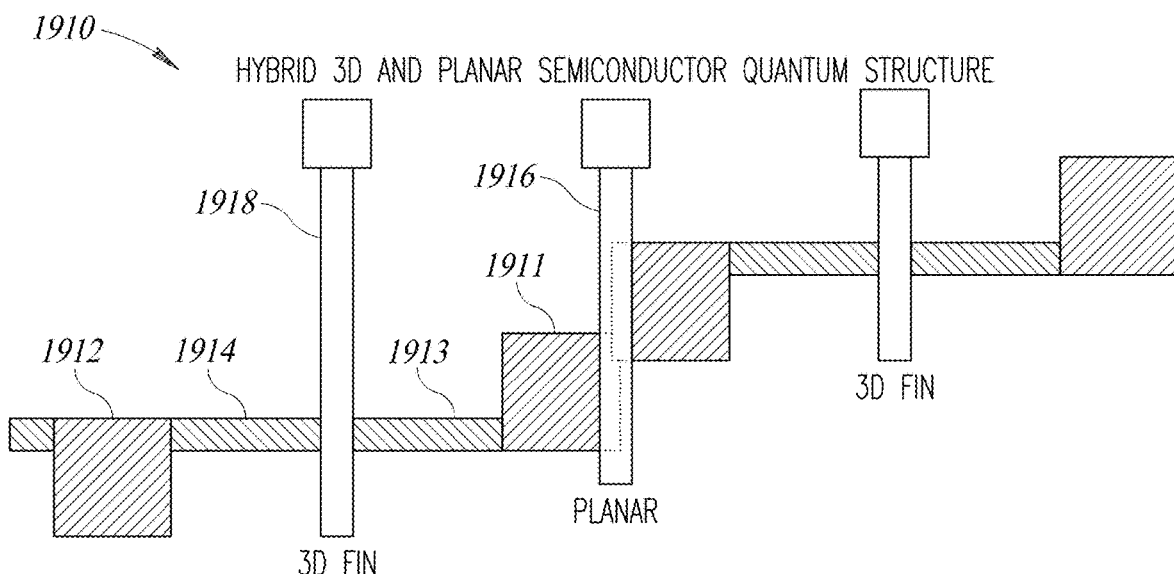
FIG. 28D is a diagram illustrating an example hybrid planar and 3D semiconductor quantum structure using both fin-to-fin and well-to-well tunneling through local depletion region.

A diagram illustrating an example hybrid planar and 3D semiconductor quantum structure using both fin-to-fin and well-to-well tunneling through local depletion region is shown in FIG. 28D. The quantum structure, generally referenced 1910, comprises 3D qdots 1912, fins with portions 1914, 1913, 3D control gate 1918, planar qdots 1911, and planar control gate 1916. This hybrid embodiment uses both 3D and planar tunneling structures which is possible in a 3D semiconductor process. The inner quantum structure is planar with two overlapping wells (i.e. qdots) and uses well-to-well tunneling through a local depletion region. The outer, i.e. left and right, quantum structures are 3D and use fin-to-fin tunneling through a local depletion region. Note that the two types of tunneling have different barrier levels and thus require different control gate signals.

The present invention also provides a semiconductor quantum structure that uses a 3D semiconductor process used to fabricate two semiconductor fins and an overlapping imposing control gate that constitutes the tunneling path from one semiconductor qdot to the other. The tunneling is controlled by the control gate that imposes the potential on the tunneling path. By modulating the potential of the imposer gate, a controlled fin-gate and gate-fin tunneling through the thin oxide under the control gate is enabled, realizing the function of a position/charge qubit. More complex structures with higher number of qdots per continuous well and larger number of wells can be built. Both planar and 3D semiconductor processes can be used to build well/fin-to-gate and gate-to-fin/well tunneling quantum structures. Hybrid 3D and planar structures can be built as well. By combining a number of such elementary quantum structures a quantum computing machine is realized.

Figure 29:
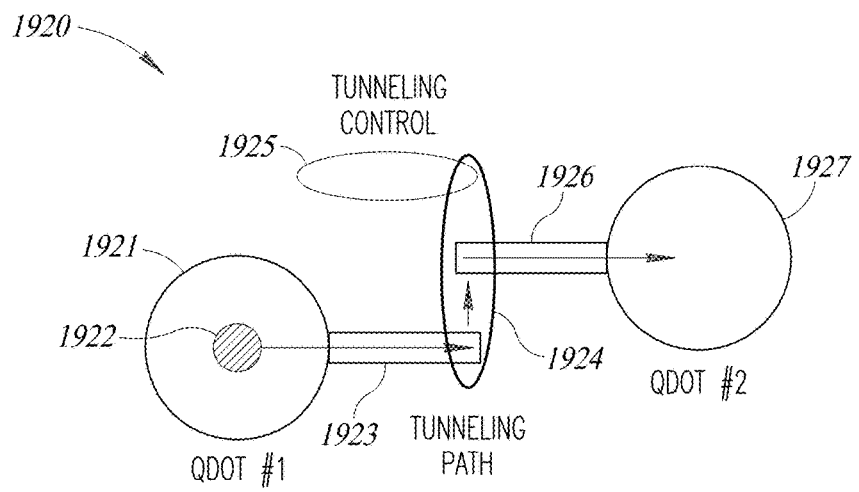
FIG. 29 is a diagram illustrating an example 3D semiconductor quantum structure using fin-to-gate tunneling through oxide.
Figure 30:
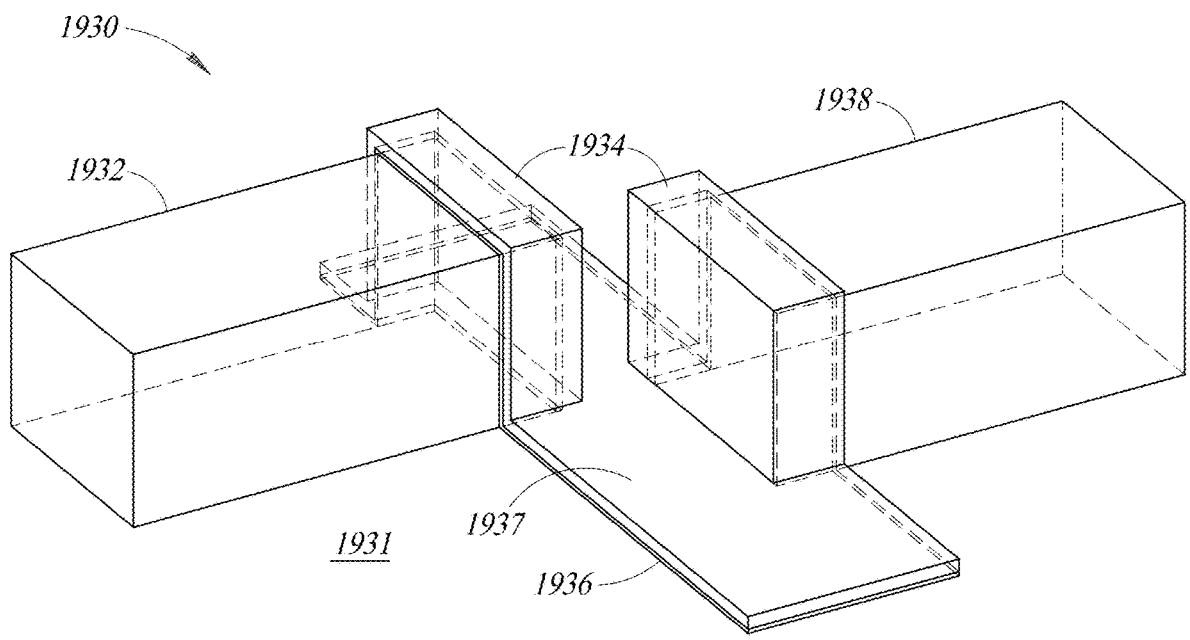
FIG. 30 is a diagram illustrating a three dimensional view of an example 3D semiconductor quantum structure using fin-to-gate and gate-to-fin tunneling through oxide.

A diagram illustrating an example 3D semiconductor quantum structure using fin-to-gate tunneling through oxide is shown in FIG. 29. The quantum structure, generally referenced 1920, comprises two wells 1921, 1927 with fin structures 1923, 1926 to realize the quantum dots #1 and #2, a gate layer with oxide 1924 overlaps both fins and creates a tunneling path from one fin to the other, and control terminal 1925. A diagram illustrating a three dimensional view of an example 3D semiconductor quantum structure using fin-to-gate and gate-to-fin tunneling through oxide is shown in FIG. 30. The quantum structure, generally referenced 1930, comprises fins 1932, 1938, overlapping control gate 1936 with thin oxide layer 1937, substrate 1931, and local depletion region 1934. Note that the well may be omitted and the qdot realized by the semiconductor fin area only.

With reference to FIGS. 29 and 30, the tunneling is controlled by the control terminal 1925 that imposes the potential on the tunneling gate. In one embodiment, the control gate is substantially floating but it is electrostatically coupled to the control terminal 1925 nearby. If the tunnel barrier is high, the quantum particle is locked in its prior state. When the control terminal determines a lowering of the barrier, the quantum particle is allowed to tunnel from one qdot to the other. Depending on the pulse width of the control signal, the quantum particle either completely or partially tunnels through. In the latter case, the quantum particle is distributed between two qdots to achieve a spatial superposition state. A thin oxide layer separates the semiconductor fin from the control gate. Note that in real implementations, the quantum structure generally has a deformed complex 3D shape where the depletion region depends on the particular implementation and semiconductor process used. The structures shown herein are for illustration purposes only.

Figure 31:
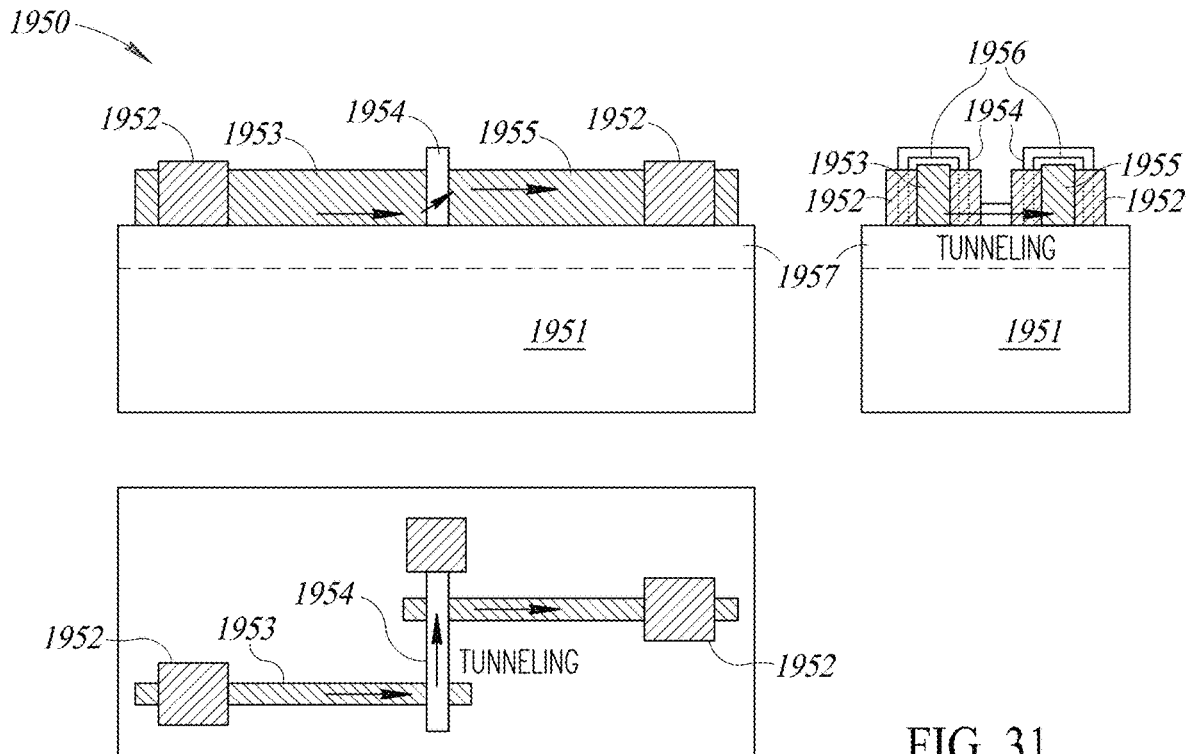
FIG. 31 is a diagram illustrating a cross section, side view, and top view of an example 3D semiconductor quantum structure using fin-to-gate tunneling through oxide.

A diagram illustrating a cross section, side view, and top view of an example 3D semiconductor quantum structure using fin-to-gate tunneling through oxide is shown in FIG. 31. The quantum structure, generally referenced 1950, comprises substrate 1951, optional oxide layer 1957, wells 1952, fins 1953, 1955, gate oxide 1956, and overlapping control gate 1954. Note that the dotted line indicates the optional oxide layer that isolates the 3D quantum structure from the substrate, i.e. SOI process. The substrate may comprise standard resistivity, high resistivity, or isolating substrates.

The tunneling through the oxide in the quantum structure is induced in a fin by the overlapping control gate. When the barrier is high, virtually no tunneling current is allowed. When the barrier is lowered, tunneling through the gate oxide allows the particle to move from one qdot to the other. If the particle has not completed the move from one qdot to the other, it will spread (equally or non-equally) between two qdots to achieve a superposition state.

Figure 32:
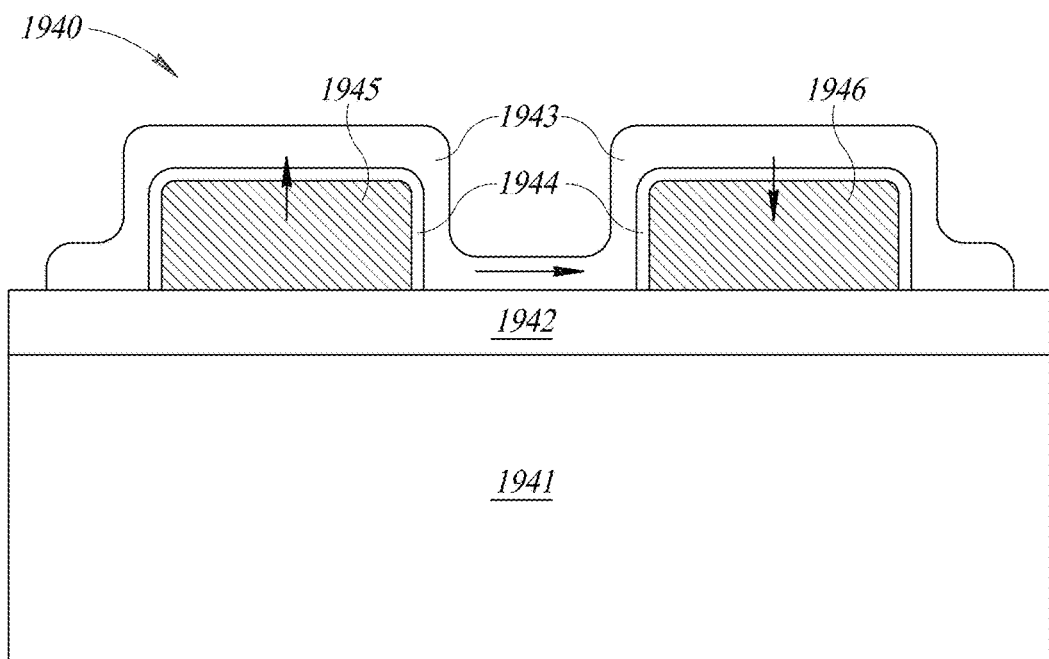
FIG. 32 is a diagram illustrating a cross section of an example 3D semiconductor quantum structure using fin-to-gate and gate-to-fin tunneling.

A diagram illustrating a cross section of an example 3D semiconductor quantum structure using fin-to-gate and gate-to-fin tunneling is shown in FIG. 32. The quantum structure, generally referenced 1940, comprises substrate 1941, optional oxide layer 1942, fins 1945, 1946, gate oxide 1944, and overlapping control gate 1943. As described supra, the tunneling through the oxide layer 1944 is controlled by the overlapping control terminal that imposes the potential on the control gate. If the tunnel barrier is high, the quantum particle is locked in its prior state. When the control terminal determines a lowering of the barrier, the quantum particle is allowed to tunnel from one qdot to the other.

Figure 33:
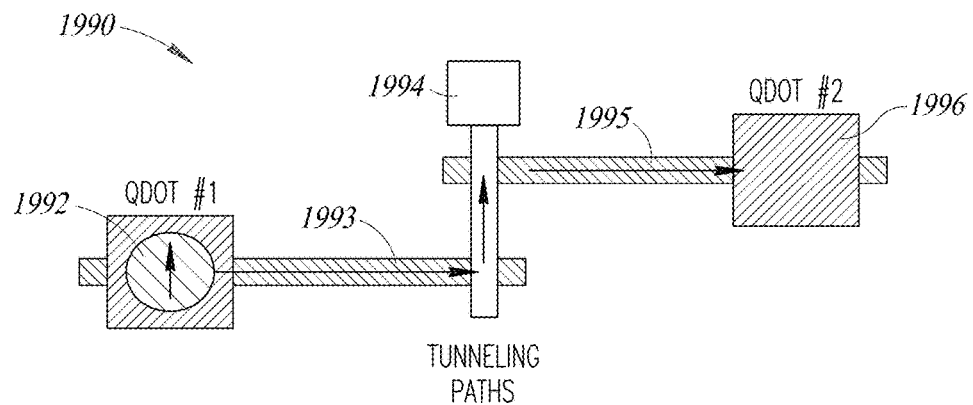
FIG. 33 is a diagram illustrating a top view of an example two qdot 3D semiconductor quantum structure using fin-to-gate tunneling through oxide.

A diagram illustrating a top view of an example two qdot 3D semiconductor quantum structure using fin-to-gate tunneling through oxide is shown in FIG. 33. The quantum structure, generally referenced 1990, comprises two wells 1992, 1996 with fin structures 1993 that realize quantum dots #1 and #2 and a control gate layer with oxide 1994 overlapping both fins creating a tunneling path 1995 for particle 1992 from one fin to the other.

Note that different shapes can be used for the layers used to construct the quantum structure, e.g., squares, rectangles, polygons, circles, composed shapes, etc. as described supra. In this embodiment, two wells are added, one to each fin which crosses the well in the middle. When the control terminal lowers the barrier, the quantum particle in the left qdot tunnels to the right qdot.

Figure 34A:
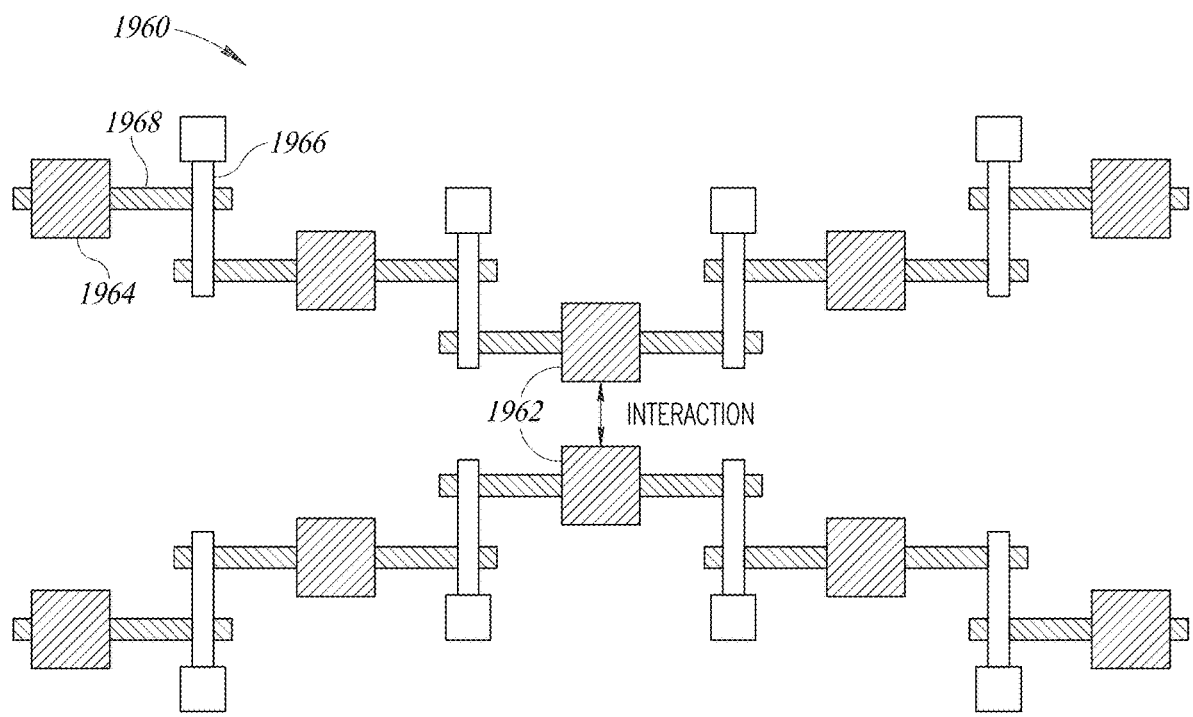
FIG. 34A is a diagram illustrating an example double V quantum interaction structure using 3D semiconductor process with fin-to-gate tunneling.

A diagram illustrating an example double V quantum interaction structure using 3D semiconductor process with fin-to-gate tunneling is shown in FIG. 34A. The quantum interaction gate, generally referenced 1960, comprises two 3D structures comprising a plurality of qdots 1964, fins 1968, control gates 1966, and interaction qdots 1962.

In this embodiment, the inner two semiconductor wells 1962 come in very close proximity thereby allowing a strong interaction between particles or distributed particles in the two qdots. The distance between other pairs of qdots is significantly larger and thus the interaction between corresponding particles is much smaller, ideally negligible. In this manner, the double V quantum structure shifts two or more particles into specific positions for a well controlled interaction and them transports them apart. The preparation of the quantum state also happens when particles are further away and thus can be done largely independent one from the other. This also allows a well controlled interaction between particles only when they are in specific qdots and when the control signals are configured to enable the interaction.

Figure 34B:
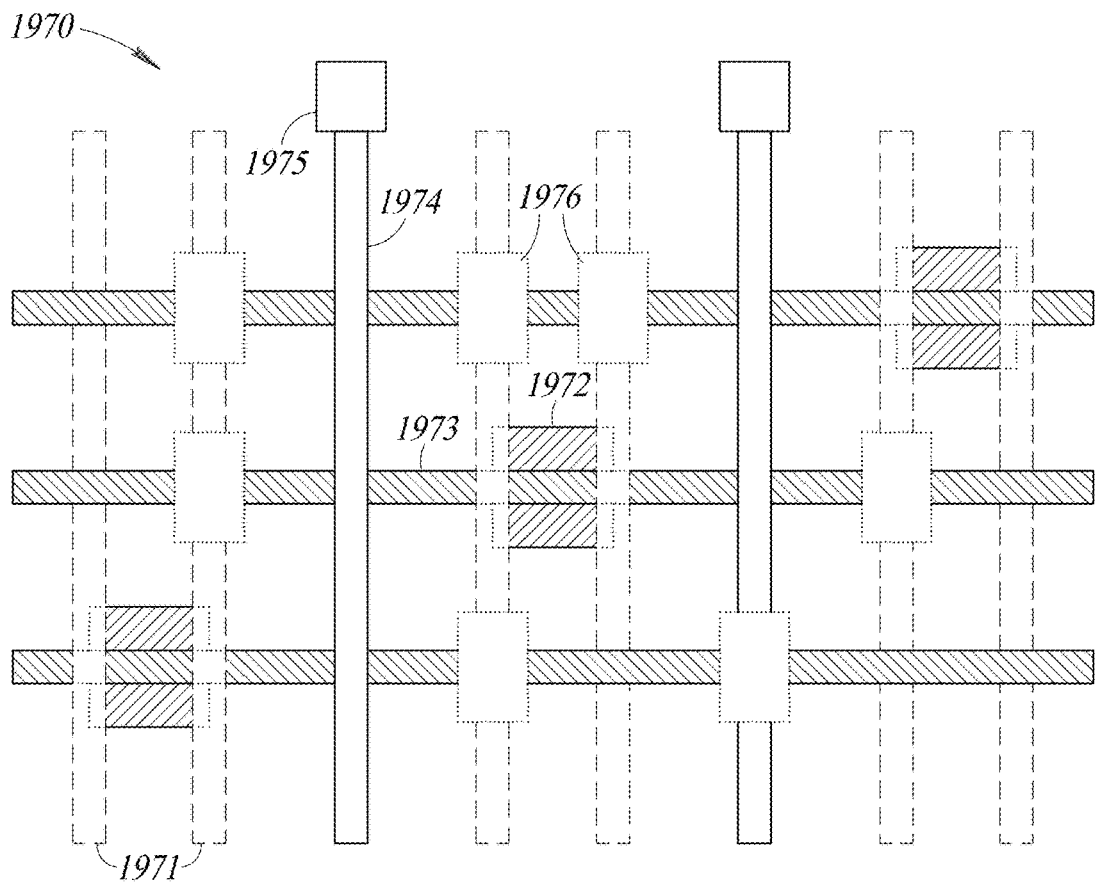
FIG. 34B is a diagram illustrating an example quantum structure with fin-to-gate tunneling with dummy gates and cuts to create dummy fins.

A diagram illustrating an example quantum structure with fin-to-gate tunneling with dummy gates and cuts to create dummy fins is shown in FIG. 34B. The quantum structure, generally referenced 1970, comprises a plurality of qdots 1972, fins 1973, control gates 1974, contacts 1975, dummy gates 1971 not used in operation of the circuit, and gate cuts 1976. Depending on the actual 3D semiconductor process used, dummy gates may be needed which remain floating with no potential. The gates need to be equally spaced and on the edges of the well. In addition, they may need to be cut in order to prevent unwanted interactions. The cutting may be done on top of a dummy fin, or alternatively without the fin.

Figure 34C:
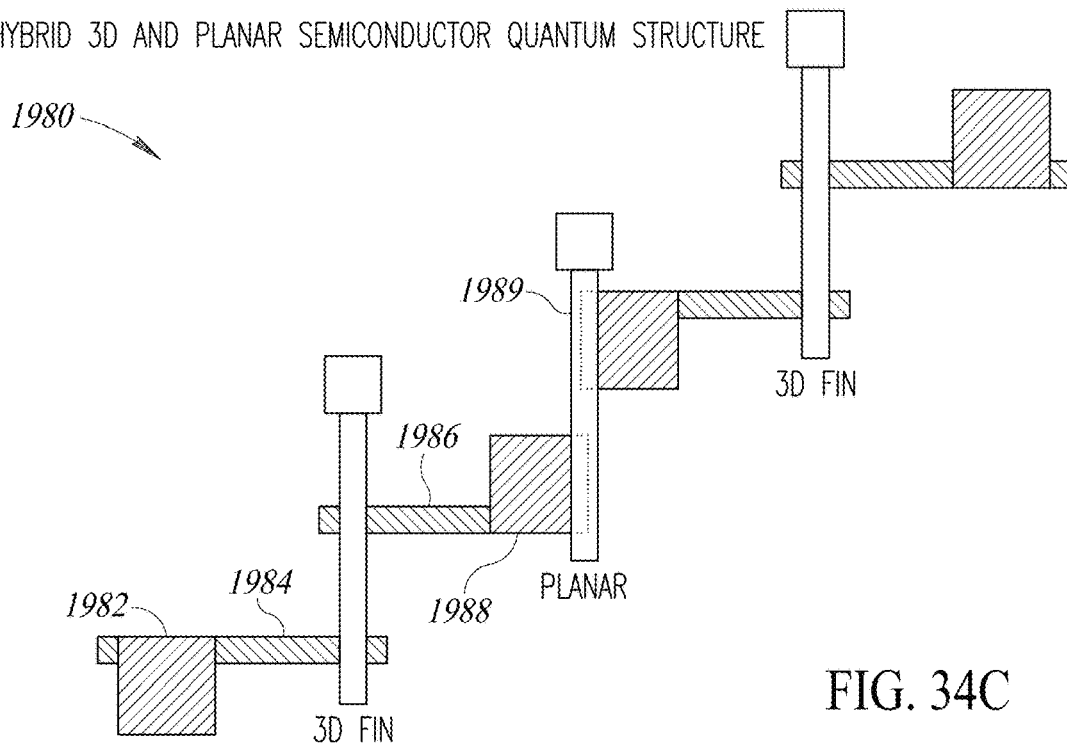
FIG. 34C is a diagram illustrating an example hybrid planar and 3D semiconductor quantum structure using both fin-to-gate and well-to-gate tunneling.

A diagram illustrating an example hybrid planar and 3D semiconductor quantum structure using both fin-to-gate and well-to-gate tunneling is shown in FIG. 34C. The quantum structure, generally referenced 1980, comprises 3D qdots 1982, fins 1984, 1986, 3D control gate 1986, planar qdots 1988, and planar control gate 1989. This hybrid embodiment uses both 3D and planar tunneling structures which is possible in a 3D semiconductor process. The inner quantum structure is planar with two wells (i.e. qdots) and uses well-to-gate tunneling through oxide. The outer, i.e. left and right, quantum structures are 3D and use fin-to-fin tunneling through oxide. Note that the two types of tunneling have different barrier levels and thus require different control gate signals.

Figure 35:
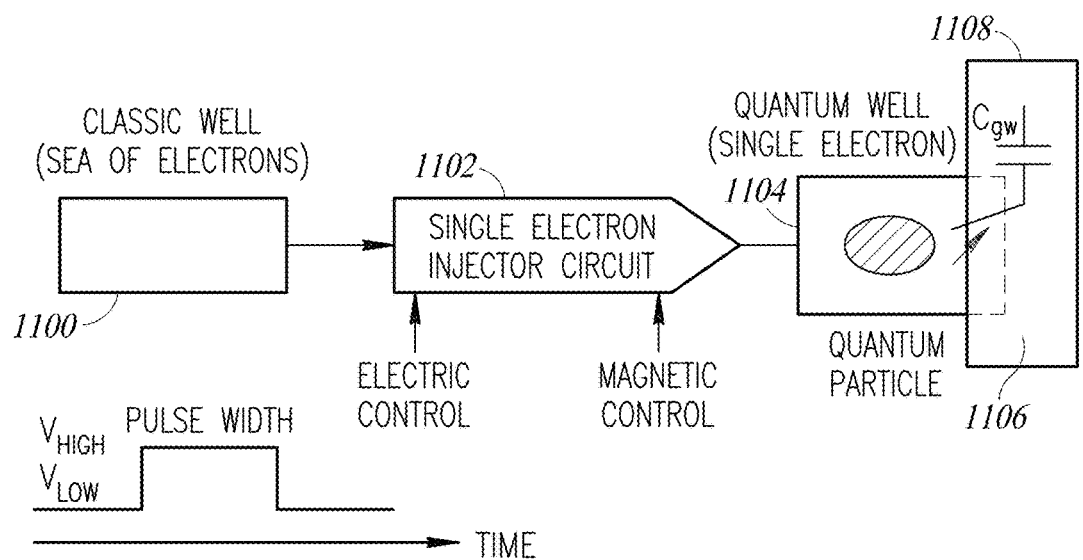
FIG. 35 is a diagram illustrating an example initialization configuration for a quantum interaction structure using tunneling through gate-well oxide layer.

A diagram illustrating an example initialization configuration for a quantum interaction structure using tunneling through gate-well oxide layer is shown in FIG. 35. The circuit comprises a classic well 1100, single particle (e.g., electron) injector circuit 1102, quantum well 1104, and control gate 1108. The circuit is operative to separate a quantum behaving electron from the sea of electrons present on the surrounding classic semiconductor structures, such as well 1100. The single electron injection circuit 1102 takes only one electron from the classic well situated on its left side and injects it into the quantum well when the proper control signal is applied. In general, there are several ways to control the quantum structure: (1) using electric signals only, (2) using magnetic signals only, or (3) using a combination of electric and magnetic signals. The electric control signal preferably has specified amplitude levels (Vlow/Vhigh) and given pulse width. The magnetic control signal is preferably of appropriate strength.

Note that the magnetic field control can be used to select an electron with a given spin orientation. This uses the property of electrons to orient their spin depending on the direction of the magnetic field direction at the time when the single electron was isolated from the classic sea of electrons. The direction of the magnetic field can be changed and thus the two spin orientations can be individually selected.

In order to perform a quantum operation in a given quantum structure having two or more qdots, the quantum system first needs to be initialized into a known base state. One or more electrons can be injected into the multi-qdot quantum structure. These single electrons are injected only into some of the qdots of the overall quantum structure. Next, control imposing signals are applied that determine the quantum evolution of the state and perform a certain desired quantum operation.

In general, the quantum operation performed depends on the specific control signals applied. In the case of a single position/charge qubit including two qdots that can realize a generalized phase rotation of the quantum state, the rotation angle is dependent on the pulse width of the control signal applied as compared to the Rabi (or occupancy state) oscillation period.

In a two qdot quantum system, if the tunneling barrier is lowered and kept low, a quantum particle starting from one of the qdots will begin tunneling to the next qdot. At a given time of half the Rabi oscillation period the particle will be completely on the second qdot, after which it will start tunneling back to the first qdot. At a certain time, the particle will have returned to the first qdot, after which the process repeats itself. This process is called the Rabi or occupancy oscillation and its period is named the Rabi or occupancy oscillation period. The phase rotation in a two qdot system will depend on the control signal pulse width as related to the Rabi oscillation period.

Figure 36:
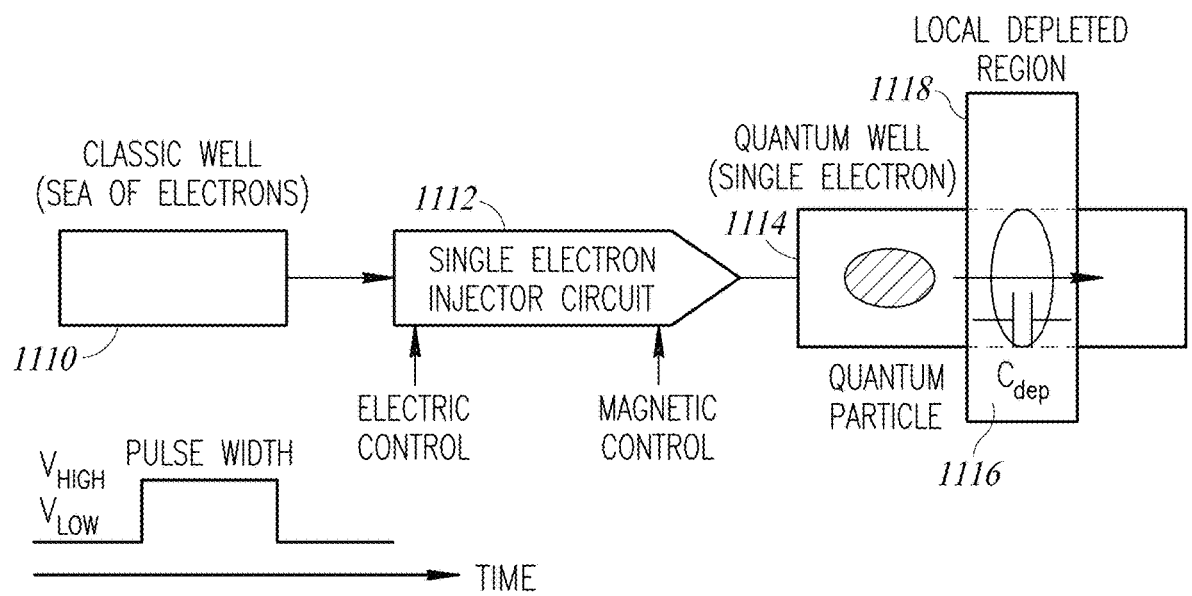
FIG. 36 is a diagram illustrating an example initialization configuration for a quantum interaction structure using tunneling through local depleted region in a continuous well.

A diagram illustrating an example initialization configuration for a quantum interaction structure using tunneling through a local depleted region in a continuous well is shown in FIG. 36. The circuit comprises a classic well 1110, single particle (e.g., electron) injector circuit 1112, quantum well 1114, and control gate 1118. The quantum structure comprises two qdots (additional qdots are possible) on either side of the control gate 1118, and a tunneling path (represented by the arrow) that has a partial overlap with the qdots. The quantum operation is controlled by a control gate (or control terminal) 1118 situated in close proximity of the tunneling path.

In one embodiment, the qdots are implemented by semiconductor wells, while the tunneling path is realized by a polysilicon layer that partially or completely overlaps the two wells. The tunneling appears vertically over the thin oxide layer between the semiconductor well and the polysilicon layer. The control terminal is realized with another well or another polysilicon layer placed in close proximity in order to exercise reasonable control over the tunneling effect.

In another embodiment, a semiconductor quantum processing structure is realized using lateral tunneling in a local depleted well. The two qdots are linked by a region that is locally depleted where the tunneling occurs (represented by the arrow). The control terminal typically overlaps the tunneling path in order to maintain well-controlled depletion of the entire linking region between the two qdots. This prevents direct electric conduction between the two qdots.

In another embodiment, the two qdots of the quantum structure are realized by a single semiconductor well having a control polysilicon layer on top. The tunneling occurs laterally/horizontally through the depleted region that isolates the two qdots.

It is noted that quantum structures can be implemented in semiconductor processes using various tunneling effects. One possible tunneling is the through a thin oxide layer. In most semiconductor processes the thinnest oxide is the gate oxide, which can span several atomic layers. In some processes, the oxide layer used by the metal-insulator-metal (MIM) capacitance is also very thin. Another example is the tunneling through a depleted region between two semiconductor well regions. Such a local depleted region may be induced by a control terminal into an otherwise continuous drawn well or fin.

Figure 37A:
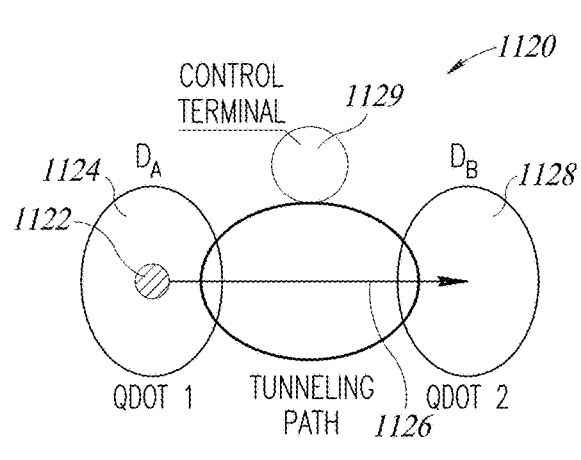
FIG. 37A is a diagram illustrating an example planar semiconductor quantum structure using tunneling through oxide layer.

A diagram illustrating an example planar semiconductor quantum structure using tunneling through oxide layer is shown in FIG. 37A. The semiconductor qubit, generally referenced 1120, comprises two qdots 1124, 1128, partial overlapped polysilicon gate 1129 and vertical thin oxide tunneling 1126, and can contain a particle 1122.

Figure 37B:
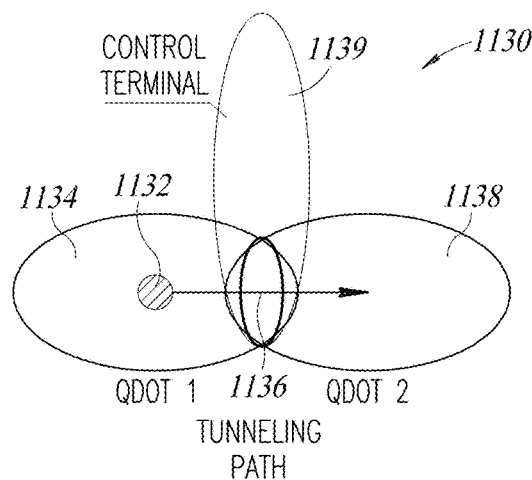

A diagram illustrating an example planar semiconductor quantum structure using tunneling through local depleted well is shown in FIG. 37B. The semiconductor qubit, generally referenced 1130, comprises two qdots 1134, 1138, control gate 1139, and horizontal local depleted well tunneling 1136, and can contain a particle 1132.

Figure 37C:
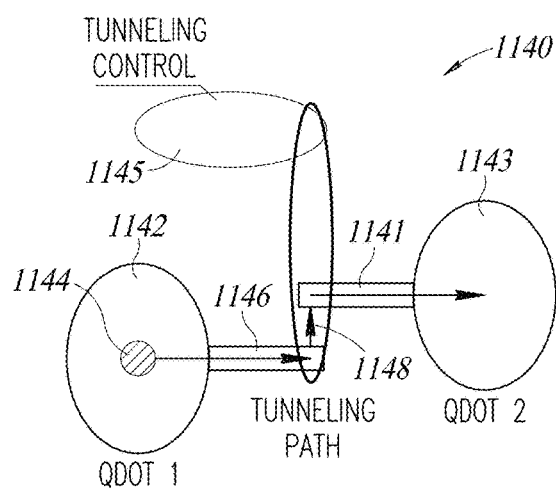

Note that there are numerous types of semiconductor processes. Some are planar, while others are used to fabricate 3D structures (e.g., FinFET). A diagram illustrating an example 3D process semiconductor quantum structure using tunneling through oxide layer is shown in FIG. 37C. The semiconductor qubit, generally referenced 1140, comprises two qdots 1142, 1143, control gate 1145, 3D fins 1146, 1141, and partial fin-to-gate overlap and vertical thin oxide tunneling 1148, and can contain a particle 1144.

Figure 37D:
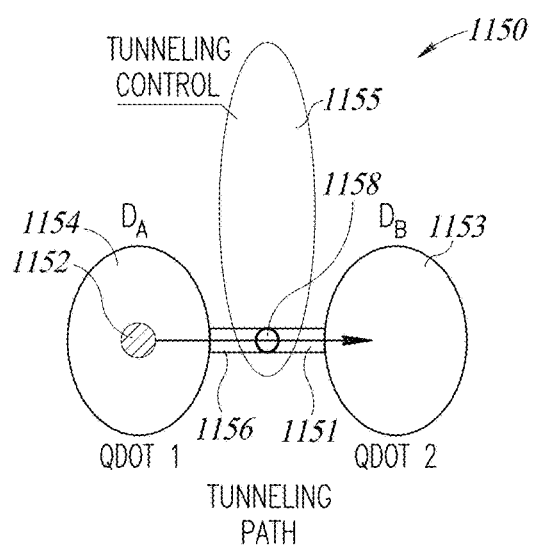

A diagram illustrating an example 3D process semiconductor quantum structure using tunneling through local depleted well is shown in FIG. 37D. The 3D semiconductor qubit, generally referenced 1150, comprises two qdots 1154, 1153, control gate 1155, 3D fins 1156, 1151, and horizontal local depleted fin tunneling 1158, and can contain a particle 1152.

In one embodiment, controlled-NOT (CNOT) quantum gates can be realized with any of the above described qubit structures implemented in either planar or 3D semiconductor processes.

Figure 38A:
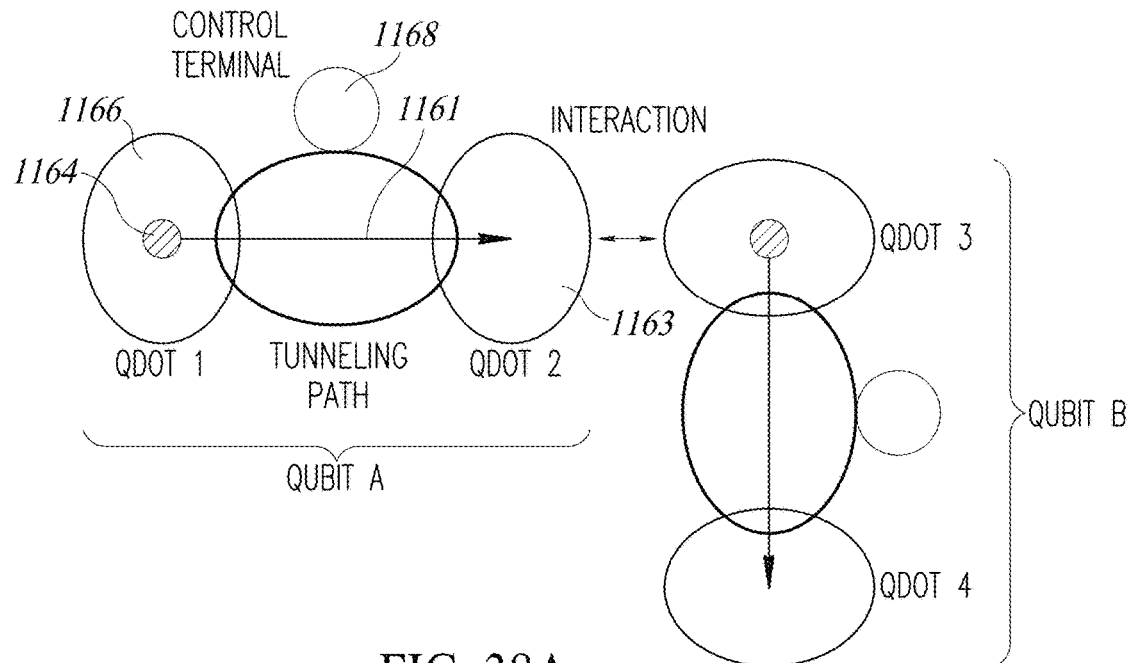

A diagram illustrating an example CNOT quantum interaction gate using tunneling through oxide layer implemented in planar semiconductor processes is shown in FIG. 38A. The quantum interaction gate comprises two qubits, qubit A and qubit B, with each qubit comprising two qdots 1166, 1163, tunneling path 1161, and control terminal 1168. Qdots 1 and 2 of qubit A and qdots 3 and 4 of qubit B are arranged such that qdots 2 and 3 are close enough for (possibly present there) particles 1164 to interact, for example, in an electrostatic manner.

Figure 38B:
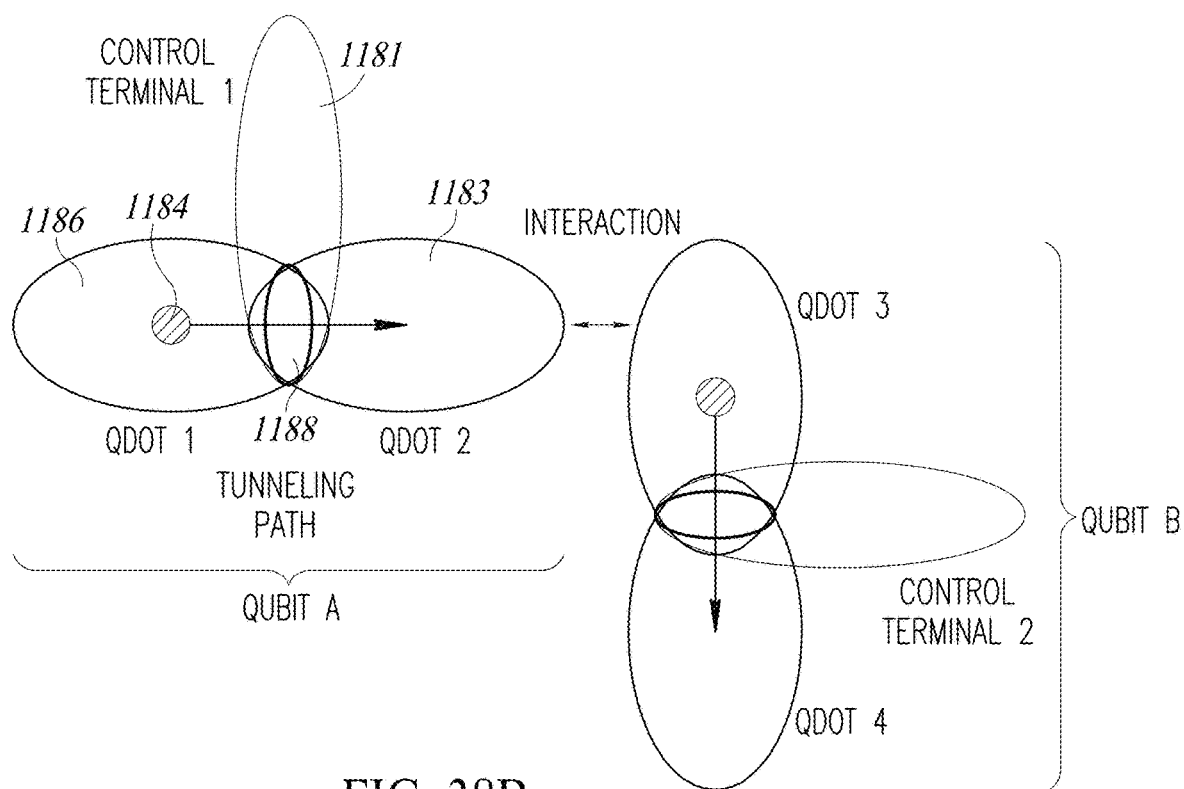

A diagram illustrating an example CNOT quantum interaction gate using tunneling through local depleted well implemented in planar semiconductor processes is shown in FIG. 38B. The quantum interaction gate comprises two qubits, qubit A and qubit B, with each qubit comprising two qdots 1186, 1183, tunneling path 1188, and control terminal 1181. Qdots 1 and 2 of qubit A and qdots 3 and 4 of qubit B are arranged such that qdots 2 and 3 are close enough for particles 1184 to interact.

Figure 38C:
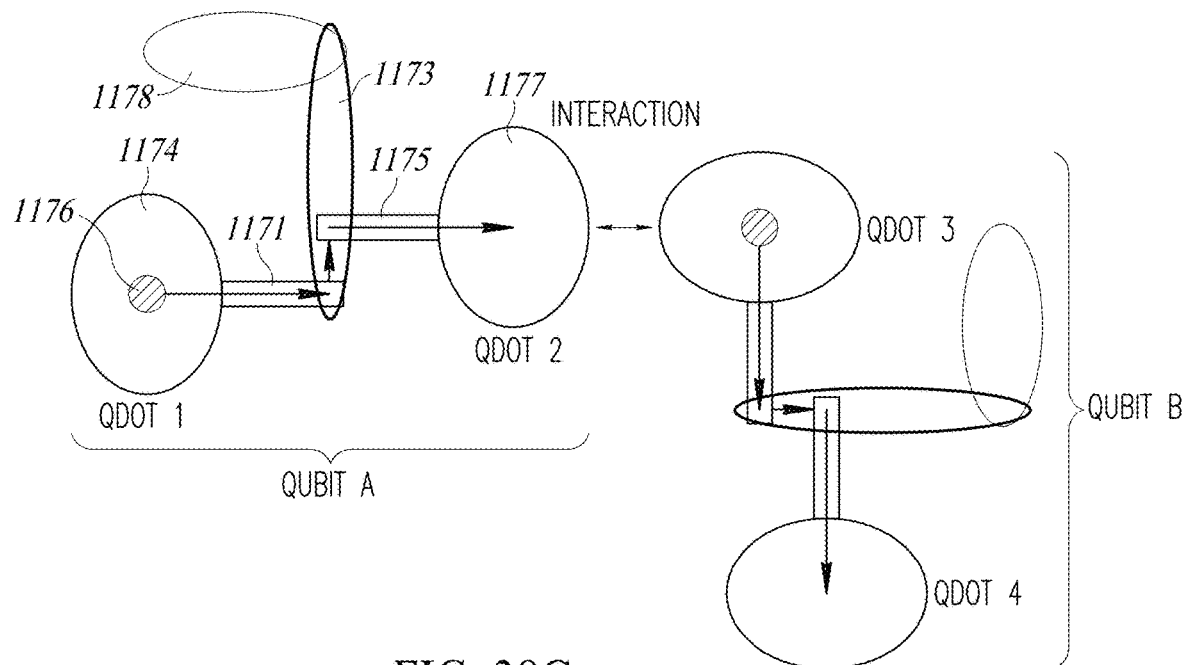

A diagram illustrating an example CNOT quantum interaction gate using tunneling through oxide layer implemented in 3D semiconductor processes is shown in FIG. 38C. The quantum interaction gate comprises two qubits, qubit A and qubit B, with each qubit comprising two qdots 1174, 1177, tunneling path 1171, 1173, 1175, and control terminal 1178. Qdots 1 and 2 of qubit A and qdots 3 and 4 of qubit B are arranged such that qdots 2 and 3 are close enough for particles (if present there) 1176 to interact.

Figure 38D:
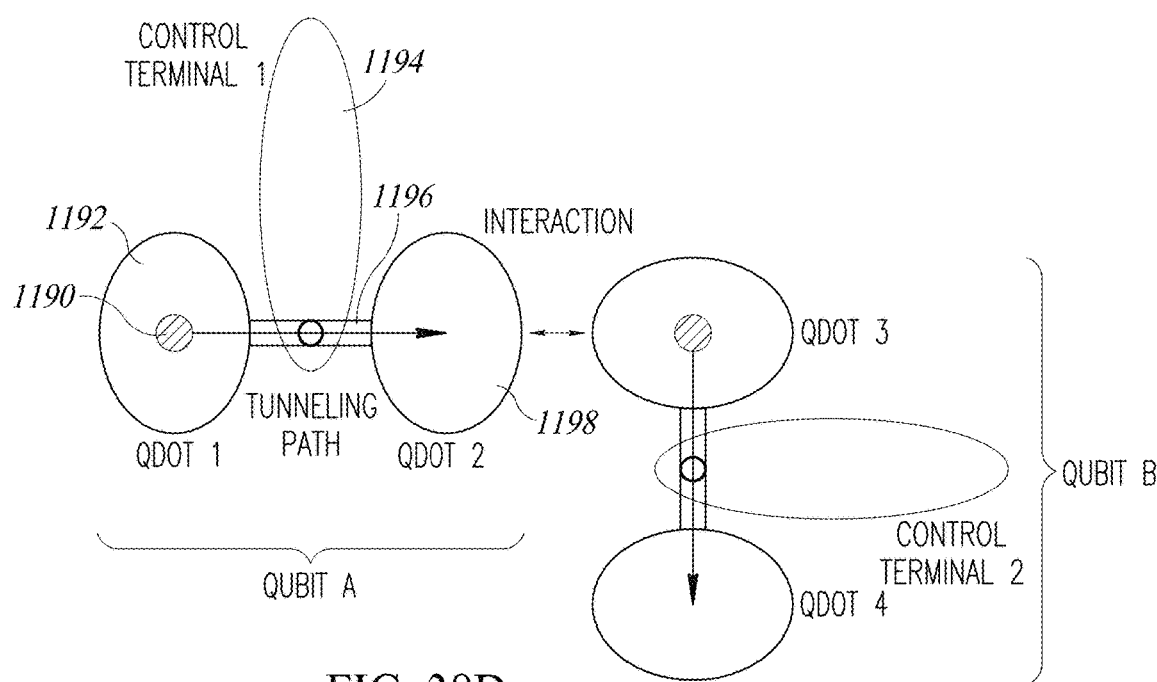

A diagram illustrating an example CNOT quantum interaction gate using tunneling through local depleted fin implemented in 3D semiconductor processes is shown in FIG. 38D. The quantum interaction gate comprises two qubits, qubit A and qubit B, with each qubit comprising two qdots 1192, 1198, tunneling path 1196, and control terminal 1194. Qdots 1 and 2 of qubit A and qdots 3 and 4 of qubit B are arranged such that qdots 2 and 3 are close enough for particles 1190 to interact.

Quantum Interaction

Quantum computing is based on the interaction between two or more individual particles that have been separated from a collectivity and which follow the laws of quantum mechanics. In order for two particles to interact, they generally need to be brought in close proximity. Particles that are relatively far away from one another have a small or negligible interaction.

Each particle carries information in its position and/or spin. Position/charge qubit based quantum computing uses the position to encode information, while spin qubit based quantum computing uses the spin of the particles to encode information. Hybrid qubits use both the position and the spin to encode information.

The two or more particles that need to interact and thus make an exchange of information need to be separately initialized in their corresponding quantum state. The separation may be either in distance, ensuring a negligible interaction of the particles as they are initialized, or in time when the particles are initialized at different time instances. In some embodiments both space and time separation may be used to ensure isolation between the two or more starting quantum states.

When two or more quantum particles/states are brought in close proximity, they interact with one another and in the process exchange information. We call the particles entangled as each of the particles carry information from all particles that have interacted. After the entanglement has occurred, the particles are moved at large distance and they still carry the entire information contained initially by the distinct initialized states. If measurement/detection is perform on one of the particles from the entangled ensemble, the corresponding quantum state will be collapsed. By measuring, for example, a charge qubit it is determined whether the particle is present or not in a given qdot. When one qubit is measured the corresponding component from the other qubits that are part of the entangled ensemble will also collapse.

In the case of semiconductor quantum structures based on tunneling through a local depletion region induced in a continuous well under the control of a gate terminal, the tunneling current is the quantum physics effect that governs the operation of the structure. The tunneling effect/current is dependent on one side on the tunnel barrier height, which in turn depends on the signal level applied at the control terminal. A second element that impacts the tunnel barrier and thus the tunneling effect is the presence of any other particle (one or more) in proximity of the target qubit. The presence or absence of another particle will change the Rabi oscillation frequency of a given target qubit. In a double qdot system when the control terminal determines a lowering of the tunnel barrier, the quantum particle will start tunneling forth and back between the two qdots. The precise position of the particle will depend on the pulse width of the control signal that enables the Rabi oscillation.

Figures 39A, 39B:
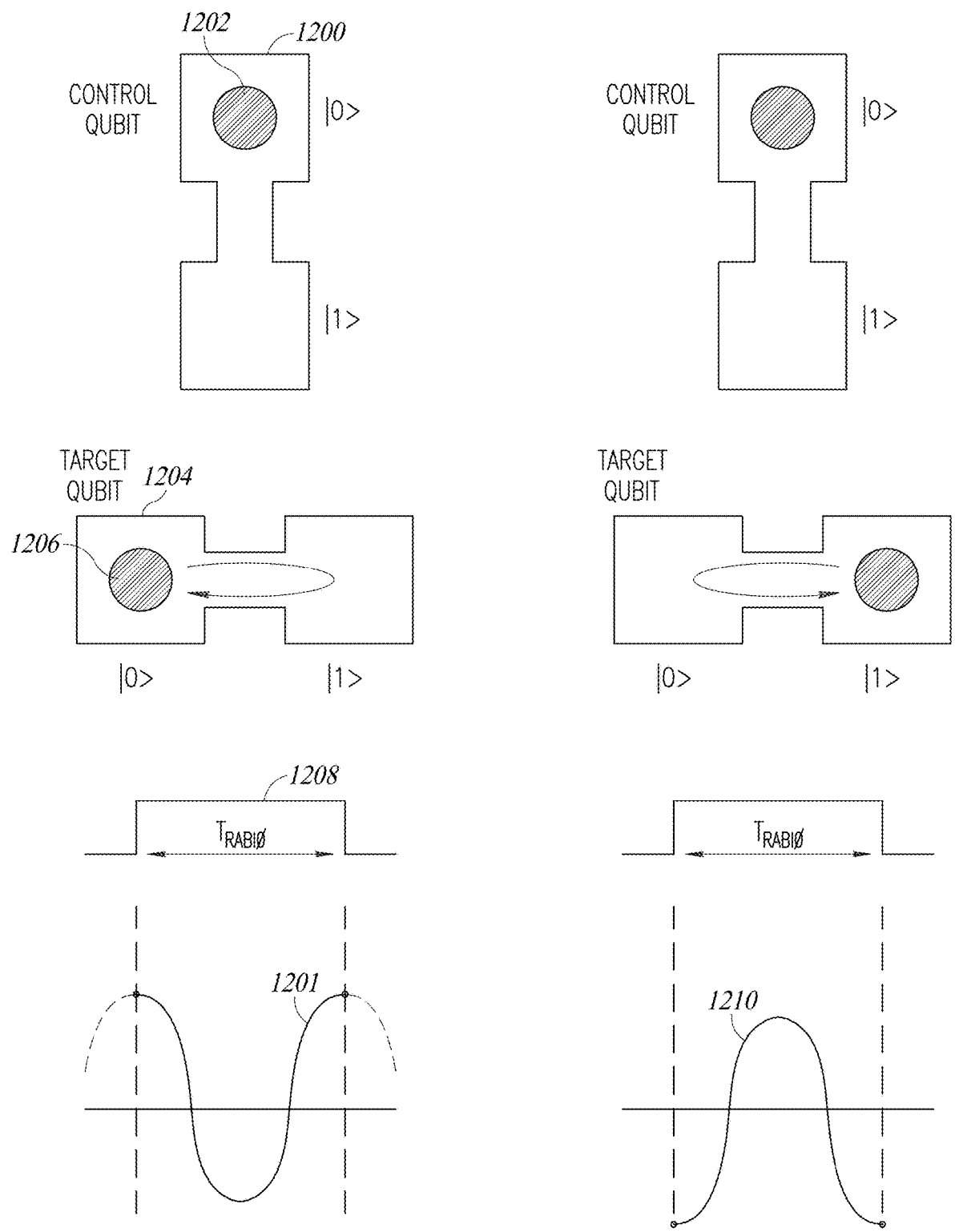

In order to get interaction between two particles present in their respective qubits, a semiconductor system with at least four qdots is needed as shown in FIG. 39A. There are multiple ways of operating a two qubit quantum structure, depending on how and what control signals are applied. In one embodiment of the quantum interaction gate, one of the two qubits may be designated as the "target" qubit and the other as the "control" qubit. The state evolution of the target qubit will be impacted by the state of the control qubit. The control qubit stays fixed during the interaction and only the target qubit will change its measured state. In the interaction process, however, both particles will entail changes as a result of their entanglement. In the position/charge qubit implementation, the spin of the control qubit may change as a result of the interaction, while the position of the target qubit will change as a result of the interaction. Any combination of position and spin changes are possible for the target and control qubits. In this embodiment, only the target qubit control terminal receives a pulse. Various quantum gates can be constructed in this way, including the controlled-NOT quantum gate, the Toffolli (control-control-NOT) quantum gate, the controlled rotation quantum gate, and the ancillary quantum gate.

Moving the quantum particles/states to and from given quantum gates is performed with quantum shift registers. Their length and orientation are preferably such that it links the different quantum gates into a corresponding quantum circuit based on a particular quantum algorithm.

In yet another embodiment of the quantum interaction gate, both (or all) qubits are allowed to change in their measured state (position, spin, or both). To achieve this both (or all) control terminals are pulsed. As a result, both (or all) particles that enter entanglement will have their measured state changed (position, spin, or both). As a byproduct of the entanglement, the other non-measured dimension may experience changes as well, e.g., the spin in a position qubit or the position in a spin qubit.

A diagram illustrating a first example controlled NOT double qubit structure and related Rabi oscillation is shown in FIG. 39A. The top control qubit 1200 comprises two qdots which can contain particle 1202. The lower target qubit 1204 comprises two qdots and can contain particle 1206. In one example, the control qubit may have a vertical orientation of its double qdot, while the target qubit may have a horizontal orientation of its double qdot. Other orientation combinations are possible, including angled or slanted.

In operation, when the particle 1202 of the control qubit is in its further away position we denote this quantum state as |0>. The Rabi oscillation frequency 1201 (or period) of the target qubit has a first value. If a control signal 1208 is applied to the target qubit that has a pulse width equal to the Rabi period, the particle will tunnel forward and back to its initial position resulting in keeping its original state. This is valid for both base quantum states when the particles are not in split states. For example, if the particle is initially present in the left qdot of the target qubit (we can arbitrarily denote this state as |0>) at the beginning of the control signal pulse, the particle will be back in the left qdot at the end of the pulse and thus the state |0> is preserved. If the particle was initially in the right qdot of the target qubit (we denote that state as |1>) as shown in FIG. 39B, the state is again preserved at the end of the control pulse equal to the Rabi period 1210 when the control particle is further away.

Now if the particle of the control qubit is moved to the closer-in position (which we denote by the quantum state |1>), as shown in FIG. 39C, the Rabi oscillation frequency and period will be modified as a result of the interaction between the two particles. In one example, the Rabi oscillation frequency of the target qubit is decreased as compared to dashed curve 1214 and its corresponding Rabi oscillation period 1212 is increased. If the same control pulse width is applied as before, the particle no longer has enough time to tunnel forward and back to its initial position. In this case the pulse width of the control signal is just enough for the particle to tunnel from the left qdot to the right qdot. This corresponds to an inversion or a NOT operation.

In FIG. 39C the particle that was initially in the left qdot (state |0>) has time to fully go to the right qdot (state |1>) with Rabi oscillation period 1212. In FIG. 39D the particle that was initially in the right qdot (state |1>) has time to fully go to the left qdot (state |0>) with Rabi oscillation period 1216. This corresponds to a controlled quantum inversion operation, hence the name controlled-NOT.

Figure 40:
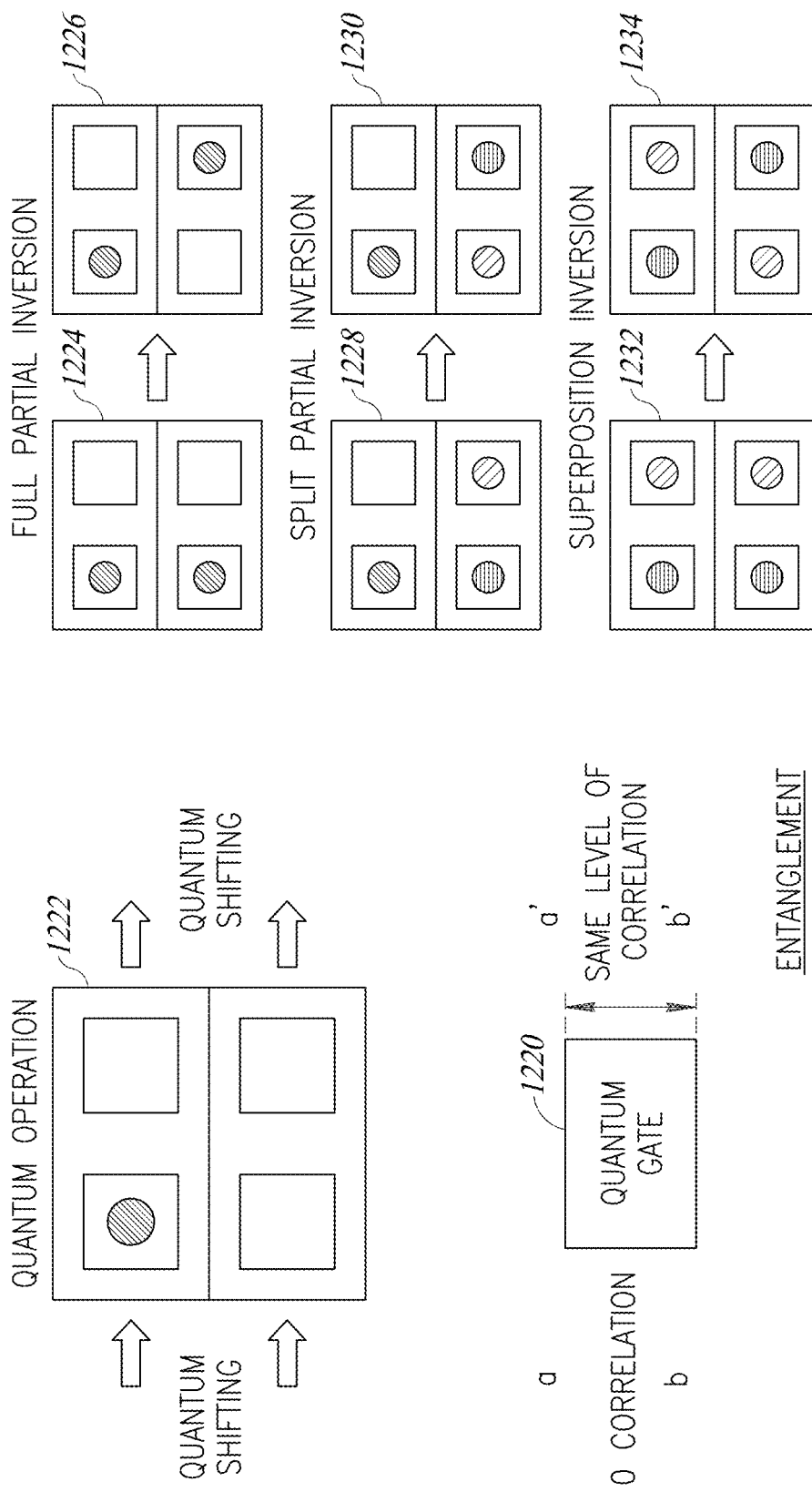

In the controlled-NOT quantum operation, the inversion applies not only to the base states |0> results in |1> and |1> results in |0>, but also applies to any superposition of quantum state a|0>+b|1> which goes to b|0>+a|0>. Such an operation 1222 for the quantum gate 1220 is shown in FIG. 40. The CNOT operation for full particle inversion is shown on the top right for two base state qubits. Both target and control qubits are in base states/full particle operation. In the state 1224 before inversion, the particles of both control and target qubits are in left positions. In the state 1226 after invention, the particle of the target qubit is in the right position.

In the middle is illustrated the CNOT operation for split particle inversion. In the state 1228 before inversion, the control qubit is in a base state, while the target qubit is in a split state. In the state 1230 after inversion, the target qubit state is inverted.

In the bottom is illustrated the CNOT operation for superposition inversion. In the state 1232 before inversion, both the control and the target qubits are in split states. In the state 1234 after inversion, the target qubit state is inverted. This is the more general quantum CNOT operation case.

Note that the controlled-NOT quantum gate together with the Hadamard gate form a fundamental quantum set, which means that any quantum algorithm can be built with a given combination of these two fundamental quantum gates.

To precisely obtain the functionality of a quantum CNOT, the distance between the four qdots is preferably such that when the control qubit/particle changes its position from the |0> to the |1> base state, the corresponding Rabi oscillation period of the target qubit is doubled (i.e. the frequency is halved). The control signal of the target qubit is also preferably equal to the Rabi period in the state |0> of the control qubit.

If these conditions are not satisfied, the quantum interaction gate will not have a CNOT operation, but a different controlled rotation operation. In this case, the two particles still interact and the corresponding Rabi oscillation period is changed, but not to a double value for the CNOT operation, but to some other value that results in a different particle splitting/rotation.

In real life implementations of such semiconductor quantum gates/structures, there are process variations (e.g., distances, thicknesses, dimensions, etc.) and also variability of the control signals (e.g., pulse width variabilities) which result in different amounts of Rabi oscillation period modifications. In one embodiment, a calibration procedure of the semiconductor quantum gate is applied to achieve CNOT functionality. An advantage of the semiconductor quantum implementation is that the integrated circuits approach allows the individual calibration of each quantum gate in the system. This compensates both for the random and the deterministic components of the variability.

A diagram illustrating an example controlled NOT quantum interaction gate using square layers with partial overlap and tunneling through oxide layer is shown in FIG. 41A. The CNOT quantum interaction gate, generally referenced 1360, comprises imposers 1362, 1364 each with separate control pulses, PULSE A and PULSE B, control gates 1363, and qdots 1361. Particles 1366, 1368 interact to provide the CNOT functionality. Note that only two chain paths have been used in this case. It is appreciated that other shapes, e.g., rectangle, etc., may be used.

A diagram illustrating an example Toffoli quantum interaction gate using square layers with partial overlap is shown in FIG. 41B. The controlled-controlled NOT (CCNOT) quantum interaction gate (or Toffoli gate), generally referenced 1370, comprises imposers 1372, 1374, 1376 each with separate control pulses, control gates 1379, and qdots 1375. Particles 1378, 1371, 1373 interact to provide the CCNOT functionality. It is appreciated that other shapes, e.g., rectangle, etc., may be used.

A diagram illustrating an example higher order controlled NOT quantum interaction gate using square layers with partial overlap is shown in FIG. 41C. In a similar manner, higher order quantum interaction gates can be constructed. The semiconductor $n^{th}$ order CNOT (n-CNOT) using square layers with partial overlap, generally referenced 1380, comprises a plurality of qdots 1386 making up multiple qubits, imposers 1382, control gates 1387, and particles 1384. It is appreciated that other shapes, e.g., rectangle, etc., may be used.

A diagram illustrating a first example of semiconductor entanglement quantum interaction gate including initialization, staging, interaction, and output locations is shown in FIG. 42A. The quantum interaction gate, generally referenced 1240, in the shape of double V comprises two qubits in close proximity and gradual increasing of the distance between the staging and initialization/detection or output locations to minimize parasitic interaction. Other shapes are also possible, while achieving large distance when interaction is not desired and close distance when interaction is desired. Interaction occurs between the two interaction qdots 1243, 1244.

A diagram illustrating a second example of semiconductor entanglement quantum interaction gate including initialization, staging, interaction, and output locations is shown in FIG. 42B. The quantum interaction gate, generally referenced 1250, in the shape of T comprises two qubits in close proximity and gradual increasing of the distance between the staging and initialization/detection or output locations to minimize parasitic interaction. Other shapes are also possible, while achieving large distance when interaction is not desired and close distance when interaction is desired. Interaction occurs between the two interaction qdots.

A diagram illustrating a third example of semiconductor entanglement quantum interaction gate including initialization, staging, interaction, and output locations is shown in FIG. 42C. The quantum interaction gate, generally referenced 1260, comprises two qubits whose interaction qdots are situated in close proximity and gradual increasing the distance between the staging and initialization/detection or output locations to minimize parasitic interaction. In this case, the particles are shifted forward and back through the same qdots. This structure is called the I-interaction structure. It has the same main characteristics as the double-V structure, but particles are traveling through the same qdots forward and back, instead of different loading (move-in) and de-loading (move-out) paths, like in FIG. 42A.

A diagram illustrating a fourth example of semiconductor entanglement quantum interaction gate including initialization, staging, interaction, and output locations is shown in FIG. 42D. The quantum interaction gate, generally referenced 1270, in the shape of H comprises three qubits forming main paths 1 and 2, and interactor path 3, in close proximity with gradual increasing of the distance between the staging and initialization/detection or output locations to minimize parasitic interaction. Other shapes are also possible, while achieving large distance when interaction is not desired and close distance when interaction is desired. First and second interaction occurs between the two pairs of interaction qdots.

In a quantum core, a large number of interactions between the different quantum states/particles needed to be performed. Using the double-V and multiple-V quantum interaction structures a quantum core with relatively parallel quantum paths can be realized.

A diagram illustrating an example quantum interaction gate using double V interaction between neighboring paths is shown in FIG. 43A. The quantum interaction gate, generally referenced 1280, comprises close-by interaction qdots and further-away qdots for negligible parasitic interaction, input quantum state 1281, output quantum 1282, a plurality of N quantum paths 1283, and double V interaction 1284 between paths where the interactions are allowed between neighboring quantum paths.

A diagram illustrating an example quantum interaction gate using H interaction between neighboring paths is shown in FIG. 43B. The quantum interaction gate, generally referenced 1290, comprises close-by interaction qdots and further-away qdots for negligible parasitic interaction, input quantum state 1291, output quantum state 1292, a plurality of N quantum paths 1293, and H shaped interaction 1294 between paths where the interactions are allowed between neighboring quantum paths.

In some cases, it may be desirable to perform interactions not only between neighboring paths or qdots. A diagram illustrating an example quantum interaction ring with star shaped access and double V interaction with multiple next door neighbors (with multiple detection points) is shown in FIG. 43C. The quantum interaction ring (or hub), generally referenced 1300, comprises interaction ring 1304, input quantum state 1302, a plurality of double V interactions 1306, and a plurality of detectors 1301. Any of the quantum states in the spokes of the ring configuration can be moved into the ring to interact with another quantum state.

A diagram illustrating an example quantum interaction ring with star shaped access and H interaction with multiple next door neighbors is shown in FIG. 43D. The quantum interaction ring, generally referenced 1310, comprises interaction ring 1316, input quantum state 1314, a plurality of H shaped interactions 1318, and plurality of detectors 1312. Any of the quantum states available in the star configuration can be brought to the ring to interact with another state.

Numerous shapes can be used to implement CNOT quantum interaction gates. A diagram illustrating an example T shape quantum interaction gate using tunneling through a local depleted well for interaction between two qubits is shown in FIG. 44A. The quantum interaction gate, generally referenced 1320, comprises two qubit paths labeled 1 and 2. The CNOT gate allows interaction between two particles implemented using structures with tunneling 1325 through a local depleted well and T-shape chains. The qubits comprise a plurality of qdots 1323, 1326, and control gate 1324. A four qdot interaction structure 1321 shows the possible interaction between the two qubits. An alternative four qdot interaction structure 1322 is also possible. Alternatively, the T shape CNOT quantum interaction gate, generally referenced 1327, can be constructed with paths 1 and 2, where path 2 is L shaped.

A diagram illustrating an example H shape quantum interaction gate using tunneling through a local depleted well for interaction between three qubits is shown in FIG. 44B. The quantum interaction gate, generally referenced 1330, comprises three qubits paths, namely 1, 2, and 3 which include quantum shift registers. Each qubit comprises a plurality of qdots 1335, 1338, control gate 1336, and tunneling through a local depleted well 1337. Note that other shapes such as I-shape, T-shape, L-shape can also be realized. Both orthogonal (i.e. vertical and horizontal) and angled structures can be used. Several possible qdot interaction structures are possible including four qdot interaction structures 1331, 1332, 1333, 1334.

A diagram illustrating an example of a triple V shape quantum interaction gate is shown in FIG. 44C. The quantum interaction gate, generally referenced 1340, comprises a plurality of qdots 1341, 1343, control gates 1344, and tunneling through a local depleted well 1342 for interaction between three qubit paths or qudits (paths 1, 2, and 3). The triple-V interaction structure allows the entanglement of three particles using two consecutive two-particle entanglement.

Note that if more than two particles need to interact, it is not needed to bring them simultaneously in close proximity. Multiple V-paths can be used to bring together pairs of particles/states to interact. In some cases, it is desired to achieve interaction/entanglement between multiple particles/states. A triple-V quantum structure (or in general a multi-V structure) can be used to achieve this. There are two interaction locations: (1) between the first and second V-shape quantum structure, and (2) between the second and the third V-shape quantum structure. In this case, an even larger number of quantum shift registers are used to transport the quantum particles/states between, to, and from the interaction locations.

Another example of interaction shape is X or star-shape. A diagram illustrating an example double V shape quantum interaction gate using tunneling through a local depleted well for interaction between two qubits is shown in FIG. 44D. The X shaped quantum interaction gate, generally referenced 1350, comprises a plurality of qdots 1351, 1354, control gates 1352, and local depleted well 1353. The X-interaction structure allows entanglement of four particles, either simultaneously or at consecutive times), where each well has bidirectional particle transport. Note that the X-shape (or star-shape) is a version of double-V quantum interaction in which the two V-shapes are split in the middle. This allows the interaction between a larger number of particles.

One of the most efficient ways to build a quantum core is using a grid configuration in which the qdots are arranged in rows and columns. A diagram illustrating a first example CNOT quantum interaction gate within a grid array of programmable semiconductor qubits is shown in FIG. 45A. The re-configurable grid-based quantum computing structure, generally referenced 1360, comprises a plurality of qubits 1362 arranged in rows and columns and associated control circuitry including control signals generator 1364.

As an example, a double-V interaction structure is shown programmed as indicated by the four arrows. Note that the grid array of qubits can be re-programmed to implement other structures and configurations.

A diagram illustrating a second example CNOT quantum interaction gate within a grid array of programmable semiconductor qubits is shown in FIG. 45B. The re-configurable grid-based quantum computing structure, generally referenced 1370, comprises a plurality of qubits 1372 arranged in rows and columns and associated control circuitry including control signals generator 1374. As an example, a double-V interaction structure is shown programmed as indicated by the four arrows. Note that the grid array of qubits can be re-programmed to implement other structures and configurations.

Most of the structures described supra use charge qubits and qdots that are electrically controlled via an electric field. A more general quantum structure can use hybrid electric and magnetic control. The magnetic field can be generated with an inductor or a resonator. A diagram illustrating an example quantum interaction gate constructed with both electric and magnetic control is shown in FIG. 46. The structure, generally referenced 1380, comprises a quantum interaction gate located within a magnetic control 1384, and electric control 1382. In this example, the hybrid electric and magnetic control is applied to a double-V structure using tunneling through local depleted regions. One or more gates can be under the control of a magnetic field generation structure. In one embodiment, given a focused magnetic field, the control is local if only one interaction structure is covered by the strong magnetic field from the inductor (or resonator). Note that the size and shape of the magnetic field generator can vary.

In the case of a larger quantum core, multiple inductors can be used to create local magnetic control fields. Alternatively, a global magnetic control can be used, which impacts two or more quantum structures at a time. A diagram illustrating an example grid array of programmable semiconductor qubits with both global and local magnetic is shown in FIG. 47. The structure, generally referenced 1390, comprises a plurality of qubits 1398 arranged in rows and columns, a plurality of local magnetic controls 1396 (per quantum gate), a global magnetic control 1392, and an electric control 1394. With global magnetic control, multiple quantum structures are controlled by the same magnetic field. One example use for the magnetic field is to select the spin orientation of the particles that are loaded in the quantum structures/core.

First through eighth stages of an example quantum interaction gate particle interaction are shown in FIGS. 48A through 48H, respectively. FIG. 48A illustrates the initializing of an H-style quantum interaction gate with injecting particles 1400, 1402, 1404. All particles can be injected at the same time. In this case, however, some particles may stay in qdots for long time intervals before they undergo processing. This results in loss of quantum accuracy due to decoherence. It is thus advantageous to load the particles only as they are needed in the quantum computation flow. In FIG. 48B, the splitting of particle into 1406 and 1408, and spatial entanglement are shown.

Once the particles are injected, they can be split as shown in FIG. 48C and transported to the interaction qdots. In the H-style interactor, the interactor particle 1410 is moved around to realize the desired interactions. The interactor particle is split 1414 and the interaction 1412 between the first path and the interactor path occurs as shown in FIG. 48D. FIG. 48E illustrates the transport of the interactor particle 1416 towards the second main path on the right side of the H structure. FIG. 48F illustrates the transporting of the particle 1418 in the second main path towards the interaction position.

FIG. 48G illustrates the performing of the second interaction 1420 of the split particle 1422 between the second main path and the interactor path. In this manner, the first main path interacts with the second main path via the interactor. Subsequently, the states are shifted away from the interacting position towards the output qdots 1424, 1426 where detectors are located. FIG. 48H illustrates the detecting process and thus the collapsing of the quantum states.

A diagram illustrating an example semiconductor double qdot qubit using tunneling through a separate layer planar structure is shown in FIG. 49A. The planar semiconductor qubit, generally referenced 1430, uses thin gate oxide tunneling and comprises qdots 1434, 1438, control gate 1432, and polysilicon or oxide 1436.

A diagram illustrating an example planar semiconductor double qdot qubit using tunneling through a local depleted well planar structure is shown in FIG. 49B. The planar semiconductor qubit, generally referenced 1440, uses tunneling 1448 through a local depletion region inside a continuous well, and comprises qdots 1444, 1441, control gate 1446, and contact 1442.

A diagram illustrating an example 3D semiconductor qubit using tunneling through a separate gate oxide layer 3D FIN-FET structure is shown in FIG. 49C. The 3D semiconductor qubit with fin-to gate tunneling 1471, generally referenced 1450, comprises qdots 1454, 1456, fins 1458, and control gate 1452.

A diagram illustrating an example 3D semiconductor qubit using tunneling through a local depletion in a fin structure is shown in FIG. 49D. The 3D semiconductor qubit with local depleted fin tunneling 1473, generally referenced 1451, comprises qdots 1453, 1455, fins 1459, and control gate 1457.

A diagram illustrating a semiconductor CNOT quantum interaction gate using two qubit double qdot structures with tunneling through a separate planar structure is shown in FIG. 49E. The CNOT quantum interaction gate, generally referenced 1460, comprises a first qubit having a plurality of qdots 1466, control gate 1464, and metal layer 1462 above the control gate 1464. A second qubit comprises a plurality of qdots 1465, control gate 1463, and contact 1467. The two qubits are located in close proximity so that interaction occurs between qdots 1468 and 1461. Other interactions may occur as indicated by the arrows but these are much weaker since the qdots are further away from each other.

Semiconductor CNOT gates can be built using tunneling through a depletion region. Several different positions for getting interaction between two or more particles inside the same continuously drawn well will now be described. In this case, the two interacting particles are not on separate chain structures, but inside the same chain structure.

A diagram illustrating a first example quantum interaction gate with interaction between two particles in the same continuous well is shown in FIG. 49F. The quantum interaction gate, generally referenced 1470, comprises a plurality of qdots in the same continuous well, two particles 1476, 1478, and control gates 1472, 1474. Since the two particles are separated by the top qdot, the interaction in this example is weaker.

A diagram illustrating a second example quantum interaction gate with interaction between two particles in the same continuous well is shown in FIG. 49G. The quantum interaction gate, generally referenced 1480, comprises a plurality of qdots in the same continuous well, two particles 1486, 1488, and control gates 1482, 1484. Since the two particles are in adjacent qdots, the interaction in this example is stronger.

A diagram illustrating a third example quantum interaction gate with interaction between two particles in the same continuous well is shown in FIG. 49H. The quantum interaction gate, generally referenced 1490, comprises a plurality of qdots in the same continuous well 1491, two particles 1496, 1498, and control gates 1494. Since the two particles are in adjacent parallel qdots, the interaction in this example is the strongest.

In an alternate embodiment the two particles that will interact can be hosted by two different chain structures. A diagram illustrating a first example quantum interaction gate with interaction between two or more particles in different continuously drawn wells is shown in FIG. 49I. The quantum interaction gate, generally referenced 1500, comprises two qubits with shared control gates 1502, and two particles 1506, 1508. The qubits are located in close proximity to permit strong interaction between the particles.

A diagram illustrating a second example quantum interaction gate with interaction between two particles in different continuous wells is shown in FIG. 49J. The quantum interaction gate, generally referenced 1510, comprises two qubits with separate control gates 1512, 1514 and two particles 1516, 1518. The qubits are not located in close proximity thus resulting in a weaker interaction between the particles.

A diagram illustrating a second example quantum interaction gate with interaction between two particles in different continuous wells is shown in FIG. 49K. The quantum interaction gate, generally referenced 1520, comprises two qubits with shared control gates 1522, 1524 and two particles 1526, 1528. Although the qubits are located in close proximity, the particles are not in adjacent qdots thus resulting in a weaker interaction between the particles.

A diagram illustrating a second example quantum interaction gate with interaction between two particles in different continuous wells is shown in FIG. 49L. The quantum interaction gate, generally referenced 1530, comprises two qubits each with separate control gates 1532, 1534, and two particles 1536, 1538. Although the qubits are located at the pinnacle of their respective V structures, the two qubits are skewed from each other thus resulting in weaker interaction between the particles.

Note that to get the full operation of the CNOT quantum interaction gate, the gate needs to be initialized and at the end measured. Additional layers are needed to perform such operations. The gate may be operated by itself (interconnect directly to the classic world), or it may be interconnected with other quantum gates. A diagram illustrating a CNOT quantum interaction gate using two qubit double qdot structures with tunneling through a separate oxide layer (partial overlapped gate) implemented in a planar process with gating to classic circuits is shown in FIG. 50A. In particular, the gating to the classic electronic circuits is shown including reset, injection, imposing, and detection. The imposers use indirect floating potential imposing. The CNOT quantum interaction gate, generally referenced 1540, comprises two qubits spaced in close proximity to each other such that qdots 1548 and 1541 can interact electrostatically. The first qubit comprises qdot 1546, gate 1542, floating gate 1544 and interface 1549 to classic (i.e. non-quantum) circuitry. The second qubit comprises gate 1545, floating gate 1543, qdot 1547, and an interface to classic circuitry.

A diagram illustrating a CNOT quantum interaction gate with tunneling through a local depleted well using voltage driven gate imposing and gating to classic circuits is shown in FIG. 50B. The CNOT quantum interaction gate, generally referenced 1550, comprises two qubits each having a continuous well divided into two qdots 1553, 1557, depletion region 1563, two gates 1554, 1555, contacts 1552, 1558, 1562, and interface device 1556, 1560 to classic circuitry. The CNOT semiconductor quantum interaction gate uses direct voltage potential imposing. It has tunneling through a local depleted well using voltage driven gate imposing. It also features gating to classic electronic circuits.

A diagram illustrating a CNOT semiconductor quantum interaction gate with tunneling through a local depleted well using voltage driven gate imposing and multiple gating to classic circuits is shown in FIG. 50C. The CNOT quantum interaction gate, generally referenced 1570, comprises two qubits with tunneling through a local depleted well using voltage driven gate imposing, having multiple gates towards the classic electronic circuits. Each qubit comprises continuous well 1578 divided into three qdots, a plurality of imposer control gates 1574 with contacts 1572, depletion region 1573, and interface 1576 to classic circuitry. The qubits are located in close proximity to permit interaction between particles. It has more Qdots separated by imposer gates that overlap the linear section of the well.

A diagram illustrating an example quantum interaction gate with continuous well incorporating reset, inject, impose, and detect circuitry is shown in FIG. 50D. The quantum interaction gate, generally referenced 1590, comprises a continuous well 1598 with a plurality of control gates 1599, 1601, depletion regions 1600, interfaces 1596, 1602 to classic circuitry, reset circuit 1591, injector circuit 1592, imposer(s) circuits 1593, and detector circuit 1594. In this case, the imposers that isolate the adjacent qdots overlap the folded side of the continuous well.

A diagram illustrating an example double V CNOT quantum interaction gate using separate control gates that mandates larger spacing resulting in a weaker interaction is shown in FIG. 51A. In this structure, no common gates are used thus the distance between the two wells that host the two particles that will interact are forced to be at a larger distance from each other. The quantum interaction gate, generally referenced 1610, comprises two qubits arranged in a double V configuration. Each qubit comprising a continuous well 1613 divided into a plurality of qdots by control gates 1612 having contacts 1611, interface 1618 to classic circuitry, and interaction qdot 1614. The two qubits use tunneling through local depleted well and separate control gates that result in larger spacing and further away placement resulting in a weaker interaction.

A diagram illustrating an example double V CNOT quantum interaction gate using common control gates for sections in closer proximity to permit smaller spacing and stronger interaction is shown in FIG. 51B. The quantum interaction gate, generally referenced 1620, comprises two qubits arranged in a double V configuration. Each qubit comprising a continuous well 1621 divided into a plurality of qdots by common control gates 1623 having contacts 1624 and separate control gates 1626 having contacts 1627, interface 1622 to classic circuitry, and interaction qdot 1625. The two qubits use tunneling through local depleted well and shared control gates that result in closer placement and thus stronger interaction.

The entanglement of the particles depends strongly on the distance the two or more particles are brought together. The closer the particles are, the higher the level of interaction between them. A diagram illustrating an example double V CNOT quantum interaction gate using common control gates for two control gates on both sides of the interacting qdots is shown in FIG. 51C. The double-V CNOT uses common control gates for the sections that are in closer proximity in order to allow a smaller spacing and thus a stronger interaction. To be able to bring the two wells at the minimum distance allowed by the process, all gates adjacent to the wells that are at the minimum distance are shared. This is because the gate-to-gate spacing is increasing the well-to-well minimum separation. The gates that are further away can be separate.

The larger the number of common gates between the two or more wells, the more constraints exist in the operation of the quantum gate (i.e. the particles are not moving independently but their move is correlated due to the common gate control). The quantum interaction gate, generally referenced 1640, comprises two qubits arranged in a double V configuration. Each qubit comprising a continuous well 1641 divided into a plurality of qdots by common control gates 1643 having contacts 1645 and separate control gates 1644 having contacts 1647, interface 1642 to classic circuitry, and interaction qdot 1646. This structure uses common control gates only for the two control gates on both sides of the qdots that are interacting. These two gates are the most important since they set the minimum spacing between the wells. The two qubits use tunneling through local depleted wells and common control gates that result in the closest placement for strong interaction. This restricts the operation somewhat, but allows for a much stronger interaction, due to the closer position of the interaction qdots.

A diagram illustrating an example double V CNOT quantum interaction gate incorporating inject, impose, and detect circuitry is shown in FIG. 51D. The quantum interaction gate, generally referenced 1660, comprises two qubits arranged in a double V configuration. Each qubit comprising a continuous well 1664 divided into a plurality of qdots by separate control gates 1666 having contacts, interface 1668 to classic circuitry, imposer circuit 1661, injector circuit 1662, detector circuit 1663, and interaction qdot 1665. The two qubits are skewed and use tunneling through local depleted well and separate control gates that result in moderate interaction.

A diagram illustrating a first example z quantum shift register quantum interaction gate using planar semiconductor process with partial overlap of semiconductor well and control gate is shown in FIG. 52A. The quantum interaction gate, generally referenced 1680, has a double V shape, comprises a zig zag quantum shift register, and uses half gate length side overlap with hangover.

Double-V and multi-V quantum interaction structures can be also implemented with qubits and qdots with tunneling through an oxide layer. A diagram illustrating a second example z quantum shift register quantum interaction gate using planar process with partial overlap of semiconductor well and control gate is shown in FIG. 52B. The quantum interaction gate, generally referenced 1690, comprises a zig zag quantum shift register and uses half gate length side overlap with hangover.

A diagram illustrating an example of H-style quantum interaction gate implemented with planar semiconductor qdots using tunneling through oxide layer (the H-structure is rotated at an angle) with partial overlap of semiconductor well and control gate is shown in FIG. 52C. The quantum interaction gate uses tunneling through oxide layer. The multi-V quantum interaction gate, generally referenced 1700, comprises a zig zag quantum shift register, multiple flow paths, an interactor path, multiple interactions, and uses half gate length side overlap with hangover. The quantum computation path in this case has more complex shapes, not just linear.

Other types of tunneling can be used to build semiconductor quantum interaction gates. A diagram illustrating an example of H-style quantum interaction gate (the H-structure is rotated at an angle and gates with multiple orientations) implemented with planar semiconductor qdots using tunneling through local depleted region in continuous wells is shown in FIG. 52D. The quantum interaction gate, generally referenced 1710, comprises two main quantum paths that are approximately linear in shape (at a certain angle) and one interactor path with a T-shape, which has an interaction qdot with each of the two main paths.

Controlled-NOT and higher order quantum gates realized in planar semiconductor processes have been disclosed supra. Similar quantum structures can be realized in three-dimensional semiconductor processes. A diagram illustrating a first example CNOT quantum interaction gate using 3D FIN-FET semiconductor process with tunneling through separate layer and interaction from enlarged well islands allowing smaller spacing and stronger interaction is shown in FIG. 53A. The quantum interaction gate, generally referenced 1720, comprises two qubits each including a plurality of qdots 1721, 1724, control gates 1723 and 3D FIN FET structures 1722. A complete overlap between gate and fin-well was used.

By reducing the overlap between gate and fin-well the overall capacitance of the structure is reduced, increasing the Coulomb blockade voltage. A diagram illustrating a second example CNOT quantum interaction gate using 3D FIN-FET semiconductor process with tunneling through separate oxide layer, partial overlap between gate and fin-well, and interaction from enlarged well islands allowing smaller spacing and stronger interaction is shown in FIG. 53B. The quantum interaction gate, generally referenced 1730, comprises two qubits each including a plurality of qdots 1731, 1734, control gates 1733 and 3D FIN FET structures 1732. The interaction is realized between enlarged well islands allowing a smaller spacing and thus a stronger interaction.

Semiconductor quantum interaction gates can be realized in 3D processes using tunneling through fin local depletion regions induced in semiconductor fins. A diagram illustrating a third example CNOT quantum interaction gate using 3D FIN-FET semiconductor process with interaction from enlarged well islands allowing smaller spacing and stronger interaction is shown in FIG. 53C. The quantum interaction gate, generally referenced 1740, comprises two qubits each including a plurality of qdots 1742, 1748, control gates 1746 and 3D FIN FET structures 1744. Note that for CNOT function two semiconductor chains are implemented. For higher order gates more than two semiconductor chains can be used.

Interaction between wells can result in tighter spacing and thus stronger interaction between quantum particles. Interaction, however, can be achieved between particles located in semiconductor fins. A diagram illustrating a fourth example CNOT quantum interaction gate using 3D FIN-FET semiconductor process with fin to fin interaction mandating larger spacing resulting in weaker interaction is shown in FIG. 53D. The quantum interaction gate, generally referenced 1750, comprises two qubits each including a plurality of qdots 1752, 1758, control gates 1756 and 3D FIN FET structures 1754.

Quantum Annealing Interaction Gate

A quantum gate is a circuit/structure operating on a relatively small number of qubits: one, two, three, four and rarely more. A gate operating on two or more qubits or qudits is referred to as an interaction gate. The type of quantum gate is given both by the physical/geometrical structure of the gate and by the corresponding control signal. A given geometrical structure may perform different quantum gate functions depending on the control signals that are applied, i.e. their shape, amplitude, duration, position, etc. One such example is the double-V quantum interaction gate which can implement a controlled-NOT, a controlled-Rotation (controlled-Pauli), controlled-Swap and even quantum annealing functions. The same applies to the H-shape quantum interaction gate, the X-shape quantum interaction gate, L-shape quantum interaction gate, I-shape quantum interaction gate, etc.

Quantum annealing is an operation of finding the minima of a given function over a given set of candidate solutions using a quantum fluctuation method. The system is started from a superposition of all possible states with equal weighting and it evolves following the time dependent Schrodinger equation. If the rate of change is slow, the system stays close to its ground state of the instantaneous Hamiltonian (total energy of the ensemble) resulting in Adiabatic Quantum Computing (AQC). The AQC is based on the well-known adiabatic theorem to perform computations. A simple Hamiltonian can be initialized and a slow change of the system towards a more complex Hamiltonian is performed. If the change is slow, the system starts from the ground state of the simple Hamiltonian and evolves to the ground state of the complex Hamiltonian, representing the solution that is pursued.

The time needed for an adiabatic change is dependent on the gap in energy between the Eigenvalues of the Hamiltonian and thus depends on the Rabi oscillation period. The change needs to be slow (longer) when compared with the period of the Rabi oscillation. Because the system is maintained all the time close to the ground state in the quantum annealing process, it is less susceptible to interaction with the outside world. This is one of the advantages of quantum annealing. A necessary condition is that the energy coming from the outside world is lower than the energy gap between the ground states and the next higher energy excited states.

A diagram illustrating quantum annealing applied to a double-qubit semiconductor quantum interaction structure using charged carriers (electrons or holes) is shown in FIG. 54. In the general case, quantum annealing can be applied to an arbitrarily large number of qubits. For simplicity we show the two-qubit case, but a higher number of qubits is also possible. In its simplest form the double-qubit annealing can be realized in a structure having four quantum dots. A similar process, however, can be realized in structures having six or higher number of qdots. We assume that the quantum structure was prepared with two different and independent qubits: $Q_A$ and $Q_B$. To avoid interaction between $Q_A$ and $Q_B$ they can be prepared at some larger distance from the interaction location and then be quantum shifted in position inside the quantum interaction structure. Assume that initially the tunnel barriers 1760, 1762 are high and there is no Rabi oscillation established. Each of the two qubits has its own corresponding Rabi oscillation from the moment the tunnel barrier at their initialization was lowered until the Rabi oscillation was stopped.

To achieve quantum annealing the corresponding control signals are varied very slowly in order not to perturb the system with the shape of the control signal. In contrast with the controlled-NOT or controlled-Rotation gates when fast control pulse are applied, in the case of quantum annealing the control gates $Q_A$ and $Q_B$ of the two qubits are very slowly changed when compared with the period of the corresponding Rabi oscillations as shown in the center of FIG. 54. Assuming that $Q_A$ and $Q_B$ had a given split initially as shown in the top left side of FIG. 54, by slowly raising the gate control 1770 the tunnel barrier 1768 is slowly lowered and will allow the interaction between the two qubits (1764, 1766). If we look at the vector representation of the quantum state in the Bloch sphere of the |0> and |1> base states, the result of the quantum annealing is to slightly change the position of the corresponding vectors from $Q_A$ and $Q_B$ to $Q_A^*$ and $Q_B^*$. When the tunnel barrier is lowered in both qubits, Rabi oscillations will be enabled in both double qdot structures. While the Rabi oscillations 1772 of the two qubits are initially non-synchronized if the two qubits are not entangled, during the slow annealing process the Rabi oscillations 1774 of the two qubits will become synchronized.

When the qubits are independent the system can be factorized, while after the entanglement of the qubits the system can no longer be factorized. It will be described by a global Hamiltonian that grows in dimensions when compared with the Hamiltonian of the independent qubits. Once entangled, the information is present simultaneously in both qubits. This is represented with the fact that after the entanglement the vectors of the two qubits have both been slightly shifted to take into account the interaction of the other qubit. Once entangled, if one qubit is measured and its state is collapsed, the other qubit will also be collapsed, or at least the component corresponding to the entanglement.

An advantage of the quantum annealing is that it can perform the search in parallel over a large space of solutions. In a system with a large number of qubits at initialization a superposition of all possible solutions is loaded and through the quantum annealing process the system will evolve to the single solution that corresponds to the lowest minima. This is very useful in problems where there are multiple local minima, but the absolute lowest minima is the goal of the search.

The control signal for a quantum annealing process in a semiconductor quantum interaction gate can be generated by a classical electronic circuit. It can be an analog or a mixed-signal control signal generation. A digitally controlled system can be implemented in which the amplitude of time position of the control signals is prescribed with corresponding Digital-to-Analog Converters (DAC). A staircase signal shape can be generated by the DACs. The signal can be smoothed using optional filtering circuitry.

Controlled Quantum-Swap Interaction Gate

There exist a large number of different quantum operation gates. When implementing a quantum computer it is preferable to have a universal set of quantum gates implemented since many quantum algorithms can be implemented using a specific number and interconnection of such universal gates. The SWAP gate corresponds to a classic Boolean logic operation. A controlled quantum gate is an interaction gate where the specified operation is performed only in the presence of a control signal or a control qubit. The SWAP gate is the circuit that permutes the incoming states. The quantum SWAP gate is the corresponding quantum gate that operates on quantum superposed states. The controlled SWAP gate is universal with respect to all the classic Boolean operations. A quantum computing machine using controlled SWAP quantum gates can implement any classic algorithm.

FIG. 55 illustrates the operation of the controlled SWAP quantum gate. The operation can be controlled by a control signal or by the presence of another control qubit. The controlled SWAP gates in the general case is a three qubit quantum gate.

If the control gate signals applied are sufficiently fast the quantum system will leave the ground state. This is in contrast with the quantum annealing adiabatic control (slow with respect to the corresponding Rabi oscillation frequencies). A controlled SWAP quantum gate differs from the controlled-NOT and controlled Rotation gates, since both gate control signals are exercised. As such both tunnel barriers of qubit A and qubit B are lowered, allowing the two qubits to interact. This gate results in large perturbations from the ground state and can result in large rotations of the quantum state corresponding vectors in the Bloch sphere.

It is assumed that qubit A and qubit B are initialized with two different quantum states (they can be both base states or split/superposed states, as shown in FIG. 55 with potential diagrams 1780, 1782). The initialization of qubit A and qubit B is preferably done at large distance between the qubits, such that the parasitic interaction between them at initialization is minimized. After initialization the qubits are quantum shifted into position inside the quantum interaction gate. Both $G_A$ and $G_B$ gate control signals 1788, 1790 are pulsed high at the same time (FIG. 55 center) allowing the two qubits to interact. The initial qubit A will tend to have the impact on qubit B in the direction of changing it to qubit B* that is a mirror version of qubit A. Similarly, the initial qubit B will tend to have the impact on qubit A in the direction of changing it to qubit A* that is a mirror of qubit B, as shown on the bottom of FIG. 55. Both these actions happen simultaneously resulting in a swap of the two quantum qubits. As a result, the outcome of qubit A* becomes the initial qubit B and the outcome of qubit B* becomes the initial qubit A. The amplitude of the control signals $G_A$ and $G_B$ is preferably commensurate with the lowering of the tunneling barrier to allow the interaction and the change of the qubits, while the duration of the control pulses is preferably commensurate with the corresponding Rabi oscillations. Note that the lowering of the barrier enables tunneling within a qubit and not between qubits.

Note that the control SWAP quantum gate operation can be realized by a number of physical geometrical implementations of the quantum interaction semiconductor gate. This includes the double-V or multiple-V structure, the X, T, L, I-shape interaction structures and any combination thereof.

Controlled Pauli Quantum Rotation Interaction Gates

Pauli quantum gates are single qubit gates that perform rotation about the z, y, and x axis of the Bloch sphere. To aid in understanding their operation we consider the Bloch sphere representation of the quantum states using the unitary sphere. Any quantum state can be represented by a vector on the Bloch sphere. There are two angular coordinates in the Bloch sphere: (1) the θ angle representing the co-latitude versus the z-axis; and (2) the φ angle representing the longitude versus the x-axis. These angles (i.e. rotation) corresponds to the superposition of the |0> and |1> base states in the given quantum state. Note that it is not possible to measure both the θ and φ angles simultaneously. The φ quantum phase cannot be independently measured, but it can be evidenced with a quantum interaction gate. This is because the result of a quantum interaction depends on both θ and φ angles that represent the quantum structure, not just the θ quantum superposition angle.

With reference to FIG. 56, the position of the vector on the Bloch sphere 1816, which represents the given quantum state of the system, is set by the parameters of the control gate signal. The duration of the control gate pulse that lowers the tunneling barrier determines the θ rotation since it sets the split superposition of the two base states |0> and |1>. The θ rotation with respect to the z-axis is what can be measured directly. In the case of a charge qubit this corresponds to the presence or absence of the carrier from the measurement qdot. The outcome of the measurement is binary, for example 0 denoting absence and 1 denoting presence. If a number of successive measurements are performed, however, the probability of the 0 and 1 measured states represent the splitting of the superposed quantum state.

From the Bloch sphere perspective, the measurement corresponds to the projection of the quantum state on the base state axis, e.g., the z-axis. During such measurement of a single qubit the information on the quantum angle φ is lost. While the absolute angle φ of a quantum state cannot be measured, the difference in φ angle between two quantum states can be measured. A two qubit case having $Q_A$ and $Q_B$ vectors is illustrated on the right side of FIG. 56. The $φ_A$ and $φ_B$ quantum angles cannot be measured by the difference between them since it will impact the outcome of the quantum interaction between the two qubits. As such, the outcome of a quantum interaction depends not only on the $θ_A$ and $θ_B$ superposition angles of the two qubits, but also on the difference between their quantum angles $φ_A$, $φ_B$. Therefore, we can indirectly measure the difference in the quantum angle φ with the outcome of a quantum interaction gate.

Consider a two-qubit quantum structure, for example the double-V, or H, X, T, L, I-shape quantum interaction structure, and the two gate control signals $G_A$ and $G_B$ 1800, 1802, 1804, 1806. Qubit A acts as a control qubit in the sense that the designated quantum operation occurs only when qubit A is |1>. Qubit B is the one that undergoes the rotation action. The θ angle (i.e. latitude) is set by the $τ_θ$ time (i.e. pulse width) when the quantum state is rotated about the z-axis. The $τ_φ$ time that the vector performs a precession around the z-axis is the time period that determines the quantum angular rotation about the x-axis. Having a gate control $G_A$ that sets the time of z-rotation and the z-precession can generate an arbitrary rotation in the x, y, z coordinates. Note that the gate control signal $G_B$ may include multiple pulses. For example, the pulse can be split into two to create a θ rotation. Each pulse may, for example, result in a θ/2 rotation about the z-axis. The time interval between the two pulses is when the precession around the z-axis happens, without changing the θ angle that is directly observable in the quantum measurement. This time determines the φ angle value.

In a two qubit system as in the example provided herein, the $Δ_φ$ angle can be measured because the difference in quantum angle φ impacts the result of the entangled state between qubit A and qubit B.

By applying the appropriate control signals to a double qubit structure a controlled-Pauli quantum gate can be implemented in which the Pauli rotation is enabled by the control qubit of the structure.

For example, if no rotation θ about the z-axis is desired, two pulses with the combined duration equal to the Rabi period is applied. In such case, the resulting vector has the same angle θ as it had at the beginning. Now, by changing the time distance between the two pulses that add up to the Rabi period a precession of the quantum state is enabled and the angle φ is changed. By changing the angle φ a rotation about both the x and y-axis is realized. Combining rotation about z-axis with rotation about the x-axis and the y-axis a generalized quantum rotation operation is generated by the proposed semiconductor quantum interaction gate. The difference between the number of controlled quantum rotation gates that can be implemented is given by the nature of the control signals. The controlled-NOT (CNOT) quantum gate is in fact the controlled-Z (cZ) Pauli gate. Any generalized controlled quantum rotation can be generated by the double qubit structure. Qubit A functions as the control qubit that enables the operation, while qubit B is the target qubit whose state undergoes the generalized rotation in the Bloch sphere.

Quantum Ancillary Interaction Gate

In classical computing any memory bit can be set to 0 and 1 at any time and used as such in computations. Furthermore, classic bits can be copied and they will be an exact copy of the initial bit. This is not possible in quantum computing. First, a qubit cannot be copied. Since the qubit is represented by both the θ and φ angular phase in the Bloch sphere and any measurement of a qubit results only in a projection of the qubit on the axis of the base states, the internal φ quantum phase cannot be accessed and thus cannot be copied. Second, a memory bit cannot be simply set or reset in a reversible quantum computing machine, since this results in losing the information that the qubit had before.

In a quantum computation algorithm or in its hardware implementation it is not possible to deterministically place a qubit in a given prescribed state unless the algorithm/machine has access to qubits whose value is unknown. Such qubits that have their value unknown a priori are called ancilla qubits. The Hadamard equal distribution quantum state is an example of an unknown state.

In quantum computing algorithms and corresponding hardware, machine implementation of quantum catalyst uses ancilla qubits to store entangled states that enable performing states which will not be possible with local operations and classic communication structures. A quantum ancillary gate stores such an entangled state from an initial target quantum state.

FIG. 57 illustrates one embodiment in which a quantum ancillary interaction gate can be implementing using a semiconductor quantum interaction gate. The operation of the ancillary gate is to store an entangled state originated from an initial target qubit A. To do so a double qubit structure is used. The physical implementation of the quantum ancillary gate can be any of the embodiments of the semiconductor quantum interaction gate disclosed herein, including the double-V, the H-shape, the X-shape, the T or L-shape, the I-shape or any combinations thereof.

The operation of the quantum ancillary interaction gate starts with the preparation of a Hadamard equal distribution state in qubit B, which is the target qubit to store the entangled state. It is important to first prepare the Hadamard state since it needs to have no other qubit in close proximity with which it can parasitically interact. It will not be possible to load the qubit A first and then initialize the Hadamard state in qubit B, since qubit B will interact with qubit A.

Once the Hadamard state is initialized in qubit B, the interaction gate can proceed with the ancillary action. There are multiple ways to initialize a Hadamard state in qubit B. For example, a base state can be loaded first by injecting a single electron into one of the two qdots of qubit B. Next, a gate control pulse $G_B$ having a width equal to half the Rabi oscillation period is used which results in an equal split of the state with a 50-50% superposition of the |0> and |1> base states. At the end of the Hadamard preparation phase the tunnel barriers are all high, thereby preventing tunneling (see potential diagrams 1820, 1822).

Next, the quantum state of qubit A is moved into the ancillary gate. Because qubit B is in an equally distributed state, qubit A will not be impacted by the presence of qubit B. Note that this is not the case, however, if qubit A is loaded first and then qubit B is attempted to be placed in the Hadamard state.

In the second phase of the ancillary interaction gate operation the tunneling barrier of qubit B is lowered by applying a corresponding $G_B$ gate control signal 1830 to target qubit B. Qubit A and qubit B will then interact and result in an entangled state (see potential diagrams 1824, 1826). The state of qubit B* will be pushed towards the mirror state of qubit A. If the length of the pulse $G_B$ is equal to the Rabi oscillation period of the ensemble, then there is no actual rotation from the gate control signal and all quantum rotation comes from the entanglement of the two qubits.

Note that qubit B* is not a copy of qubit A (this is not possible in quantum computing), but it is an entangled state originated from qubit A that can be stored and used in other operations.

An example application and use of the ancilla bits and ancillary gates is in quantum error correction circuits that calculate the syndrome code of the errors that were injected.

Note that there are many physical implementations of the ancillary gate. Preferably they have at least four qdots, but can have a larger number. Two exemplary embodiments are illustrated in the bottom of FIG. 57. On the left side is shown a double qdot interaction gate using the "dog-bone" described supra, while on the right side is shown a double-V structure using six qdots out of which four are active. For the ancillary gates it is preferable to have good symmetry between the two double qdots such that the stored entangled state does not have an offset bias of the state due to the imbalance in the interaction.

Note that FIG. 57 illustrates a two qubit ancillary gate. It is appreciated that higher order ancillary gates using a larger number of qdots are contemplated as well and can be used to store higher order quantum states. In addition, the Hadamard equal probability split may be achieved using more than two qubits: e.g., three, four or more qubits. In this manner, entangled states of a larger number of qubits can be stored.

Modified Semiconductor Process and Related Quantum Structures

As described supra, FIG. 9Q illustrates an example full classic FET structure 410 having drain and source doped diffusions 412 with contacts 411 and metal on top on both sides of the gate 416. Note that such a structure results in significantly higher parasitic gate capacitance since it includes the gate-to-metal, gate-to-contact and gate-to diffusion additional components. As described infra, a modified semiconductor process is used that eliminates any diffusion, contact, and metal on top of the active layer. Also, parasitic capacitance of the doped diffusions 412 is higher.

The half-classic half-quantum structure 420 of FIG. 9R comprises one side 422 of the gate 427 with n+ or p+ doping and contacts 421 and the other side of the gate 427 with neither n+ or p+ doping nor contacts. This type of device is used at the interface between classic circuitry and quantum circuitry functioning as either an injector or detector device.

The full quantum structure 430 shown in FIG. 9S has neither n+ or p+ doping nor contacts on both sides 432 of the gate 436. The undoped active region 432 is where quantum dots (i.e. wells) are constructed with appropriate bias voltages applied to the structure. The shape of the active region may be any desired shape such as described herein in FIGS. 7A-7S, 8A-8C, and 9A-AG.

Note that in FIGS. 9Q, 9R, and 9S the regions on both sides of the gate have the same active layer width which is approximately equal to the gate width. This, however, results in a larger gate capacitance. To reduce the parasitic gate capacitance, the width of the active layer can be made smaller than the gate width on one or both sides. The semiconductor quantum structure 440 shown in FIG. 9T comprises an asymmetric aperture tunneling well with reduced parasitic capacitance on one side (e.g., the left side) of the gate 446. FIG. 9U illustrates a quantum structure 450 with asymmetric aperture tunneling well with reduced parasitic capacitance on both sides of the gate 456.

Using active wells having different widths on the both sides of the gate reduces somewhat the parasitic gate capacitance. A more significant reduction in gate capacitance, however, can be achieved by having an active well structure having a narrow region under the gate and wider regions on both sides of the gate. FIG. 9V illustrates such a semiconductor quantum structure 460 having a symmetric dog bone aperture tunneling well 463 with reduced parasitic capacitance on both sides of the gate 466. Neither active region 462, 464 on both sides of the gate have n+ or p+ diffusion, contacts or metal. Quantum structure 470 shown in FIG. 9W has an asymmetric dog bone aperture tunneling well 473 with further reduced parasitic capacitance on the both sides of the gate 476. Neither active region 472, 474 on both sides of the gate have n+ or p+ diffusion, contacts or metal. Note that in structures 460, 470 there remains a residual overlap of the gate and the wider active wells on both sides of the gate.

To reduce the well and gate capacitances even further, the overlap between the gate and the wider wells on the sides of the gates can be eliminated. FIG. 9X shows a semiconductor quantum structure 480 with a symmetric dog bone aperture tunneling well with reduced parasitic capacitance on both sides of the gate 486 and no well-gate overlap in the wider regions. Neither active region 482, 484 on both sides of the gate have n+ or p+ diffusion, contacts or metal. FIG. 9Y shows a quantum structure 490 with an asymmetric dog bone aperture tunneling well with reduced parasitic capacitance on the both sides of the gate 496 and no well-gate overlap in the wider regions. Neither active region 492, 494 on both sides of the gate have n+ or p+ diffusion, contacts or metal.

Note that these kind of quantum devices described supra can be used as building blocks to construct larger quantum structures having different shapes.

A diagram illustrating an example quantum structure with metal, CA (i.e. contacts), and n+ layers is shown in FIG. 58. The example quantum structure, generally referenced 2000, has half-classic, half-quantum devices at either end and full-quantum devices in the middle. The quantum structure comprises a plurality of quantum well devices, and interface devices. The structure comprises a substrate 2002, buried oxide layer 2004, undoped RX (i.e. active) layer 2006, raised source/drain 2008, contacts (CA) 2010, metal (M1) 2012, gate oxide 2014, and silicide 2016. In one embodiment, the interface devices on either end of the structure 2000 are electrically biased while the inner active layer structures are electrically floating. Note that in one embodiment, any number of full quantum devices can be used in the structure. The interface devices have raised source/drain doped diffusion 2008, contact 2010 and metal plates 2012 on the inner side of the gate.

A diagram illustrating an example quantum structure with CA and n+ layers is shown in FIG. 59. In this figure, the metal (M1) is not deposited on the inner six floating quantum well (i.e. active layer) structures leaving the CA and n+ layers intact. This reduces the parasitic gate capacitance somewhat by eliminating the metal layer.

A diagram illustrating an example quantum structure with n+ layer is shown in FIG. 60. Here the metal (M1) and CA layers are not formed on the inner six floating quantum well (i.e. active layer) devices leaving the n+ layer intact. This further reduces the parasitic gate capacitance by eliminating the metal layer and contact (CA) layer.

A diagram illustrating an example quantum structure without metal, CA, and n+ layers is shown in FIG. 61. In this figure, the metal (M1), CA, and n+ layers are not formed on the inner six floating quantum well devices. This reduces the parasitic gate capacitance and well capacitance even further by eliminating the metal layer, contact (CA), and n+ doping layer.

A diagram illustrating a quantum structure with constant distance between all well regions is shown in FIG. 62. The structure, generally referenced 2020, comprises two qubit arrays, each including a half-classic, half-quantum interface device 2023 on both the left and right ends of the structure, and a plurality of imposers 2025 forming/separating qdots on either side thereof. The classic side of the interface device comprises raised diffusion 2024, source/drain contacts 2026, gate 2022, and gate contacts 2029). Note that in one embodiment, both sides of a device gate may have contacts, only one side may have contacts, or no side may have contacts. Quantum structures may be constructed using these elementary building block devices where they are combined in any desired fashion to produce any desired geometric shape.

In one embodiment, the interface devices are electrically biased while the quantum well structures are electrically floating. It is preferable that the imposer devices are properly biased. This can be done but connecting the imposers to voltage sources, which could be dynamically changing (i.e. pulsed). Alternatively, the imposers can be made floating if self-biasing is used to set the proper bias. This is based on the following considerations. In CMOS technology, for example, the gate leakage current is not zero, although it has little temperature variability. Further, the source/drain current is highly temperature dependent, which is undesirable. This technique exploits the fact that leaving the gate floating will force its voltage to the correct biasing voltage through leakage. Hence, the gate is self-biased. The imposer voltage can be dynamically changed by applying a voltage pulse via capacitive coupling. Further considerations include the possibility of adjusting the threshold voltage via backgates, which makes it beneficial considering the move towards a larger number of imposers. Thus, the qdots, in order to operate properly, are floating.

The process used to construct the quantum structure including qdots and interface devices may comprise any of the types of devices described supra, including (1) n+ diffusion only on the interface devices; (2) n+ diffusion on all devices; (3) n+ and CA only on the interface devices; (4) n+ and CA on all devices; (5) n+, CA, and metal only on the interface devices; and (6) n+, CA, and metal on all devices.

A diagram illustrating double V shaped quantum structure with weak and strong interaction areas is shown in FIG. 63. In this example quantum structure, generally referenced 2030, comprises interface and imposers arranged in a staircase double 'V' configuration and including raised diffusion 2034, contacts 2036, gates 2032, and undoped active regions 2031. The structure exhibits weak quantum interaction near either end of the structure where the qdots are further away and strong quantum interaction in the center where the qdots at the apex of the 'V' are close to each other. The ten inner qdots may comprise (1) undoped silicon; (2) doped silicon; (3) doped silicon with contacts; (4) doped silicon with contacts and metal. Note that regardless of the shape of the structure and the composition of the qdots, all the qdots are preferably electrically floating.

A diagram illustrating a cross section of a quantum structure with multiple quantum dots, injector and extractor interface devices is shown in FIG. 64. A diagram illustrating a cross section of the interface device of FIG. 64 in more detail is shown in FIG. 65. A diagram illustrating a cross section of the quantum dots of FIG. 64 in more detail is shown in FIG. 66. Note that these photographs are cross sections of a real world quantum structure constructed in accordance with the invention and schematically represented by the upper and lower structures shown in FIGS. 62 and 63 described supra.

With reference to FIGS. 64, 65, and 66, the example quantum structure, generally referenced 2040, comprises a substrate 2042, oxide (BOX) layer 2044 providing electrical isolation from the substrate, thin undoped silicon layer (i.e. active) 2046, and gate oxide 2048. An injector interface device 2050 on the left side functions to inject quantum particles (e.g., electrons) into the quantum path 2054. Detector interface device 2052 on the right side functions to detect the particle after the quantum interaction. The detector and injector, however, can both be connected to both the left and right end of the structure. They use the same structure and their operation can be time shared. The interface device 2056 (overlapped with 2050) comprises a raised diffusion source/drain 2062, contact (CA) 2060, and metal (M1) 2058, and dummy gate 2064.

The quantum devices 2066 comprise a gate surrounded on both sides by qdots. The gate is fabricated from the silicon dioxide layer 2048 over the active layer 2046, silicide layer on top of the silicon dioxide layer, and polysilicon and nitride layers over the silicide layer. In this example structure, seven qdots are shown, namely QD1 through QD7.

A diagram illustrating a top view of a double V shaped quantum structure with multiple quantum dots, injector and extractor interface devices is shown in FIG. 67. The example structure, generally referenced 2070, comprises a first upper quantum device row 2072 and a second lower quantum device row 2074. Each quantum device row comprises left injector/detector interface devices 2078 and right injector/detector interface devices 2076. The four relatively wide dark bands 2080 represent the raised source/drain diffusion regions in each of the four interface devices. Seven qdots 2082 are formed on either side of the gates 2084 in the upper and lower quantum device row.

Note that this top level view of the double 'V' shaped structure is a photograph of a real world quantum structure constructed in accordance with the invention and is schematically represented by the structure shown in FIG. 63 described supra.

A diagram illustrating a cross section of a classic FET semiconductor device with dopings and contacts on both sides of the gate is shown in FIG. 68. The structure, generally referenced 2090, comprises a substrate 2092, electrically isolating oxide (BOX) 2094, undoped silicon layer 2096, diffusion 2098, channel 2114, gate oxide 2112, silicide 2110, poly silicon/nitride 2106, raised source/drain doped diffusion 2100, contacts 2102, and metal layer 2104.

The structure 2090 has raised diffusions and contacts with metal plates on both sides of the gate resulting in much larger parasitic capacitance. The parasitic capacitance grows inversely proportional to the distance between the layers of the parallel plate capacitances. Since the contact 2102, metal plates 2104, and raised diffusions 2100 are in close proximity to the gate, they result in significant parasitic capacitance components.

A diagram illustrating a cross section of a semiconductor quantum structure using a classic FET on the left side and a qubit with dopings on the quantum wells is shown in FIG. 69. By eliminating the contacts and metal plates on top of the well regions, two important parasitic capacitance components are eliminated. The structure, generally referenced 2120, comprises a substrate 2122, electrically isolating oxide 2124, silicon layer 2126, raised source/drain diffusions 2140, 2152, 2128, gate oxide 2146, 2134, silicide 2148, 2132, polysilicon/nitride 2150, 2130. The figure shows an example of a semiconductor quantum structure cross section with a classic FET on the left side operative to inject the quantum particle and/or detect the quantum particle. The quantum structure on the right side has doped diffusions 2153, 2128 on the quantum wells. In this example structure, the raised source/drain diffusions are present on both sides of the gate as well. Note that in this embodiment, the separation between native active and the n+/p+ doped active is somewhere in the central portion of the active. In addition, classic gate 2150 is electrically biased while quantum gates 2130 can be electrically floating for the purpose of self-biasing via the leakage current and further dynamically controlled by applying voltage pulses via capacitive coupling.

A diagram illustrating a cross section of a semiconductor quantum structure using a classic FET on the left side and a qubit without doping and contacts on both sides of the gate is shown in FIG. 70. The semiconductor quantum structure uses a classic FET shown on the left side for reset, injection, and/or detection and includes a quantum qubit without doping and contacts on both sides of electrically floating gate 2186 on the right side. A further reduction of the parasitic gate capacitance is achieved by eliminating the raised diffusion at least on one side of the gate 2186, or on both sides (as shown). The structure 2160 has raised diffusions on both sides of the gate 2170 in series with a quantum device that has raised diffusions, contacts, and metal plates removed from both sides of the gate 2186.

The structure, generally referenced 2160, comprises a substrate 2162 and electrical isolating oxide (BOX) 2164. The electrically biased classic device on the left further comprises doped diffusion regions 2166/2168, 2180/2182, gate oxide 2174, silicide 2172, polysilicon/nitride 2170, and channel 2176/2178. Note that the separation between native active 2184 and the n+/p+ doped active 2182 is in the central part of the active. The separation, however, could be located anywhere between the two gates 2170, 2186 (approximately halfway shown).

A diagram illustrating a cross section of a semiconductor quantum structure using a half classic, half quantum device on the left side and a device without dopings or contacts on both sides of the gate is shown in FIG. 71. Note that it is not required that the interface device has the raised diffusion on both sides of its gate. A further reduction in parasitic capacitance is achieved by eliminating the raised diffusion on the inner side of the gate. Quantum structure 2200 comprises a half-classic, half-quantum device on the left for reset, injection, and/or detection. The left side of the gate 2210 of the half-classic, half-quantum device comprises an electrically biased classic FET structure including raised diffusion 2208/2206. The right side of gate 2210 comprises a quantum structure including an undoped active region without contact or metal. The adjacent on the right is without doping, contacts, or metal on both sides of the electrically floating qubit gate 2222.

A quantum structure may have an interface device at a single end of the well as shown in FIGS. 70 and 71. Alternatively, it may have interface devices at both ends of the well. A diagram illustrating a quantum structure with half classic, half quantum devices 2236, 2240 on both ends of the well with full quantum devices in the middle 2238 is shown in FIG. 72. The quantum structure, generally referenced 2230, comprises a substrate 2232, oxide 2234, and undoped silicon layer 2252. The two half-classic, half-quantum interface devices on either end of the well comprise raised source/drain diffusion 2254, contacts 2244, and metal 2242 on the outer side of their respective electrically biased gates 2260 and operate as a classic FET. Note that any number of full quantum devices may be fabricated, each operating quantum. In this embodiment, the raised source/drain diffusion, contact and metal plates on the inner side of the two interface device gates 2260 have not been fabricated.

A diagram illustrating a quantum structure with full classic devices on either end and full quantum devices in the middle is shown in FIG. 73. This alternative embodiment of a quantum structure, generally referenced 2270, comprises full classic devices 2278, 2282 at both ends and full quantum devices 2280 in the middle. The structure also comprises a substrate 2272, oxide 2274, and undoped silicon layer 2276. The two half-classic, half-quantum interface devices on either end of the well comprise raised source/drain diffusion 2303, contacts 2286, and metal 2284 on the outer side of their respective electrically biased gates 2288 and operate as classic FETs.

Note that any number of full quantum wells can be used (three full in this example). In addition, combinations of full classic and half classic, half quantum devices are also possible. In this embodiment, the interface devices have the raised diffusion on both sides of the gate. The contacts and metal plates, however, are not needed for the wells since there is no electrical contact needed on the inner side of each interface device. They may, however, be present but with a concomitant increase in parasitic capacitance.

Note that the technique of reducing the parasitic well and gate capacitances by not fabricating the contact, metal plate, and optionally the raised diffusion layer, can be applied to a variety of semiconductor processes, including planar processes, 3D processes and hybrid planar/3D processes. They also can be applied both to the semiconductor quantum structures using tunneling through depletion region induced in a semiconductor well and also to quantum structures using tunneling between two or more wells through a narrow oxide layer.

A diagram illustrating a top view of a planar semiconductor quantum gate using two arrays of active wells (more than two are possible) with aperture tunneling through local depletion region and n+ blocking layer that stops in the middle of the gate is shown in FIG. 74. The structure, generally referenced 2310, comprises upper and lower qubit arrays. Each qubit array comprises a plurality of wells 2324, a plurality of gates 2322 (which can act as imposers), gate contacts 2320, a plurality of half-classic, half-quantum interface devices with raised source/drain diffusion 2316 (hatched), n+/p+ doped region 2312 and undoped masked region 2314 (dotted box). The edge of the mask defining the border of the raised diffusion processing runs through the middle of the gate (can be anywhere within the width of the gate).

A diagram illustrating a top view of a planar semiconductor quantum gate using two active well arrays (more than two are possible) with aperture tunneling through local depletion region and n+ blocking layer that stops in the middle of the active is shown in FIG. 75. The structure, generally referenced 2330, comprises an upper and lower qubit array. Each qubit comprises a well 2342, a plurality of gates 2338, gate contacts 2344, a plurality full classic interface devices with raised source/drain diffusion 2336 (hatched), n+/p+ doped region 2332 and undoped masked region 2334 (dotted box). The edge of the mask defining the border of the raised diffusion processing runs through the middle of the active well (can be anywhere between the interface device gate and adjacent imposer gate).

A diagram illustrating a top view of a 3D semiconductor quantum gate using two active well arrays (more than two are possible) with aperture tunneling through local depletion region and n+ blocking layer that stops in the middle of the gate is shown in FIG. 76. The structure, generally referenced 2350, comprises an upper and lower qubit. Each qubit array comprises a well 2358, a plurality of gates 2362, gate contacts 2360, a plurality of half-classic, half-quantum interface devices with raised source/drain diffusion 2356, n+/p+ doped region 2352 and undoped masked region 2354 (dotted box). The edge of the mask defining the border of the raised diffusion processing runs through the middle of the gate (can be anywhere within the width of the gate).

A diagram illustrating a top view of a 3D semiconductor quantum gate using two active well arrays (more than two are possible) with aperture tunneling through local depletion region and n+ blocking layer that stops in the middle of the active is shown in FIG. 77. The structure, generally referenced 2370, comprises an upper and lower qubit array. Each qubit array comprises a well 2382, a plurality of gates 2380, gate contacts 2378, a plurality of full classic interface devices with raised source/drain diffusion 2376, n+/p+ doped region 2372 and undoped masked region 2374 (dotted box). The edge of the mask defining the border of the raised diffusion processing runs somewhere through the middle of the active well (can be anywhere between the interface device gate and adjacent imposer gate).

A diagram illustrating a top view of a planar semiconductor quantum gate using two active well arrays (more than two are possible) with aperture tunneling through oxide layer and n+ blocking layer that stops in the middle of the gate is shown in FIG. 78. The structure, generally referenced 2390, comprises a plurality of wells 2400, a plurality of internal gates (imposers) 2404, and interface device gates 2398, gate contacts 2402, a plurality of half-classic, half-quantum interface devices with raised source/drain diffusion 2396 (hatched), n+/p+ doped region 2392 and undoped masked region 2394 (dotted box). The edge of the mask defining the border of the raised diffusion processing runs through the middle of the gate (can be anywhere within the width of the gate).

A diagram illustrating a top view of a planar semiconductor quantum gate using two active well arrays with aperture tunneling through oxide layer and n+ blocking layer that stops in the middle of the active is shown in FIG. 79. The structure, generally referenced 2410, comprises a well 2424, a plurality of internal gates (imposers) 2422, and interface device gates 2416, gate contacts 2420, a plurality of full classic interface devices with raised source/drain diffusion 2418 (hatched), n+/p+ doped region 2412 and undoped masked region 2414 (dotted box). The edge of the mask defining the border of the raised diffusion processing runs through the middle of the active well (can be anywhere between the interface device gate and edge of the well 2424).

A diagram illustrating a top view of a 3D semiconductor quantum gate using two active well arrays with aperture tunneling through oxide layer and n+ blocking layer that stops in the middle of the gate is shown in FIG. 80. The structure, generally referenced 2430, comprises an upper and lower qubit array. Each qubit comprises a well 2440, a plurality of gates 2436, a plurality of half-classic, half-quantum interface devices with raised source/drain diffusion 2438, n+/p+ doped region 2432 and undoped masked region 2434 (dotted box). The edge of the mask defining the border of the raised diffusion processing runs through the middle of the gate (can be anywhere within the width of the gate).

A diagram illustrating a top view of a 3D semiconductor quantum gate using two active wells with aperture tunneling through oxide layer and n+ blocking layer that stops in the middle of the active is shown in FIG. 81. The structure, generally referenced 2450, comprises an upper and lower qubit array. Each qubit comprises a plurality of wells 2460, a plurality of gates 2456, a plurality of full classic interface devices with raised source/drain diffusion 2458, n+/p+ doped region 2452 and undoped masked region 2454 (dotted box). The edge of the mask defining the border of the raised diffusion processing runs through the middle of the active well (can be anywhere between the interface device gate and adjacent imposer gate).

Note that the actual implementation of the modified semiconductor process technique described supra to reduce parasitic gate capacitance will depend on the particular semiconductor process used. A diagram illustrating an example semiconductor quantum gate using staircase shaped n+ wells stopping in the middle of the gate is shown in FIG. 82. This diagram presents a real world planar semiconductor quantum structure from an exemplary SOI semiconductor process.

The layout, generally referenced 2470, comprises an example semiconductor quantum structure with two 'V' staircase shaped active wells 2480 and aperture tunneling through depletion region, reset circuit 2474, injector/detector interface devices 2478, 2482 at both ends of the well, and n+/p+ masked stopping layer within block 2472. In this example, the n+/p+ stopping layer stops in the middle of the interface device gate. Alternatively, as described supra, interface devices may be present only at one end of the well. Any combination of the two situations can be used when a larger of wells are used in a higher order quantum structure.

In order to eliminate raised source/drain diffusions, the n+ implantation is blocked in the case of a p-well or intrinsic well structure. Similarly the p+ implantation is blocked in an n-well case.

Note that in order to perform quantum operations, the semiconductor quantum structure require a reset circuit, an initialization circuit, and a detection/measurement circuit. The layout shown also comprises semiconductor quantum gates using complex L-shape wells showing the reset, injection/detection devices with n+ stopping in the middle of the interface device gate.

Those skilled in the art will recognize that the boundaries between logic and circuit blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediary components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the claims, any reference signs placed between parentheses shall not be construed as limiting the claim. The use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first," "second," etc. are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a quantum device, comprising:
    providing a substrate;
    forming a silicon layer over said substrate and configured to include a first interface device, a plurality of imposer devices, and a second interface device;
    applying a stop mask configured to prevent doping of said plurality of imposer devices;
    doping of one or more areas outside said stop mask; and
    wherein said first interface device and said second interface device are electrically biased.

2. The method according to claim 1, further comprising forming a contact layer and metal layer to fabricate said first interface device and said second interface device.

3. The method according to claim 1, further comprising forming an oxide layer between said substrate and said silicon layer.

4. The method according to claim 1, wherein said plurality of imposer devices are electrically floating.

5. The method according to claim 4, wherein said electrically floating plurality of imposer devices are capacitively coupled to at least one of said first interface device and said second interface device.

6. The method according to claim 1, wherein said doped areas are selected from a group consisting of low doped (n−, p−), medium doped (n, p), high doped (n+, p+), and highly doped (n++, p++).

7. The method according to claim 1, further comprising an interconnect contact layer (CA layer) disposed on said doped layer on one or both sides of a first control gate in said first interface device and a second control gate in said second interface device.

8. The method according to claim 7, further comprising a metal layer disposed on said CA layer on one or both sides of said first and second control gate.

9. The method according to claim 1, wherein said first interface device and said second interface are formed by:
    fabricating a doped layer over said silicon layer operative to function as a source or drain terminal;
    fabricating an interconnect contact layer (CA layer) over said doped layer;
    fabricating a metal layer over said CA layer; and
    wherein said doped layer is selected from a group consisting of low doped (n−, p−), medium doped (n, p), high doped (n+, p+), and highly doped (n++, p++).

10. The method according to claim 1, wherein said substrate is selected from a group comprising a semiconductor, silicon on insulator (SOI), insulating substrate replacement, and a bulk substrate having a global depletion layer that isolates top devices from said substrate.

11. The method according to claim 1, wherein said first interface device and said second interface device each comprise a classic raised diffusion source/drain region only on one side of their corresponding gate and no diffusion, contact, or metal layers on an opposite side of their corresponding gate.

12. The method according to claim 1, wherein said first interface device and said second interface device each comprise a classic raised diffusion source/drain region on a first side and a non-zero portion of a second side of their corresponding gate, wherein said classic raised diffusion source/drain region extends from said second side of said corresponding gate a non-zero portion of a distance to a corresponding gate on a corresponding adjacent imposer device, wherein a remaining distance to said corresponding gate on a corresponding adjacent imposer device comprising an undoped region.

13. The method according to claim 1, wherein said first interface device, said plurality of imposers, and said second interface device are constructed using a semiconductor process selected from the group consisting of planar semiconductor process with tunneling through a depletion region, a 3D FinFET semiconductor process with tunneling through a depletion region, a planar semiconductor process with tunneling through gate oxide, and a 3D FinFET semiconductor process with tunneling through gate oxide.

14. A method of manufacturing a quantum device, comprising:
providing a substrate;
forming a substantially undoped silicon layer over said substrate;
fabricating a plurality of control gates over said undoped silicon layer to form a plurality of qubits, each qubit including a quantum dot formed on either side of each control gate;
applying a stop mask configured to prevent doping of said plurality of qubits;
doping of one or more areas outside said stop mask; and
wherein the quantum dots in each qubit are maintained electrically floating.

15. The method according to claim 14, wherein said undoped silicon layer is electrically insulated from said substrate by an oxide layer sandwiched therebetween.

16. The method according to claim 14, wherein said substrate comprises a material selected from a group comprising a semiconductor, silicon on insulator (SOI), insulating substrate replacement, and a bulk substrate having a global depletion layer that isolates top devices from said substrate.

17. The method according to claim 14, wherein said control gate comprises gate oxide, polysilicon, silicide, and nitride layers.

18. A method of manufacturing a quantum device, comprising:
providing a substrate;
forming a substantially undoped silicon layer over said substrate;
fabricating an oxide layer over said undoped silicon layer;
fabricating a control gate constructed over said oxide layer, said oxide layer and said control gate partially overlapping said undoped silicon layer, whereby a first quantum dot and a second quantum dot are formed on either side of said control gate;
applying a stop mask configured to prevent doping of said first quantum dot and said second quantum dot;
doping of one or more areas outside said stop mask;
wherein an electrical potential applied to said control gate enables tunneling between said first quantum dot and said second quantum dot through said oxide layer; and
wherein both said first quantum dot and said second quantum dot are maintained electrically floating.

19. The quantum device according to claim 18, wherein said substrate is selected from a group comprising a semiconductor, silicon on insulator (SOI), insulating substrate replacement, and a bulk substrate having a global depletion layer that isolates top devices from said substrate.

20. The quantum device according to claim 18, wherein said control gate comprises gate oxide, polysilicon, silicide, and nitride layers.

* * * * *